US006647250B1

(12) United States Patent
Bultman et al.

(10) Patent No.: US 6,647,250 B1
(45) Date of Patent: *Nov. 11, 2003

(54) METHOD AND SYSTEM FOR ENSURING RECEPTION OF A COMMUNICATIONS SIGNAL

(75) Inventors: Michael J. Bultman, Jacksonville, FL (US); Robert W. Cook, Switzerland, FL (US); Richard C. Looke, Jacksonville, FL (US); Charley D. Moses, Jr., Jacksonville, FL (US); David F. Sorrells, Jacksonville, FL (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/376,509

(22) Filed: Aug. 18, 1999

Related U.S. Application Data

(63) Continuation of application No. 09/176,415, filed on Oct. 21, 1998.

(51) Int. Cl.[7] .................................................. H04B 1/02
(52) U.S. Cl. ........................................ 455/102; 455/61
(58) Field of Search .......................... 455/59, 61, 102, 455/101, 93, 118, 108, 110, 60; 370/343, 344; 375/300, 302

(56) References Cited

U.S. PATENT DOCUMENTS

| 2,057,613 | A | 10/1936 | Gardner ........................ 250/8 |
| 2,241,078 | A | 5/1941 | Vreeland ..................... 179/15 |
| 2,270,385 | A | 1/1942 | Skillman ..................... 179/15 |

(List continued on next page.)

FOREIGN PATENT DOCUMENTS

| DE | 35 41 031 A1 | 5/1986 | ............ H03D/3/00 |
| DE | 42 37 692 C1 | 3/1994 | ............ H04B/1/26 |
| DE | 196 27 640 A1 | 1/1997 | ............ H03D/7/12 |

(List continued on next page.)

OTHER PUBLICATIONS

Aghvami, H. et al., "Land Mobile Satellites Using the Highly Elliptic Orbits—The UK T–SAT Mobile Payload," *4th International Conf. On Satellite Systems for Mobile Communications and Navigation*, Oct. 17–19, 1988, pp. 147–153.

Akers, N.P. et al., "RF Sampling Gates: a Brief Review," *IEE Proc.*, vol. 133, Part A, No. 1, Jan. 1986, pp. 45–49.

Al–Ahmad, H.A.M. et al., "Doppler Frequency Correction for a Non–Geostationary Communications Satellite, Techniques for CERS and T–SAT," *Electronics Division Colloquium on Low Noise Oscillators and Synthesizer*, Jan. 23, 1986, pp. 4/1–4/5.

(List continued on next page.)

*Primary Examiner*—Lee Nguyen
(74) *Attorney, Agent, or Firm*—Sterne, Kessler, Goldstein & Fox P.L.L.C.

(57) ABSTRACT

The present invention includes a system and method for ensuring reception of a communications signal. A modulating baseband signal with desired information is accepted, and a plurality of redundant spectrums is generated. Each redundant spectrum comprises the necessary amplitude, phase, and frequency information to substantially reconstruct the modulating baseband signal. It is expected but not required that the redundant spectrums will be generated at a first location and sent to a second location over a communications medium. At the second location, the redundant spectrums are independently processed to recover a demodulating baseband signal for each of the redundant spectrums. In one embodiment, an error detection process is employed at the second location to detect and eliminate those demodulated baseband signals that have been corrupted during transmission. An error-free demodulated baseband signal is selected from the remaining demodulated baseband signals. The error-free demodulated baseband signal is representative of the modulating baseband signal sent over the communications medium.

13 Claims, 97 Drawing Sheets

U.S. PATENT DOCUMENTS

| | | | |
|---|---|---|---|
| 2,283,575 A | 5/1942 | Roberts | 250/6 |
| 2,358,152 A | 9/1944 | Earp | 179/171.5 |
| 2,410,350 A | 10/1946 | Labin et al. | 179/15 |
| 2,451,430 A | 10/1948 | Barone | 250/8 |
| 2,462,069 A | 2/1949 | Chatterjea et al. | 250/17 |
| 2,462,181 A | 2/1949 | Grosselfinger | 250/17 |
| 2,472,798 A | 6/1949 | Fredendall | 178/44 |
| 2,497,859 A | 2/1950 | Boughtwood et al. | 250/8 |
| 2,499,279 A | 2/1950 | Peterson | 332/41 |
| 2,802,208 A | 8/1957 | Hobbs | 343/176 |
| 2,985,875 A | 5/1961 | Grisdale et al. | 343/100 |
| 3,023,309 A | 2/1962 | Foulkes | 250/17 |
| 3,069,679 A | 12/1962 | Sweeney et al. | 343/200 |
| 3,104,393 A | 9/1963 | Vogelman | 343/200 |
| 3,114,106 A | 12/1963 | McManus | 325/56 |
| 3,118,117 A | 1/1964 | King et al. | 332/22 |
| 3,226,643 A | 12/1965 | McNair | 325/40 |
| 3,246,084 A * | 4/1966 | Krypter | 455/61 |
| 3,258,694 A | 6/1966 | Shepherd | 325/145 |
| 3,383,598 A | 5/1968 | Sanders | 325/163 |
| 3,384,822 A | 5/1968 | Miyagi | 325/30 |
| 3,454,718 A | 7/1969 | Perreault | 178/66 |
| 3,523,291 A | 8/1970 | Pierret | 340/347 |
| 3,548,342 A | 12/1970 | Maxey | 332/9 |
| 3,555,428 A | 1/1971 | Perreault | 325/320 |
| 3,617,892 A | 11/1971 | Hawley et al. | 325/145 |
| 3,621,402 A | 11/1971 | Gardner | 328/37 |
| 3,622,855 A | 11/1971 | Oberdorf et al. | 325/40 |
| 3,623,160 A | 11/1971 | Giles et al. | 340/347 DA |
| 3,626,417 A | 12/1971 | Gilbert | 343/203 |
| 3,629,696 A | 12/1971 | Bartelink | 324/57 R |
| 3,662,268 A | 5/1972 | Gans et al. | 325/56 |
| 3,689,841 A | 9/1972 | Bello et al. | 325/39 |
| 3,702,440 A | 11/1972 | Moore | |
| 3,714,577 A | 1/1973 | Hayes | 325/145 |
| 3,716,730 A | 2/1973 | Cerny, Jr. | 307/295 |
| 3,717,844 A | 2/1973 | Barret et al. | 340/5 R |
| 3,735,048 A | 5/1973 | Tomsa et al. | 179/15 BM |
| 3,767,984 A | 10/1973 | Shinoda et al. | |
| 3,806,811 A | 4/1974 | Thompson | 325/146 |
| 3,852,530 A | 12/1974 | Shen | |
| 3,868,601 A | 2/1975 | MacAfee | 332/45 |
| 3,949,300 A | 4/1976 | Sadler | 325/31 |
| 3,967,202 A | 6/1976 | Batz | 325/31 |
| 3,980,945 A | 9/1976 | Bickford | 325/30 |
| 3,987,280 A | 10/1976 | Bauer | 235/150.53 |
| 3,991,277 A | 11/1976 | Hirata | 179/15 FD |
| 4,003,002 A | 1/1977 | Snijders et al. | 332/10 |
| 4,013,966 A | 3/1977 | Campbell | 325/363 |
| 4,017,798 A | 4/1977 | Gordy et al. | 325/42 |
| 4,019,140 A | 4/1977 | Swerdlow | 322/65 |
| 4,032,847 A | 6/1977 | Unkauf | 325/323 |
| 4,035,732 A | 7/1977 | Lohrmann | 325/446 |
| 4,047,121 A | 9/1977 | Campbell | 331/76 |
| 4,051,475 A | 9/1977 | Campbell | 343/180 |
| 4,066,841 A | 1/1978 | Young | 178/66 R |
| 4,066,919 A | 1/1978 | Huntington | 307/353 |
| 4,080,573 A | 3/1978 | Howell | 325/439 |
| 4,081,748 A | 3/1978 | Batz | 325/56 |
| 4,130,765 A | 12/1978 | Arakelian et al. | 307/220 R |
| 4,130,806 A | 12/1978 | Van Gerwen et al. | 325/487 |
| 4,142,155 A | 2/1979 | Adachi | 325/47 |
| 4,170,764 A | 10/1979 | Salz et al. | 332/17 |
| 4,204,171 A | 5/1980 | Sutphin, Jr. | 328/167 |
| 4,210,872 A | 7/1980 | Gregorian | 330/9 |
| 4,220,977 A | 9/1980 | Yamanaka | |
| 4,245,355 A | 1/1981 | Pascoe et al. | 455/326 |
| 4,253,066 A | 2/1981 | Fisher et al. | 329/50 |
| 4,253,067 A | 2/1981 | Caples et al. | 329/110 |
| 4,253,069 A | 2/1981 | Nossek | 330/107 |
| 4,308,614 A | 12/1981 | Fisher et al. | 370/119 |
| 4,320,361 A | 3/1982 | Kikkert | 332/16 R |
| 4,320,536 A | 3/1982 | Dietrich | 455/325 |
| 4,334,324 A | 6/1982 | Hoover | 455/333 |
| 4,346,477 A | 8/1982 | Gordy | 455/257 |
| 4,355,401 A | 10/1982 | Ikoma et al. | 375/5 |
| 4,356,558 A | 10/1982 | Owen et al. | 364/724 |
| 4,360,867 A | 11/1982 | Gonda | 363/158 |
| 4,363,132 A | 12/1982 | Collin | 455/52 |
| 4,365,217 A | 12/1982 | Berger et al. | 333/165 |
| 4,369,522 A | 1/1983 | Cerny, Jr. et al. | 455/333 |
| 4,370,572 A | 1/1983 | Cosand et al. | 307/353 |
| 4,384,357 A | 5/1983 | deBuda et al. | |
| 4,389,579 A | 6/1983 | Stein | 307/353 |
| 4,392,255 A | 7/1983 | Del Giudice | 455/328 |
| 4,393,395 A | 7/1983 | Hacke et al. | 358/23 |
| 4,430,629 A | 2/1984 | Betzl et al. | 333/165 |
| 4,446,438 A | 5/1984 | Chang et al. | 328/127 |
| 4,456,990 A | 6/1984 | Fisher et al. | 370/119 |
| 4,470,145 A | 9/1984 | Williams | |
| 4,472,785 A | 9/1984 | Kasuga | 364/718 |
| 4,479,226 A | 10/1984 | Prabhu et al. | 375/1 |
| 4,481,490 A | 11/1984 | Huntley | 332/41 |
| 4,481,642 A | 11/1984 | Hanson | 375/9 |
| 4,483,017 A | 11/1984 | Hampel et al. | 382/17 |
| 4,484,143 A | 11/1984 | French et al. | 329/50 |
| 4,485,488 A | 11/1984 | Houdart | 455/327 |
| 4,504,803 A | 3/1985 | Lee et al. | 332/31 R |
| 4,517,519 A | 5/1985 | Mukaiyama | 329/126 |
| 4,517,520 A | 5/1985 | Ogawa | 329/145 |
| 4,518,935 A | 5/1985 | van Roermund | 333/173 |
| 4,521,892 A | 6/1985 | Vance et al. | 375/88 |
| 4,563,773 A | 1/1986 | Dixon, Jr. et al. | 455/327 |
| 4,577,157 A | 3/1986 | Reed | 329/50 |
| 4,583,239 A | 4/1986 | Vance | 375/94 |
| 4,591,736 A | 5/1986 | Hirao et al. | 307/267 |
| 4,602,220 A | 7/1986 | Kurihara | 331/19 |
| 4,603,300 A | 7/1986 | Welles, II et al. | 329/50 |
| 4,612,464 A | 9/1986 | Ishikawa et al. | 307/496 |
| 4,612,518 A | 9/1986 | Gans et al. | 332/21 |
| 4,616,191 A | 10/1986 | Galani et al. | 331/4 |
| 4,621,217 A | 11/1986 | Saxe et al. | 315/1 |
| 4,628,517 A | 12/1986 | Schwarz et al. | 375/40 |
| 4,634,998 A | 1/1987 | Crawford | 331/1 A |
| 4,648,021 A | 3/1987 | Alberkrack | 363/157 |
| 4,651,034 A | 3/1987 | Sato | 307/556 |
| 4,653,117 A | 3/1987 | Heck | 455/209 |
| 4,675,882 A | 6/1987 | Lillie et al. | 375/80 |
| 4,688,253 A | 8/1987 | Gumm | 381/7 |
| 4,716,376 A | 12/1987 | Daudelin | 329/107 |
| 4,716,388 A | 12/1987 | Jacobs | 333/173 |
| 4,718,113 A | 1/1988 | Rother et al. | 455/209 |
| 4,726,041 A | 2/1988 | Prohaska et al. | 375/91 |
| 4,733,403 A | 3/1988 | Simone | 375/103 |
| 4,734,591 A | 3/1988 | Ichitsubo | 307/219.1 |
| 4,737,969 A | 4/1988 | Steel et al. | 375/67 |
| 4,743,858 A | 5/1988 | Everard | 330/10 |
| 4,745,463 A | 5/1988 | Lu | 358/23 |
| 4,751,468 A | 6/1988 | Agoston | 328/133 |
| 4,757,538 A | 7/1988 | Zink | 381/7 |
| 4,768,187 A | 8/1988 | Marshall | 370/69.1 |
| 4,769,612 A | 9/1988 | Tamakoshi et al. | 328/167 |
| 4,785,463 A | 11/1988 | Janc et al. | 375/1 |
| 4,791,584 A | 12/1988 | Greivenkamp, Jr. | 364/525 |
| 4,801,823 A | 1/1989 | Yokoyama | 307/353 |
| 4,806,790 A | 2/1989 | Sone | 307/353 |
| 4,810,904 A | 3/1989 | Crawford | 307/353 |
| 4,810,976 A | 3/1989 | Cowley et al. | 331/117 R |
| 4,811,362 A | 3/1989 | Yester, Jr. et al. | 375/75 |
| 4,816,704 A | 3/1989 | Fiori, Jr. | 307/519 |
| 4,819,252 A | 4/1989 | Christopher | 375/122 |

| Patent No. | Date | Inventor | Class |
|---|---|---|---|
| 4,833,445 A | 5/1989 | Buchele | 341/118 |
| 4,841,265 A | 6/1989 | Watanabe et al. | 333/194 |
| 4,855,894 A | 8/1989 | Asahi et al. | 363/157 |
| 4,862,121 A | 8/1989 | Hochschild et al. | 333/173 |
| 4,868,654 A | 9/1989 | Juri et al. | 358/133 |
| 4,870,659 A | 9/1989 | Oishi et al. | 375/82 |
| 4,871,987 A | 10/1989 | Kawase | 332/100 |
| 4,885,587 A | 12/1989 | Wiegand et al. | 42/14 |
| 4,885,756 A | 12/1989 | Fontanes et al. | 375/82 |
| 4,888,557 A | 12/1989 | Puckette, IV et al. | 329/341 |
| 4,890,302 A | 12/1989 | Muilwijk | 375/80 |
| 4,893,316 A | 1/1990 | Janc et al. | 375/44 |
| 4,893,341 A | 1/1990 | Gehring | 381/7 |
| 4,894,766 A | 1/1990 | De Agro | 363/159 |
| 4,896,152 A | 1/1990 | Tiemann | 340/853 |
| 4,902,979 A | 2/1990 | Puckette, IV | 329/343 |
| 4,908,579 A | 3/1990 | Tawfik et al. | 328/167 |
| 4,910,752 A | 3/1990 | Yester, Jr. et al. | 375/75 |
| 4,914,405 A | 4/1990 | Wells | 331/25 |
| 4,920,510 A | 4/1990 | Senderowicz et al. | 364/825 |
| 4,922,452 A | 5/1990 | Larsen et al. | 365/45 |
| 4,931,921 A | 6/1990 | Anderson | 363/163 |
| 4,943,974 A | 7/1990 | Motamedi | 375/1 |
| 4,944,025 A | 7/1990 | Gehring et al. | 455/207 |
| 4,955,079 A | 9/1990 | Connerney et al. | 455/325 |
| 4,965,467 A | 10/1990 | Bilterijst | 307/352 |
| 4,967,160 A | 10/1990 | Quievy et al. | 328/16 |
| 4,970,703 A | 11/1990 | Hariharan et al. | 367/138 |
| 4,982,353 A | 1/1991 | Jacob et al. | 364/724.1 |
| 4,984,077 A | 1/1991 | Uchida | 358/140 |
| 4,995,055 A | 2/1991 | Weinberger et al. | 375/5 |
| 5,003,621 A | 3/1991 | Gailus | 455/209 |
| 5,005,169 A | 4/1991 | Bronder et al. | 370/76 |
| 5,006,810 A | 4/1991 | Popescu | 328/167 |
| 5,010,585 A | 4/1991 | Garcia | 455/118 |
| 5,014,304 A | 5/1991 | Nicollini et al. | 379/399 |
| 5,015,963 A | 5/1991 | Sutton | 329/361 |
| 5,016,242 A | 5/1991 | Tang | |
| 5,017,924 A | 5/1991 | Guiberteau et al. | 342/195 |
| 5,020,149 A | 5/1991 | Hemmie | 455/325 |
| 5,020,154 A | 5/1991 | Zierhut | 455/608 |
| 5,052,050 A | 9/1991 | Collier et al. | 455/296 |
| 5,065,409 A | 11/1991 | Hughes et al. | 375/91 |
| 5,083,050 A | 1/1992 | Vasile | 307/529 |
| 5,091,921 A | 2/1992 | Minami | 375/88 |
| 5,095,533 A | 3/1992 | Loper et al. | 455/245 |
| 5,095,536 A | 3/1992 | Loper | 455/324 |
| 5,111,152 A | 5/1992 | Makino | 329/300 |
| 5,113,094 A | 5/1992 | Grace et al. | 307/529 |
| 5,113,129 A | 5/1992 | Hughes | 323/316 |
| 5,115,409 A | 5/1992 | Stepp | 364/841 |
| 5,122,765 A | 6/1992 | Pataut | 332/105 |
| 5,124,592 A | 6/1992 | Hagino | 307/520 |
| 5,126,682 A | 6/1992 | Weinberg et al. | 329/304 |
| 5,136,267 A | 8/1992 | Cabot | 333/174 |
| 5,140,705 A | 8/1992 | Kosuga | 455/318 |
| 5,150,124 A | 9/1992 | Moore et al. | 342/68 |
| 5,151,661 A | 9/1992 | Caldwell et al. | 328/14 |
| 5,157,687 A | 10/1992 | Tymes | 375/1 |
| 5,159,710 A | 10/1992 | Cusdin | 455/304 |
| 5,170,414 A | 12/1992 | Silvian | 375/59 |
| 5,172,070 A | 12/1992 | Hiraiwa et al. | 329/304 |
| 5,191,459 A | 3/1993 | Thompson et al. | 359/133 |
| 5,204,642 A | 4/1993 | Ashgar et al. | 331/135 |
| 5,212,827 A | 5/1993 | Meszko et al. | 455/219 |
| 5,214,787 A | 5/1993 | Karkota, Jr. | 455/3.2 |
| 5,220,583 A | 6/1993 | Solomon | 375/82 |
| 5,220,680 A | 6/1993 | Lee | 455/102 |
| 5,222,144 A | 6/1993 | Whikehart | 381/15 |
| 5,230,097 A | 7/1993 | Currie et al. | 455/226.1 |
| 5,239,686 A | 8/1993 | Downey | 455/78 |
| 5,241,561 A | 8/1993 | Barnard | 375/1 |
| 5,249,203 A | 9/1993 | Loper | 375/97 |
| 5,251,218 A | 10/1993 | Stone et al. | 370/120 |
| 5,251,232 A | 10/1993 | Nonami | 375/5 |
| 5,260,970 A | 11/1993 | Henry et al. | 375/10 |
| 5,263,194 A | 11/1993 | Ragan | 455/316 |
| 5,263,196 A | 11/1993 | Jasper | 455/324 |
| 5,267,023 A | 11/1993 | Kawasaki | 358/23 |
| 5,278,826 A | 1/1994 | Murphy et al. | 370/76 |
| 5,282,023 A | 1/1994 | Scarpa | 358/36 |
| 5,287,516 A | 2/1994 | Schaub | 375/88 |
| 5,293,398 A | 3/1994 | Hamao et al. | 375/1 |
| 5,303,417 A | 4/1994 | Laws | 455/314 |
| 5,307,517 A | 4/1994 | Rich | 455/306 |
| 5,315,583 A | 5/1994 | Murphy et al. | 370/18 |
| 5,319,799 A | 6/1994 | Morita | 455/78 |
| 5,321,852 A | 6/1994 | Seong | 455/182.1 |
| 5,325,204 A | 6/1994 | Scarpa | 348/607 |
| 5,337,014 A | 8/1994 | Najle et al. | 324/613 |
| 5,339,054 A | 8/1994 | Taguchi | 332/100 |
| 5,339,459 A | 8/1994 | Schiltz et al. | 455/333 |
| 5,353,306 A | 10/1994 | Yamamoto | 375/14 |
| 5,355,114 A | 10/1994 | Sutterlin et al. | 340/310 A |
| 5,361,408 A | 11/1994 | Watanabe et al. | 455/324 |
| 5,369,404 A | 11/1994 | Galton | 341/143 |
| 5,369,800 A * | 11/1994 | Takagi et al. | 455/59 |
| 5,375,146 A | 12/1994 | Chalmers | 375/103 |
| 5,379,040 A | 1/1995 | Mizomoto et al. | 341/143 |
| 5,379,141 A | 1/1995 | Thompson et al. | 359/125 |
| 5,388,063 A | 2/1995 | Takatori et al. | 364/724.17 |
| 5,390,364 A | 2/1995 | Webster et al. | 455/52.3 |
| 5,400,084 A | 3/1995 | Scarpa | 348/624 |
| 5,404,127 A | 4/1995 | Lee et al. | 340/310.02 |
| 5,410,326 A | 4/1995 | Goldstein | |
| 5,410,541 A | 4/1995 | Hotto | 370/76 |
| 5,410,743 A | 4/1995 | Seely et al. | 455/326 |
| 5,412,352 A | 5/1995 | Graham | 332/103 |
| 5,416,803 A | 5/1995 | Janer | 375/324 |
| 5,422,913 A | 6/1995 | Wilkinson | 375/347 |
| 5,423,082 A | 6/1995 | Cygan et al. | 455/126 |
| 5,428,638 A | 6/1995 | Cioffi et al. | 375/224 |
| 5,428,640 A | 6/1995 | Townley | 375/257 |
| 5,434,546 A | 7/1995 | Palmer | 332/151 |
| 5,438,692 A | 8/1995 | Mohindra | 455/324 |
| 5,444,415 A | 8/1995 | Dent et al. | 329/302 |
| 5,444,416 A | 8/1995 | Ishikawa et al. | 329/341 |
| 5,444,865 A | 8/1995 | Heck et al. | 455/86 |
| 5,446,421 A | 8/1995 | Kechkaylo | 332/100 |
| 5,446,422 A | 8/1995 | Mattila et al. | 332/103 |
| 5,448,602 A | 9/1995 | Ohmori et al. | 375/347 |
| 5,451,899 A | 9/1995 | Lawton | 329/302 |
| 5,454,007 A | 9/1995 | Dutta | 375/322 |
| 5,454,009 A | 9/1995 | Fruit et al. | 372/202 |
| 5,463,356 A | 10/1995 | Palmer | 332/117 |
| 5,463,357 A | 10/1995 | Hobden | 332/151 |
| 5,465,071 A | 11/1995 | Kobayashi et al. | 329/315 |
| 5,465,410 A | 11/1995 | Hiben et al. | 455/266 |
| 5,465,415 A | 11/1995 | Bien | 455/326 |
| 5,465,418 A | 11/1995 | Zhou et al. | 455/332 |
| 5,471,162 A | 11/1995 | McEwan | 327/92 |
| 5,479,120 A | 12/1995 | McEwan | 327/91 |
| 5,479,447 A | 12/1995 | Chow et al. | 375/260 |
| 5,483,193 A | 1/1996 | Kennedy et al. | 329/300 |
| 5,483,549 A | 1/1996 | Weinberg et al. | 375/200 |
| 5,483,691 A | 1/1996 | Heck et al. | 455/234.2 |
| 5,483,695 A | 1/1996 | Pardoen | |
| 5,490,173 A | 2/1996 | Whikehart et al. | 375/316 |
| 5,493,581 A | 2/1996 | Young et al. | 375/350 |
| 5,493,721 A | 2/1996 | Reis | 455/339 |
| 5,495,200 A | 2/1996 | Kwan et al. | 327/554 |
| 5,495,202 A | 2/1996 | Hsu | 327/113 |

| | | | |
|---|---|---|---|
| 5,495,500 A | 2/1996 | Jovanovich et al. ......... 375/206 |
| 5,499,267 A | 3/1996 | Ohe et al. .................... 375/206 |
| 5,500,758 A | 3/1996 | Thompson et al. ......... 359/189 |
| 5,513,389 A | 4/1996 | Reeser et al. ............... 455/311 |
| 5,515,014 A | 5/1996 | Troutman .................... 332/178 |
| 5,517,688 A | 5/1996 | Fajen et al. ................. 455/333 |
| 5,519,890 A | 5/1996 | Pinckley ..................... 455/307 |
| 5,523,719 A | 6/1996 | Longo et al. ................ 327/557 |
| 5,523,726 A | 6/1996 | Kroeger et al. ............. 332/103 |
| 5,523,760 A | 6/1996 | McEwan ..................... 342/89 |
| 5,539,770 A | 7/1996 | Ishigaki ...................... 375/206 |
| 5,555,453 A | 9/1996 | Kajimoto et al. ........... 455/266 |
| 5,557,641 A | 9/1996 | Weinberg .................... 375/295 |
| 5,557,642 A | 9/1996 | Williams .................... 375/316 |
| 5,563,550 A | 10/1996 | Toth ........................... 329/347 |
| 5,574,755 A | 11/1996 | Persico ....................... 375/295 |
| 5,579,341 A | 11/1996 | Smith et al. ................ 375/267 |
| 5,579,347 A | 11/1996 | Lindquist et al. ........... 375/346 |
| 5,584,068 A | 12/1996 | Mohindra ................... 455/324 |
| 5,592,131 A | 1/1997 | Labreche et al. ........... 332/103 |
| 5,600,680 A | 2/1997 | Mishima et al. |
| 5,602,847 A | 2/1997 | Pagano et al. .............. 370/484 |
| 5,602,868 A | 2/1997 | Wilson ....................... 375/219 |
| 5,604,592 A | 2/1997 | Kotidis et al. .............. 356/357 |
| 5,604,732 A | 2/1997 | Kim et al. .................. 370/342 |
| 5,606,731 A | 2/1997 | Pace et al. |
| 5,608,531 A | 3/1997 | Honda et al. ................ 386/1 |
| 5,610,946 A | 3/1997 | Tanaka et al. .............. 375/269 |
| RE35,494 E | 4/1997 | Nicollini .................... 327/554 |
| 5,617,451 A | 4/1997 | Mimura et al. ............. 375/340 |
| 5,619,538 A | 4/1997 | Sempel et al. .............. 375/328 |
| 5,621,455 A | 4/1997 | Rogers et al. ................ 348/6 |
| 5,628,055 A | 5/1997 | Stein ........................... 455/89 |
| 5,630,227 A | 5/1997 | Bella et al. ................. 455/324 |
| 5,633,815 A | 5/1997 | Young |
| 5,638,396 A | 6/1997 | Klimek ....................... 372/92 |
| 5,640,415 A | 6/1997 | Pandula ...................... 375/202 |
| 5,640,424 A | 6/1997 | Banavong et al. .......... 375/316 |
| 5,640,428 A | 6/1997 | Abe et al. ................... 375/334 |
| 5,640,698 A | 6/1997 | Shen et al. ................. 455/323 |
| 5,648,985 A | 7/1997 | Bjerede et al. ............. 375/219 |
| 5,650,785 A | 7/1997 | Rodal ......................... 342/357 |
| 5,661,424 A | 8/1997 | Tang ........................... 327/105 |
| 5,663,878 A | 9/1997 | Walker ....................... 363/159 |
| 5,663,986 A | 9/1997 | Striffler ...................... 375/260 |
| 5,668,836 A | 9/1997 | Smith et al. ................ 375/316 |
| 5,675,392 A | 10/1997 | Nayebi et al. .............. 348/584 |
| 5,678,220 A | 10/1997 | Fournier ..................... 455/302 |
| 5,680,078 A | 10/1997 | Ariie .......................... 332/178 |
| 5,680,418 A | 10/1997 | Croft et al. ................. 375/346 |
| 5,689,413 A | 11/1997 | Jaramillo et al. ........... 363/146 |
| 5,694,096 A | 12/1997 | Ushiroku et al. ........... 333/195 |
| 5,699,006 A | 12/1997 | Zele et al. .................. 327/341 |
| 5,705,949 A | 1/1998 | Alelyunas et al. .......... 329/304 |
| 5,705,955 A | 1/1998 | Freeburg et al. ............ 331/14 |
| 5,710,998 A | 1/1998 | Opas ........................... 455/324 |
| 5,714,910 A | 2/1998 | Skoczen et al. ............. 331/3 |
| 5,715,281 A | 2/1998 | Bly et al. .................... 375/344 |
| 5,721,514 A | 2/1998 | Crockett et al. ............. 331/3 |
| 5,724,002 A | 3/1998 | Hulick ........................ 329/361 |
| 5,724,653 A | 3/1998 | Baker et al. ................ 455/296 |
| 5,729,577 A | 3/1998 | Chen .......................... 375/334 |
| 5,729,829 A | 3/1998 | Talwar et al. ............... 455/63 |
| 5,732,333 A | 3/1998 | Cox et al. ................... 455/126 |
| 5,736,895 A | 4/1998 | Yu et al. ..................... 327/554 |
| 5,737,035 A | 4/1998 | Rotzoll ....................... 348/725 |
| 5,742,189 A | 4/1998 | Yoshida et al. ............. 327/113 |
| 5,748,683 A | 5/1998 | Smith et al. ................ 375/347 |
| 5,757,870 A | 5/1998 | Miya et al. ................. 375/367 |
| RE35,829 E | 6/1998 | Sanderford, Jr. ............ 375/200 |
| 5,760,645 A | 6/1998 | Comte et al. ............... 329/304 |
| 5,764,087 A | 6/1998 | Clark .......................... 327/105 |
| 5,767,726 A | 6/1998 | Wang .......................... 327/356 |
| 5,768,118 A | 6/1998 | Faulk et al. .................. 363/72 |
| 5,768,323 A | 6/1998 | Kroeger et al. ............. 375/355 |
| 5,770,985 A | 6/1998 | Ushiroku et al. ........... 333/193 |
| 5,771,442 A | 6/1998 | Wang et al. .................. 455/93 |
| 5,777,692 A | 7/1998 | Ghosh ........................ 348/725 |
| 5,777,771 A | 7/1998 | Smith ......................... 359/180 |
| 5,778,022 A | 7/1998 | Walley ....................... 375/206 |
| 5,786,844 A | 7/1998 | Rogers et al. ................ 348/6 |
| 5,793,801 A | 8/1998 | Fertner ....................... 375/219 |
| 5,793,818 A | 8/1998 | Claydon et al. ............ 375/326 |
| 5,801,654 A | 9/1998 | Traylor ....................... 341/144 |
| 5,802,463 A | 9/1998 | Zuckerman ................. 455/208 |
| 5,809,060 A | 9/1998 | Cafarella et al. ........... 375/206 |
| 5,812,546 A | 9/1998 | Zhou et al. ................. 370/342 |
| 5,818,582 A | 10/1998 | Fernandez et al. .......... 356/318 |
| 5,818,869 A | 10/1998 | Miya et al. ................. 375/206 |
| 5,825,254 A | 10/1998 | Lee ............................. 331/25 |
| 5,834,985 A | 11/1998 | Sundegård .................. 332/100 |
| 5,841,324 A | 11/1998 | Williams .................... 331/17 |
| 5,841,811 A | 11/1998 | Song .......................... 375/235 |
| 5,844,449 A | 12/1998 | Abeno et al. ............... 332/105 |
| 5,859,878 A | 1/1999 | Phillips et al. ............. 375/316 |
| 5,864,754 A | 1/1999 | Hotto ......................... 455/280 |
| 5,870,670 A | 2/1999 | Ripley et al. |
| 5,872,446 A | 2/1999 | Cranford, Jr. et al. ...... 323/315 |
| 5,881,375 A | 3/1999 | Bonds ........................ 455/118 |
| 5,883,548 A | 3/1999 | Assard et al. ............... 329/306 |
| 5,892,380 A | 4/1999 | Quist .......................... 327/172 |
| 5,894,239 A | 4/1999 | Bonaccio et al. ........... 327/176 |
| 5,894,496 A | 4/1999 | Jones ......................... 455/126 |
| 5,896,562 A | 4/1999 | Heinonen ................... 455/76 |
| 5,900,747 A | 5/1999 | Brauns ........................ 327/9 |
| 5,901,054 A | 5/1999 | Leu et al. .................... 363/41 |
| 5,901,187 A | 5/1999 | Iinuma ....................... 375/347 |
| 5,901,344 A | 5/1999 | Opas .......................... 455/76 |
| 5,901,347 A | 5/1999 | Chambers et al. .......... 455/234.1 |
| 5,901,348 A | 5/1999 | Bang et al. .................. 455/254 |
| 5,901,349 A | 5/1999 | Guegnaud et al. .......... 455/302 |
| 5,903,178 A | 5/1999 | Miyatsuji et al. ........... 327/308 |
| 5,903,187 A | 5/1999 | Claverie et al. ............ 329/342 |
| 5,903,196 A | 5/1999 | Salvi et al. .................. 331/16 |
| 5,903,421 A | 5/1999 | Furutani et al. ............. 361/58 |
| 5,903,553 A | 5/1999 | Sakamoto et al. .......... 370/338 |
| 5,903,595 A | 5/1999 | Suzuki ........................ 375/207 |
| 5,903,609 A | 5/1999 | Kool et al. .................. 375/261 |
| 5,903,827 A | 5/1999 | Kennan et al. .............. 455/326 |
| 5,903,854 A | 5/1999 | Abe et al. ................... 455/575 |
| 5,905,449 A | 5/1999 | Tsubouchi et al. ......... 340/925.69 |
| 5,907,149 A | 5/1999 | Marckini .................... 235/487 |
| 5,907,197 A | 5/1999 | Faulk .......................... 307/119 |
| 5,909,447 A | 6/1999 | Cox et al. ................... 370/508 |
| 5,911,116 A | 6/1999 | Nosswitz .................... 455/83 |
| 5,911,123 A | 6/1999 | Shaffer et al. ............... 455/554 |
| 5,914,622 A | 6/1999 | Inoue .......................... 327/172 |
| 5,915,278 A | 6/1999 | Mallick ....................... 73/658 |
| 5,920,199 A | 7/1999 | Sauer .......................... 324/678 |
| 5,926,065 A | 7/1999 | Wakai et al. ................ 329/304 |
| 5,933,467 A | 8/1999 | Sehier et al. ................ 375/350 |
| 5,937,013 A | 8/1999 | Lam et al. |
| 5,943,370 A | 8/1999 | Smith ......................... 375/334 |
| 5,945,660 A | 8/1999 | Nakasuji et al. ............ 235/462.46 |
| 5,952,895 A | 9/1999 | McCune, Jr. et al. ...... 332/128 |
| 5,953,642 A | 9/1999 | Feldtkeller et al. ......... 455/195.1 |
| 5,956,025 A | 9/1999 | Goulden et al. |
| 5,959,850 A | 9/1999 | Lim ............................ 363/17 |
| 5,960,033 A | 9/1999 | Shibano et al. ............. 375/207 |
| 6,014,551 A | 1/2000 | Pesola et al. |
| 6,028,887 A | 2/2000 | Harrison et al. ............ 375/206 |
| 6,041,073 A | 3/2000 | Davidovici et al. ........ 375/148 |

| | | | | |
|---|---|---|---|---|
| 6,049,706 A | 4/2000 | Cook et al. .................. 455/313 |
| 6,054,889 A | 4/2000 | Kobayashi .................. 327/357 |
| 6,061,551 A | 5/2000 | Sorrells et al. ............. 455/118 |
| 6,061,555 A | 5/2000 | Bultman et al. ............ 455/313 |
| 6,073,001 A | 6/2000 | Sokoler |
| 6,081,691 A | 6/2000 | Renard et al. ............. 455/12.1 |
| 6,084,922 A | 7/2000 | Zhou et al. .................. 375/316 |
| 6,085,073 A | 7/2000 | Palermo et al. |
| 6,091,939 A * | 7/2000 | Banh .......................... 455/102 |
| 6,091,940 A | 7/2000 | Sorrells et al. ............. 455/118 |
| 6,091,941 A | 7/2000 | Moriyama et al. .......... 455/126 |
| 6,098,046 A | 8/2000 | Cooper et al. |
| 6,098,886 A | 8/2000 | Swift et al. ............ 235/472.01 |
| 6,121,819 A | 9/2000 | Traylor ....................... 327/359 |
| 6,125,271 A | 9/2000 | Rowland et al. ............ 455/313 |
| 6,127,947 A | 10/2000 | Uchida et al. |
| 6,144,236 A | 11/2000 | Vice et al. .................. 327/113 |
| 6,144,846 A | 11/2000 | Durec ......................... 455/323 |
| 6,147,340 A | 11/2000 | Levy ....................... 250/214 R |
| 6,147,763 A | 11/2000 | Steinlechner ............... 356/484 |
| 6,150,890 A | 11/2000 | Damgaard et al. ............ 331/14 |
| 6,175,728 B1 | 1/2001 | Mitama ....................... 455/323 |
| 6,215,475 B1 | 4/2001 | Meyerson et al. .......... 345/173 |
| 6,266,518 B1 | 7/2001 | Sorrells et al. ............. 455/118 |
| 6,314,279 B1 | 11/2001 | Mohindra |
| 6,330,244 B1 | 12/2001 | Swartz et al. |
| 6,353,735 B1 | 3/2002 | Sorrells et al. ............. 455/118 |
| 6,370,371 B1 | 4/2002 | Sorrells et al. ............. 455/323 |
| 6,400,963 B1 | 6/2002 | Glöckler et al. |
| 6,421,534 B1 | 7/2002 | Cook et al. |

FOREIGN PATENT DOCUMENTS

| | | | | |
|---|---|---|---|---|
| DE | 197 35 798 C1 | 7/1998 | ........... H04L/27/00 |
| EP | 0 035 166 A1 | 9/1981 | ............ H04B/1/26 |
| EP | 0 087 336 A1 | 8/1983 | ............ H03D/7/12 |
| EP | 0 099 265 A1 | 1/1984 | ............ H03D/3/04 |
| EP | 0 087 336 B1 | 7/1986 | ............ H03D/7/12 |
| EP | 0 254 844 A2 | 2/1988 | ............ H03D/7/00 |
| EP | 0 276 130 A2 | 7/1988 | ............ H03D/7/00 |
| EP | 0 276 130 A3 | 7/1988 | ............ H03D/7/00 |
| EP | 0 193 899 B1 | 6/1990 | ............. G01S/7/52 |
| EP | 0 380 351 A2 | 8/1990 | ......... H03H/17/04 |
| EP | 0 380 351 A3 | 2/1991 | ......... H03H/17/04 |
| EP | 0 411 840 A2 | 2/1991 | .......... G01R/33/36 |
| EP | 0 423 718 A2 | 4/1991 | ............ H04N/7/01 |
| EP | 0 411 840 A3 | 7/1991 | .......... G01R/33/36 |
| EP | 0 486 095 A1 | 5/1992 | ............ H03D/3/00 |
| EP | 0 423 718 A3 | 8/1992 | ............ H04N/7/01 |
| EP | 0 512 748 A2 | 11/1992 | ............ H04N/9/64 |
| EP | 0 529 836 A1 | 3/1993 | ............ H03L/7/089 |
| EP | 0 548 542 A1 | 6/1993 | ......... H03B/19/14 |
| EP | 0 512 748 A3 | 7/1993 | ............ H04N/9/64 |
| EP | 0 560 228 A1 | 9/1993 | ............ H03D/7/12 |
| EP | 0 632 288 A2 | 1/1995 | .......... G01S/13/75 |
| EP | 0 632 577 A1 | 1/1995 | ............ H03D/7/16 |
| EP | 0 411 840 B1 | 10/1995 | .......... G01R/33/36 |
| EP | 0 696 854 A1 | 2/1996 | ............ H04B/1/26 |
| EP | 0 632 288 A3 | 7/1996 | .......... G01S/13/75 |
| EP | 0 732 803 A1 | 9/1996 | ............ H03D/3/00 |
| EP | 0 486 095 B1 | 2/1997 | ............ H03D/3/00 |
| EP | 0 782 275 A2 | 7/1997 | ............ H04B/7/02 |
| EP | 0 785 635 A1 | 7/1997 | ............ H04B/1/713 |
| EP | 0 789 449 A2 | 8/1997 | ............ H03D/7/12 |
| EP | 0 795 955 A2 | 9/1997 | .......... H03D/13/00 |
| EP | 0 795 955 A3 | 9/1997 | .......... H03D/13/00 |
| EP | 0 795 978 A2 | 9/1997 | ............. H04L/5/06 |
| EP | 0 817 369 A2 | 1/1998 | ............ H03D/7/00 |
| EP | 0 817 369 A3 | 1/1998 | ............ H03D/7/00 |
| EP | 0 837 565 A1 | 4/1998 | ............ H04B/1/69 |
| EP | 9 862 274 A1 | 9/1998 | ............ H03M/1/06 |
| EP | 0 874 499 A2 | 10/1998 | ........... H04L/25/06 |
| EP | 0 512 748 B1 | 11/1998 | ............ H04N/9/64 |
| FR | 2 245 130 | 4/1975 | ............ H03K/5/13 |
| FR | 2 669 787 A1 | 5/1992 | ......... H03D/7/14 |
| FR | 2 743 231 A1 | 7/1997 | ............ H04B/7/12 |
| GB | 2 161 344 A | 1/1986 | ............ H04B/7/12 |
| GB | 2 215 945 A | 9/1989 | .......... H04L/27/00 |
| GB | 2 324 919 A | 11/1998 | ............ H03D/7/18 |
| JP | 47-2314 | 2/1972 | |
| JP | 55-66057 | 5/1980 | ............ G06K/7/10 |
| JP | 56-114451 | 9/1981 | ............ H04B/7/02 |
| JP | 58-7903 | 1/1983 | ............ H03C/1/02 |
| JP | 58-133004 | 8/1983 | ............ H03D/1/00 |
| JP | 59-144249 | 8/1984 | .......... H04L/27/00 |
| JP | 60-58705 | 4/1985 | ............ H03D/7/00 |
| JP | 60-130203 | 7/1985 | ............ H03D/7/00 |
| JP | 61-30821 | 2/1986 | ............ H04B/1/10 |
| JP | 63-54002 | 3/1988 | ......... H03B/19/114 |
| JP | 63-65587 | 3/1988 | ............ G06K/7/10 |
| JP | 63-153691 | 6/1988 | .......... G06K/17/00 |
| JP | 2-39632 | 2/1990 | ............ H04B/7/12 |
| JP | 2-131629 | 5/1990 | ............ H04B/7/12 |
| JP | 2-276351 | 11/1990 | .......... H04L/27/22 |
| JP | 4-123614 | 4/1992 | ....... H03K/19/0175 |
| JP | 4-127601 | 4/1992 | ............ H03D/7/00 |
| JP | 5-175730 | 7/1993 | ............ H03D/1/00 |
| JP | 5-175734 | 7/1993 | ............ H03D/3/00 |
| JP | 5-327356 | 12/1993 | ............ H03D/7/00 |
| JP | 6-237276 | 8/1994 | .......... H04L/27/20 |
| JP | 7-154344 | 6/1995 | .......... H04B/14/06 |
| JP | 7-307620 | 11/1995 | ............ H03D/1/18 |
| JP | 8-23359 | 1/1996 | .......... H04L/27/20 |
| JP | 8-32556 | 2/1996 | ............ H04L/1/04 |
| JP | 8-139524 | 5/1996 | ............ H03D/7/00 |
| WO | WO 80/01633 A1 | 8/1980 | ............. H04J/1/08 |
| WO | WO 91/18445 A1 | 11/1991 | ............ H03D/7/18 |
| WO | WO 94/05087 A1 | 3/1994 | ............ H03M/1/00 |
| WO | WO 95/01006 A1 | 1/1995 | ............ H03M/1/66 |
| WO | WO 96/02977 A1 | 2/1996 | ............ H04B/1/26 |
| WO | WO 96/08078 A1 | 3/1996 | ............ H03D/3/00 |
| WO | WO 96/39750 A1 | 12/1996 | ............ H04B/1/26 |
| WO | WO 97/08839 A2 | 3/1997 | ............ H04B/1/04 |
| WO | WO 97/08839 A3 | 3/1997 | ............ H04B/1/04 |
| WO | WO 97/38490 A1 | 10/1997 | ............ H03K/7/00 |
| WO | WO 98/00953 A1 | 1/1998 | .......... H04L/27/26 |
| WO | WO 98/24201 A1 | 6/1998 | ............ H04H/1/00 |
| WO | WO 98/40968 A3 | 9/1998 | ............ H03L/7/08 |
| WO | WO 98/40968 A2 | 9/1998 | ............. H03L/7/08 |
| WO | WO 99/23755 A1 | 5/1999 | ............ H03D/7/16 |

OTHER PUBLICATIONS

Ali, I. et al., "Doppler Characterization for LEO Satellites," *IEEE Trans. On Communications,* vol. 46, No. 3, Mar. 1998, pp. 309–313.

Allan, D.W., "Statistics of Atomic Frequency Standards," *Proc. Of the IEEE Special Issue on Frequency Stability,* Feb. 1966. pp. 221–230.

Allstot, D.J. et al., "MOS Switched Capacitor Ladder Filters," *IEEE Journal of Solid–State Circuits,* vol. SC–13, No. 6, Dec. 1978, pp. 806–814.

Allstot, D.J. and Black Jr. W.C., "Technological Design Considerations for Monolithic MOS Switched–Capacitor Filtering Systems," *Proceedings of the IEEE,* vol. 71, No. 8, Aug. 1983, pp. 967–986.

Alouini, M. et al., "Channel Characterization and Modeling for Ka–Band Very Small Aperture Terminals," *Proc. Of the IEEE,* vol. 85, No. 6, Jun. 1997, pp. 981–997.

Andreyev, G.A. and Ogarev, S.A., "Phase Distortions of Keyed Millimeter–Wave Signals in the Case of Propagation in a Turbulent Atmosphere," *Telecommunications and Radio Engineering,* vol. 43, No. 12, Dec. 1988, pp. 87–90.

Antonetti, A. et al., "Optoelectronic Sampling in the Picosecond Range," *Optics Communications,* vol. 21, No. 2, May 1977, pp. 211–214.

Austin, J. et al., "Doppler Correction of the Telecommunication Payload Oscillators in the UK T–SAT," *18th European Microwave Conference,* Sep. 12–15, 1988, pp. 851–857.

Auston, D.H., "Picosecond optoelectronic switching and gating in silicon," *Applied Physics Letters,* vol. 26, No. 3, Feb. 1, 1975, pp. 101–103.

Baher, H., "Transfer Functions for Switched–Capacitor and Wave Digital Filters," *IEEE Transactions on Circuits and Systems,* vol. CAS–33, No. 11, Nov. 1986, pp. 1138–1142.

Baines, R., "The DSP Bottleneck," *IEEE Communications Magazine,* May 1995, pp. 46–54.

Banjo, O.P. and Vilar, E., "Binary Error Probabilities on Earth–Space Links Subject to Scintillation Fading," *Electronics Letters,* vol. 21, No. 7, Mar. 28, 1985, pp. 296–297.

Banjo, O.P. and Vilar, E., "The Dependence of Slant Path Amplitude Scintillations on Various Meteorological Parameters," *Antennas and Propagation (ICAP 87) Part 2: Propagation,* Mar. 30–Apr. 2, 1987, pp. 277–280.

Banjo, O.P. et al., "Tropospheric Amplitude Spectra Due to Absorption and Scattering in Earth–Space Paths," *Antennas and Propagation (ICAP 85),* Apr. 16–19, 1985, pp. 77–82.

Basili, P. et al., "Case Study of Intense Scintillation Events on the OTS Path," *IEEE Trans. On Antennas and Propagation,* vol. 38, No. 1, Jan. 1990, pp. 107–113.

Basili, P. et al., "Observation of High $C^2$ and Turbulent Path Length on OTS Space–Earth Link," *Electronics Letters,* vol. 24, No. 17, Aug. 18, 1988, pp. 1114–1116.

Blakey, J.R. et al., "Measurement of Atmospheric Millimetre–Wave Phase Scintillations in an Absorption Region," *Electronics Letters,* vol. 21, No. 11, May 23, 1985, pp. 486–487.

Burgueño, A. et al., "Influence of rain gauge integration time on the rain rate statistics used in microwave communications," *annales des telecommunications,* Sep./Oct. 1988, pp. 522–527.

Burgueño, A. et al., "Long Term Joint Statistical Analysis of Duration and Intensity of Rainfall Rate with Application to Microwave Communications," *Antennas and Propagation (ICAP 87) Part 2: Propagation,* Mar. 30–Apr. 2, 1987, pp. 198–201.

Burgueño, A. et al., "Long Term Statistics of Precipitation Rate Return Periods in the Context of Microwave Communications," *Antennas and Propagation (ICAP 89) Part 2: Propagation,* Apr. 4–7, 1989, pp. 297–301.

Burgueño, A. et al., "Spectral Analysis of 49 Years of Rainfall and Relation to Fade Dynamics," *IEEE Trans. On Communications,* vol. 38, No. 9, Sep. 1990, pp. 1359–1366.

Catalan, C. and Vilar, E., "Approach for satellite slant path remote sensing," *Electronics Letters,* vol. 34, No. 12, Jun. 11, 1998, pp. 1238–1240.

Chan, P. et al., "A Highly Linear 1–GHz CMOS Downconversion Mixer," *European Solid State Circuits Conference,* Seville, Spain, Sep. 22–24, 1993, pp. 210–213.

Copy of Declaration of Michael J. Bultman filed in U.S. patent application Ser. No. 09/176,022, which is directed to related subject matter.

Copy of Declaration of Robert W. Cook filed in U.S. patent application Ser. No. 09/176,022, which is directed to related subject matter.

Copy of Declaration of Alex Holtz filed in U.S. patent application Ser. No. 09/176,022, which is directed to related subject matter.

Copy of Declaration of Richard C. Looke filed in U.S. patent application Ser. No. 09/176,022, which is directed to related subject matter.

Copy of Declaration of Charley D. Moses, Jr. filed in U.S. patent application Ser. No. 09/176,022, which is directed to related subject matter.

Copy of Declaration of Jeffrey L. Parker and David F. Sorrells, with attachment Exhibit 1, filed in U.S. patent application Ser. No. 09/176,022, which is directed to related subject matter.

Dewey, R.J. and Collier, C.J., "Multi–Mode Radio Receiver," pp. 3/1–3/5.

DIALOG File 347 (JAPIO) English Language Patent Abstract for JP 2–276351, published Nov. 13, 1990, (1 Page).

DIALOG File 347 (JAPIO) English Language Patent Abstract for JP–2–131629, published May 21, 1990, (1 Page).

DIALOG File 347 (JAPIO) English Language Patent Abstract for JP 2–39632, published Feb. 8, 1990, (1 Page).

DIALOG File 348 (European Patents) English Language Patent Abstract for EP 0 785 635 A1, published Dec. 26, 1996, (3 Pages).

DIALOG File 348 (European Patents) English Language Patent Abstract for EP 35166 A1, published Feb. 18, 1981, (2 Pages).

"DSO takes sampling rate to 1 Ghz," *Electronic Engineering,* Mar. 1987, pp. 77 and 79.

Erdi, G. and Henneuse, P.R., "A Precision FET–Less Sample–and–Hold with High Charge–to–Droop Current Ratio," *IEEE Journal of Solid–State Circuits,* vol. SC–13, No. 6, Dec. 1978, pp. 864–873.

Faulkner, N.D. and Vilar, E., "Subharmonic Sampling for the Measurement of Short Term Stability of Microwave Oscillators," *IEEE Trans. On Instrumentation and Measurement,* vol. IM–32, No. 1, Mar. 1983, pp. 208–213.

Faulkner, N.D. et al., "Sub–Harmonic Sampling for the Accurate Measurement of Frequency Stability of Microwave Oscillators," *CPEM 82 Digest: Conf. On Precision Electromagnet Measurements,* 1982, pp. M–10 & M–11.

Faulkner, N.D. and Vilar, E., "Time Domain Analysis of Frequency Stability Using Non–Zero Dead–Time Counter Techniques," *CPEM 84 Digest Conf. On Precision Electromagnetic Measurements,* 1984, pp. 81–82.

Filip, M. and Vilar, E., "Optimum Utilization of the Channel Capacity of a Satellite Link in the Presence of Amplitude Scintillations and Rain Attenuation," *IEEE Trans. On Communications,* vol. 38, No. 11, Nov. 1990, pp. 1958–1965.

Fukahori, K., "A CMOS Narrow–Band Signaling Filter with Q Reduction," *IEEE Journal of Solid–State Circuits,* vol. SC–19, No. 6, Dec. 1984, pp. 926–932.

Fukuchi, H. and Otsu, Y., "Available time statistics of rain attenuation on earth–space path," *IEE Proc.,* vol. 135, pt. H, No. 6 , Dec. 1988, pp. 387–390.

Gibbons, C.J. and Chadha, R., "Millimetre–wave propagation through hydrocarbon flame," *IEE Proc.,* vol. 134, pt. H, No. 2, Apr. 1987, pp. 169–173.

Gilchrist, B. et al., "Sampling hikes performance of frequency synthesizers," *Microwaves R&F,* Jan. 1984, pp. 93–94 and 110.

Gossard, E.E., "Clear weather meteorological effects on propagation at frequencies above 1 GHz," *Radio Science,* vol. 16, No. 5, Sep.–Oct. 1981, pp. 589–608.

Gregorian, R. et al., "Switched–Capacitor Circuit Design," *Proceedings of the IEEE,* vol. 71, No. 8, Aug. 1983, pp. 941–966.

Groshong et al., "Undersampling Techniques Simplify Digital Radio," *Electronic Design,* May 23, 1991, pp. 67–68, 70, 73–75 and 78.

Grove, W.M., "Sampling for Oscilloscopes and Other RF Systems: Dc through X–Band," *IEEE Trans. On Microwave Theory and Techniques,* Dec. 1966, pp. 629–635.

Haddon, J. et al., "Measurement of Microwave Scintillations on a Satellite Down–Line at X–Band," $2^{nd}$ *Int'l Conf. On Antennas and Propagation Part 2: Propagation,* Apr. 13–16, 1991, pp. 113–117.

Haddon, J. and Vilar, E., "Scattering Induced Microwave Scintillations from Clear Air and Rain on Earth Space Paths and the Influence of Antenna Aperture," *IEEE Trans. On Antennas and Propagation,* vol. Ap–343, No. 5, May 1986, pp. 646–657.

Haddon, J. and Vilar, E., "Scattering Induced Microwave Scintillations from Clear Air and Rain on Earth Space Paths and the Influence of Antenna Aperture," *IEEE Trans. On Antennas and Propagation,* vol. AP–34, No. 5, May 1986, pp. 646–657.

Hafdallah, H. et al., "2–4 Ghz MESFET Sampler," *Electronics Letters,* vol. 24, No. 3, Feb. 4, 1988, pp. 151–153.

Herben, M.H.A.J., "Amplitude and Phase Scintillation Measurements on 8–2 km Line–Of–Sight Path at 30 Ghz," *Electronics Letters,* vol. 18, No. 7, Apr. 1, 1982, pp. 287–289.

Hewitt, A. et al.,"An 18 Ghz Wideband LOS Multipath Experiment," *Int'l Conf. On Measurements for Telecommunication Transmission Systems—MTTS 85,* Nov. 27–28, 1985, pp. 112–116.

Hewitt, A. et al., "An Autoregressive Approach to the Identification of Multipath Ray Parameters from Field Measurements," *IEEE Trans. On Communications,* vol. 37, No. 11, Nov. 1989, pp. 1136–1143.

Hewitt, A. and Vilar, E., "Selective fading on LOS Microwave Links: Classical and Spread–Spectrum Measurement Techniques," *IEEE Trans. On Communications,* vol. 36, No. 7, Jul. 1988, pp. 789–796.

Hospitalier, E., "Instruments for Recording and Observing Rapidly Varying Phenomena," *Science Abstracts,* vol. VII, 1904, pp. 22–23.

Howard, I.M. and Swansson, N.S., "Demodulating High Frequency Resonance Signals for Bearing Fault Detection," *The Institution of Engineers Australia Communications Conference,* Melbourne Sep. 18–20, 1990, pp. 115–121.

Hu, X., *A Switched–Current Sample–and–Hold Amplifier for FM Demodulation,* Thesis for Master of Applied Science, Dept. of Electrical and Computer Engineering, University of Toronto, 1995, pp. 1–64.

Hung, H–L. A. et al., "Characterization of Microwave Integrated Circuits Using An Optical Phase–Locking and Sampling System," *IEEE MTT–S Digest,* 1991, pp. 507–510.

Hurst, P.J., "Shifting the Frequency Response of Switched–Capacitor Filters by Nonuniform Sampling," *IEEE Transactions on Circuits and Systems,* vol. 38, No. 1, Jan. 1991, pp. 12–19.

Itakura, T., "Effects of the sampling pulse width on the frequency characteristics of a sample–and–hold circuit," *IEEE Proc. Circuits, Devices and Systems,* vol. 141, No. 4, Aug. 1994, pp. 328–336.

Janssen, J.M.L., "An Experimental 'Stroboscopic' Oscilloscope for Frequencies up to about 50 Mc/s: I. Fundamentals," *Philips Technical Review,* vol. 12, No. 2, Aug. 1950, pp. 52–59.

Janssen, J.M.L. and Michels, A.J., "An Experimental 'Stroboscopic' Oscilloscope for Frequencies to about 50 Mc/s: II. Electrical Build–Up," *Philips Technical Review,* vol. 12, No. 3, Sep. 1950, pp. 73–82.

Jondral, V.F. et al., "Doppler Profiles for Communication Satellites," *Frequenz,* May–Jun. 1996, pp. 111–116.

Kaleh, G.K., "A Frequency Diversity Spread Spectrum System for Communication in the Presence of In–band Interference," *1995 IEEE Globecom,* pp. 66–70.

Karasawa, Y. et al., "A New Prediction Method for Tropospheric Scintillation on Earth–Space Paths," *IEEE Trans. On Antennas and Propagation,* vol. 36, No. 11, Nov. 1988, pp. 1608–1614.

Kirsten, J. and Fleming, J., "Undersampling reduces data–acquisition costs for select applications," *EDN,* Jun. 21, 1990, pp. 217–222, 224, 226–228.

Lam, W.K. et al., "Measurement of the Phase Noise Characteristics of an Unlocked Communications Channel Identifier," *Proc. Of The 1993 IEEE International Frequency Control Symposium,* Jun. 2–4, 1993, pp. 283–288.

Lam, W.K. .et al., "Wideband sounding of 11.6 Ghz transhorizon channel," *Electronics Letters,* vol. 30, No. 9, Apr. 28, 1994, pp. 738–739.

Larkin, K.G., "Efficient demodulator for bandpass sampled AM signals," *Electronics Letters,* vol. 32, No. 2, Jan. 18, 1996, pp. 101–102.

Lau, W.H. et al., "Analysis of the Time Variant Structure of Microwave Line–of–sight Multipath Phenomena," *IEEE Global Telecommunications Conference & Exhibition,* Nov. 28–Dec. 1, 1988, pp. 1707–1711.

Lau, W.H. et al., "Improved Prony Algorithm to Identify Multipath Components," *Electronics Letters,* vol. 23, No. 20, Sep. 24, 1987, pp. 1059–1060.

Lesage, P. and Audoin, C., "Effect of Dead–Time on the Estimation of the Two–Sample Variance," *IEEE trans. On Instrumentation and Measurement,* vol. IM–28, No. 1, Mar. 1979, pp. 6–10.

Liechti, C.A., "Performance of Dual–gate GaAs MESFET's as Gain–Controlled Low–Noise Amplifiers and High–Speed Modulators," *IEEE Trans. On Microwave Theory and Techniques,* vol. MTT–23, No. 6, Jun. 1975, pp. 461–469.

Linnenbrink, T.E. et al., "A One Gigasample Per Second Transient Recorder," *IEEE trans. On Nuclear Science,* vol. NS–26, No. 4, Aug. 1979, pp. 4443–4449.

Liou, M.L., "A Tutorial on Computer–Aided Analysis of Switched–Capacitor Circuits," *Proceedings of the IEEE,* vol. 71, No. 89, Aug. 1983, pp. 987–1005.

Lo, P. et al., "Coherent Automatic Gain Control," *IEE Colloquium on Phase Locked Techniques,* Mar. 26, 1980, pp. 2/1–2/6.

Lo, P. et al., "Computation of Rain Induced Scintillations on Satellite Down–Links at Microwave Frequencies," *Third Int'l Conf. On Antennas and Propagation (ICAP 83) Part 2: Propagation*, Apr. 12–15, 1993, pp. 127–131.

Lo, P.S.L.O. et al., "Observations of Amplitude Scintillations on a Low–Elevation Earth–Space Path," *Electronics Letters*, vol. 20, No. 7, Mar. 29, 1984, pp. 307–308.

Madani, K. and Aithison, C.S., "A 20 Ghz Microwave Sampler," *IEEE Trans. On Microwave Theory and Techniques*, vol. 40, No. 10, Oct. 1992, pp. 1960–1963.

Marsland, R.A. et al., "130 Ghz GaAs monolithic integrated circuit sampling head," *Appl. Phys. Lett.*, vol. 55, No. 6, Aug. 7, 1989, pp. 592–594.

Martin, K. and Sedra, A.S., "Switched–Capacitor Building Blocks for Adaptive Systems," *IEEE Transactions on Circuits and Systems*, vol. CAS–28, No. 6, Jun. 1981, pp. 576–584.

Marzano, F.S. and d'Auria, G., "Model–based Prediction of Amplitude Scintillation variance due to Clear–Air Tropospheric Turbulence on Earth–Satellite Microwave Links," *IEEE Trans. On Antennas and Propagation*, vol. 46, No. 10, Oct. 1998, pp. 1506–1518.

Matricciani, E., "Prediction of fade durations due to rain in satellite communication systems," *Radio Science*, vol. 32, No. 3, May–Jun. 1997, pp. 935–941.

McQueen, J.G., "The Monitoring of High–Speed Waveforms," *Electronic Engineering*, Oct. 1952, pp. 436–441.

Merkelo, J. and Hall, R.D., "Broad–Band Thin–Film Signal Sampler," *IEEE Journal of Solid–State Circuits*, vol. SC–7, No. 1, Feb. 1972, pp. 50–54.

Merlo, U. et al., "Amplitude Scintillation Cycles in a Sirio Satellite–Earth Link," *Electronics Letters*, vol. 21, No. 23, Nov. 7, 1985, pp. 1094–1096.

Morris, D., "Radio–holographic reflector measurement of the 30–m millimeter radio telescope at 22 Ghz with a cosmic signal source," *Astronomy and Astrophysics*, vol. 203, No. 2, Sep. (II) 1988, pp. 399–406.

Moulsley, T.J. et al., "The efficient acquisition and processing of propagation statistics," *Journal of the Institution of Electronic and Radio Engineers*, vol. 55, No. 3, Mar. 1985, pp. 97–103.

Ndzi, D. et al., "Wide–Band Statistical Characterization of an Over–the–Sea Experimental Transhorizon Link," *IEE Colloquium on Radio Communications at Microwave and Millimetre Wave Frequencies*, Dec. 16, 1996, pp. 1/1–1/6.

Ndzi, D. et al., "Wideband Statistics of Signal Levels and Doppler Spread on an Over–The–Sea Transhorizon Link," *IEE Colloquium on Propagation Characteristics and Related System Techniques for Beyond Line–of–Sight Radio*, Nov. 24, 1997, pp. 9/1–9/6.

"New zero IF chipset from Philips," *Electronic Engineering*, Sep. 1995, p. 10.

Ohara, H. et al., "First monolithic PCM filter cuts costs of telecomm systems," *Electronic Design*, vol. 27, No. 8, Apr. 12, 1979, (6 pages).

Oppenheim, A.V. et al., *Signals and Systems*, Prentice–Hall, 1983, pp. 527–531 and 561–562.

Ortgies, G., "Experimental Parameters Affecting Amplitude Scintillation Measurements on Satellite Links," *Electronics Letters*, vol. 21, No. 17, Aug. 15, 1985, pp. 771–772.

Pärssinen et al., "A 2–GHz Subharmonic Sampler for Signal Downconversion," *IEEE Trans. on Microwave Theory and Techniques*, vol. 45, No. 12, Dec. 1997, (7 pages).

Peeters, G. et al., "Evaluation of Statistical Models for Clear–Air Scintillation Prediction Using Olympus Satellite Measurements," *International Journal if Satellite Communications*, vol. 15, No. 2, Mar.–Apr. 1997, pp. 73–88.

Perrey, A.G. and Schoenwetter, H.K., NBS Technical Note 1121: A Schottky Diode Bridge Sampling Gate, May 1980, pp. 1–14.

Poulton, K. et al., "A 1–Ghz 6–bit ADC System," *IEEE Journal of Solid–State Circuits*, vol. SC–22, No. 6, Dec. 1987, pp. 962–969.

Press Release, "Parkervision, Inc. Announces Fiscal 1993 Results," 2 Pages, Apr. 6, 1994.

Press Release, "Parkervision, Inc. Announces the Appointment of Michael Baker to the New Position of National Sales Manager," 1 Page, Apr. 7, 1994.

Press Release, "Parkervision's Cameraman Well–Received by Distance Learning Market," 2 Pages, Apr. 8, 1994.

Press Release, "Parkervision, Inc. Announces First Quarter Financial Results," 2 Pages, Apr. 26, 1994.

Press Release, "Parkervision, Inc. Announces The Retirement of William H. Fletcher, Chief Financial Officer," 1 Page, May 11, 1994.

Press Release, "Parkervision, Inc. Announces New Cameraman System II™ At Infocomm Trade Show," 3 Pages, Jun. 9, 1994.

Press Release, "Parkervision, Inc. Announces Appointments to its National Sales Force," 2 Pages, Jun. 17, 1994.

Press Release, "Parkervision, Inc. Announces Second Quarter and Six Months Financial Results," 3 Pages, Aug. 9, 1994.

Press Release, "Parkervision, Inc. Announces Third Quarter and Nine Months Financial Results," 3 Pages, Oct. 28, 1994.

Press Release, "Parkervision, Inc. Announces First Significant Dealer Sale of Its Cameraman® System II," 2 Pages, Nov. 7, 1994.

Press Release, "Parkervision, Inc. Announces Fourth Quarter and Year End Results," 2 Pages, Mar. 1, 1995.

Press Release, "Parkervision, Inc. Announces Joint Product Developments With VTEL," 2 Pages, Mar. 21, 1995.

Press Release, "Parkervision, Inc. Announces First Quarter Financial Results," 3 Pages, Apr. 28, 1995.

Press Release, "Parkervision Wins Top 100 Product Districts' Choice Award," 1 Page, Jun. 29, 1995.

Press Release, "Parkervision National Sales Manager Next President of USDLA," 1 Page, Jul. 6, 1995.

Press Release, "Parkervision Granted New Patent," 1 Page, Jul. 21, 1995.

Press Release, "Parkervision, Inc. Announces Second Quarter and Six Months Financial Results," 2 Pages, Jul. 31, 1995.

Press Release, "Parkervision, Inc. Expands Its Cameraman System II Product Line," 2 Pages Sep. 22, 1995.

Press Release, "Parkervision Announces New Camera Control Technology," 2 Pages, Oct. 25, 1995.

Press Release, "Parkervision, Inc. Announces Completion of VTEL/Parkervision Joint Product Line," 2 Pages, Oct. 30, 1995.

Press Release, "Parkervision, Inc. Announces Third Quarter and Nine Months Financial Results," 2 Pages, Oct. 30, 1995.

Press Release, "Parkervision's Cameraman Personal Locator Camera System Wins Telecon XV Award," 2 Pages, Nov. 1, 1995.

Press Release, "Parkervision, Inc. Announces Purchase Commitment From VTEL Corporation," 1 Page, Feb. 26, 1996.

Press Release, "ParkerVision, Inc. Announces Fourth Quarter and Year End Results," 2 Pages, Feb. 27, 1996.

Press Release, "ParkerVision, Inc. Expands its Product Line," 2 Pages, Mar. 7, 1996.

Press Release, "ParkerVision Files Patents for its Research of Wireless Technology," 1 Page, Mar. 28, 1996.

Press Release, "Parkervision, Inc. Announces First Significant Sale of Its Cameraman® Three–Chip System," 2 pages, Apr. 12, 1996.

Press Release, "Parkervision, Inc. Introduces New Product Line For Studio Production Market," 2 Pages, Apr. 15, 1996.

Press Release, "Parkervision, Inc. Announces Private Placement of 800,000 Shares," 1 Page, Apr. 15, 1996.

Press Release, "Parkervision, Inc. Announces First Quarter Financial Results," 3 Pages, Apr. 30, 1996.

Press Release, "Parkervision's New Studio Product Wins Award," 2 Pages, Jun. 5, 1996.

Press Release, "Parkervision, Inc. Announces Second Quarter and Six Months Financial Results," 3 Pages, Aug. 1, 1996.

Press Release, "Parkervision, Inc. Announces Third Quarter and Nine Months Financial Results," 2 Pages, Oct. 29, 1996.

Press Release, "PictureTel and ParkerVision Sign Reseller Agreement," 2 Pages, Oct. 30, 1996.

Press Release, "CLI and ParkerVision Bring Enhanced Ease–of–Use to Videoconferencing," 2 Pages, Jan. 20, 1997.

Press Release, "Parkervision, Inc. Announces Fourth Quarter and Year End Results," 3 Pages, Feb. 27, 1997.

Press Release, "Parkervision, Inc. Announces First Quarter Financial Results," 3 Pages, Apr. 29, 1997.

Press Release, "NEC and Parkervision Make Distance Learning Closer," 2 Pages, Jun. 18, 1997.

Press Release, "Parkervision Supplies JPL with Robotic Cameras, Cameraman Shot Director for Mars Mission," 2 Pages, Jul. 8, 1997.

Press Release, "Parkervision and IBM Join Forces to Create Wireless Computer Peripherals," 2 Pages, Jul. 23, 1997.

Press Release, "ParkerVision, Inc. Announces Second Quarter and Six Months Financial Results," 3 Pages, Jul. 31, 1997.

Press Release, "Parkervision, Inc. Announces Private Placement of 990,000 Shares," 2 Pages, Sep. 8, 1997.

Press Release, "Wal–Mart Chooses Parkervision for Broadcast Production," 2 Pages, Oct. 24, 1997.

Press Release, "Parkervision, Inc. Announces Third Quarter Financial Results," 3 Pages, Oct. 30, 1997.

Press Release, "ParkerVision Announces Breakthrough in Wireless Radio Frequency Technology," 3 Pages, Dec. 10, 1997.

Press Release, "Parkervision, Inc. Announces the Appointment of Joseph F. Skovron to the Position of Vice President, Licensing—Wireless Technologies," 2 Pages, Jan. 9, 1998.

Press Release, "Parkervision Announces Existing Agreement with IBM Terminates—Company Continues with Strategic Focus Announced in December," 2 Pages, Jan. 27, 1998.

Press Release,, "Laboratory Tests Verify Parkervision Wireless Technology," 2 Pages, Mar. 3, 1998.

Press Release, "Parkervision, Inc. Announces Fourth Quarter and Year End Financial Results," 3 Pages, Mar. 5, 1998.

Press Release, "Parkervision Awarded Editors' Pick of Show for NAB 98," 2 Pages, Apr. 15, 1998.

Press Release, "Parkervision Announces First Quarter Financial Results," 3 Pages, May 4, 1998.

Press Release, "Parkervision 'DIRECT2DATA' Introduced in Response to Market Demand," 3 Pages, Jul. 9, 1998.

Press Release, "Parkervision Expands Senior Management Team," 2 Pages, Jul. 29, 1998.

Press Release, "Parkervision Announces Second Quarter and Six Months Financial Results," 4 Pages, Jul. 30, 1998.

Press Release, "Parkervision Announces Third Quarter and Nine Months Financial Results," 3 Pages, Oct. 30, 1998.

Press Release, "Questar Infocomm, Inc. Invests $5 Million in Parkervision Common Stock," 3 Pages, Dec. 2, 1998.

Press Release, "Parkervision Adds Two New Directors," 2 Pages, Mar. 5, 1999.

Press Release, "Parkervision Announces Fourth Quarter and Year End Financial Results," 3 Pages, Mar. 5, 1999.

Press Release, "Joint Marketing Agreement Offers New Automated Production Solution," 2 Pages, Apr. 13, 1999.

"Project COST 205: Scintillations in Earth–satellite links," *Alta Fequenza: Scientific Review in Electronics,* vol. LIV, No. 3, May–Jun., 1985, pp. 209–211.

Razavi, B., *BF Microelectronics,* Prentice–Hall, 1998, pp. 147–149.

Reeves, R.J.D., "The Recording and Collocation of Waveforms (Part 1)," *Electronic Engineering,* Mar. 1959, pp. 130–137.

Reeves, R.J.D., "The Recording and Collocation of Waveforms (Part 2)," *Electronic Engineering,* Apr. 1959, pp. 204–212.

Rein, H.M. and Zahn, M., "Subnanosecond–Pulse Generator with Variable Pulsewidth Using Avalanche Transistors," *Electronic Letters,* vol. 11, No. 1, Jan. 9, 1975, pp. 21–23.

Riad, S.M. and Nahman, N.S., "Modeling of the Feed–through Wideband (DC to 12.4 Ghz) Sampling–Head," *IEEE MTT–S International Microwave Symposium Digest,* Jun. 27–29, 1978, pp. 267–269.

Rizzoli, V. et al., "Computer–Aided Noise Analysis of MESFET and HEMT Mixers," *IEEE Trans. On Microwave Theory and Techniques,*vol. 37, No. 9, Sep. 1989, pp. 1401–1410.

Rowe, H.E., *Signals and Noise in Communication Systems,* D. Van Nostrand Company, Inc., Princeton, New Jersey, 1965, including, for example, Chapter V, Pulse Modulation Systems.

Rücker, F. and Dintelmann, F., "Effect of Antenna Size on OTS Signal Scintillations and Their Seasonal Dependence," *Electronics Letters,* vol. 19, No. 24, Nov. 24, 1983, pp. 1032–1034.

Russell, R. and Hoare, L., "Millimeter Wave Phase Locked Oscilllators," *Military Microwaves '78 Conference Proceedings,* Oct. 25–27, 1978, pp. 238–242.

Sabel, L.P., "A DSP Implementation of a Robust Flexible Receiver/Demultiplexer for Broadcast Data Satellite Communications," *The Institution of Engineers Australia Communications Conference,* Melbourne Oct. 16–18, 1990, pp. 218–223.

Salous, S., "IF digital generation of FMCW waveforms for wideband channel characterization," *IEE Proceedings–I,* vol. 139, No. 3, Jun. 1992, pp. 281–288.

"Sampling Loops Lock Sources to 23 Ghz," *Microwaves & RF,* Sep. 1990, p. 212.

Sasikumar, M. et al., "Active Compensation in the Switched–Capacitor Biquad," *Proceedings of the IEEE,* vol. 71, No. 8, Aug. 1983, pp. 1008–1009.

Saul, P.H., "A GaAs MESFET Sample and Hold Switch," *5th European Solid State Circuits Conference—ESSCIRC 79,* 1979, pp. 5–7.

Shen, D.H. et al., "A 900–MHZ RF Front–End with Integrated Discrete–Time Filtering," *IEEE Journal of Solid–State Circuits,* vol. 31, No. 12, Dec. 1996, pp. 1945–1954.

Shen, X.D. and Vilar, E., "Anomalous transhorizon propagation and meteorlogical processes of a multilink path," *Radio Science,* vol. 30, No. 5, Sep.–Oct. 1995, pp. 1467–1479.

Shen, X. and Tawfik, A.N., "Dynamic Behaviour of Radio Channels Due to Trans–Horizon Propagation Mechanisms," *Electronics Letters,* vol. 29, No. 17, Aug. 19, 1993, pp. 1582–1583.

Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation,* Mar. 8, 1996, pp. 4/1–4–7.

Shen, X. and Vilar, E., "Path loss statistics and mechanism of transhorizon propagation over a sea path," *Electronics Letters,* vol. 32, No. 3, Feb. 1, 1996, pp. 259–261.

Shen, D. et al., "A 900 MHZ Integrated Discrete–Time Filtering RF Front–End," *IEEE International Solid State Circuits Conference,* vol. 39, Feb. 1996, pp. 54–55 and 417.

Spillard, C. et al., "X–Band Tropospheric Transhorizon Propagation Under Differing Meteorological Conditions," *Antennas and Propagation (ICAP 89) Part 2: Propagation,* Apr. 4–7, 1989, pp. 451–455.

Stafford, K.R. et al., "A Complete Monolithic Sample/Hold Amplifier," *IEEE Journal of Solid–State Circuits,* vol. SC–9, No. 6, Dec. 1974, pp. 381–387.

Staruk, W. Jr. et al., "Pushing HF Data Rates," *Defense Electronics,* May 1985, pp. 211, 213, 215, 217, 220 &222.

Stephenson, A.G, "Digitizing multiple RF signals requires an optimum sampling rate," *Electronics,* Mar. 27, 1972, pp. 106–110.

Sugarman, R., "Sampling Oscilloscope for Statistically Varying Pulses," *The Review of Scientific Instruments,* vol. 28, No. 11, Nov. 1957, pp. 933–938.

Sylvain, M., "Experimental probing of multipath microwave channels," *Radio Science,* vol. 24, No. 2, Mar.–Apr. 1989, pp. 160–178.

Takano, T., "NOVEL GaAs Pet Phase Detector Operable To Ka Band," *IEEE MT–S Digest,* 1984, pp. 381–383.

Tan, M.A., "Biquadratic Transconductance Switched–Capacitor Filters," *IEEE Transactions on Circuits and Systems—I: Fundamental Theory and Applications,*vol. 40, No. 4, Apr. 1993, pp. 272–275.

Tanaka, K. et al., "Sample Chip Multisystem AM Stereo Decoder IC," *IEEE Trans. On Consumer Electronics,* vol. CE–32, No. 3, Aug. 1986, pp. 482–496.

Tawfik, A.N., "Amplitude, Duration and Predictability of Long Hop Trans–Horizon X–band Signals Over the Sea," *Electronics Letters,* vol. 28, No. 6, Mar. 12, 1992, pp. 571–572.

Tawfik, A.N. and Vilar, E., "Correlation of Transhorizon Signal Level Strength with Localized Surface Meteorological Parameters," *8th International Conf. On Antennas and Propagation,* Mar. 30–Apr. 2, 1993, pp. 335–339.

Tawfik, A.N. and Vilar, E., "Dynamic Structure of a Transhorizon Signal at X–band Over a Sea Path," *Antennas and Propagation (ICAP 89) Part 2: Progagation,* Apr. 4–7, 1989, pp. 446–450.

Tawfik, A.N. and Vilar, E., "Statistics of Duration and Intensity of Path Loss in a Microwave Transhorizon Sea–Path," *Electronics Letters,* vol. 26, No. 7, Mar. 29, 1990, pp. 474–476.

Tawfik, A.N. and Vilar, E., "X–Band Transhorizon Measurements of CW Transmissions Over the Sea—Part 1: Path Loss, Duration of Events, and Their Modeling," *IEEE Trans. On Antennas and Propagation,* vol. 41, No. 11, Nov. 1993, pp. 1491–1500.

Temes, G.C. and Tsividis, T., "The Special Section on Switched–Capacitor Circuits," *Proceedings of the IEEE,* vol. 71, No. 8, Aug. 1983, pp. 915–916.

Thomas, G.B., *Calculus and Analytic Geometry,* Third Edition, Addison–Wesley Publishing, 1960, pp. 119–133.

Tomassetti, Q., "An Unusual Microwave Mixer," *16th European Microwave Conference,* Sep. 8–12, 1986, pp. 754–759.

Tortoli, P. et al., "Bidirectional Doppler Signal Analysis Based on a Single RF Sampling Channel," *IEEE Trans. On Ultrasonics, Ferroelectrics, and Frequency Control,* vol. 41, No. 1, Jan. 1984, pp. 1–3.

Tsividis, Y. and Antognetti, P. (Ed.), *Design of MOS VLSI Circuits for Telecommunications,* p. 304.

Tsividis, Y., "Principles of Operation and Analysis of Switched–Capacitor Circuits," *Proceedings of the IEEE,* vol. 71, No. 8, Aug. 1983, pp. 926–940.

Tsurumi, H. and Maeda, T., "Design Study on a Direct Conversion Receiver Front–End for 280 MHZ, 900 MHZ, and 2.6 Ghz Band Radio Communication Systems," *41st IEEE Vehicular Technology Conference,* May 19–22, 1991, pp. 457–462.

Valdamanis, J.A. et al., "Picosecond and Subpicosecond Optoelectronics for Measurements of Future High Speed Electronic Devices," *IEDM Technical Digest,* Dec. 5–7, 1983, pp. 597–600.

van de Kamp, M.M.J.L., "Asymmetric signal level distribution due to tropospheric scintillation," *Electronics Letters,* vol. 34, No. 11, May 28, 1998, pp. 1145–1146.

Vasseur, H. and Vanhoenacker, D., "Characterization of trosposhperic turbulent layers from radiosonde data," *Electronics Letters,* vol. 34, No. 4, Feb. 19, 1998, pp. 318–319.

Verdone, R., "Outage Probability Analysis for Short–Range Communication Systems at 60 Ghz in ATT Urban Environments," *IEEE Trans On. Vehicular Technology,* vol. 46, No. 4, Nov. 1997, pp. 1027–1039.

Vierira–Ribeiro, S.A., *Single–IF DECT Receiver Architecture using a Quadrature Sub–Sampling Band–Pass Sigma–Delta Modulator,* Thesis for Degree of Master's of Engineering, Carleton University, Apr. 1995, pp. 1–180.

Vilar, E. et al., "A Comprehensive/Selective MM–Wave Satellite Downlink Experiment on Fade Dynamics," *10th Interntional Conf. On Antennas and Propagation,* Apr. 14–17, 1997, pp. 2.98–2.101.

Vilar, E. et al., "A System to Measure LOS Atmospheric Transmittance at 19 Ghz," *Agard Conf. Proc. No. 346: Characteristics of the Lower Atmosphere Influencing Radio Wave Propagation,* Oct. 4–7, 1983, pp. 8–1–8–16.

Vilar, E. and Smith, H., "A Theoretical and Experimental Study of Angular Scintillations in Earth Space Paths," *IEEE Trans. On Antennas and Propagation,* vol. AP–34, No. 1, Jan. 1986, pp. 2–10.

Vilar, E. et al., "A Wide Band Transhorizon Experiment at 11.6 Ghz," $8^{th}$ International Conf. On Antennas and Propagation, Mar. 30–Apr. 2, 1993, pp. 441–445.

Vilar, E. and Matthews, P.A., "Amplitude Dependence of Frequency in Oscillators," Electronics Letters, vol. 8, No. 20, Oct. 5, 1972, pp. 509–511.

Vilar, E. et al., "An experimental mm–wave receiver system for measuring phase noise due to atmospheric turbulence," Conf. Proc. $25^{th}$ European Microwave Conference, 1995, pp. 114–119.

Vilar, E. and Burgueño, A., "Analysis and Modeling of Time Intervals Between Rain Rate Exceedances in the Context of Fade Dynamics," IEEE Trans. On Communications, vol. 39, No. 9, Sep. 1991, pp. 1306–1312.

Vilar, E. et al.,"Angle of Arrival Fluctuations in High and Low Elevation Earth Space Paths," Antennas and Propagation (ICAP 85), Apr. 16–19, 1985, pp. 83–88.

Vilar, E., "Antennas and Propagation: A Telecommunications Systems Subject," Electronics Division Colloquium on Teaching Antennas and Propagation to Undergraduates, Mar. 8, 1988, (6 Pages).

Vilar, E. et al., "CERS*. Millimetre–Wave Beacon Package and Related Payload Doppler Correction Strategies," Electronics Division Colloquium on CERS—Communications Engineering Research Satellite, Apr. 19, 1984, pp. 10/1–10/10.

Vilar, E. and Moulsley, T.J., "Comment and Reply: Probability Density Function of Amplitude Scintillations," Electronics Letters, vol. 21, No. 14, Jul. 4, 1985, pp. 620–622.

Vilar, E. et al., "Comparison of Rainfall Rate Duration Distributions for ILE–IFE and Barcelona," Electronics Letters, vol. 28, No. 20, Sep. 24, 1992, pp. 1922–1924.

Vilar, E., "Depolarization and Field Transmittance in Indoor Communications," Electronic Letters, vol. 27, No. 9, Apr. 25, 1991, pp. 732–733.

Vilar, E. and Larsen, J.R., "Elevation Dependence of Amplitude Scintillations on Low Elevation Earth Space Paths," Antennas and Propagation (ICAP) Part 2: Propagation, Apr. 4–7, 1989, pp. 150–154.

Vilar, E. et al., "Experimental System and Measurements of Transhorizon Signal Levels at 11 Ghz," $18^{th}$ European Microwave Conference, Sep. 12–15, 1988, pp. 429–435.

Vilar E. and Matthews, P.A., "Importance of Amplitude Scintillations in Millimetric Radio Links," Conf. Proc. $4^{th}$ European Microwave Conference, Sep. 10–13, 1974, pp. 202–206.

Vilar, E. and Haddon, J., "Measurement and Modeling of Scintillation Intensity to Estimate Turbulence Parameters in an Earth–Space Path" IEEE Trans. On Antennas and Propagation, vol. AP–32, No. 4, Apr. 1984, pp. 340–346.

Vilar, E. and Matthews, P.A., "Measurement of Phase Fluctuations on Millimetric Radiowave Propagation," Electronics Letters, vol. 7, No. 18, Sep. 9, 1971, pp. 566–568.

Vilar, E. and Wan, K.W., "Narrow and Wide Band Estimates of Field Strength for Indoor Communications in the Millimetre Band," Electronics Division Colloquium on Radiocommunications in the Range 30–60 Ghz, Jan. 17, 1991, pp. 5/1–5/8.

Vilar, E. and Faulkner, N.D., "Phase Noise and Frequency Stability Measurements. Numerical Techniques and Limitations," Electronics Division Colloquium on Low Noise Oscillators and Synthesizer, Jan. 23, 1986, (5 Pages).

Vilar, E. and Senin, S., "Propagation phase noise indentified using 40 Ghz satellite downlink," Electronics Letters, vol. 33, No. 22, Oct. 23, 1997, pp. 1901–1902.

Vilar, E. et al., "Scattering and Extinction: Dependence Upon Raindrop Size Distribution in Temperate (Barcelona) and Tropical (Belem) Regions," $10^{th}$ International Conf. On Antennas and Propagation, Apr. 14–17, 1997, pp. 2.230–2.233.

Vilar, E. and Haddon, J., "Scintillation Modeling and Measurement—A Tool for Remote–Sensing Slant Paths," Agard Conf. Proc. No. 332: Propagation Aspects of Frequency Sharing, Interference And System Diversity, Oct. 18–22, 1982, pp. 27–1–27–13.

Vilar, E., "Some Limitations on Digital Transmission Through Turbulent Atmosphere," Int'l Conf. On Satellite Communication Systems Technology, Apr. 7–10, 1975, pp. 169–187.

Vilar, E. and Matthews, P.A., "Summary of Scintillation Observations in a 36 Ghz Link Across London," Int'l. Conf. On Antennas and Propagation Part 2: Propagation, Nov. 28–30, 1978, pp. 36–40.

Vilar, E. et al.,"Wideband Characterization of Scattering Channels," $10^{th}$ International Conf. On Antennas and Propagation, Apr. 14–17, 1997, pp. 2.353–2.358.

Vollmer, A., "Complete GPS Receiver Fits on Two Chips," Electronic Design, Jul. 6, 1998, pp. 50, 52, 54, 56.

Voltage and Time Resolution in Digitization Oscilloscopes: Application Note 348, Hewlett Packard, Nov. 1986, pp. 1–11.

Wan, K.W. et al., "A Novel Approach to the Simultaneous Measurement of Phase and Amplitude Noises in Oscillator," $19^{th}$ European Microwave Conference Proceedings, Sep. 4–7, 1989, pp. 809–813.

Wan, K.W. et al., "Extended Variances and Autoregressive/Moving Average Algorithm for the Measurement and Synthesis of Oscillator Phase Noise," Proc. Of the $43^{rd}$ Annual Symposium on Frequency Control, 1989, pp. 331–335.

Wan, K.W. et al., "Wideband Transhorizon Channel Sounder at 11 Ghz," Electronics Division Colloquium on High Bit Rate UHF/SHF Channel Sounders—Technology and Measurement, Dec. 3, 1993, pp. 3/1–3/5.

Wang, H., "A 1–V Multigigahertz RF Mixer Core in 0.5–$\mu$m CMOS," IEEE 1998, 3 pages.

Watson, A.W.D. et al., "Digital Conversion and Signal Processing for High Performance Communications Receivers," pp. 367–373.

Weast, R.C. et al. (Ed.), Handbook of Mathematical Tables, Second Edition, The Chemical Rubber Co., 1964, pp. 480–485.

Wiley, R.G., "Approximate FM Demodulation Using Zero Crossings," IEEE Trans. On Communications, vol. COM–29, No. 7, Jul. 1981, pp. 1061–1065.

Worthman, W., "Convergence . . . Again," RF Design, Mar. 1999, p. 102.

Young, I.A. and Hodges, D.A., "MOS Switched–Capacitor Analog Sampled–Data Direct–Form Recursive Filters," IEEE Journal of Solid–State Circuits, vol. SC–14, No. 6, Dec. 1979, pp. 1020–1033.

Razavi, B., "A 900–MHz/1.8–Ghz CMOS Transmitter for Dual–Band Applications," Symposium on VLSI Circuits Digest of Technical Papers, IEEE, pp. 128–131 (1998).

Ritter, G.M., "SDA, A New Solution for Transceivers," $16^{th}$ European Microwave Conference, Microwave Exhibitions and Publishers, pp. 729–733 (Sep. 8, 1986).

DIALOG File 351 (Derwent WPI) English Language Patent Abstract for FR 2 669 787, 1 page (May 29, 1992—Date of publication of application).

Akos, D.M. et al., "Direct Bandpass Sampling of Multiple Distinct RF Signals," *IEEE Transactions on Communications,* IEEE, vol. 47, No. 7, pp. 983–988 (Jul. 1999).

Patel, M. et al., "Bandpass Sampling for Software Radio Receivers, and the Effect of Oversampling on Aperture Jitter," *VTC 2002,* IEEE, pp. 1901–1905 (2002).

English–language Abstract of Japanese Patent Publication No. 61–030821, 1 Page (Feb. 13, 1986—Date of publication of application).

English–language Abstract of Japanese Patent Publication No. 05–327356, 1 Page (Dec. 10, 1993)—Date of publication of application).

English–language Abstract of Japanese Patent Publication No. 60–130203, from http://www1.ipdl.jpo.go.jp, 1 Page (Jul. 11, 1985—Date of publication of application).

Fest, Jean–Pierre, "Le Convertisseur A/N Revolutionne Le Recepteur Radio," *Electronique,* JML (Publisher), No. 54, pp. 40–42 (Dec. 1995).

Translation of DE Patent No. 35 41 031 A1, 22 pages.

Translation of EP Patent No. 0 732 803 A1, 9 pages.

Fest, Jean–Pierre, "The A/D Converter Revolutionizes the Radio Receiver," *Electronique,* JMJ (Publisher), No. 54, 3 pages (Dec. 1995). (Translation of Doc. AQ50).

Translation of German Patent No. DE 197 35 798 C1, 8 pages.

Miki, S. and Nagahama, R., *Modulation System II,* Common Edition 7, Kyoritsu Publishing Co., Ltd., pp. 146–154 (Apr. 30, 1956).

Miki, S. and Nagahama, R., *Modulation System II,* Common Edition 7, Kyoritsu Publishing Co., Ltd., pp. 146–149 (Apr. 30, 1956). (Partial Translation of Doc. AQ51).

Rabiner, L.R. and Gold, B., *Theory And Application Of Digital Signal Processing,* Prentice–Hall, Inc. pp. xiii–xii and 40–46 (1975).

English–language Abstract of Japanese Patent Publication No. 08–032556, from http://www1.ipdl.jpo.go.jp, 2 Pages (Feb. 2, 1996—Date of publication of application).

English–language Abstract of Japanese Patent Publication No. 08–139524, from http://www1.ipdl.jpo.go.jp, 2 Pages (May 31, 1996—Date of publication of application).

English–language Abstract of Japanese Patent Publication No. 59–144249, from http://www1.ipdl.jpo.go.jp, 2 Pages (Aug. 18, 1984—Date of publication of application).

English–language Abstract of Japanese Patent Publication No. 63–054002, from http://www1.ipdl.jpo.go.jp, 2 Pages (Mar. 8, 1988—Date of publication of application).

English–language Abstract of Japanese Patent Publication No. 06–237276, from http://www1.ipdl.jpo.go.jp, 2 Pages (Aug. 23, 1994—Date of publication of application).

English–language Abstract of Japanese Patent Publication No. 08–023359, from http://www1.ipdl.jpo.go.jp, 2 Pages (Jan. 23, 1996—Date of publication of application).

Translation of Japanese Patent Publication No. 47–2314, 7 pages.

Partial Translation of Japanese Patent Publication No. 58–7903, 3 pages.

English–language Abstract of Japanese Patent Publication No. 58–133004, from http://www1.ipdl.jpo.go.jp, 2 Pages (Aug. 8, 1993—Date of publication of application).

English–language Abstract of Japanese Patent Publication No. 60–058705, from http://www1.ipdl.jpo.go.jp, 2 Pages (Apr. 4, 1985—Date of publication of application).

English–language Abstract of Japanese Patent Publication No. 04–123614, from http://www1.ipdl.jpo.go.jp, 2 Pages (Apr. 23, 1992–Date of publication of application).

English–language Abstract of Japanese Patent Publication No. 04–127601, from http://www1.ipdl.jpo.go.jp, 2 Pages (Apr. 28, 1992—Date of publication of application).

English–language Abstract of Japanese Patent Publication No. 05–175730, from http://www1.ipdl.jpo.go.jp, 2 Pages (Jul. 13, 1993—Date of publication of application).

English–language Abstract of Japanese Patent Publication No. 05–175734, from http://www1.ipdl.jpo.go.jp, 2 Pages (Jul. 13, 1993—Date of publication of application).

English–language Abstract of Japanese Patent Publication No. 07–154344, from http://www1.ipdl.jpo.go.jp, 2 Pages (Jun. 16, 1995—Date of publication of application).

English–language Abstract of Japanese Patent Publication No. 07–307620, from http://www1.ipdl.jpo.go.jp, 2 Pages (Nov. 21, 1995—Date of publication of application).

Oppenheim, A.V. and Schafer, R.W., *Digital Signal Processing,* Prentice–Hall, pp. vii–x, 6–35, 45–78, 87–121 and 136–165 (1975).

English–language Abstract of Japanese Patent Publication No. 55–066057, from http://www1.ipdl.jpo.go.jp, 1 Page (May 19, 1980—Date of publication of application).

English–language Abstract of Japanese Patent Publication No. 63–065587, from http://www1.ipdl.jpo.go.jp, 1 Page (Mar. 24, 1988—Date of publication of application).

English–language Abstract of Japanese Patent Publication No. 63–153691, from http://www1.ipdl.jpo.go.jp, 1 Page (Jun. 27, 1988—Date of publication of application).

Translation of Specification and Claims of FR Patent No. 2245130, 3 pages.

Fest, Jean–Pierre, "Le Convertisseur A/N Revolutionne Le Recepteur Radio," *Electronique,* JMJ (Publisher), No. 54, pp. 40–42 (Dec. 1995).

Translation of DE Patent No. 35 41 031 A1, 22 pages.

Translation of EP Patent No. 0 732 803 A1, 9 pages.

Fest, Jean–Pierre, "The A/D Converter Revolutionizes the Radio Receiver," *Electronique,* JMJ (Publisher), No. 54, 3 pages (Dec. 1995). (Translation of Doc. AQ50).

Translation of German Patent No. DE 197 35 798 C1, 8 pages.

Dines, J.A.B., "Smart Pixel Optoelectronic Receiver Based on Charge Sensitive Amplifier Design," *IEEE Journal of Selected Topics in Quantum Electronics,* IEEE, vol. 2, No. 1, pp. 117–120 (Apr. 1996).

Simoni, A. et al., "A Digital Camera for Machine Vision," *20th International Conference on Industrial Electronics, Control and Instrumentation,* IEEE, pp. 879–883 (Sep. 1994).

Stewart, R. W. and Pfann, E., "Oversampling and sigma–delta strategies for data conversion," *Electronics & Communication Engineering Journal,* IEEE, pp. 37–47 (Feb. 1998).

\* cited by examiner

FSK

FSK

FSK

PSK

PSK

PSK

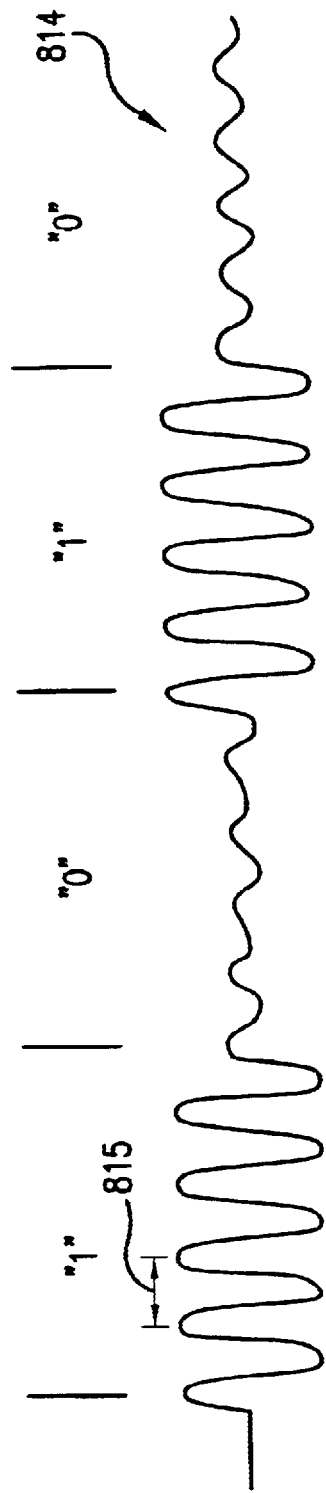
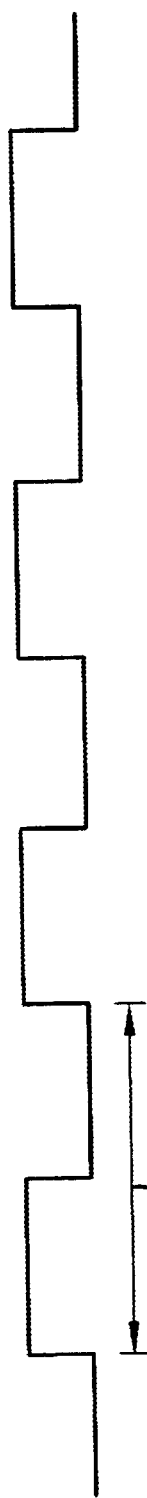
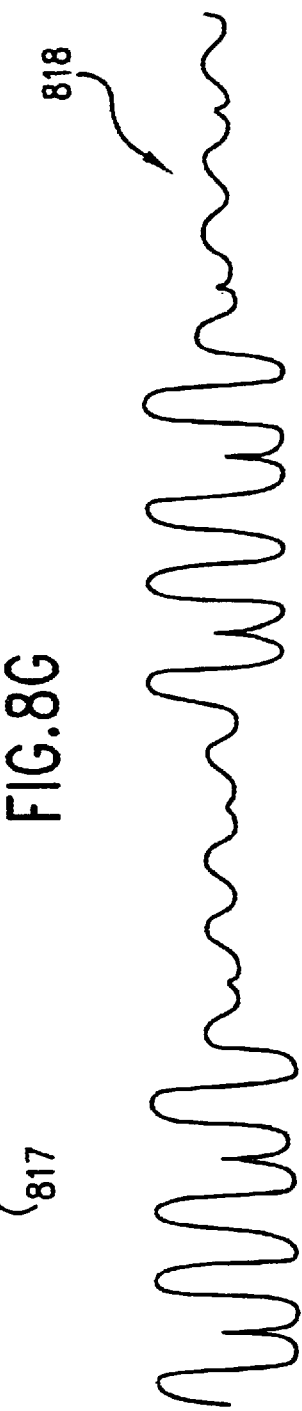
FIG. 8F
FIG. 8G
FIG. 8H

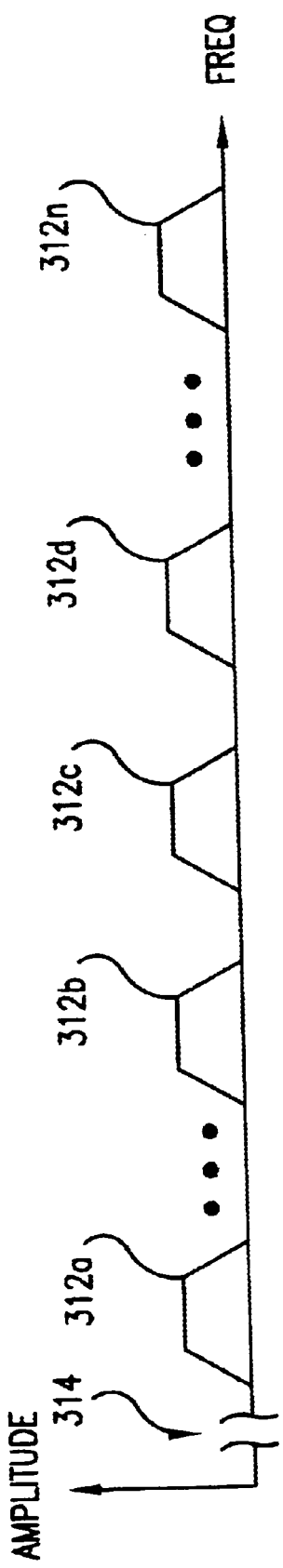
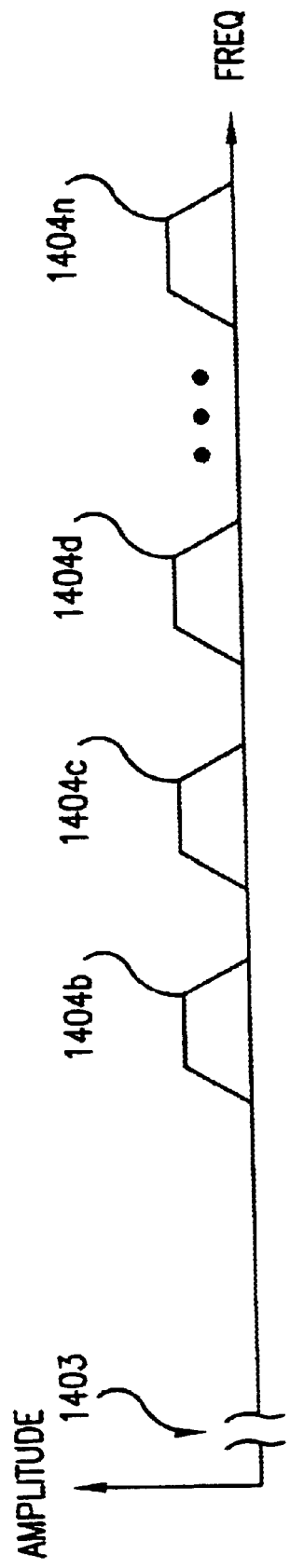

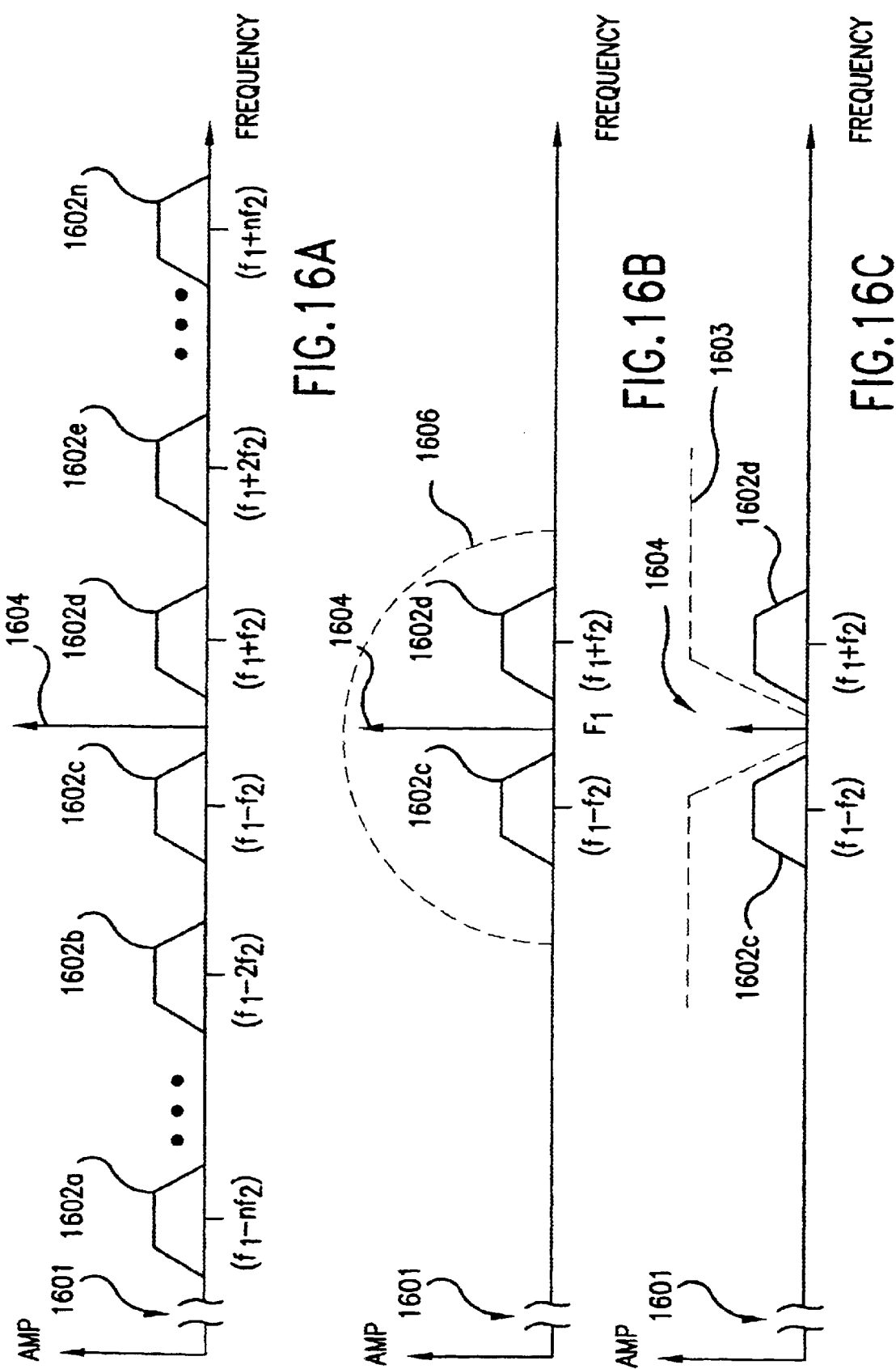

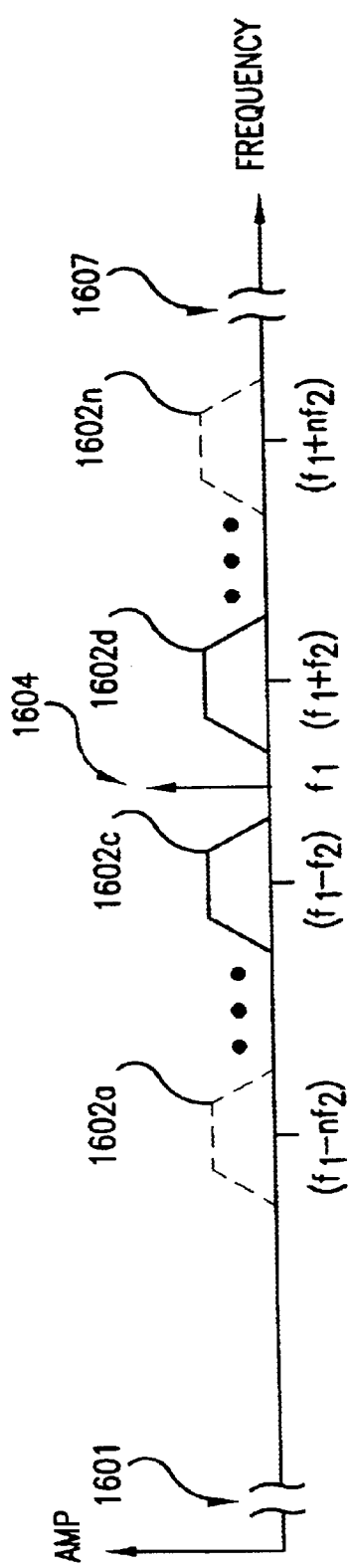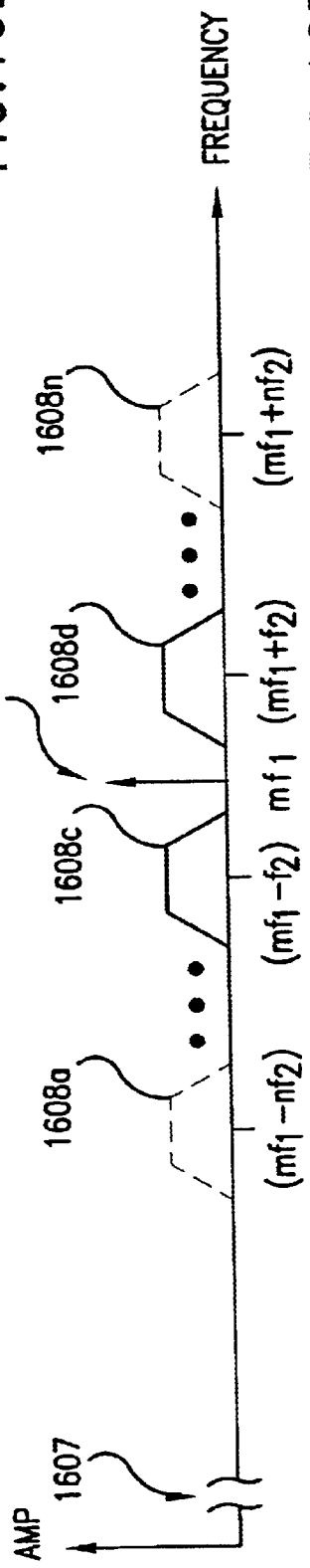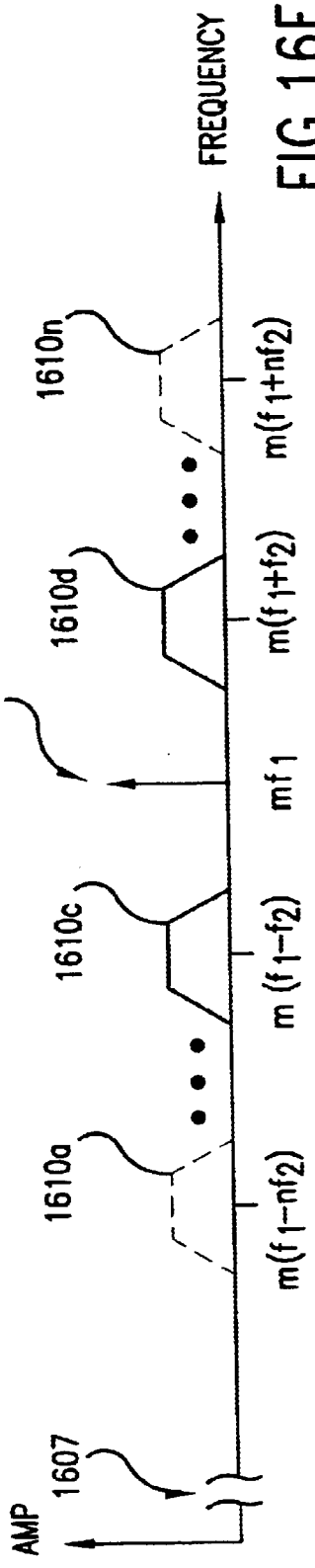

INFORMATION SIGNAL 1648

OSCILLATING SIGNAL 1650

FREQUENCY MODULATED INPUT SIGNAL 1652

SEE FIG.16N

HARMONICALLY RICH SIGNAL (SHOWN AS SQUARE WAVE) 1654

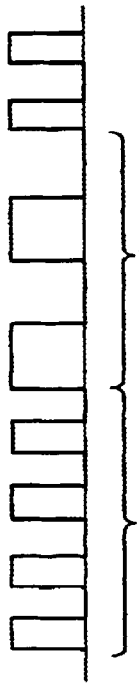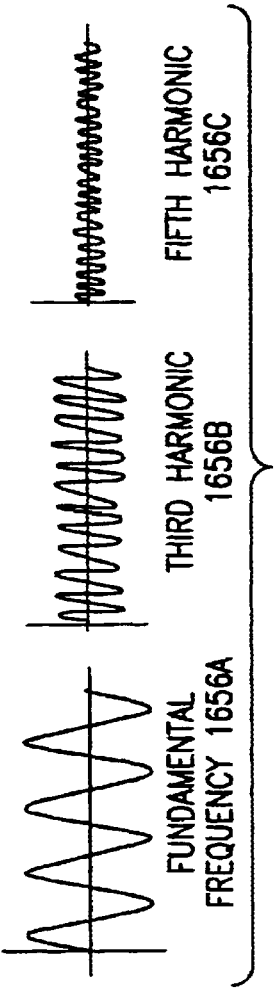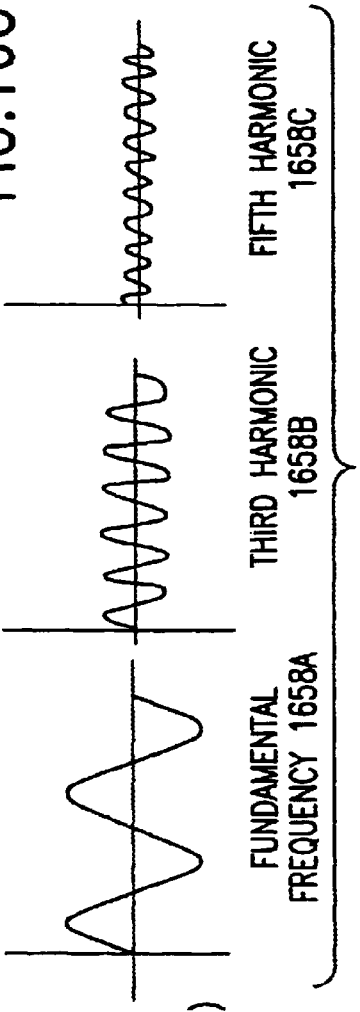

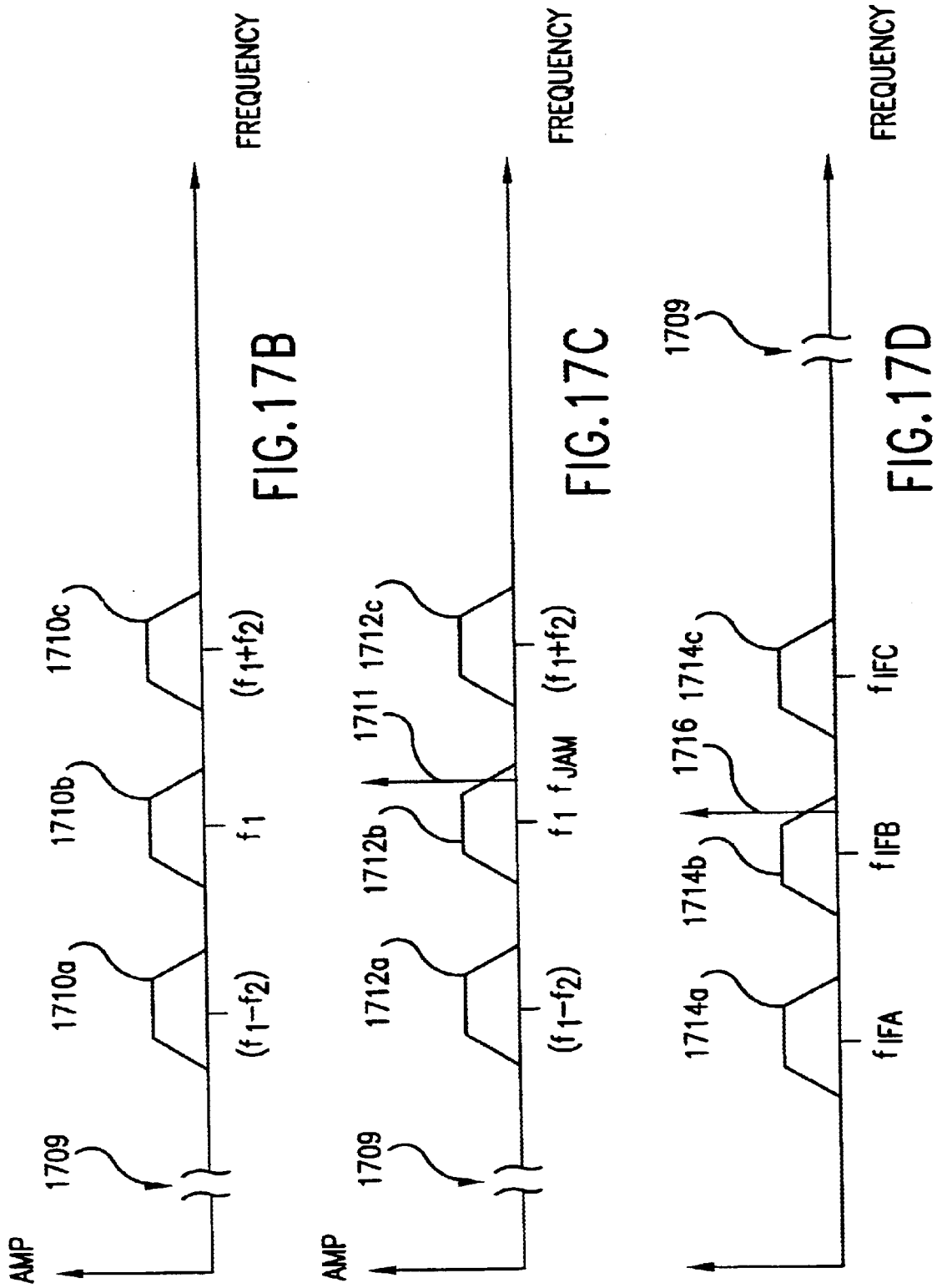

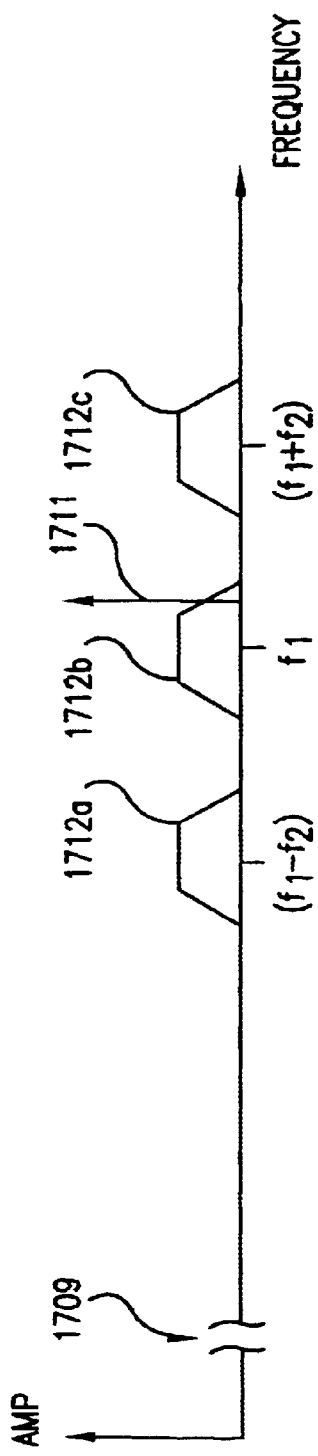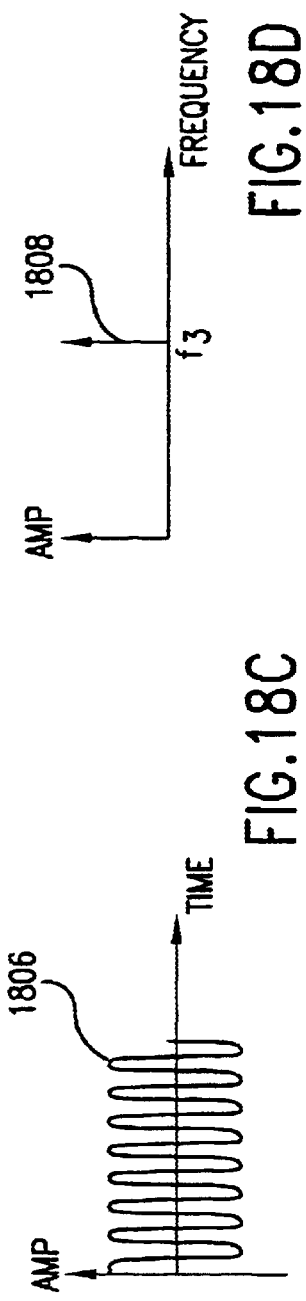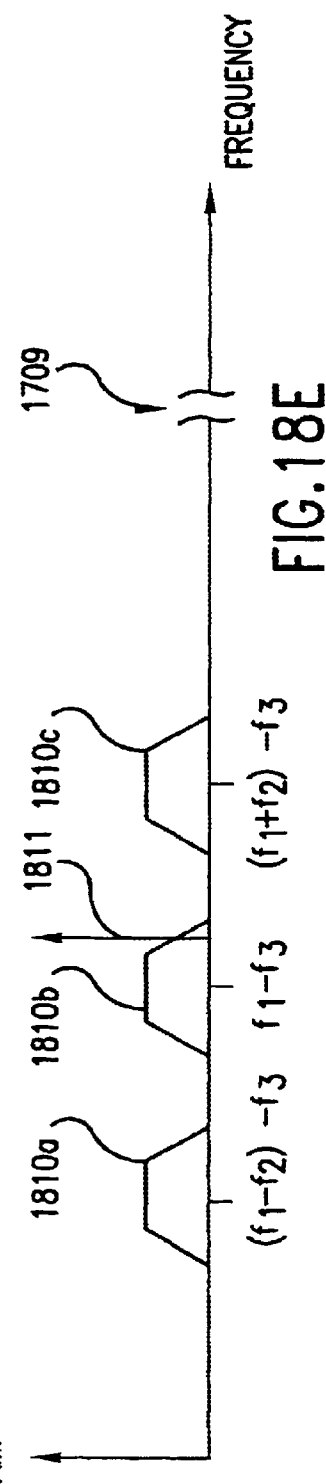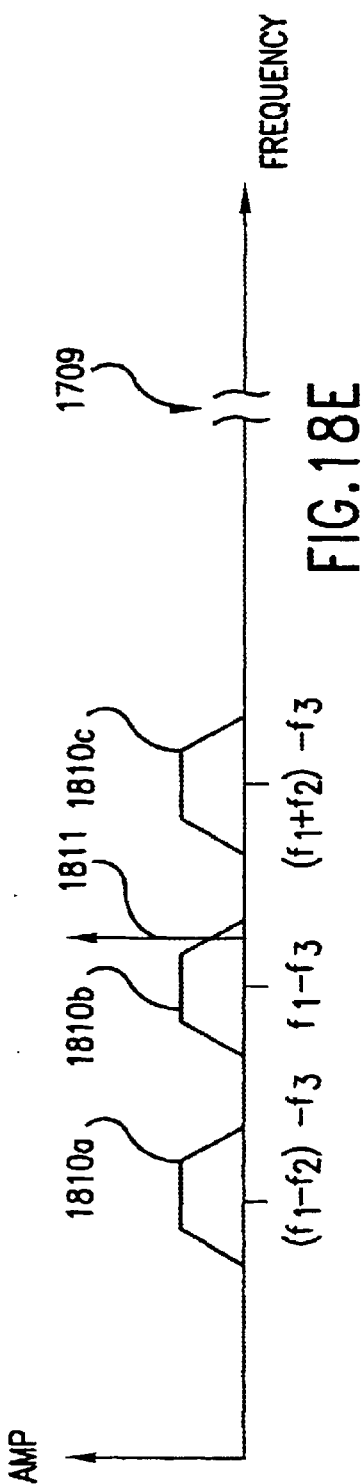
FIG.18B
FIG.18C
FIG.18D
FIG.18E

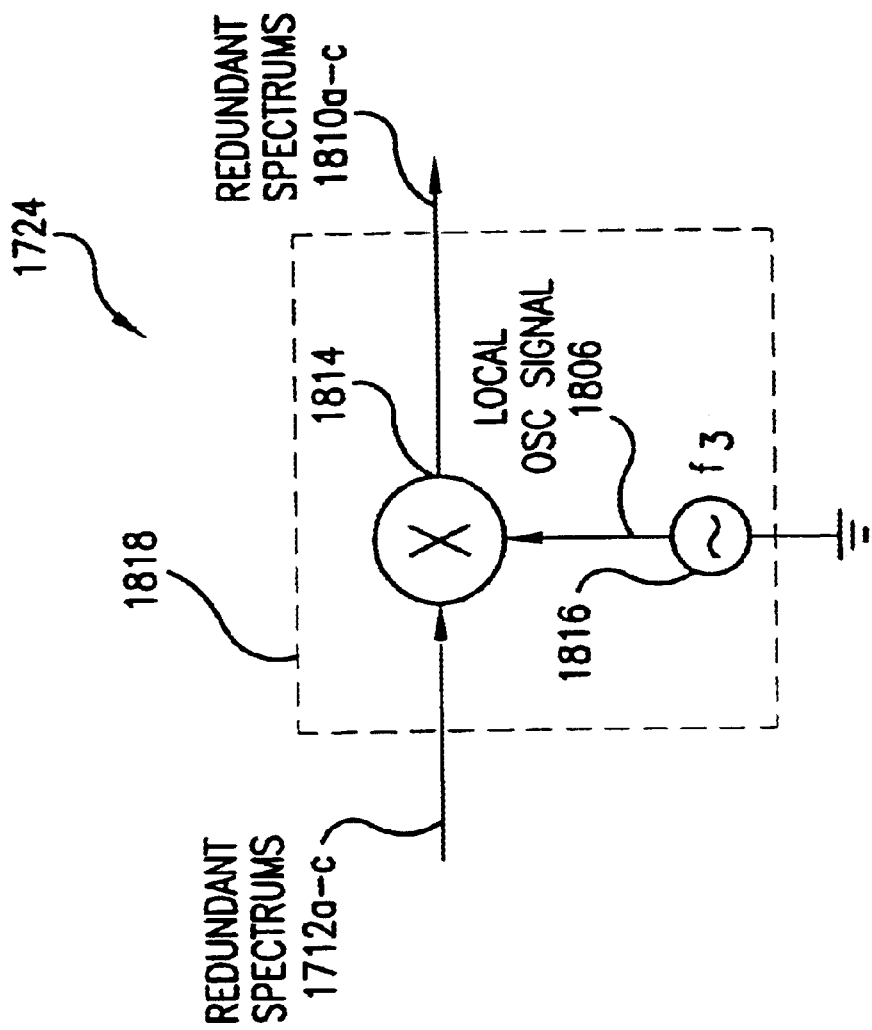

| TIME / NODE | t−1 (RISING EDGE OF φ₁) | t−1 (RISING EDGE OF φ₂) | t (RISING EDGE OF φ₁) | t (RISING EDGE OF φ₂) | t+1 (RISING EDGE OF φ₁) |
|---|---|---|---|---|---|
| 2602 | $VI_{t-1}$  2504 | $VI_{t-1}$  2508 | $VI_t$  2516 | $VI_t$  2526 | $VI_{t+1}$  2538 |
| 2604 | — | $VI_{t-1}$  2510 | $VI_{t-1}$  2518 | $VI_t$  2528 | $VI_t$  2540 |
| 2606 | $VO_{t-1}$  2506 | $VO_{t-1}$  2512 | $VO_t$  2520 | $VO_t$  2530 | $VO_{t+1}$  2542 |
| 2608 | — | $VO_{t-1}$  2514 | $VO_{t-1}$  2522 | $VO_t$  2532 | $VO_t$  2544 |
| 2610 | — | 2507 | $VO_{t-1}$  2524 | $VO_{t-1}$  2534 | $VO_t$  2546 |
| 2612 | — | — | — | $VO_{t-1}$  2536 | $VO_{t-1}$  2548 |
| 2618 | — | — | — | — | $VI_t -$ $0.1*VO_t -$ $0.8*VO_{t-1}$  2550 |

METHOD AND SYSTEM FOR ENSURING RECEPTION OF A COMMUNICATIONS SIGNAL

CROSS-REFERENCE TO OTHER APPLICATIONS

The following applications of common assignee are related to the present application, have the same filing date as the present application, and are herein incorporated by reference in their entireties:

"Method and System for Down-Converting Electromagnetic Signals," Ser. No. filed Oct. 21, 1998, now U.S. Pat. No. 6,061,551, issued May 9, 2000;

"Method and System for Frequency Up-Conversion," Ser. No. 09/176,154 filed Oct. 21, 1998;

"Integrated Frequency Translation and Selectivity," Ser. No. 09/175,966 filed Oct. 21, 1998, now U.S. Pat. No. 6,049,706, issued Apr. 11, 2000; and "Universal Frequency Translation, and Applications of Same," Ser. No. 09/176,027 filed Oct. 21, 1998, now Abandoned;

BACKGROUND OF THE INVENTION

I. Field of the Invention

This is a continuation of pending application Ser. No. 09/176,415, filed Oct. 21, 1999

The present invention relates generally to electromagnetic communications, and more particularly, to a method and system for ensuring reception of a communications signal.

II. Description of the Related Art

Communication links utilize electromagnetic signals (EM), in the form of electromagnetic waves, to carry analog or digital electronic information from a first location to a second location. In doing so, a baseband signal, containing the information to be transmitted, is impressed on an oscillating signal to produce a modulated signal at the first location. The modulated signal is sent over the communications link to the second location. At the second location, the modulated signal is typically down-converted to a lower frequency, where the baseband signal can be recovered.

All EM signals can be sufficiently described in both the time domain and the frequency domain. FIG. 1A depicts a baseband signal 102 in the time domain that starts at time to and ends at a time $t_1$. The baseband signal 102 can represent any number of real world occurrences. For example, baseband signal 102 could be the voltage output of a microphone for a given acoustical input. FIG. 1B illustrates spectrum 104, which is the frequency domain representation of baseband signal 102. Spectrum 104 depicts the relative amplitude of the sinusoidal components that when summed together with the correct relative phase will construct baseband signal 102 in the time domain. In other words, the spectrum 104 represents the relative amplitude and phase of the sine waves that constitute baseband signal 102 in the time domain.

Theoretically, a time-limited baseband signal (like baseband signal 102) has an infinite number of sinusoidal frequency components. That is, the "tail" of spectrum 104 will continue to infinity. However, the amplitude of the sinusoidal components in spectrum 104 decrease with increasing frequency. At some point, the higher frequency components can be ignored and filtered out. The highest frequency remaining defines the "frequency bandwidth" (B) of the spectrum 104. For example, if spectrum 104 corresponded to a human voice signal, the bandwidth (B) would be approximately 3.5 KHz. In other words, those sine waves beyond 3.5 KHz can be filtered out without noticeably affecting the quality of the reconstructed voice signal.

The signal with the simplest frequency domain representation is that of a single sine wave (or tone) at a given frequency $f_0$. Sine wave 106 having a frequency $f_0$, and its spectrum 108 are shown in FIGS. 1C, and 1D, respectively. Sinusoidal signals are one type of periodic signals (or repeating signals) that may also be referred to as "oscillating signals".

Amplitude modulation, a common modulation scheme, will be explored below to illustrate the effects of modulation. FIGS. 1E and 1F illustrate modulated (mod) signal 110 and its corresponding modulated spectrum 112. Modulated signal 110 is the result of amplitude modulating sine wave 106 with baseband signal 102. In the time domain, the amplitude of modulated signal 110 tracks the amplitude of the baseband signal 102, but maintains the frequency of sine wave 106. As such, sine wave 106 is often called the "carrier signal" for baseband signal 102, and its frequency is often called the "carrier frequency." In this application, information signals that are used to modulate a carrier signal may be referred to as "modulating baseband signals".

In the frequency domain, amplitude modulation causes spectrum 104 to be "up-converted" from "baseband" to the carrier frequency $f_0$, and mirror imaged about the carrier frequency $f_0$, resulting in modulated spectrum 112 (FIG. 1F). An effect of the mirror image is that it doubles the bandwidth of modulated spectrum 112 to 2B, when compared to that of modulated spectrum 104.

Modulated spectrum 112 (in FIG. 1F) is depicted as having substantially the same shape as that of modulated spectrum 104 (when the mirror image is considered). This is the case in this example for AM modulation, but in other specific types of modulations this may or may not be so as is known by those skilled in the art(s).

Modulated spectrum 112 is the frequency domain representation of what is sent over a wireless communications link during transmission from a first location to a second location when AM modulation is used. At the second location, the modulated spectrum 112 is down-converted back to "baseband" where the baseband signal 102 is reconstructed from the baseband spectrum 104. But in order to do so, the modulated spectrum 112 must arrive at the second location substantially unchanged.

During transmission over the wireless link, modulated spectrum 112 is susceptible to interference. This can occur because the receiver at the second location must be designed to accept and process signals in the range of ($f_0$–B) to ($f_0$+B). The receiver antenna accepts all signals within the stated frequency band regardless of their origin. As seen in FIG. 1G, if a second transmitter is transmitting a jamming signal 114 within the band of ($f_0$–B) to ($f_0$+B), the receiver will process the jamming signal 114 along with the intended modulated spectrum 112. (In this application a jamming signal is any unwanted signal regardless of origin that coexists in a band occupied by an intended modulated spectrum. The jamming signal need not be intended to jam.) If the power of jamming signal 114 is sufficiently large, then modulated spectrum 112 will be corrupted during receiver processing, and the intended information signal 102 will not be properly recovered.

Jamming margin defines the susceptibility that a modulated spectrum has to a jamming signal. Jamming margin is a measurement of the maximum jamming signal amplitude that a receiver can tolerate and still be able to reconstruct the intended baseband signal. For example, if a receiver can recover info signal 102 from spectrum 112 with a maximum jamming signal 114 that is 10 dB below the modulated spectrum 112, then the jamming margin is said to be −10 dBc (or dB from the carrier).

Jamming margin is heavily dependent on the type of modulation used. For example, amplitude modulation can have a typical jamming margin of approximately −6 dBc. Frequency modulation (FM) can have a jamming margin of approximately −3 dBc, and thus more resistant to jamming signals than AM because more powerful jamming signals can be tolerated.

The Federal Communications Commission (FCC) has set aside the band from 902 MHZ to 928 MHZ as an open frequency band for consumer products. This allows anyone to transmit signals within the 902–928 MHZ band for consumer applications without obtaining an operating licence, as long as the transmitted signal power is below a specified limit. Exemplary consumer applications would be wireless computer devices, cordless telephones, RF control devices (e.g. garage door openers), etc. As such, there is a potentially unlimited number of transmitters in this band that are transmitting unwanted jamming signals.

The 900–928 MHZ frequency band is only a single example of where jamming is a significant problem. Jamming problems are not limited to this band and can be a potential problem at any frequency.

What is needed is an improved method and system for ensuring the reception of a modulated signal in an environment with potentially multiple jamming signals.

What is also needed is a method and system for generating a modulated signal that is resistant to interference during transmission over a communications link.

What is further needed is a method and system for generating a modulated signal that has a higher inherent jamming margin than standard modulation schemes (e.g. AM, FM, PM, etc.), without substantially increasing system complexity and cost.

SUMMARY OF THE INVENTION

The present invention is directed to methods and systems for ensuring the reception of a communications signal, and applications thereof.

According to an embodiment, the present invention accepts a modulating baseband signal and generates a plurality of redundant spectrums, where each redundant spectrum includes the information content to represent the modulating baseband signal. In other words, each redundant spectrum includes the necessary amplitude, phase, and frequency information to reconstruct the modulating baseband signal.

In an embodiment, the redundant spectrums are generated by modulating a first oscillating signal with a modulating baseband signal, resulting in a modulated signal with an associated modulated spectrum. The modulated signal can be the result of any type of modulation including but not limited to: amplitude modulation, frequency modulation, phase modulation, or combinations thereof. The information (that represents the modulating baseband signal) in the modulated spectrum is then replicated to thereby achieve the plurality of redundant spectrums that are substantially identical in information content to the modulated spectrum. The information in the modulated spectrum can be replicated by modulating the associated modulated signal with a second oscillating signal. In one embodiment, the modulated signal is phase modulated with the second oscillating signal, where the phase of the modulated signal is shifted as a function of the second oscillating signal. In an alternate embodiment, the modulated signal is frequency modulated with the second oscillating signal, where the frequency of the modulated signal is shifted as a function of the second oscillating signal.

In an alternate embodiment, the redundant spectrums are generated by modulating a first oscillating signal with a modulated signal. The modulated signal is generated by modulating a second oscillating signal with the modulating baseband signal. As above, the modulated signal can be the result of any type of modulation including but not limited to: amplitude modulation, frequency modulation, phase modulation, or combinations thereof. In one embodiment, the first oscillating signal is phase modulated with the modulated signal, where the phase of the first oscillating signal is varied as a function of the modulated signal. In an alternate embodiment, the first oscillating signal is frequency modulated with the modulated signal, where the frequency of the first oscillating signal is varied as function of the modulated signal.

In one embodiment, the redundant spectrums are processed before being transmitted over a communications link. The spectrum processing can include selecting a subset of the redundant spectrums in order to reduce the bandwidth occupied by the redundant spectrums. The spectrum processing can also include attenuating any unmodulated tone associated with the redundant spectrums that is not desired to be transmitted. Finally, spectrum processing can include frequency upconversion and amplification, prior to transmission over the communications medium.

It is expected but not required that the redundant spectrums will be generated at a first location and transmitted to a second location over a communications medium. At the second location, a demodulated baseband signal is recovered from the received redundant spectrums. The recovery of a substantially error-free demodulated baseband signal includes translating the received redundant spectrums to a lower frequency, isolating the redundant spectrums into separate channels, and extracting the substantially error-free demodulated baseband signal from the isolated redundant spectrums. In one embodiment, extracting the error-free demodulated baseband signal includes demodulating each of the isolated redundant spectrums, analyzing each of the demodulated baseband signals for errors, and selecting a demodulated baseband signal that is substantially error-free. An error-free demodulated baseband signal is one that is substantially similar to the modulating baseband signal used to generated the redundant spectrums at the first location. Detecting errors in the demodulated baseband signals can be done in a number of ways including using cyclic redundancy check (CRC), parity check, check sum, or any other error detection scheme.

An advantage of transmitting a plurality of redundant spectrums over a communications medium is that the intended demodulated baseband signal can be recovered even if one or more of the redundant spectrums are corrupted during transmission. The intended demodulated baseband signal can be recovered because each redundant spectrum contains the necessary amplitude, phase, and frequency information to reconstruct the modulating baseband signal.

Furthermore, the bandwidth occupied by the redundant spectrums can be controlled by selecting a subset of redundant spectrums for transmission. Also, the frequency spacing between the redundant spectrums can be controlled by adjusting the frequency of the second oscillating signal. Therefore, the bandwidth occupied by the redundant spectrum is tunable, and easily customized by a communications system designer.

Further features and advantages of the invention, as well as the structure and operation of various embodiments of the invention, are described in detail below with reference to the accompanying drawings. The drawing in which an element first appears is typically indicated by the leftmost character(s) and/or digit(s) in the corresponding reference number.

BRIEF DESCRIPTION OF THE DRAWINGS

The present invention will be described with reference to the accompanying drawings wherein:

FIG. 4I depicts a structural block diagram corresponding to flowchart 400 according to an embodiment of the present invention;

FIGS. 8B–8H depict several signal diagrams that are associated with flowchart 800 according to an embodiment of the present invention;

FIG. 8I depicts a structural block diagram associated with flowchart 800 according to an embodiment of the present invention;

FIG. 8K-1 depicts a structural block diagram associated with generator 318 according to an embodiment of the present invention;

FIG. 13N-1 depicts a structural block diagram associated with generator 318 according to an embodiment of the present invention;

FIG. 13O depicts a flowchart 1342, which illustrates generating redundant spectrums by modulating a first modulated signal with a second modulated signal;

FIGS. 14B–C depict signal diagrams that are associated with flowchart 1400 according to an embodiment of the present invention;

FIGS. 16A–F depict several signal diagrams associated with flowchart 1500 according to one embodiment of the present invention;

FIGS. 16G–I depict structural embodiments and implementations for a frequency up-converter;

FIGS. 16J–R depict several signal diagrams associated with the up-converter system 1620 described in FIGS. 16G–I;

FIGS. 17B–H depict several signal diagrams that are associated with flowchart 1700 according to an embodiment of the present invention;

FIG. 17I depicts structural block diagram associated with flowchart 1700 according to an embodiment of the present invention;

FIGS. 18B–18H depict several signal diagrams that are associated with flowchart 1800 according to an embodiment of the present invention;

FIG. 18I depicts a structural block diagram associated with flowchart 1700 according to one embodiment of the present invention;

FIGS. 19A and 19A1 depict a structural embodiments and implementations for frequency down-conversion according to embodiments of the present invention;

FIG. 21I depicts a structural block diagram associated with flowchart 2100, according to one embodiment of the present invention;

FIG. 25 depicts Table 2502 associated with UDF module 2622; and

DETAILED DESCRIPTION OF THE PREFERRED EMBODIMENTS

Table of Contents

Figure 1A:
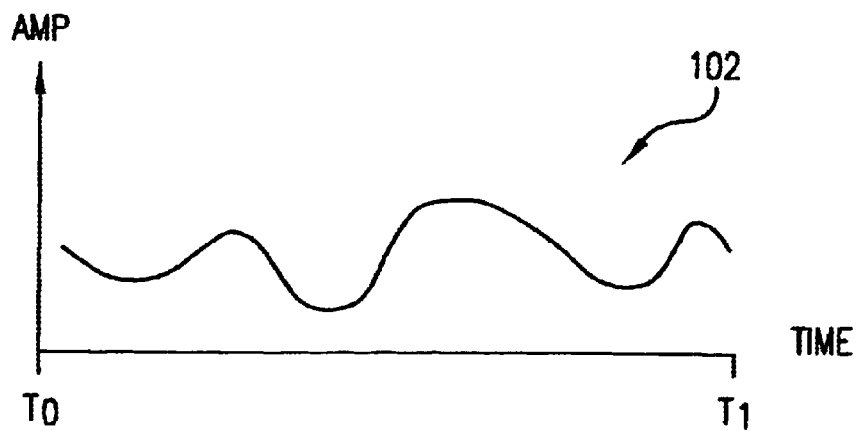
FIGS. 1A–1G depict various electrical signals in the time domain and frequency domain.
Figure 1B:
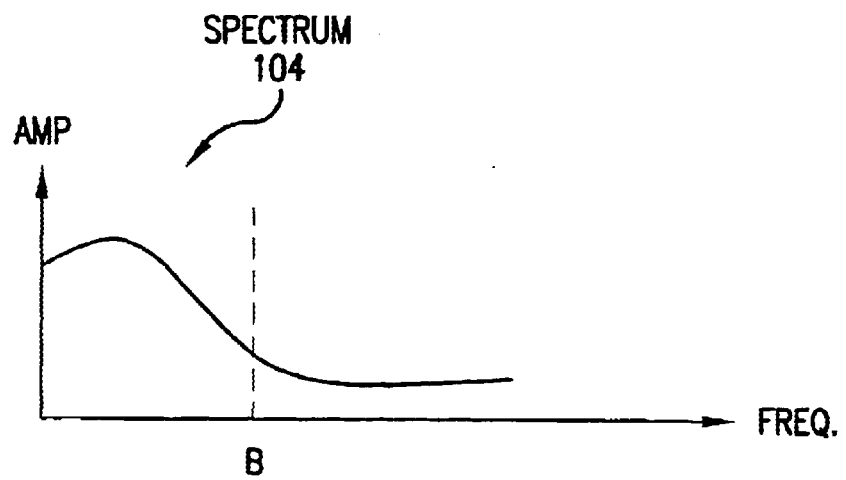
Figure 1C:
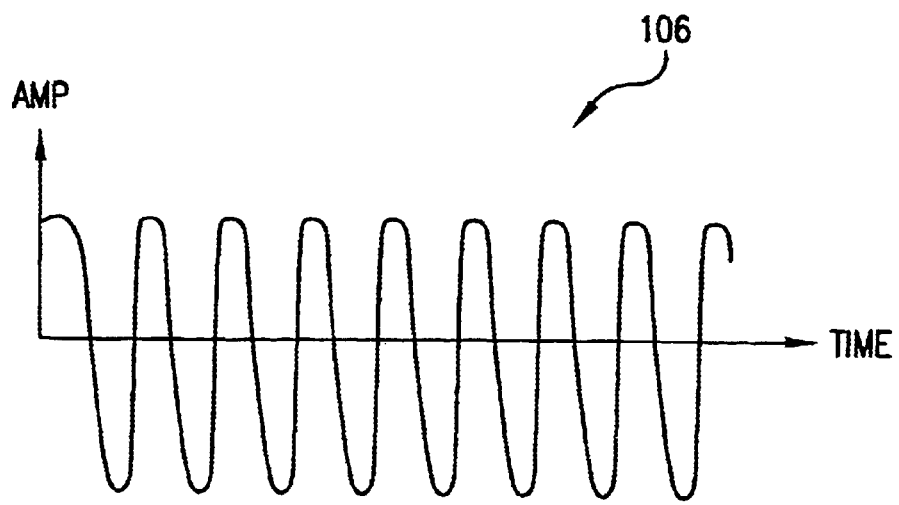
Figure 1D:
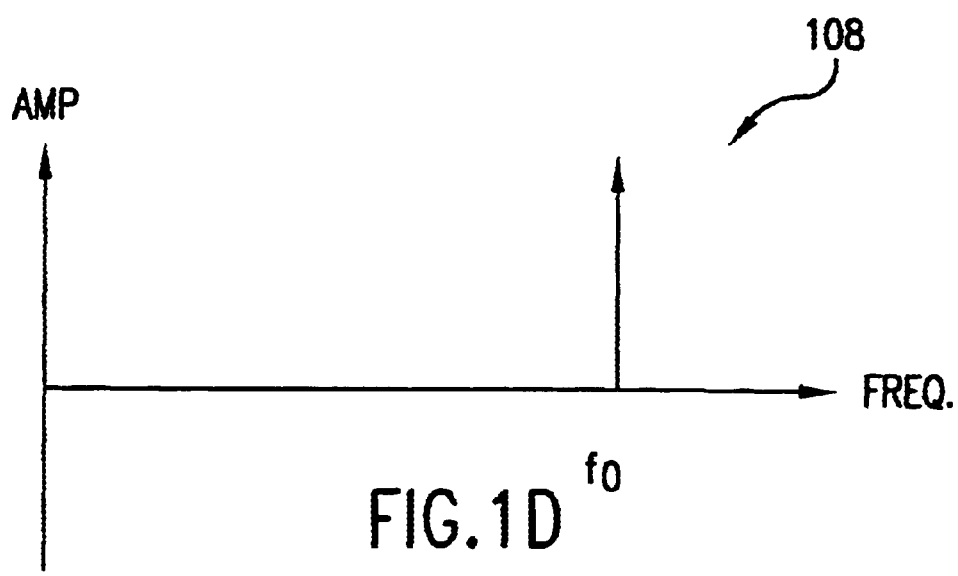
Figure 1E:
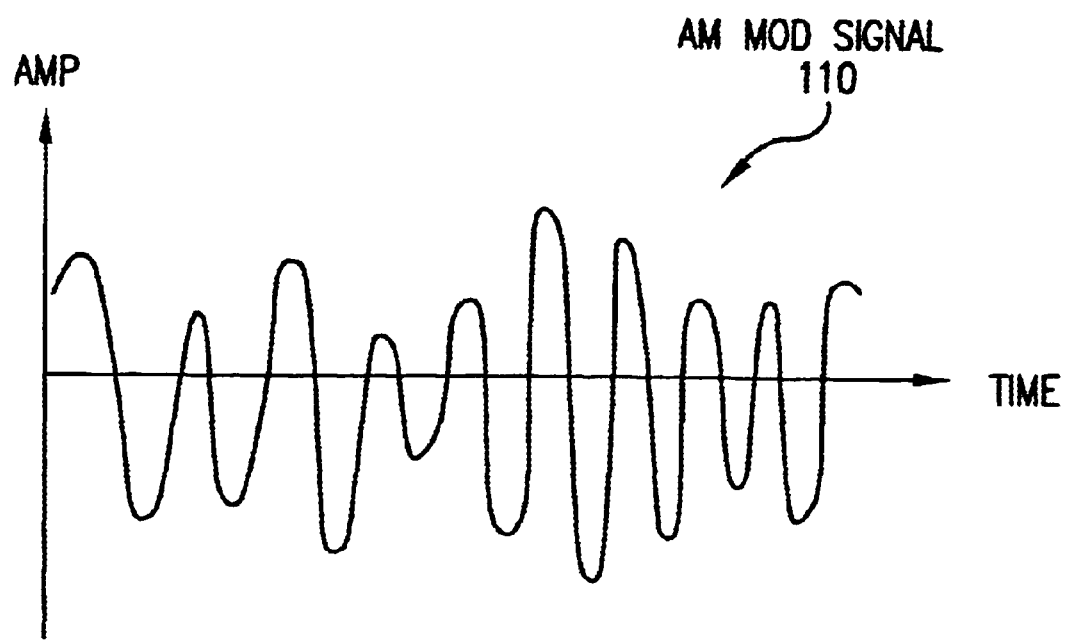
Figure 1F:
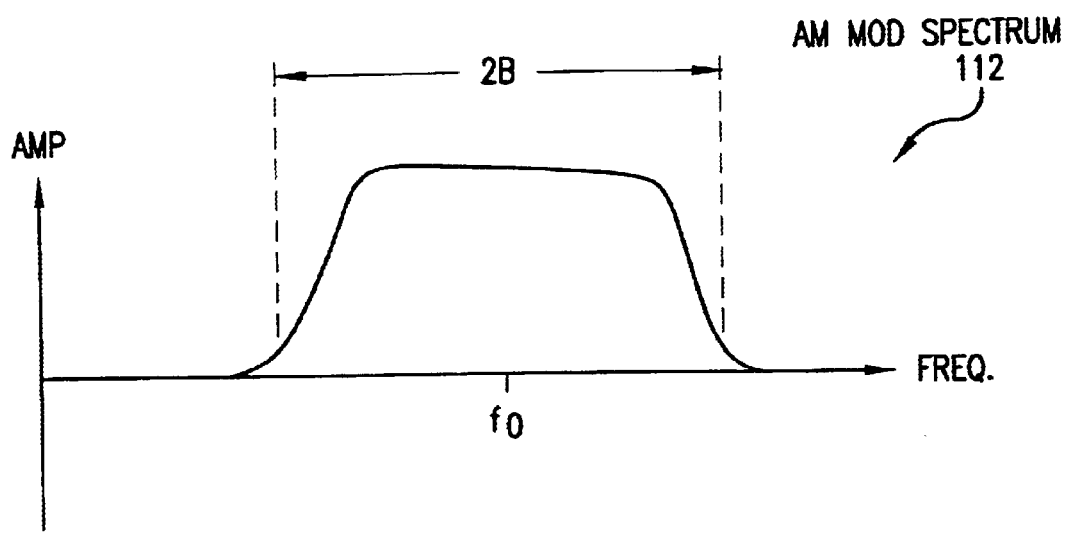
Figure 1G:
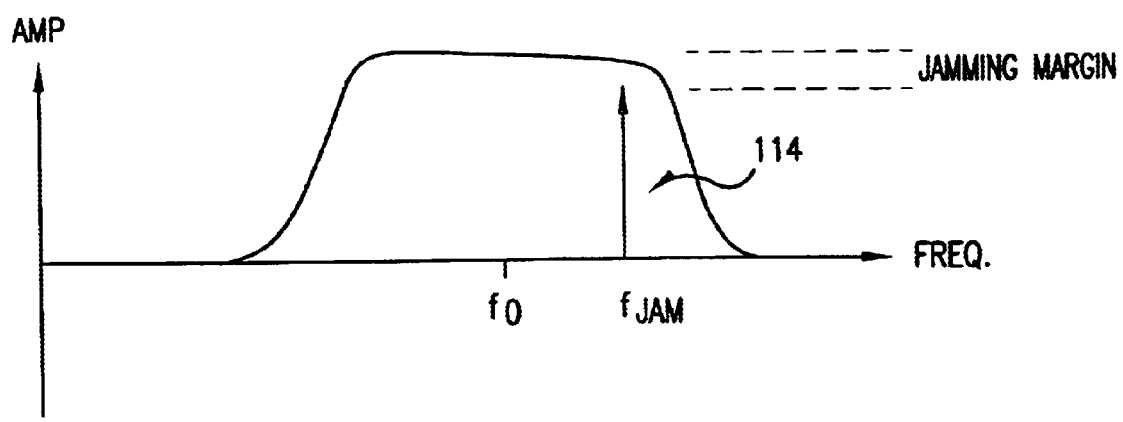

1 Terminology
2 Overview of the Invention
3 Example Environment
4 Generating Redundant Spectrums That Have Substantially the Same Information content According to Embodiments of the Present Invention
  4.1 High Level Description
    4.1.1 Operational Description
    4.1.2 Structural Description
  4.2 Example Embodiments
    4.2.1 Generating Redundant Spectrums by Replicating a Modulated Spectrum
      4.2.1.1 High Level Description
        4.2.1.1.1 Operational Description
        4.2.1.1.2 Structural Description
      4.2.1.2 Example Components of the Embodiments
        4.2.1.2.1 First Stage Modulator
          4.2.1.2.1.1 First Embodiment: Amplitude Modulation Mode
          4.2.1.2.1.1.1 Operational Description
          4.2.1.2.1.1.2 Structural Description
          4.2.1.2.1.2 Second Embodiment: Frequency Modulation Mode
          4.2.1.2.1.2.1 Operational Description
          4.2.1.2.1.2.2 Structural Description
          4.2.1.2.1.3 Third embodiment: Phase Modulation Mode
          4.2.1.2.1.3.1 Operational Description
          4.2.1.2.1.3.2 Structural Description
          4.2.1.2.1.4 Other Embodiments
        4.2.1.2.2 Second Stage Modulator (Replicator Modulator)
          4.2.1.2.2.1 First embodiment: Replicating the Modulated Spectrum by Phase Modulating the Modulated Signal.
          4.2.1.2.2.1.1 Operational Description
          4.2.1.2.2.1.2 Structural Description
          4.2.1.2.2.2 Second embodiment: Replicating the Modulated Spectrum by Frequency Modulating the Modulated Signal.

4.2.1.2.2.2.1 Operational Description
4.2.1.2.2.2.2 Structural Description
4.2.1.2.2.3 Other Embodiments
4.2.1.3 Implementation Examples
  4.2.1.3.1 First Stage Modulator
    4.2.1.3.1.1 AM Modulator as a Transistor Oscillator with a Variable Resistor
    4.2.1.3.1.2 FM Modulator as a Voltage Controlled Crystal Oscillator
    4.2.1.3.1.3 PM Modulator as a Tunable Filter
    4.2.1.3.1.4 Other Implementations
  4.2.1.3.2 Second Stage Modulator (Replicator Modulator)
    4.2.1.3.2.1 PM Modulator as a Tunable Filter
    4.2.1.3.2.2 Other Implementations for a PM modulator
    4.2.1.3.2.3 Other Implementations for the Second Stage Modulator
4.2.2 Generating Redundant Spectrums by Modulating an Oscillating Signal With a Modulated Signal
  4.2.2.1 Generating Redundant Spectrums by Phase Modulating an Oscillating Signal With a Modulated Signal
    4.2.2.1.1 High Level Description
      4.2.2.1.1.1 Operational Description
      4.2.2.1.1.2 Structural Description
    4.2.2.1.2 Example Components of the Embodiments
      4.2.2.1.2.1 First Stage Modulator
        4.2.2.1.2.1.1 First embodiment: Amplitude Modulation (AM), including Amplitude Shift Keying (ASK) Mode
        4.2.2.1.2.1.2 Second embodiment: Frequency Modulation (FM), including Frequency Shift Keying (FSK) Mode
        4.2.2.1.2.1.3 Third embodiment: Phase Modulation (PM) and Phase Shift Keying (PSK) Mode
        4.2.2.1.2.1.4 Other Embodiments
    4.2.2.1.3 Implementation Examples
      4.2.2.1.3.1 First Stage Modulator 1328
        4.2.2.1.3.1.1 AM Modulator as a Variable Gain Transistor Amplifier
        4.2.2.1.3.1.2 FM Modulator as a Voltage Controlled Crystal Oscillator
        4.2.2.1.3.1.3 Phase Modulator as Tunable Filter
        4.2.2.1.3.1.4 Other Implementations
      4.2.2.1.3.2 Phase Modulator 1332 as a tunable filter
        4.2.2.1.3.2.1 Phase Modulator 1332 as a Tunable Filter
        4.2.2.1.3.2.2 Other Implementations
  4.2.2.2 Generating Redundant Spectrums by Frequency Modulating an Oscillating Signal With a Modulated Signal
    4.2.2.2.1 High Level Description
      4.2.2.2.1.1 Operational Description
      4.2.2.2.1.2 Structural Description
    4.2.2.2.2 Example Components of the Embodiments
      4.2.2.2.2.1 First stage modulator
    4.2.2.2.3 Implementation Examples of the Embodiments
      4.2.2.2.3.1 First Stage Modulator
        4.2.2.2.3.1.1 AM Modulator as a Variable Gain Amplifier
        4.2.2.2.3.1.2 FM Modulator as a Voltage Controlled Oscillator
        4.2.2.2.3.1.3 PM Modulator as a Tunable Filter
        4.2.2.2.3.1.4 Other Implementations
      4.2.2.2.3.2 Frequency Modulator
        4.2.2.2.3.2.1 Frequency Modulator 1340 as a VCXO
        4.2.2.2.3.2.2 Other Implementations
  4.2.2.3 Other Embodiments
  4.2.3 Generating Redundant Spectrums by Modulating a First Modulating Signal with a Second Modulating Signal
    4.2.3.1 High Level Description
      4.2.3.1.1 Operational Description
      4.2.3.1.2 Structural Description
5 Spectrum Conditioning Prior to Transmission Over a Communications medium
  5.1 High Level Description
    5.1.1 Operational Description
    5.1.2 Structural Description
  5.2 Example Embodiments
    5.2.1 First Embodiment of Processing Redundant Spectrums
      5.2.1.1 Operational Description
      5.2.1.2 Structural Description
    5.2.2 Other Embodiments
    5.2.3 Implementation Examples
      5.2.3.1 Frequency Up-conversion
      5.2.3.2 Other Implementations
6 Recovering a Demodulated Baseband Signal from the Redundant Spectrums that have Substantially the Same Information content
  6.1 High Level Description
    6.1.1 Operational Description
    6.1.2 Structural Description
  6.2 Example Embodiments
    6.2.1 Down-conversion
      6.2.1.1 Down-conversion by Mixing Redundant Spectrums with an Oscillating Signal
        6.2.1.1.1 Operational Description
        6.2.1.1.2 Structural Description
      6.2.1.2 Down-conversion Using a Universal Frequency Translation Module
      6.2.1.3 Other Embodiments
    6.2.2 Spectrum Isolation
      6.2.2.1 Spectrum Isolation by Filtering Redundant Spectrums
        6.2.2.1.1 Operational Description
        6.2.2.1.2 Structural Description
      6.2.2.2 Down-conversion and Spectrum Isolation using a Unified Down-converting and Filtering Module (UDF)
      6.2.2.3 Other Embodiments
    6.2.3 Signal extraction
      6.2.3.1 Signal extraction by Demodulation, with Error Checking and/or Error Correction
        6.2.3.1.1 Operational Description
        6.2.3.1.2 Structural Description
      6.2.3.2 Other Embodiments 1. Terminology Various terms used in this application are generally described in this section. The description in this section is provided for illustrative and convenience purposes only, and is not limiting. The meaning of these terms will be apparent to persons skilled in the relevant art(s) based on the entirety of the teachings provided herein. These definitions may be discussed throughout the specification with additional detail.

Analog signal: A signal that is constant or continuously variable, as contrasted to a signal that changes between discrete states.

Baseband: A frequency band occupied by any generic information signal desired for transmission and/or reception.

Baseband signal: Any generic information signal desired for transmission and/or reception.

Carrier frequency: The frequency of a carrier signal. Typically, it is the center frequency of a transmission signal that is generally modulated.

Carrier signal: An EM wave having at least one characteristic that may be varied by modulation, that is capable of carrying information via modulation.

Demodulated baseband signal: A signal that results from processing a modulated signal. In some cases, for example, the demodulated baseband signal results from demodulating an intermediate frequency (IF) modulated signal, which results from down converting a modulated carrier signal. In another case, a signal that results from a combined down-conversion and demodulation step.

Digital signal: A signal that changes between discrete states, as contrasted to a signal that is continuous. For example, the voltage of a digital signal may shift between discrete levels.

Electromagnetic spectrum: A spectrum comprising waves characterized by variations in electric and/or magnetic fields. Such waves may be propagated in any communication medium, both natural and manmade, including but not limited to air, space, wire, cable, liquid, waveguide, microstrip, stripline, optical fiber, etc. The EM spectrum includes all frequencies greater than zero hertz.

EM signal: A signal in the EM spectrum. Also generally called an EM wave. Unless stated otherwise, all signals discussed herein are EM signals, even when not explicitly designated as such.

Jamming signal: Refers to any unwanted signal, regardless of origin, that may interfere with the proper reception and reconstruction of an intended signal.

Modulating baseband signal: Any generic information signal that is used to modulate an oscillating signal, or carrier signal.

Redundant Spectrums: A spectrum that includes the necessary amplitude, phase, and frequency information to construct a modulating baseband signal.

2. Overview of the Present Invention

The present invention is directed to methods and systems for ensuring the reception of a communications signal, and applications thereof.

According to an embodiment, the present invention accepts a modulating baseband signal and generates a plurality of redundant spectrums, where each redundant spectrum includes the information content to represent the modulating baseband signal. In other words, each redundant spectrum includes the necessary amplitude, phase, and frequency information to reconstruct the modulating baseband signal.

In an embodiment, the redundant spectrums are generated by modulating a first oscillating signal with a modulating baseband signal, resulting in a modulated signal with an associated modulated spectrum. The modulated signal can be the result of any type of modulation including but not limited to: amplitude modulation, frequency modulation, phase modulation, or combinations thereof. The information in the modulated spectrum can then replicated to thereby achieve the plurality of redundant spectrums that are substantially identical in information content to the modulated spectrum. The modulated spectrum can be replicated by modulating the associated modulated signal with a second oscillating signal. In one embodiment, the modulated signal is phase modulated with the second oscillating signal, where the phase of the modulated signal is shifted as a function of the second oscillating signal. In an alternate embodiment, the modulated signal is frequency modulated with the second oscillating signal, where the frequency of the modulated signal is shifted as a function of the second oscillating signal. Those skilled in the arts will recognize that other modulation embodiments can be used to replicate a modulated spectrum including but not limited to amplitude modulation. Such other embodiments fall within the scope and spirit of the present invention.

In an alternate embodiment, the redundant spectrums are generated by modulating a first oscillating signal with a modulated signal. The modulated signal is generated by modulating a second oscillating signal with the modulating baseband signal. As above, the modulated signal can be the result of any type of modulation including but not limited to: amplitude modulation, frequency modulation, phase modulation, or combinations thereof. In one embodiment, the first oscillating signal is phase modulated with the modulated signal, where the phase of the first oscillating signal is varied as a function of the modulated signal. In an alternate embodiment, the first oscillating signal is frequency modulated with the modulated signal, where the frequency of the first oscillating signal is varied as function of the modulated signal.

In one embodiment, the redundant spectrums are processed before being transmitted over a communications link. The spectrum processing can include selecting a subset of the redundant spectrums in order to reduce the bandwidth occupied by the redundant spectrums. The spectrum processing can also include attenuating any unmodulated tone associated with the redundant spectrums that is not desired to be transmitted. Finally, spectrum processing can include frequency upconversion and amplification, prior to transmission over the communications medium.

It is expected but not required that the redundant spectrums will be generated at a first location and transmitted to a second location over a communications medium. At the second location, a demodulated baseband signal is recovered from the received redundant spectrums. The recovery of a substantially error-free demodulated baseband signal includes translating the received redundant spectrums to a lower frequency, isolating the redundant spectrums into separate channels, and extracting the substantially error-free demodulated baseband signal from the isolated redundant spectrums. In one embodiment, extracting the error-free demodulated baseband signal includes demodulating each of the isolated redundant spectrums, analyzing each of the demodulated baseband signals for errors, and selecting a demodulated baseband signal that is substantially error-free. An error-free demodulated baseband signal is one that is substantially similar to the modulating baseband signal used to generated the redundant spectrums at the first location. Detecting errors in the demodulated baseband signals can be done in a number of ways including using cyclic redundancy check (CRC), parity check, check sum, or any other error detection scheme.

An advantage of transmitting a plurality of redundant spectrums over a communications medium is that the intended demodulated baseband signal can be recovered even if one or more of the redundant spectrums are corrupted during transmission. The intended demodulated baseband signal can be recovered because each redundant spectrum contains the necessary amplitude, phase, and frequency information to reconstruct the modulating baseband signal.

Furthermore, the bandwidth occupied by the redundant spectrums can be controlled by selecting a subset of redundant spectrums for transmission. Also, the frequency spacing between the redundant spectrums can be controlled by adjusting the frequency of the second oscillating signal. Therefore, the bandwidth occupied by the redundant spectrum is tunable, and easily customized by a communications system designer.

3. Example Environment

Figure 2A:
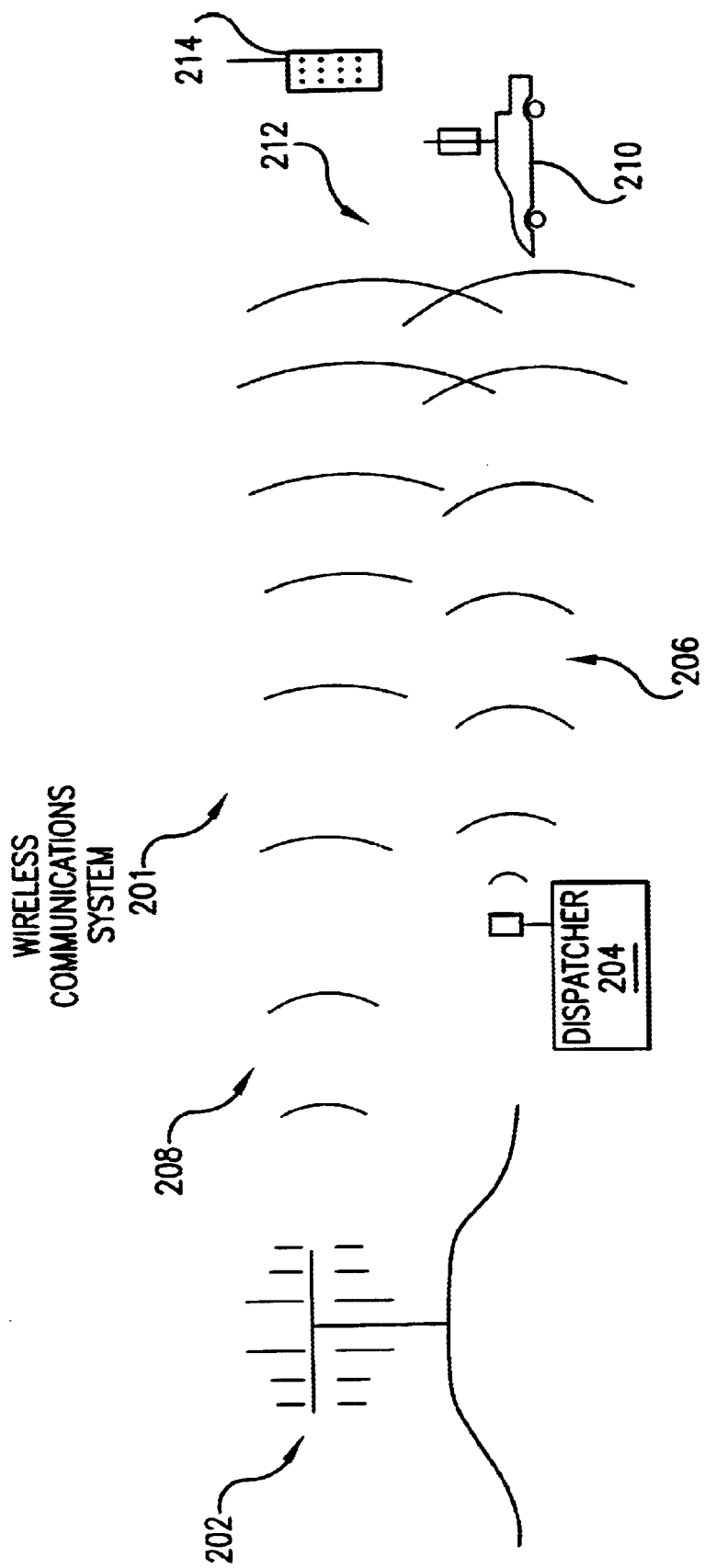
FIG. 2A depicts an exemplary environment in which the present invention is useful.

FIG. 2A illustrates an example communication system 201 in which the present invention is useful. The communications system 201 includes: a basestation 202, a dispatcher 204, a driver 210, a handset 214, and signals 206, 208, and 212.

In an embodiment, the dispatcher 204 and the driver 210 are employees of a delivery company and utilize wireless communications to operate their delivery business. For example, the dispatcher 204 may send delivery instructions over a private paging network to the driver 210. The basestation 202 is part of a wireless phone network and routes calls to handsets within its coverage area, including the handset 214. In one example, basestation 202 and dispatcher 204 utilize the same frequency band.

Figure 2B:
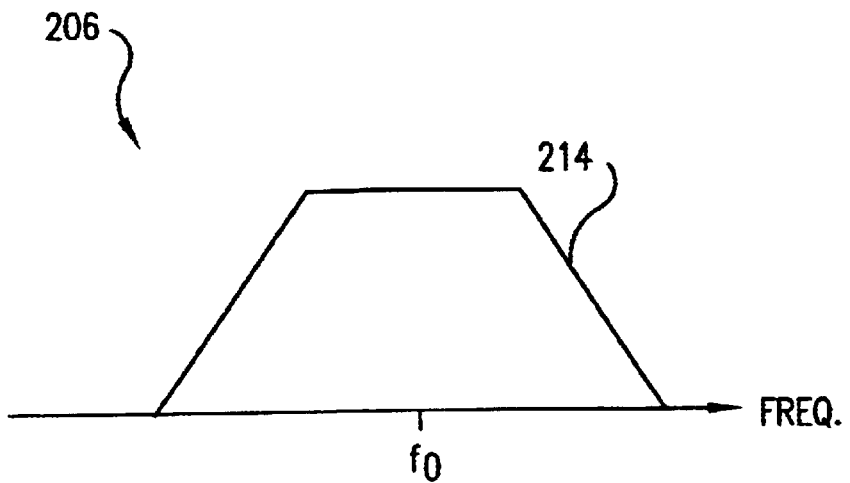
FIGS. 2B–2D depict various signals from the environment of FIG. 2A.
Figure 2C:
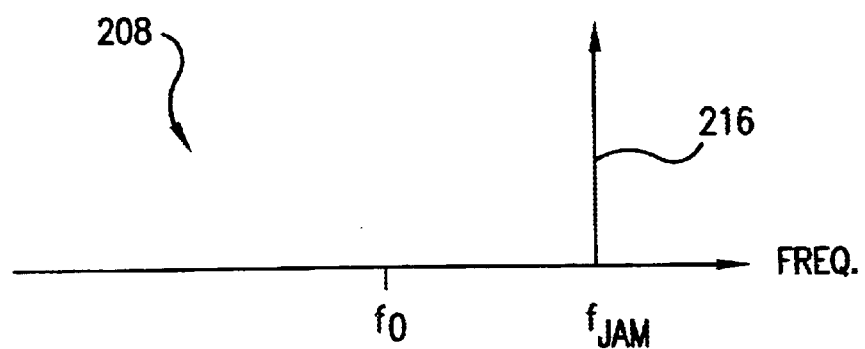
Figure 2D:
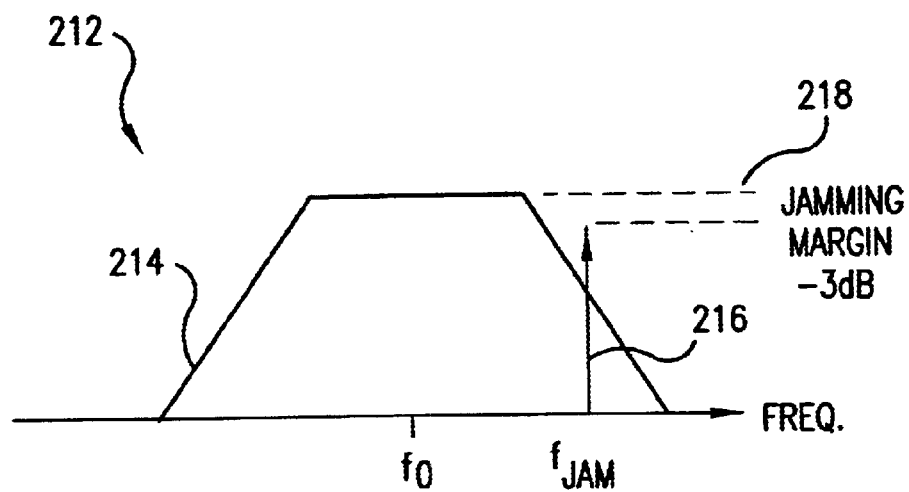

In FIG. 2A, the dispatcher 204 is shown as sending a modulated signal 206 to the driver 210. The modulated signal 206 may be a page message with current delivery instructions for the driver 210, and has a corresponding modulated spectrum 214 illustrated in FIG. 2B. Simultaneously, the basestation 202 is sending a test signal 208, which is a pure sinusoidal tone at frequency $f_{jam}$. The test signal 208 has a spectrum 216 illustrated in FIG. 2C. Since the driver 210 is mobile, the driver 210 will arrive at a geographic location where signals 206 and 208 combine to form signal 212. As shown in FIG. 2D, signal 212 includes the combination of spectrums 214 and 216.

The driver 210 must receive and process the entire spectrum 214 to properly reconstruct the page message from the dispatcher 204. To do so, the sine waves in spectrum 214 must be summed together with the correct amplitude and phase. If the power in unwanted (jamming) spectrum 216 becomes sufficiently large, the sine wave summation will be inaccurate, and the driver 210 will not be able to recover the message in data signal 206. The maximum power level of the spectrum 214 that can be tolerated is defined by the "jamming margin" of the driver 210's receiver. FIG. 2D illustrates a jamming margin 218 that is equal to −3 dB, which could be possible using FM modulated signals. That is, if the interfering spectrum 216 power level is within 3 dB of the spectrum 214 power level, then the message carried in spectrum 214 cannot be recovered intact at the driver 210's receiver.

4 Generating Redundant Spectrums That Have Substantially the Same Information Content According to Embodiments of the Present Invention The following discussion describes embodiments for generating redundant spectrums that have substantially the same information content according to the present invention. The invention description includes a high level description, example embodiments, and implementation examples of the present invention.

4.1 High Level Description

This section (including subsections) provides a high level description for generating redundant spectrums that have substantially the same information content according to an embodiment of the present invention. The following discussion includes an operational process for generating redundant spectrums according to one embodiment of the present invention. Also, a structural description for achieving this process is described herein for illustrative purposes, and is not meant to limit the invention in any way. In particular, the process described in this section can be achieved using any number of structural implementations, at least one of which is described in this section. The details of the structural description will be apparent to those skilled in the art based on the teachings herein.

4.1.1 Operational Description

Figure 3A:
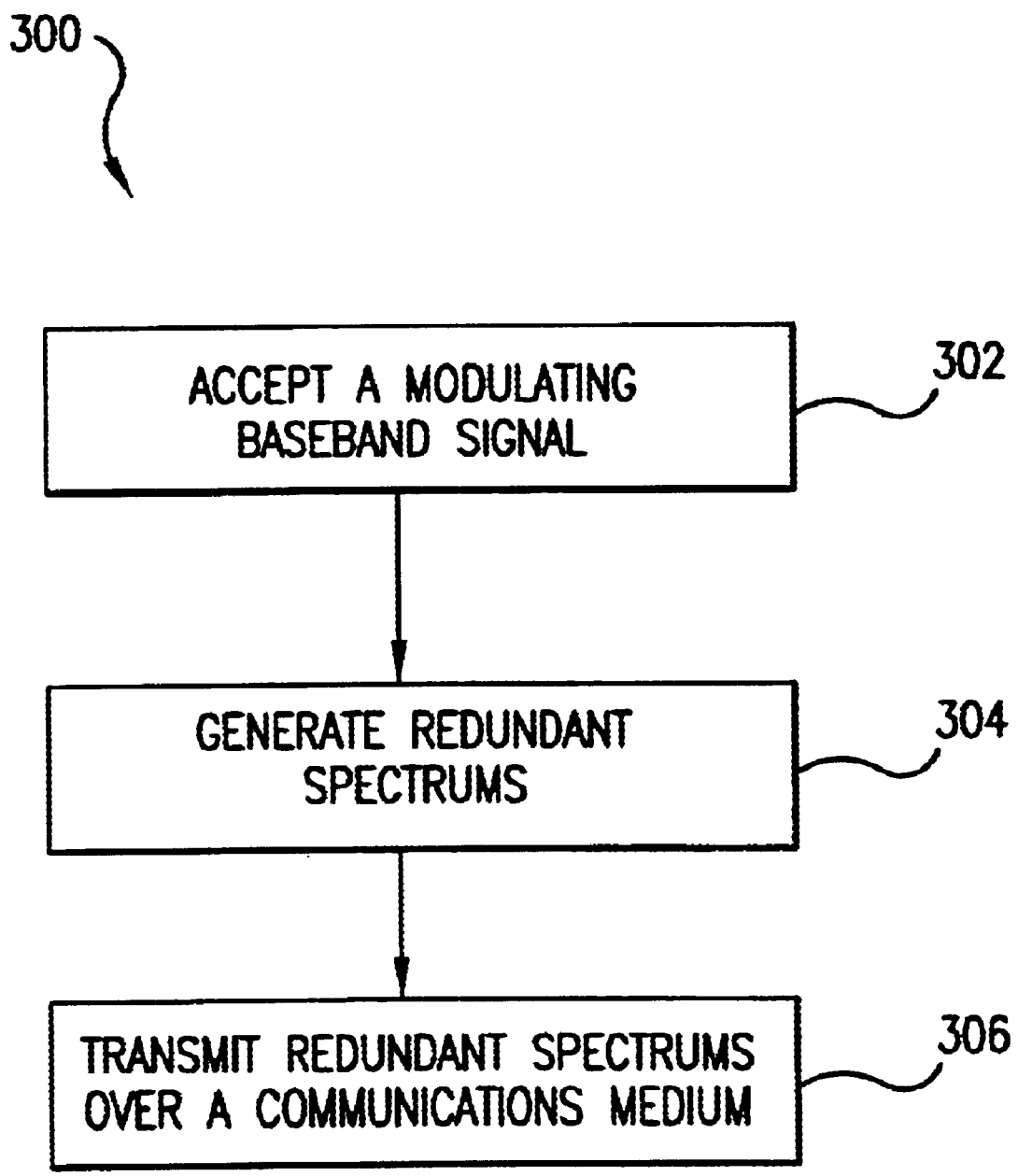
FIG. 3A depicts a flowchart 300, which illustrates generating redundant spectrums according to the present invention.
Figure 3B:
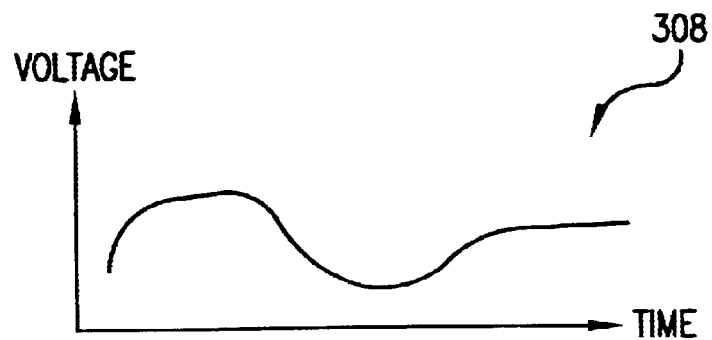
FIGS. 3B–3E depict several signal diagrams associated with flowchart 300.

FIG. 3A depicts a flowchart 300 that illustrates operational steps for generating multiple redundant spectrums that have substantially the same information content according to an embodiment of the present invention. Each redundant spectrum carries the information necessary to at least substantially or completely reconstruct the modulating baseband signal. In the following discussion, the steps in FIG. 3A will be discussed relative to the example signal diagrams shown in FIGS. 3B–3E.

In step 302, a modulating baseband signal 308 (shown in FIG. 3B) is accepted. Modulating baseband signal 308 is a representative information signal that is shown for illustrative purposes only, and is not intended to limit the present invention in any way. Modulating baseband signal 308 is represented as an analog signal in FIG. 3B, but modulating baseband signal 308 could alternatively be a digital signal, or a combination thereof.

Modulating baseband signal 308 could be a voltage (or current) characterization of any number of real world occurrences. For example, without limiting the invention, a typical analog modulating baseband signal is the voltage output of a microphone for a given acoustical input, such as a voice input. Again, without limiting the invention, a typical digital modulating baseband signal may be a digital bit stream that represents a digitized voice signal, or a digital bit stream of computer data.

Figure 3C:
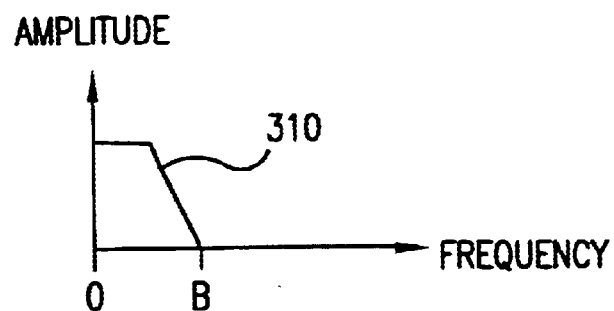

FIG. 3C illustrates the frequency spectrum 310 of the modulating baseband signal 308. As discussed earlier, the frequency spectrum of any electrical signal illustrates the relative amplitude of the sine waves that when summed together with the correct phase will sufficiently reconstruct the electrical signal in the time domain. In other words, the spectrum 310 contains the necessary amplitude, phase, and frequency information to distinctly represent the modulating baseband signal 308. As such, the modulating baseband signal 308 and the spectrum 310 are equivalent representations of the same electrical signal.

The spectrum 310 is represented in FIG. 3C as having a generic shape. Those skilled in the relevant art(s) will recognize that the actual shape of the spectrum 310 will depend on a specific modulating baseband signal 308 input. The spectrum 310 has a bandwidth B, meaning that frequencies beyond B (Hz) have substantially negligible amplitude in the spectrum 310, and thus can typically be ignored when reconstructing modulating baseband signal 308. Spectrums (like spectrum 310) that are unmodulated and are often referred to as "baseband" spectrums. This is in contrast to modulated spectrums that are typically located at much higher frequencies.

Figure 3D:
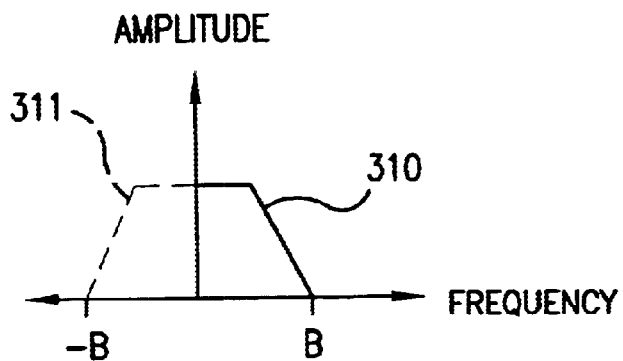

FIG. 3D illustrates the spectrum 310 and its image spectrum 311. The image spectrum 311 is the mirror image about DC (0 Hz) of the spectrum 310. The image spectrum 311 does not actually exist and hence the reason for the dotted line representation in FIG. 3D. Those skilled in the relevant art(s) often depict the image spectrum for a baseband signal to predict the shape and bandwidth of the baseband signal once it has been up-converted to a higher frequency using a modulation technique, as will be seen in later sections.

In step 304, multiple redundant spectrums 312a–n (FIG. 3E) are generated based upon the modulating baseband signal 308. Each redundant spectrum 312a–n contains the necessary amplitude, phase, and frequency information to substantially reconstruct the modulating baseband signal 308. That is, each redundant spectrum 312a–n contains at least substantially the same information content of spectrum 310. There is no numerical limit to the number of spectrums generated, and the "a–n" designation is not meant to suggest a limit in any way.

In one embodiment, each redundant spectrum 312a–n includes an image spectrum. In an alternate embodiment, each redundant spectrum 312a–n is processed to suppress the image spectrum resulting in a bandwidth of B (Hz) for each redundant spectrum 312a–n.

In one embodiment, the redundant spectrums 312a–n are at a substantially higher frequency than the spectrum 310 which exists at baseband. This is represented by the break 314 in the frequency axis of FIG. 3E.

Figure 3E:
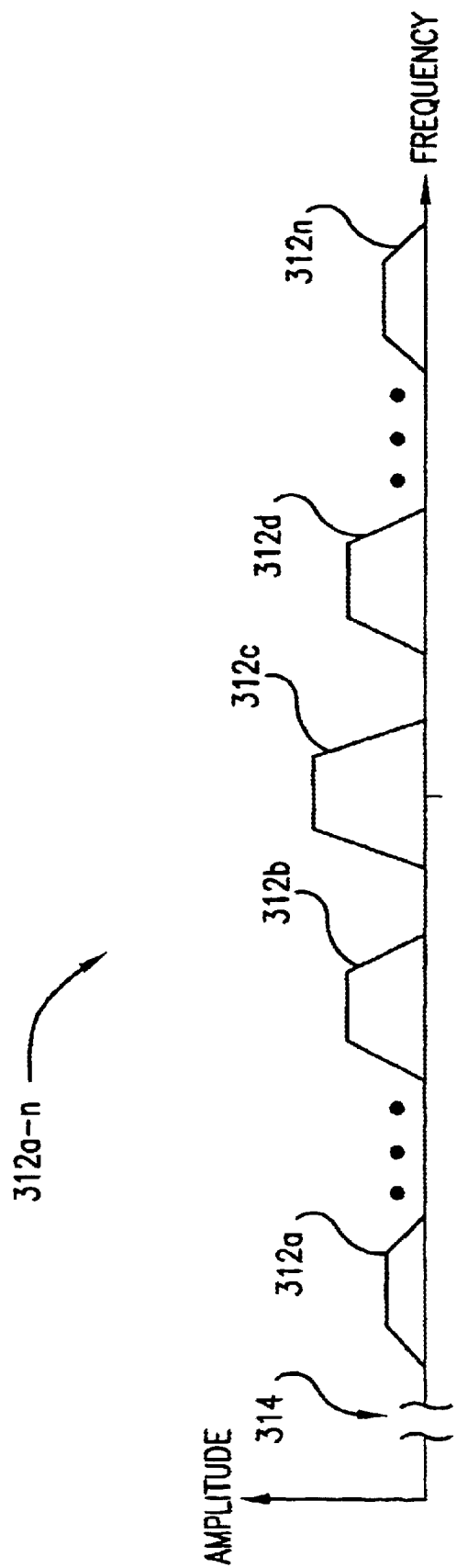

In one embodiment, the amplitude of each redundant spectrum 312a–b,d–n "rolls off" with increasing frequency distance from the center redundant spectrum 312c. For example, redundant spectrums 312b,d have a lower amplitude than center redundant spectrums 312c as is illustrated in FIG. 3E. However, the relative amplitude and phase of the frequency components within a given spectrum is conserved, and therefore, each redundant spectrum 312a–n may still be used to reconstruct the modulating baseband signal 308 despite the amplitude rolloff. As shown, FIG. 3E depicts this amplitude rolloff relative to the distance from the center spectrum. But for convenience of illustration, the amplitude rolloff will not be depicted in subsequent figures that are directed at redundant spectrums.

In step 306, the redundant spectrums 312a–n are transmitted over a communications medium. It is expected, but not required, that the redundant spectrums 312a–n would be generated at a first location and sent to a second location over the communications medium. At the second location, the redundant spectrums would be processed to recover the modulating baseband signal 308. In one embodiment, the communications medium is an over-the-air wireless communications link. In other embodiments, the communications medium can include the following: wire, optical link, liquid, or any other communications medium.

As stated above, each redundant spectrum 312a–n contains the necessary amplitude, phase, and frequency information to substantially reconstruct the modulating baseband signal 308. As such, even if one or more of the redundant spectrums 312a–n are corrupted by a jamming signal in the communications medium, the modulating baseband signal 308 can still be recovered from any of the other redundant spectrums 312a–n that have not been corrupted.

For illustrative purposes, the operation of the invention is often represented by flowcharts, such as flowchart 300 in FIG. 3A. It should be understood, however, that the use of flowcharts is for illustrative purposes only, and is not limiting. For example, the invention is not limited to the operational embodiment(s) represented by the flowcharts. Instead, alternative operational embodiments will be apparent to persons skilled in the relevant art(s) based on the discussion contained herein. Also, the use of flowcharts should not be interpreted as limiting the invention to discrete or digital operation. In practice, as will be appreciated by persons skilled in the relevant art(s) based on the herein discussion, the invention can be achieved via discrete or continuous operation, or a combination thereof. Further, the flow of control represented by the flowcharts is provided for illustrative purposes only. As will be appreciated by persons skilled in the relevant art(s), other operational control flows are within the scope and spirit of the present invention.

4.1.2 Structural Description

Figure 3F:
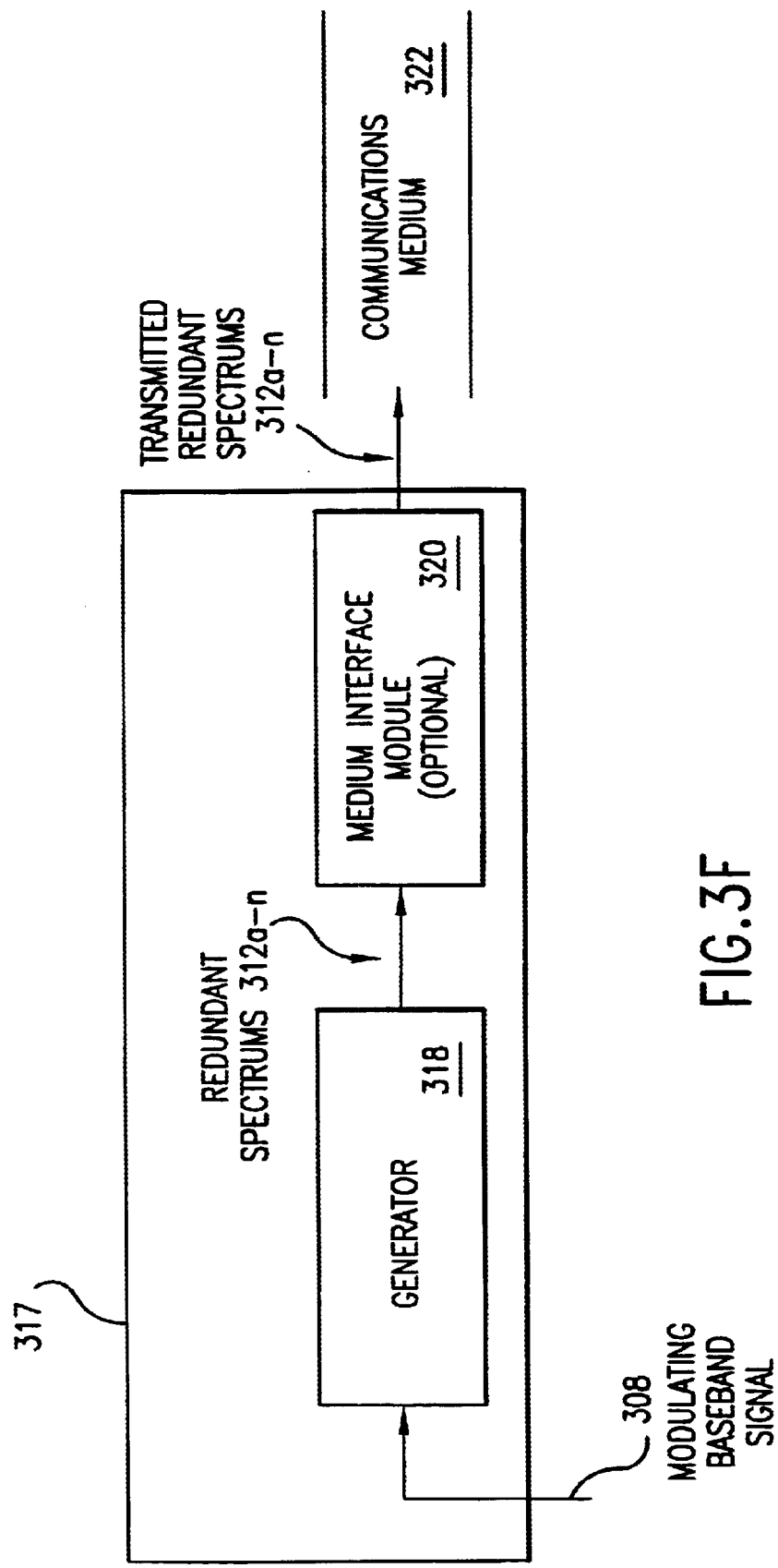
FIG. 3F depicts a structural block diagram corresponding to flowchart 300 according an embodiment of the present invention.

FIG. 3F illustrates a block diagram of transmission system 317 according to an embodiment of the present invention. Transmission system 317 comprises a generator 318 and a (optional) medium interface 320. Transmission system 317 accepts a modulating baseband signal 308 and transmits multiple redundant spectrums 312a–n in the manner shown in operational flowchart 300. In other words, the transmission system 317 is the structural embodiment for performing the operational steps in flowchart 300. However, it should be understood that the scope and spirit of the present invention includes other structural embodiments for performing steps in flowchart 300. The specifics of these other structural embodiments will be apparent to persons skilled in the relevant art(s) based on the discussion contain herein. Flowchart 300 will re-visited to further illustrate the present invention in view of the structural components in transmission system 317.

In step 302, the generator 318 accepts the modulating baseband signal 308, which has a corresponding frequency spectrum 310. In step 304, the generator 318 generates multiple redundant spectrums 312a–n. Each redundant spectrum 312a–n contains the necessary amplitude, phase, and frequency information to substantially reconstruct the modulating baseband signal 308. As such, each redundant spectrum 312a–n could be processed to reconstruct the modulating baseband signal 308.

In step 306, the (optional) medium interface module 320 transmits the redundant spectrums 312a–n over a communications medium 322. In an embodiment, the communications medium is a wireless link, and (optional) medium interface module 320 is an antenna which transmits the redundant spectrums into free space. In other embodiments, the (optional) medium interface module 320 can be (but is not limited to) one of the following: a modem, connector, or any other device that can be used to interface to a communications medium.

4.2 Example Embodiments

The following discussion describes example embodiments for generating redundant spectrums that have substantially the same information content, where the information content in each redundant spectrum represents a modulating baseband signal. A first embodiment generates redundant spectrums by replicating a modulated spectrum. The redundant spectrums can be replicated by modulating a modulated signal with an oscillating signal. A second embodiment generates redundant spectrums by modulating an oscillating signal with a modulated signal. A third embodiment generates redundant spectrums by modulating a first modulated signal with a second modulated signal. These embodiments are provided for illustrative purposes, and are not limiting. Other embodiments will be apparent to persons skilled in the art(s) based on teachings contained herein.

4.2.1 Generating Redundant Spectrums by Replicating a Modulated Spectrum

The following discussion is directed to a method and system for generating redundant spectrums by replicating a modulated spectrum according to an embodiment the invention.

4.2.1.1 High Level Description

This section (including subsections) provides a high level description for generating redundant spectrums by replicating a modulated spectrum. The following discussion includes an exemplary operational process for generating redundant spectrums by replicating a modulated spectrum. Also, a structural description for achieving this process is described herein for illustrative purposes, and is not meant to limit the invention in any way. In particular, the process described in this section can be achieved using any number of structural implementations, at least one of which is described in this section. The details of the structural description will be apparent to those skilled in the art based on the teachings herein.

4.2.1.1.1 Operational Description

Figure 4A:
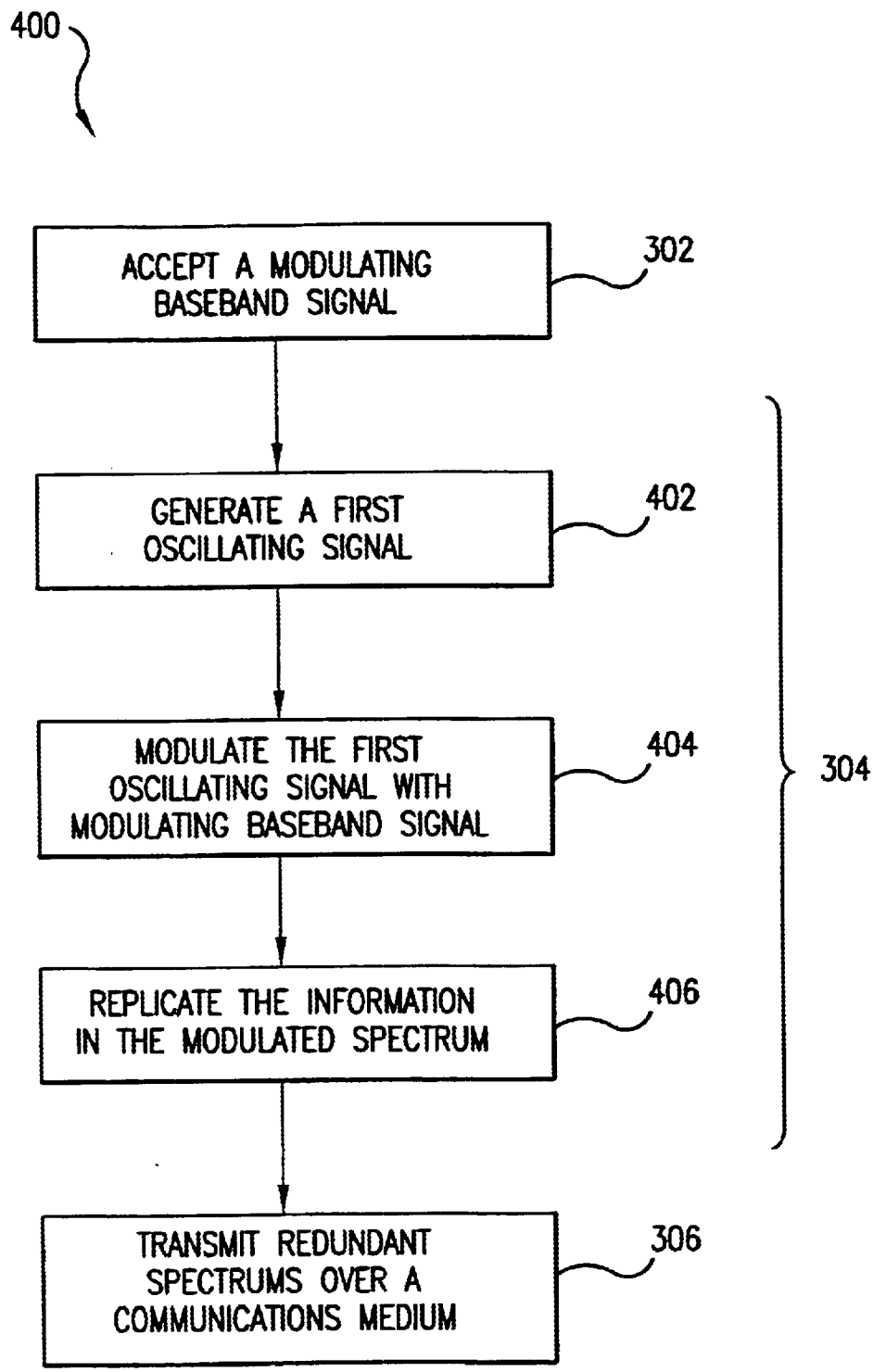
FIG. 4A depicts flowchart 400, which illustrates generating redundant spectrums by replicating a modulated spectrum according to an embodiment of the present invention.

FIG. 4A depicts a flowchart 400 which illustrates in greater detail the flowchart 300 of FIG. 3A. In particular flowchart 400 illustrates the operation of step 304 in greater detail. As described above, in step 304, multiple redundant spectrums are generated based on the input of modulating baseband signal 308. In the following discussion, the steps in flowchart 400 will be discussed in relation to the example signal diagrams shown in FIGS. 4B–4G.

Figure 4B:
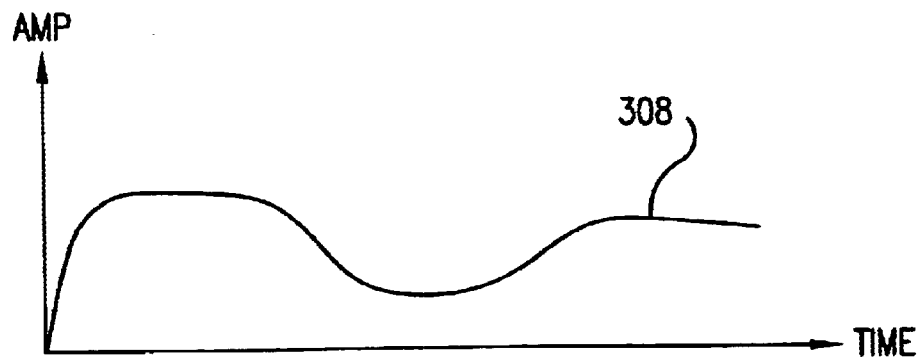
FIGS. 4B–4H depict several signal diagrams associated with flowchart 400 according to an embodiment of the present invention.
Figure 4C:
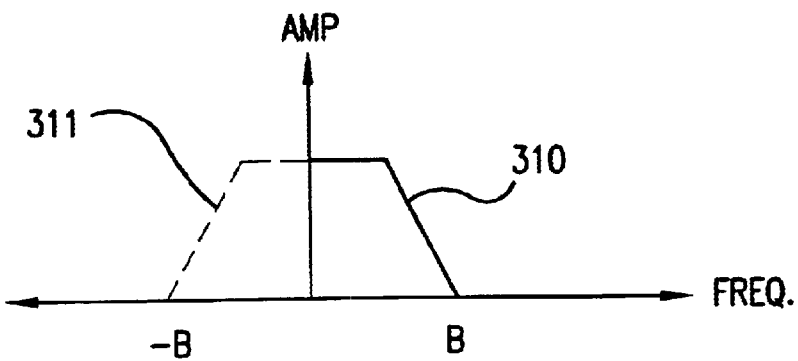
Figure 4D:
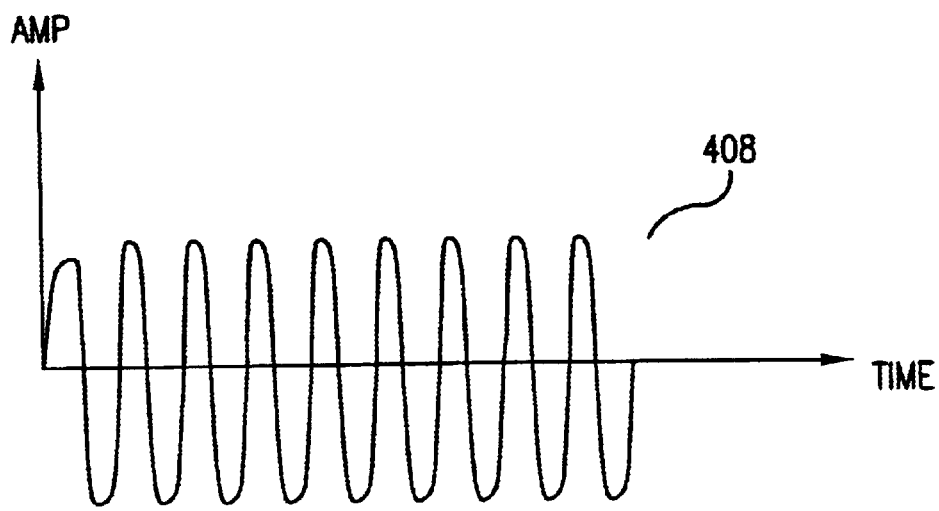

In step 302, the modulating baseband signal 308 is accepted. FIG. 4B illustrates an example modulating baseband signal 308, and FIGS. 4C illustrates a corresponding the spectrum 310 and image spectrum 311 associated with modulating baseband signal 308. It is noted that step 302, signal 308, and spectrums 310, 311 described here are the same as those described above and shown in FIGS. 3A–3D. They are re-illustrated here for convenience.

Figure 4E:
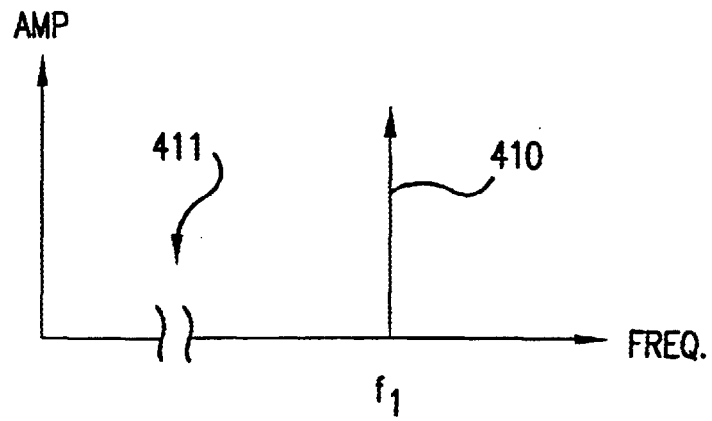

In step 402, a first oscillating signal 408 (FIG. 4D) is generated. The first oscillating signal 408 is typically a sinewave with a characteristic frequency $f_1$. Other periodic waveforms could be used including but not limited to square wave. As such, the first oscillating signal 408 has a frequency spectrum 410 that is substantially a tone at $f_1$ (FIG. 4E). Typically, $f_1$ for the first oscillating signal 408 is much higher than the highest frequency B in the modulating baseband signal spectrum 310, which is represented by the break 411 in the frequency axis in FIG. 4E. For example and without limitation, if the spectrum 310 represents the frequency components of a typical voice signal, then the spectrum bandwidth B is approximately 3.5 KHz. Whereas, a typical first oscillating signal $f_1$ will operate on the order of 100 MHZ. The invention is not limited to these example frequencies. In other embodiments, other frequencies can be used.

Figure 4F:
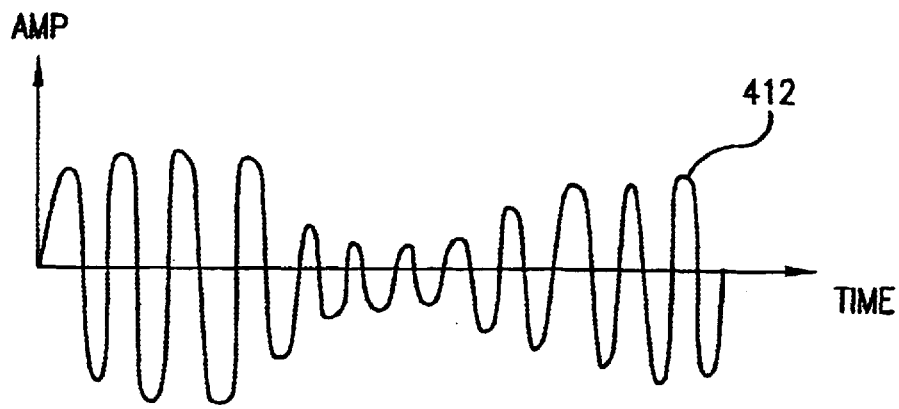
Figure 4G:
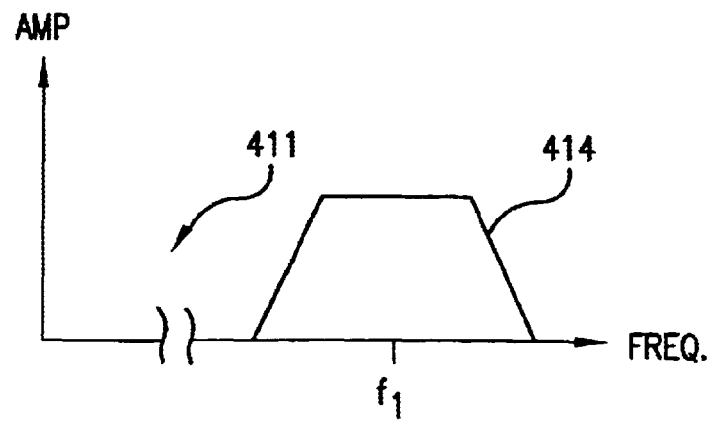

In step 404, the first oscillating signal 408 is modulated with the modulating baseband signal 308, resulting in a modulated (mod) signal 412 (FIG. 4F). The modulated signal 412 depicts the result of amplitude modulation (AM), where the amplitude of the modulating baseband signal 308 has been impressed on the amplitude of the first oscillating signal 408. The use of AM is done for example purposes only, and is not meant to limit the invention in any way. Any type of modulation could be used including but not limited to: amplitude modulation (AM), frequency modulation (FM), phase modulation (PM), etc., or any combination thereof. Various modulation schemes will be explored in section 4.2.1.2.1.

The modulated signal 412 has a corresponding modulated spectrum 414 (FIG. 4F) that is centered around $f_1$ which is the characteristic frequency of the first oscillating signal 408. The modulated spectrum 414 carries the necessary information to reconstruct the modulating baseband signal 308 at the receiver. (i.e. the modulated spectrum 414 carries the necessary amplitude, phase, and frequency information to reconstruct the modulating baseband signal 308.)

The modulated spectrum 414 has a generic shape and bandwidth. Those skilled in the art will recognize that the actual shape and bandwidth of modulated spectrum 414 will depend on the specific modulating baseband signal 308 and type of modulation used to modulate the first oscillating signal 408.

Figure 4H:
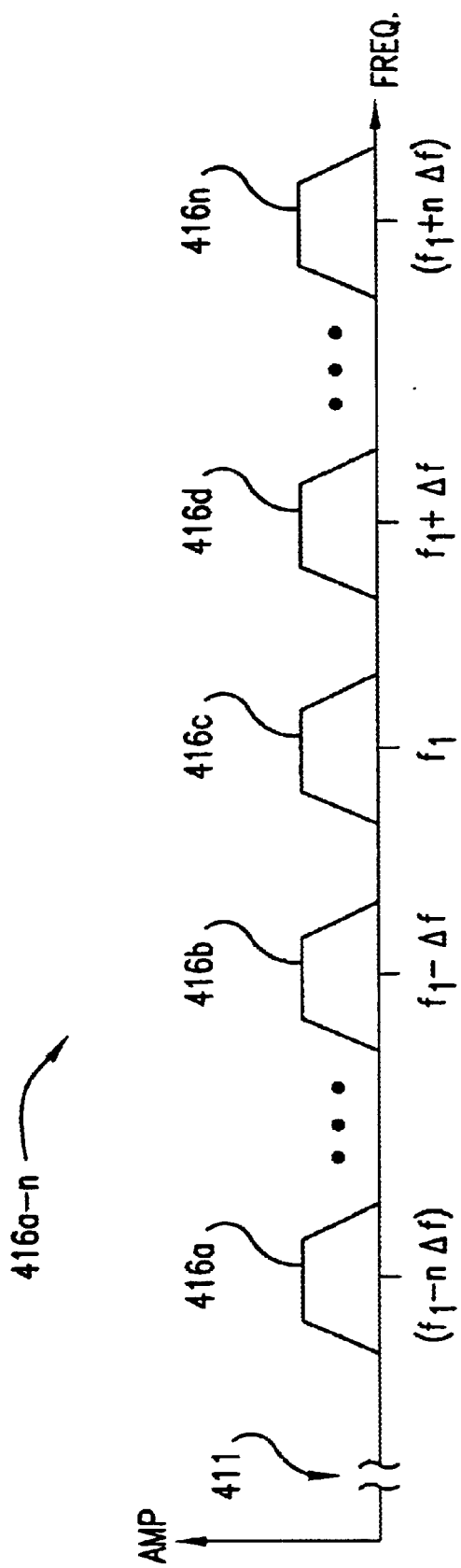
Figure 41:
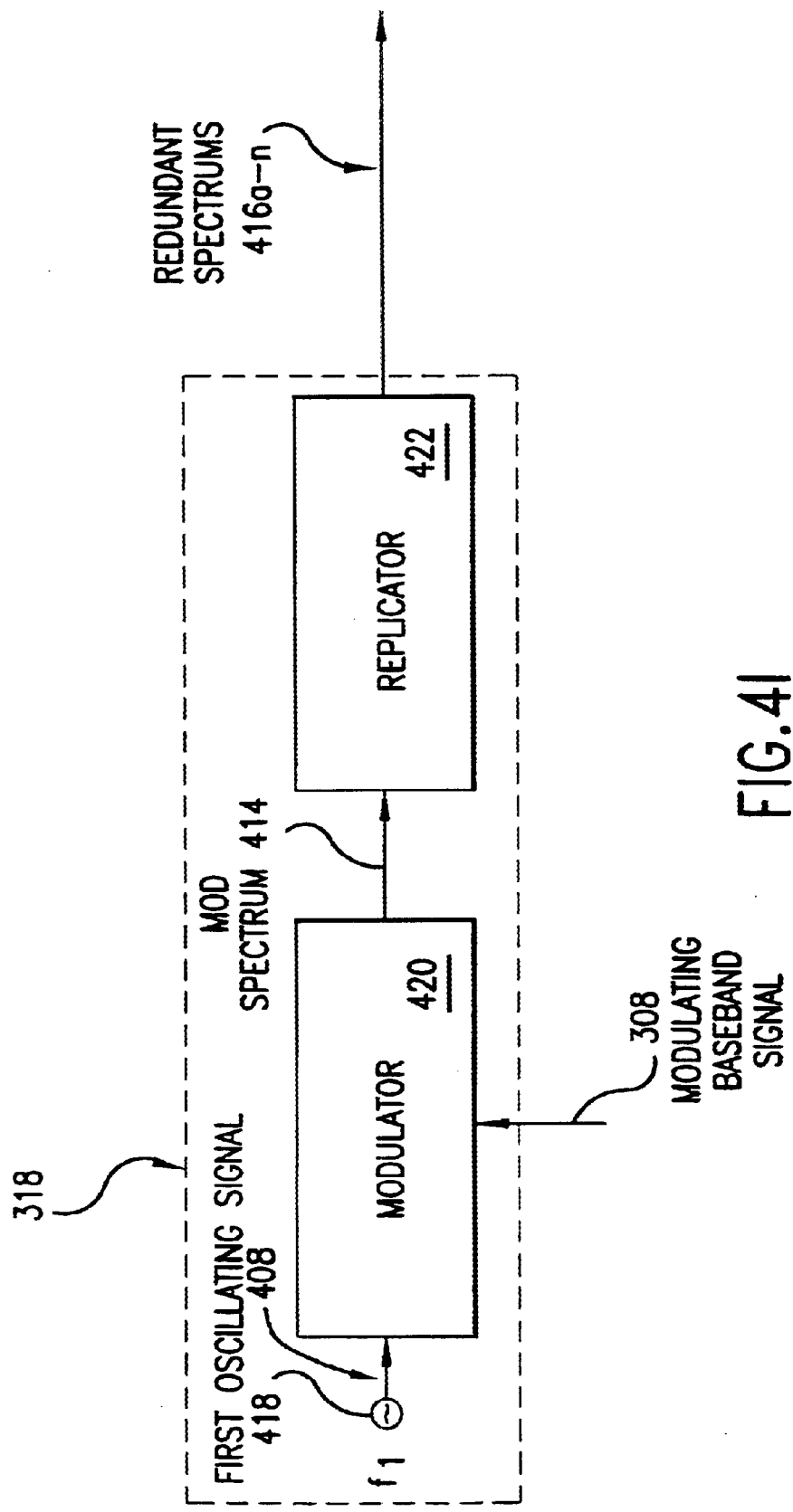

In step 406, the information contained in the modulated spectrum 414 is replicated to produce redundant spectrums 416a–n (FIG. 4H). Since each redundant spectrum 416a–n was replicated from the modulated spectrum 414, each redundant spectrum 416a–n carries the necessary information to reconstruct the modulating baseband signal 308 at the receiver. (i.e. each redundant spectrum 416 carries the necessary amplitude, phase, and frequency information to reconstruct the modulating baseband signal 308.) As such, if one of the redundant spectrums 416a–n is corrupted by a jamming signal, then the modulating baseband signal 308 can be recovered from one of the other redundant spectrums 416a–n.

In step 306, the redundant spectrums 416a–n are transmitted over a communications medium. It is expected, but not required, that the redundant spectrums 312a–n would be generated at a first location and sent to a second location over the communications medium. At the second location, the redundant spectrums would be processed to reconstruct the modulating baseband signal 308. In one embodiment, the communications medium is a wireless communications link.

Preferably, each redundant spectrum 416a–n is offset from an adjacent redundant spectrum 416a–n by an amount of $\Delta f$ Hz. For example, spectrum 416c is centered at $f_1$ and spectrum 416b is centered at $(f_1 - \Delta f)$. Theoretically, there is no limit to the number of redundant spectrums 416a–n created.

4.2.1.1.2 Structural Description

FIG. 4I illustrates a block diagram of generator 318 according to an embodiment of the present invention. Generator 318 comprises a first oscillator 418, first stage modulator 420, and replicator 422. Generator 318 accepts a modulating baseband signal 308 and generates multiple redundant spectrums 416a–n in the manner shown in operational flowchart 400. In other words, the generator 318 is a structural embodiment for performing the operational steps in flowchart 400. However, it should be understood that the scope and spirit of the present invention includes other structural embodiments for performing steps in flowchart 400. The specifics of these other structural embodiments will be apparent to persons skilled in the relevant art(s) based on the discussion contained herein. Flowchart 400 will be re-visited to further illustrate the present invention in view of the structural components in generator 318.

In step 402, the first oscillator 418 generates the first oscillating signal 408. As discussed earlier, the first oscillating signal 408 is substantially a sinusoid with frequency of $f_1$. Typically, the first oscillating signal 408 has a frequency $f_1$ that is substantially higher than the bandwidth B of spectrum 310, which represents the highest frequency component in modulating baseband signal 308. For example, a typical bandwidth B for spectrum 310 is on the order of 10 KHz, and a typical value for $f_1$ is on the order of 100 MHZ.

In step 404, the modulator 420 modulates the first oscillating signal 408 with the modulating baseband signal 308, resulting in the modulated signal 412 with corresponding modulated spectrum 414. As discussed earlier, the modulator 420 can be any type of modulator, as will be explored in more detail in later sections. The modulated spectrum 414 is centered around $f_1$, which is the frequency of first oscillating signal 408. The modulated spectrum 414 includes the necessary amplitude, and frequency information to reconstruct the modulating baseband signal 308.

In step 406, the replicator 422 replicates the information in the modulated spectrum 414 to generate redundant spectrums 416a–n. Each redundant spectrum 416a–n includes substantially a copy of the information in the modulated spectrum 414, and thus can be used to reconstruct the modulating baseband signal 308. This is because each redundant spectrum 416a–n contains the relative amplitude, phase, and frequency information to reconstruct the modulating baseband signal 308.

In step 306, (optional) medium interface 320 transmits redundant spectrums 416a–n over communications medium 322. In one embodiment, communications medium 322 is a wireless link, and (optional) medium interface module 320 includes an antenna.

4.2.1.2 Example Component(s) of the Embodiment(s)

Various embodiments related to the method(s) and structure(s) described above are presented in this section (and its subsections). Specifically, the following discussion describes example embodiments of generating redundant spectrums by replicating a modulated spectrum. These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

4.2.1.2.1 First Stage Modulator

The following discussion is directed to example embodiments of step 404 in flowchart 400 (FIG. 4A), and the first stage modulator 420 (FIG. 4I). The example embodiments include but are not limited to: amplitude modulation, frequency modulation, and phase modulation. These modulation schemes are described herein for illustrative purposes only. Other modulation schemes, including different forms of the ones described herein, will be apparent to persons skilled it the relevant art(s). Such other modulation schemes are within the scope and spirit of the present invention.

4.2.1.2.1.1 First Embodiment: Amplitude Modulation (AM) Mode, Including Amplitude Shift Keying (ASK) Mode The following discussion describes a method and system for generating redundant spectrums using amplitude modulation, including amplitude shift keying modulation.

4.2.1.2.1.1.1 Operational Description

Figure 5A:
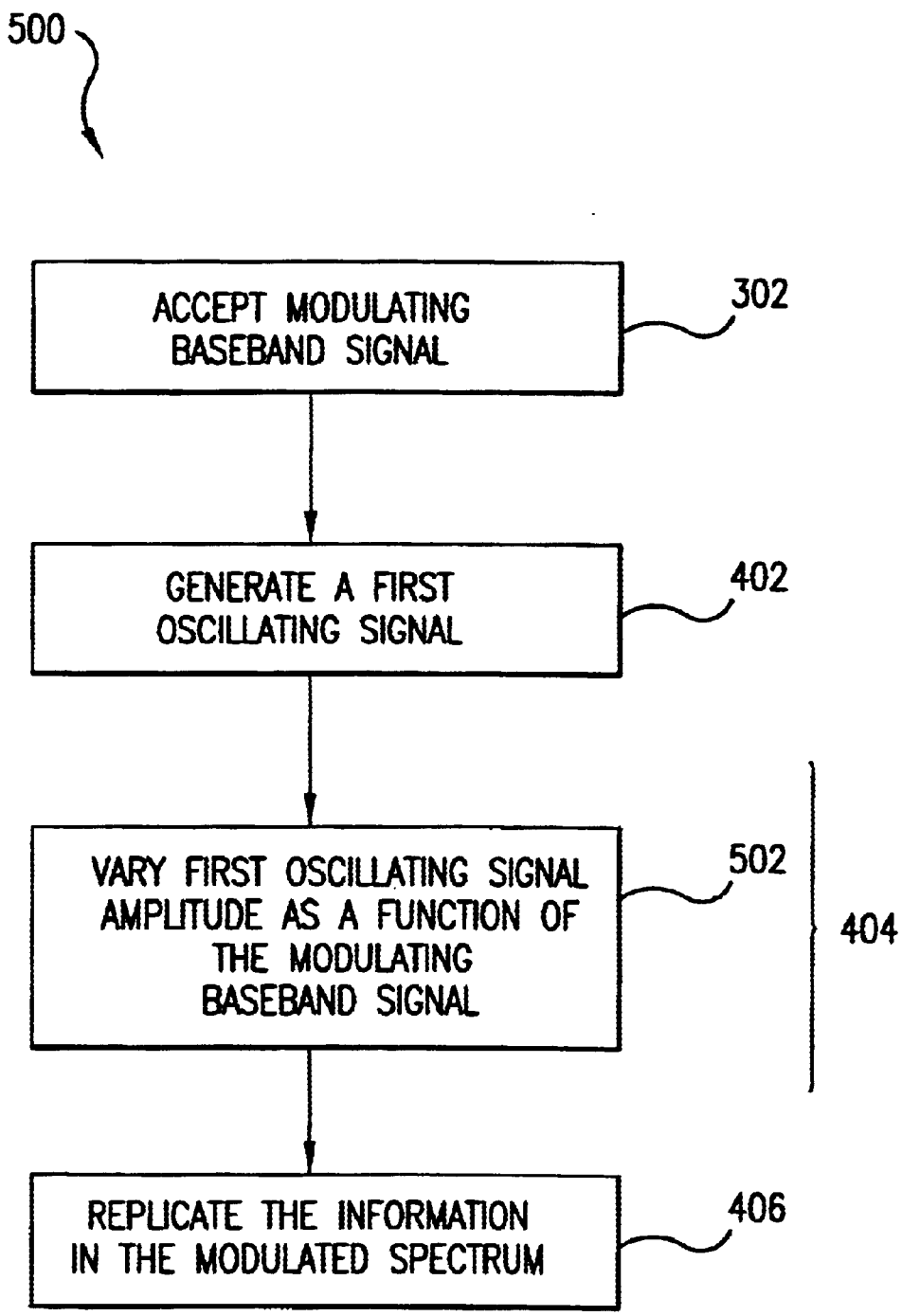
FIG. 5A depicts a flowchart 500, which illustrates amplitude modulating an oscillating signal with a modulating baseband signal according to an embodiment of the present invention.
Figure 5B:
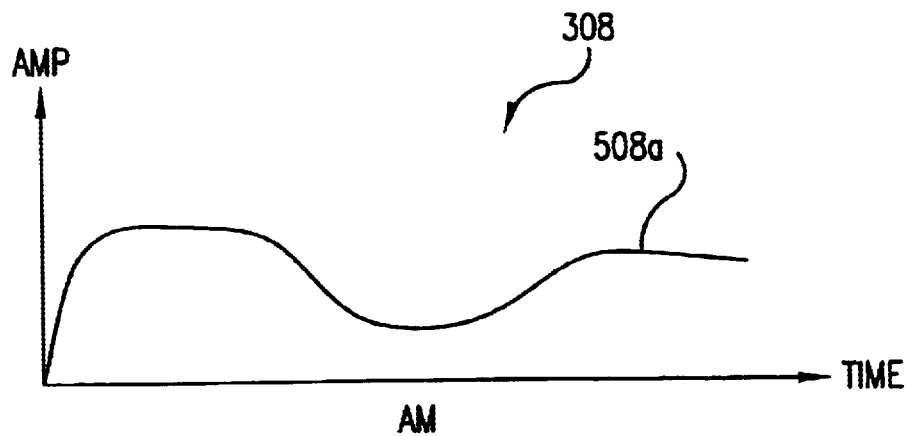
FIGS. 5B–5G depict several signal diagrams that are associated with flowchart 500 according to an embodiment of the present invention.
Figure 5C:
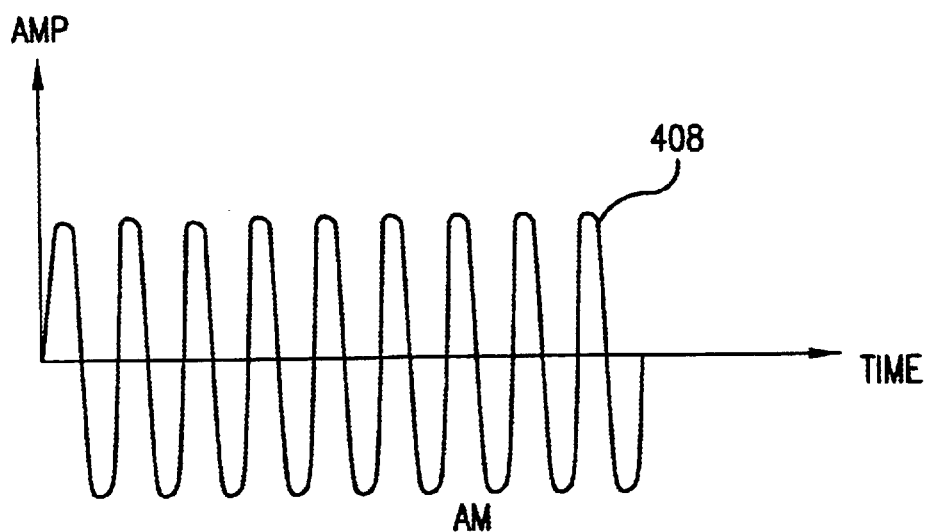
Figure 5D:
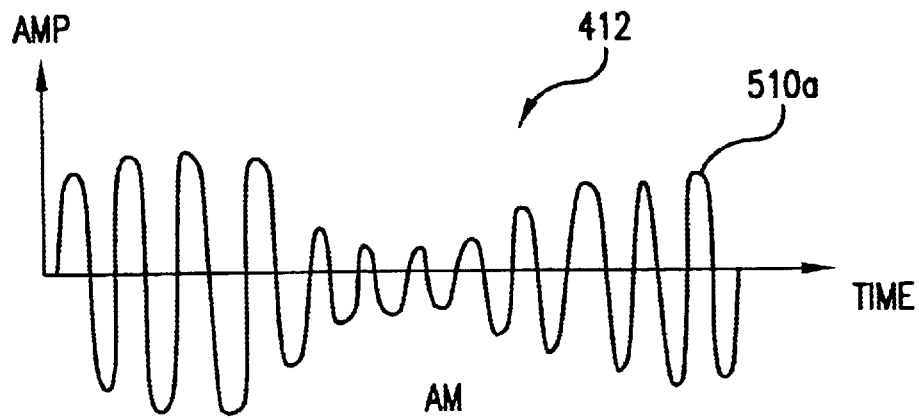
Figure 5E:
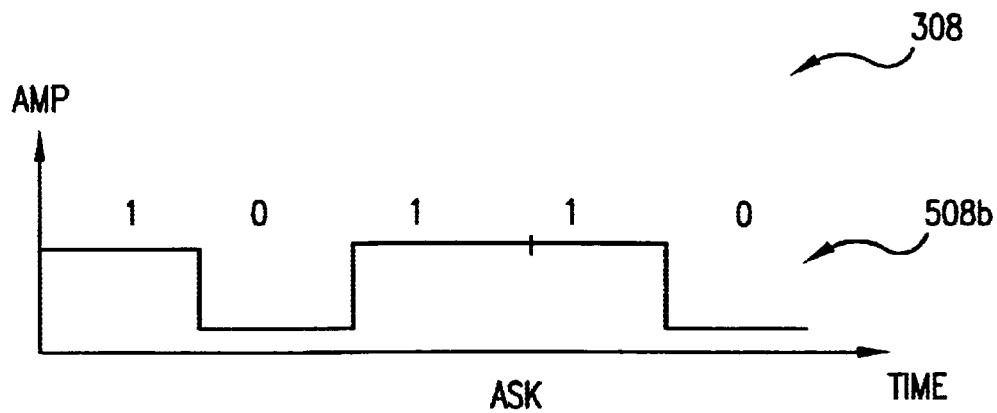
Figure 5F:
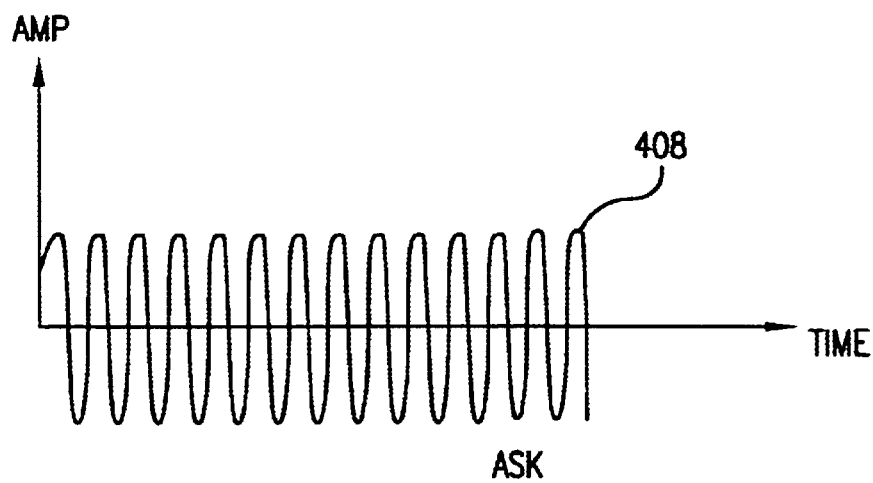
Figure 5G:
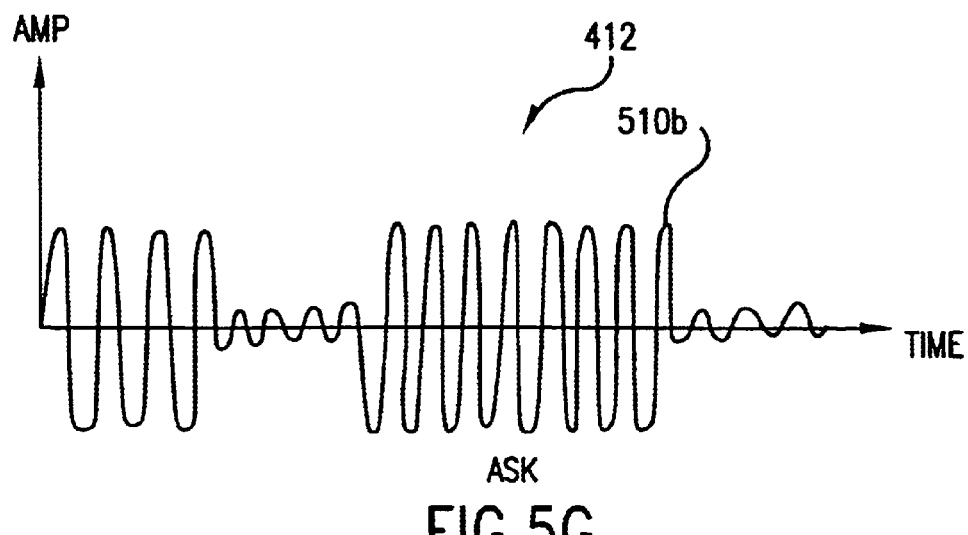

FIG. 5A depicts a flowchart 500 constituting an embodiment of the flowchart 400 of FIG. 4A. The embodiment depicted in flowchart 500 describes amplitude modulation (AM), which includes amplitude shift keying modulation (ASK). In the following discussion, the steps in flowchart 500 will be discussed in relation to the example signal diagrams shown in FIGS. 5B–5G. FIGS. 5B–5D illustrate AM, and FIGS. 5E–5G illustrate ASK modulation.

In step 302, the modulating baseband signal 308 is accepted. The modulating baseband signal 308 has been previously been described as being either an analog or digital signal. For AM, the modulating baseband signal 308 is an analog signal, which is illustrated by modulating baseband signal 508a in FIG. 5B. For ASK modulation, the modulating baseband signal 308 is a digital signal, which is illustrated by modulating baseband signal 508b in FIG. 5E.

In step 402, the first oscillating signal 408 is generated. As discussed previously, first oscillating signal 408 is substantially a sinusoid with a characteristic frequency $f_1$, and a constant amplitude. FIGS. 5C and 5F illustrate the first oscillating signal 408 for convenience.

In step 502, for AM, the amplitude of first oscillating signal 408 (FIG. 5C) is varied as a function of modulating baseband signal 508a, resulting in AM modulated signal 510a (FIG. 5D). Step 502 corresponds to step 404 in the flowchart 400 of FIG. 4A. Another way of describing AM modulation is that the amplitude of modulating baseband signal 508a is impressed on the amplitude of first oscillating signal 408. Likewise for ASK, the amplitude of the modulating baseband signal 508b is impressed on the amplitude of the first oscillating signal 408, resulting in ASK modulated signal 510b (FIG. 5G).

The difference between analog AM and ASK is seen by comparing FIG. 5D to FIG. 5G. The analog AM modulated signal 510a (FIG. 5D) has a smoothly varying amplitude "envelope". In contrast, the amplitude of the ASK modulated signal 510b shifts between two discrete levels. Furthermore, based on the forgoing discussions and illustrations, those skilled in the art(s) will recognize that the present invention can be implemented using all versions of AM.

4.2.1.2.1.1.2 Structural Description

Figure 5H:
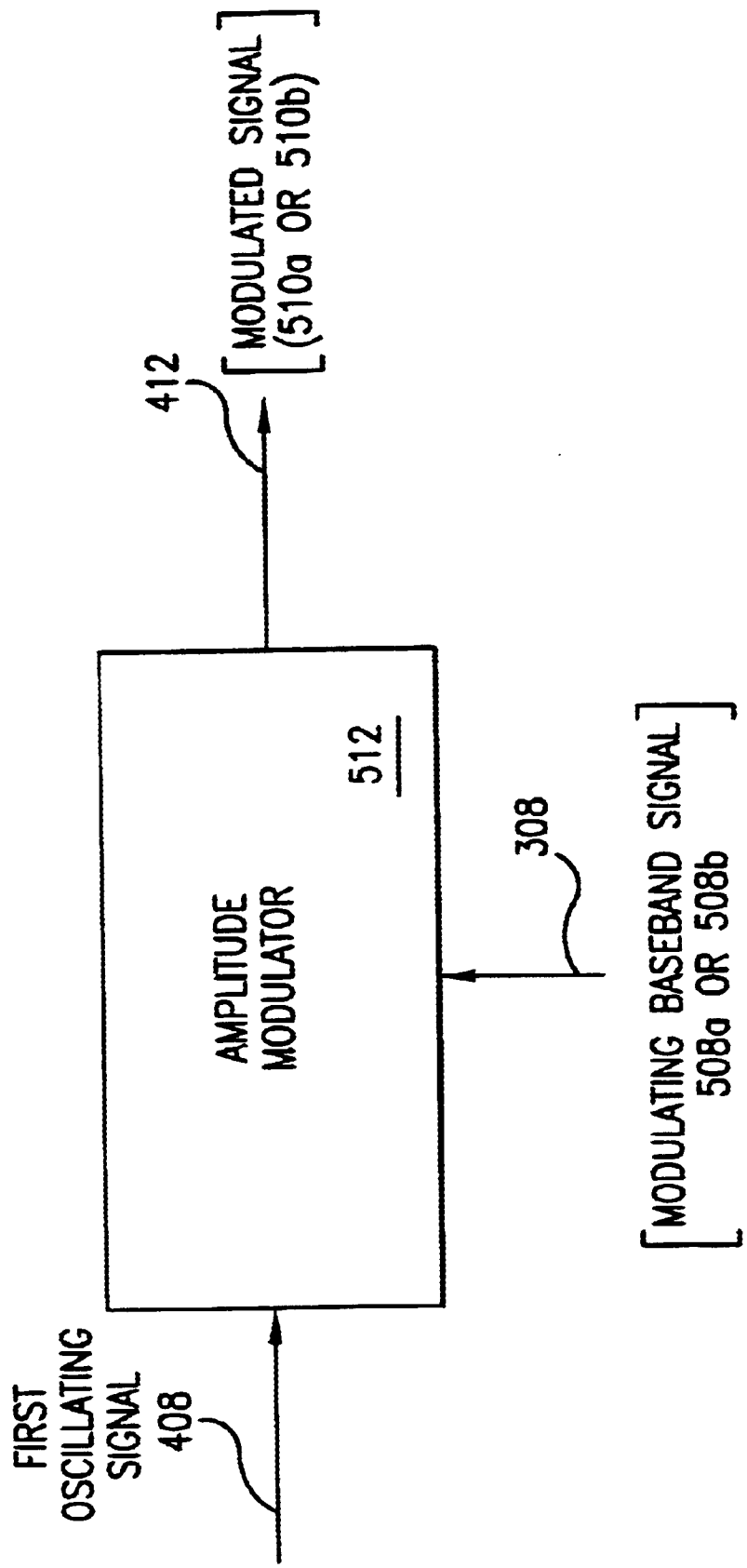
FIG. 5H depicts a structural block diagram associated with flowchart 500 according an embodiment of the present invention.

FIG. 5H illustrates an embodiment of the first stage modulator 420 in greater detail. In the embodiment of FIG. 5H, the first stage modulator 420 is an amplitude modulator 512, which implements either AM or specifically ASK modulation.

For AM, the modulating baseband signal 308 is an analog modulating baseband signal 508a. The AM modulator 512 accepts the modulating baseband signal 508a and the first oscillating signal 408. The AM modulator 512 varies the amplitude of the first oscillating signal 408 as function of the modulating baseband signal 508a, resulting in the modulated signal 510a.

For ASK modulation, the modulating baseband signal 308 is a digital modulating baseband signal 508b. The AM modulator 512 accepts the modulating baseband signal 508b and the first oscillating signal 408. The AM modulator 512 impresses the amplitude of the modulating baseband signal 508b on the amplitude of first oscillating signal 408, resulting in modulated signal 510b. The amplitude of the modulated signal 510b generally exists at discrete levels, as shown in FIG. 5G.

4.2.1.2.1.2 Second Embodiment: Frequency Modulation Mode, Including Frequency Shift Keying Mode The following discussion describes a method and system for generating redundant spectrums using frequency modulation, including frequency shift keying modulation.

4.2.1.2.1.2.1 Operational Description

Figure 6A:
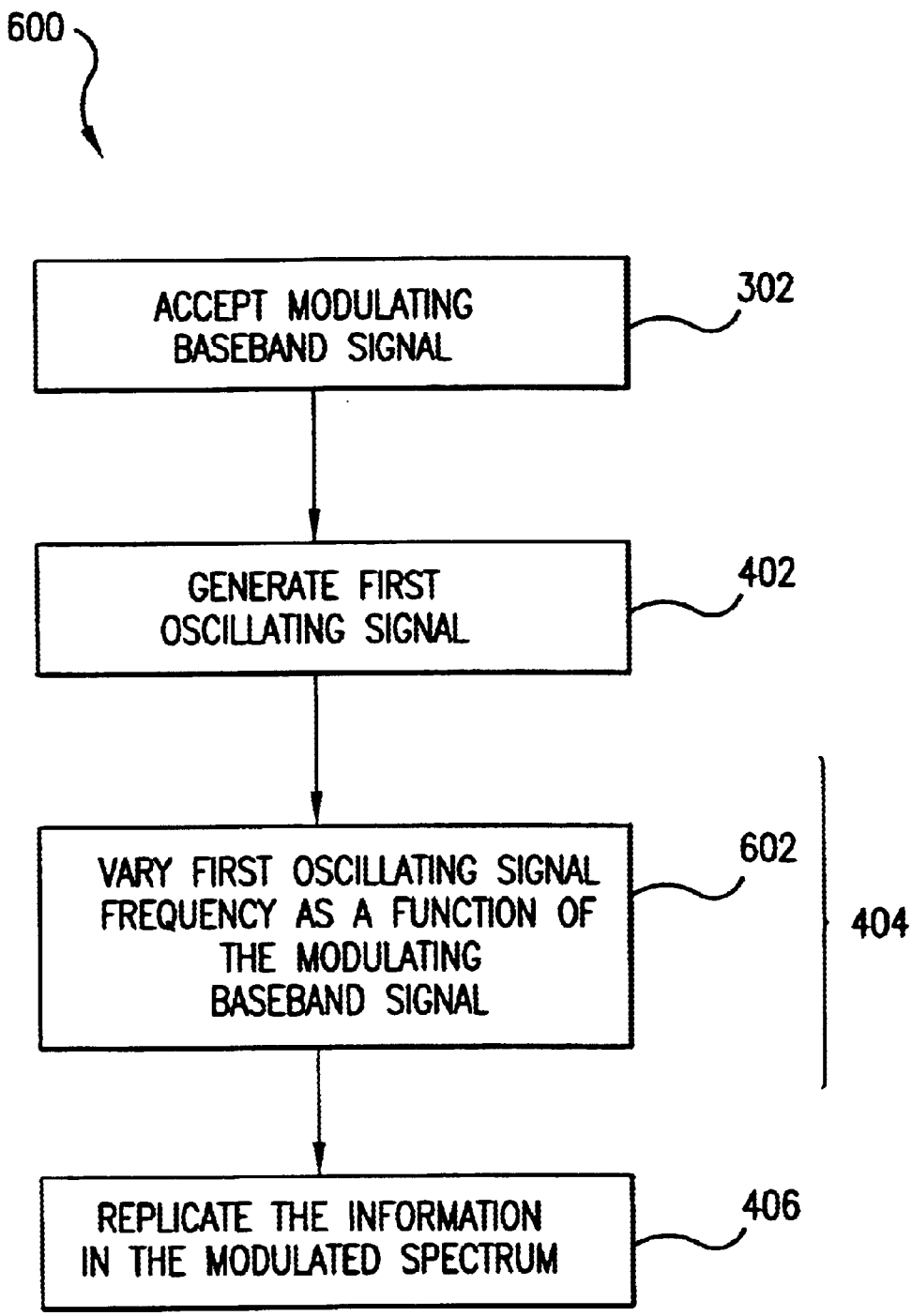
FIG. 6A depicts a flowchart 600, which illustrates frequency modulating an oscillating signal with a modulating baseband signal according to an embodiment of the present invention.
Figure 6B:
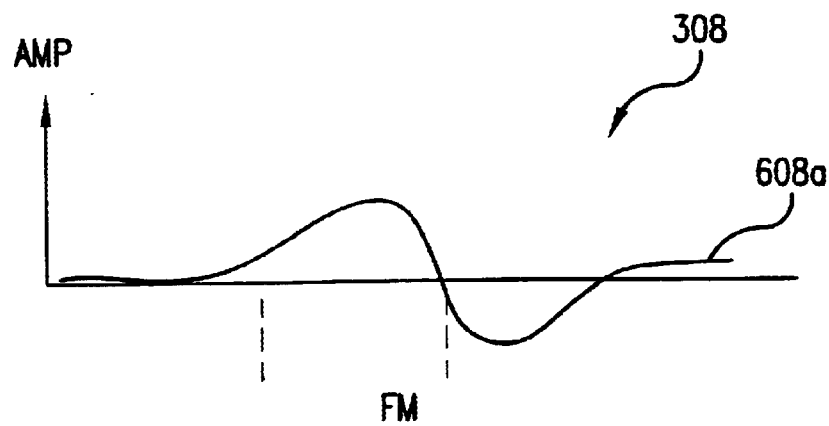
FIGS. 6B–6G depict several signal diagrams that are associated with flowchart 600 according to an embodiment of the present invention.
Figure 6C:
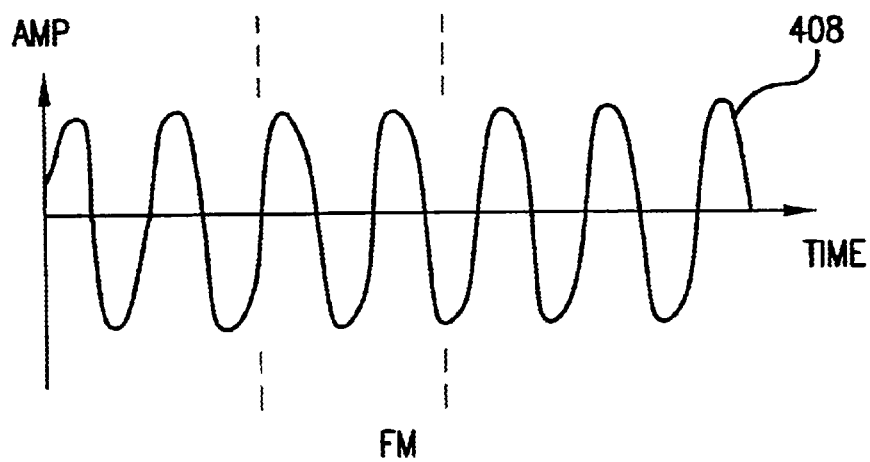
Figure 6D:
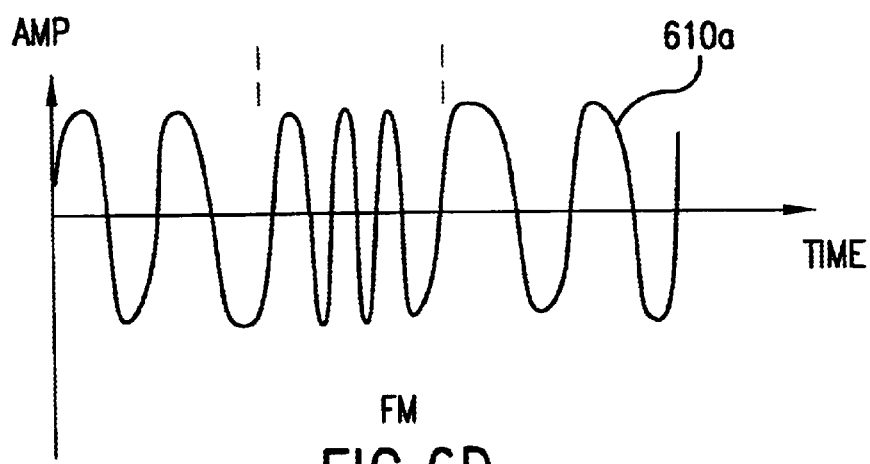
Figure 6E:
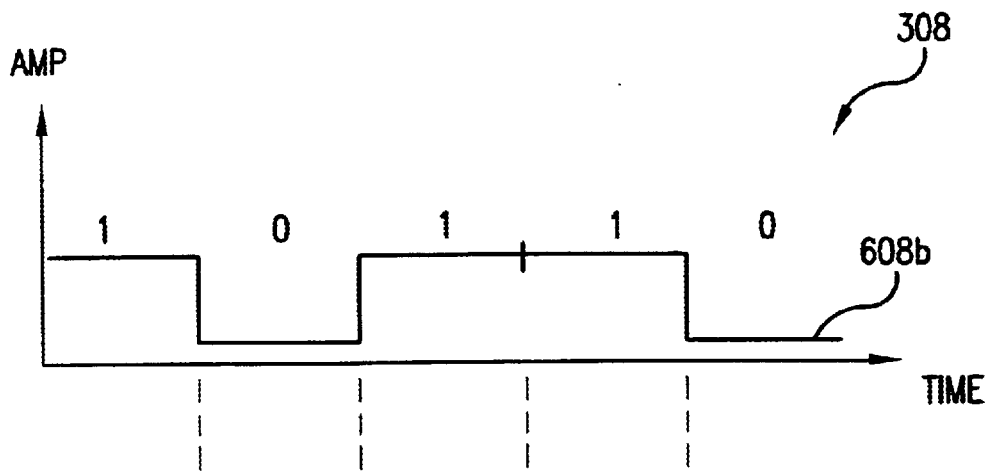
Figure 6F:
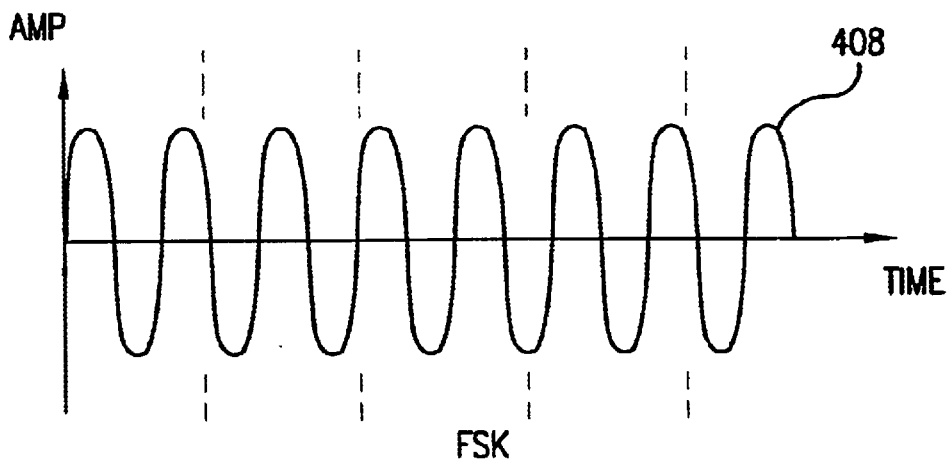
Figure 6G:
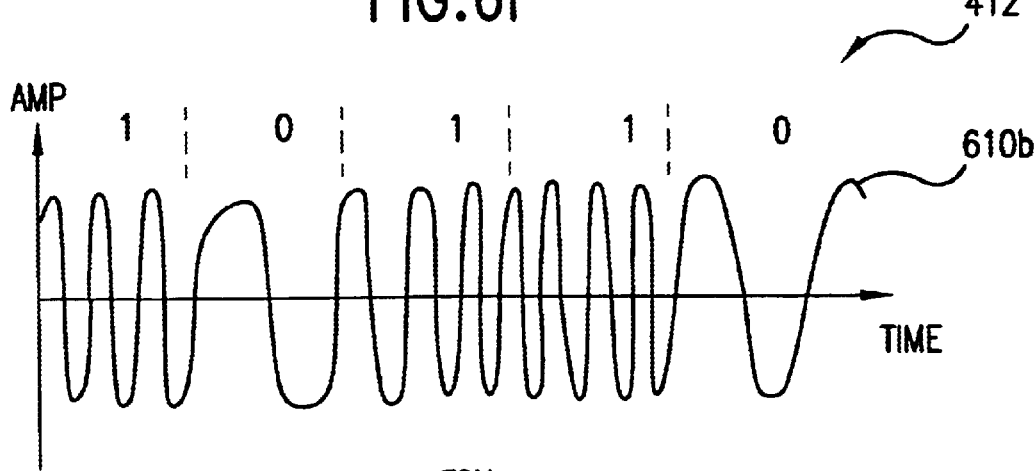

FIG. 6A depicts a flowchart 600 constituting an embodiment of the flowchart 400 of FIG. 4A. The embodiment depicted by flowchart 600 illustrates frequency modulation (FM), which includes frequency shift keying modulation (FSK). In the following discussion, the steps in flowchart 600 will be discussed in relation to the example signal diagrams shown in FIGS. 6B–6G. FIGS. 6B–6D illustrate FM modulation, and FIGS. 6E–6G illustrate FSK modulation.

In step 302, modulating baseband signal 308 is accepted. Modulating baseband signal 308 has been previously described as being either an analog or digital signal. For FM, modulating baseband signal 308 is an analog signal that is illustrated by analog modulating baseband signal 608*a* in FIG. 6B. For FSK modulation, modulating baseband signal 308 is a digital signal, which is illustrated by modulating baseband signal 608*b* in FIG. 6E.

In step 402, first oscillating signal 408 is generated. As discussed previously, first oscillating signal 408 is substantially a sinusoid with characteristic frequency $f_1$. FIGS. 6C and 6F illustrate first oscillating signal 408 for convenience.

In step 602 for FM, the frequency of first oscillating signal 408 (FIG. 6C) is varied as a function of the modulating baseband signal 608*a*, resulting in a FM modulated signal 610*a* (FIG. 6D). By comparing FIG. 6B and FIG. 6D, it can be seen that the frequency of FM modulated signal 610*a* has been varied as a function of the modulating baseband signal 608*a*.

FSK operates in step 602 in a similar fashion to the FM example described above except that the input modulating baseband signal 608*b* is a digital signal with discrete logic states. As such, FM modulated signal 610*b* exists at substantially discrete frequency states.

4.2.1.2.1.2.2 Structural Description

Figure 6H:
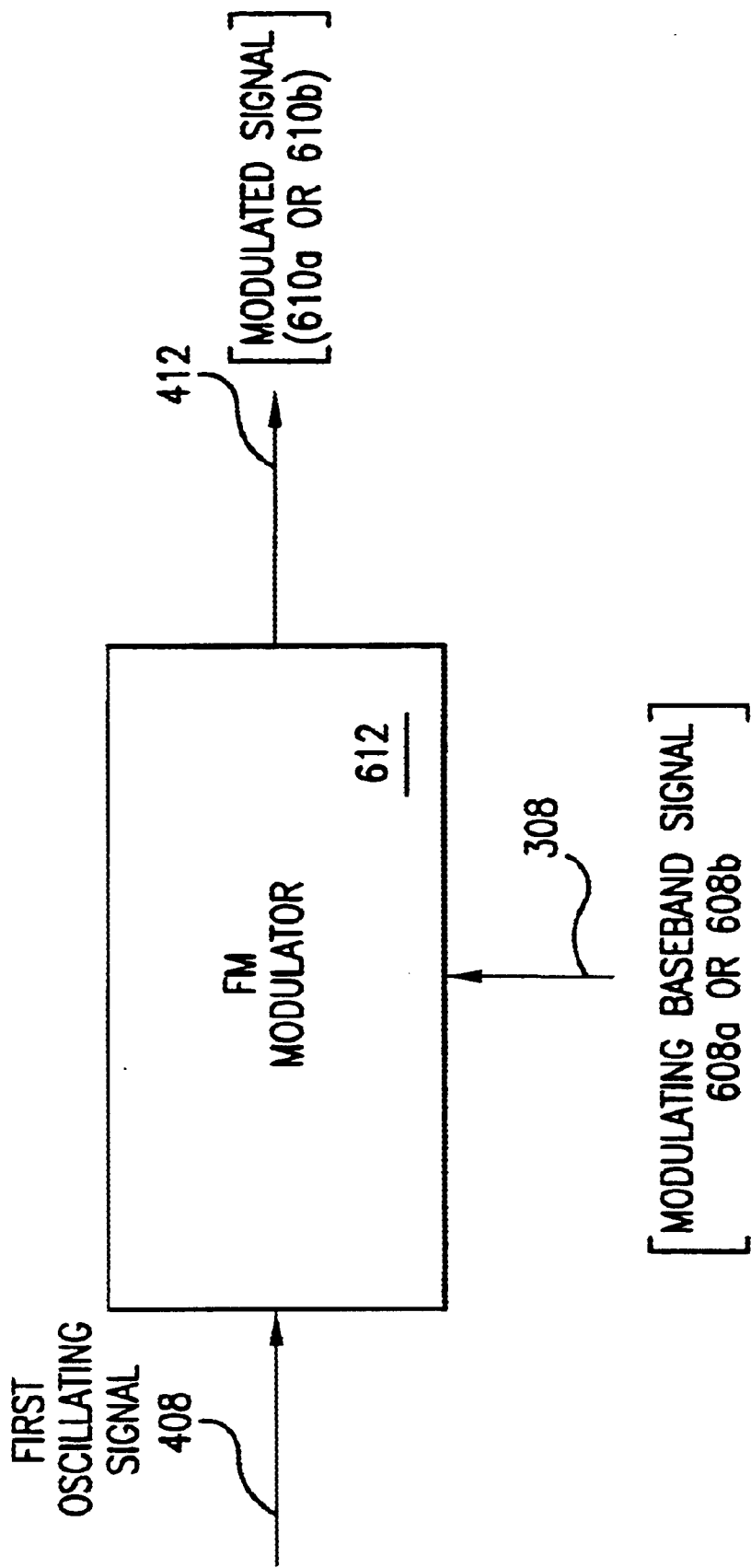
FIG. 6H depicts a structural block diagram associated with flowchart 600 according to an embodiment of the present invention.

FIG. 6H illustrates first stage modulator 420 as an FM modulator 612, which implements FM, including FSK modulation.

For FM, the modulating baseband signal 308 is an analog modulating baseband signal 608*a*. FM modulator 612 accepts modulating baseband signal 608*a* and first oscillating signal 408. FM modulator 612 varies the frequency of first oscillating signal 408 as a function of the modulating baseband signal 608*a*, resulting in FM modulated signal 610*a*.

FM modulator 612 operates similarly for FSK modulation, except that the modulating baseband signal 308 is a modulating baseband signal 608*b* with discrete logic states. Thus, the resulting FM modulated signal 610*b* has discrete frequency states.

4.2.1.2.1.3 Third Embodiment: Phase Modulation, Including Phase Shift Keying Mode The following discussion describes a method and system for generating redundant spectrums using phase modulation, including phase shift keying modulation.

4.2.1.2.1.3.1 Operational Description

Figure 7A:
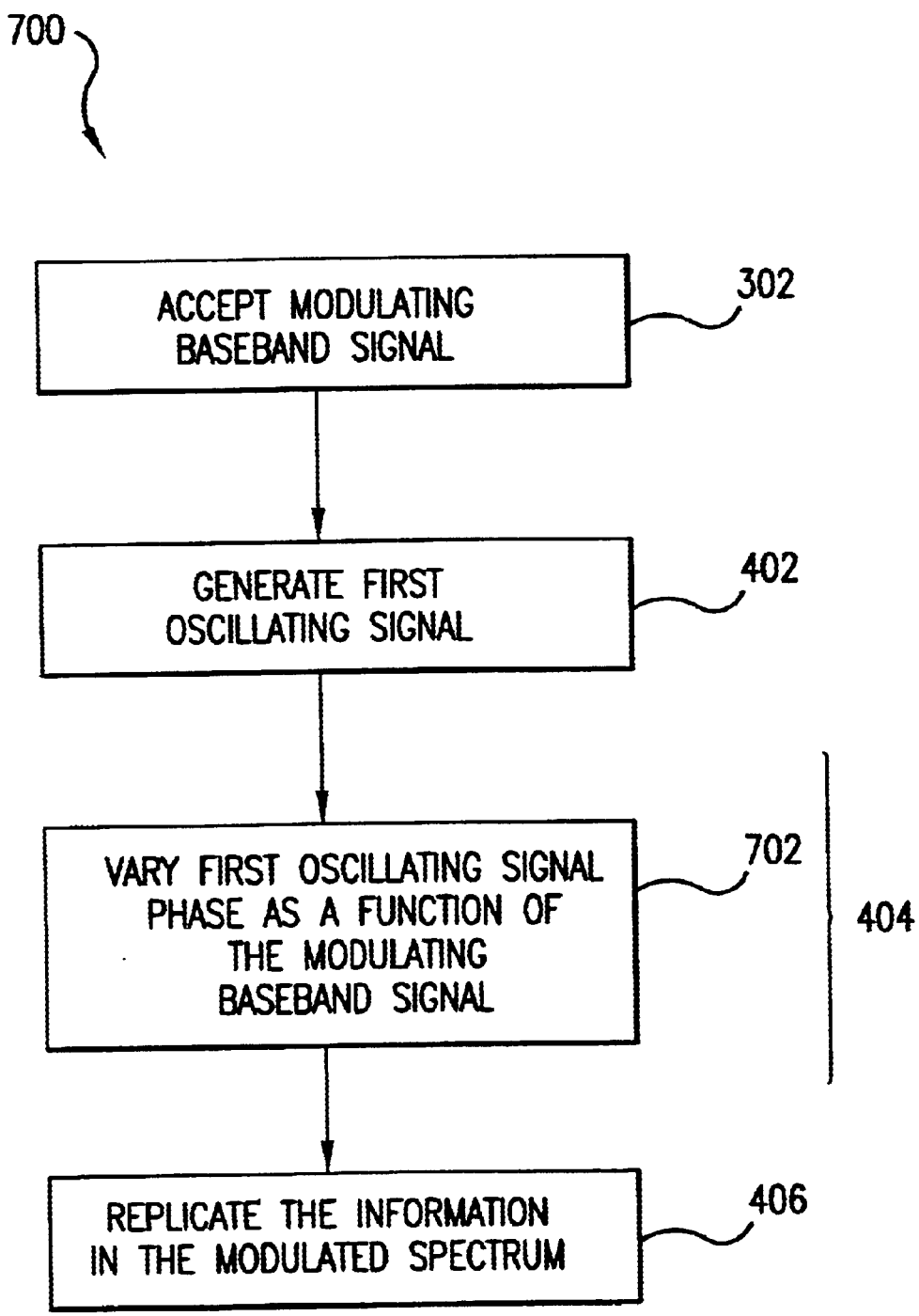
FIG. 7A depicts a flowchart 700, which illustrates phase modulating an oscillating signal with a modulating baseband signal.
Figure 7B:
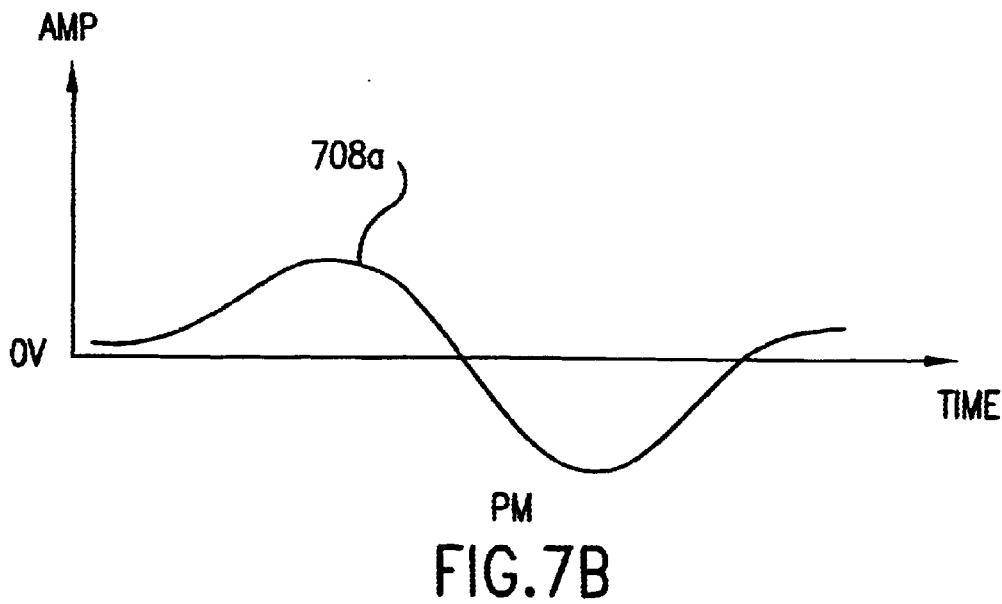
FIGS. 7B–7G depict several signal diagrams that are associated with flowchart 700.
Figure 7C:
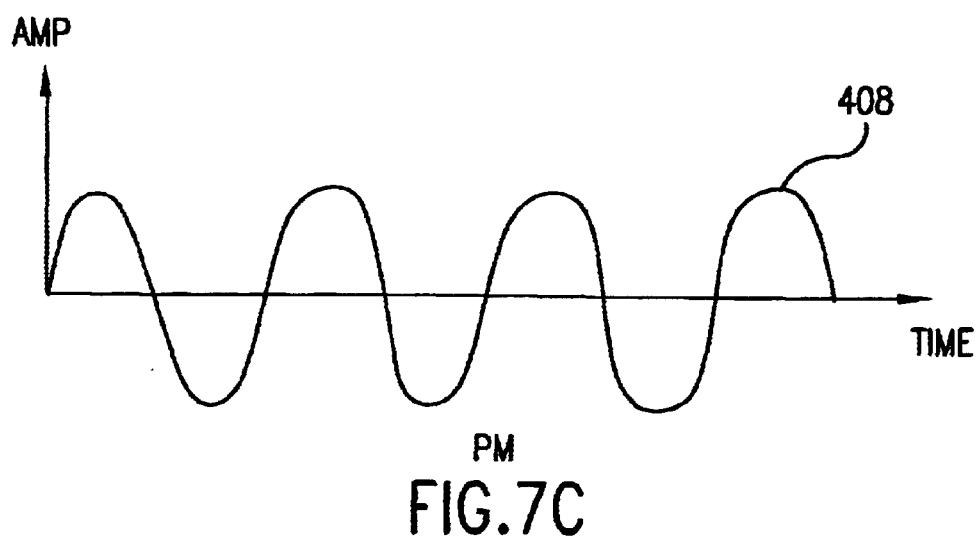
Figure 7D:
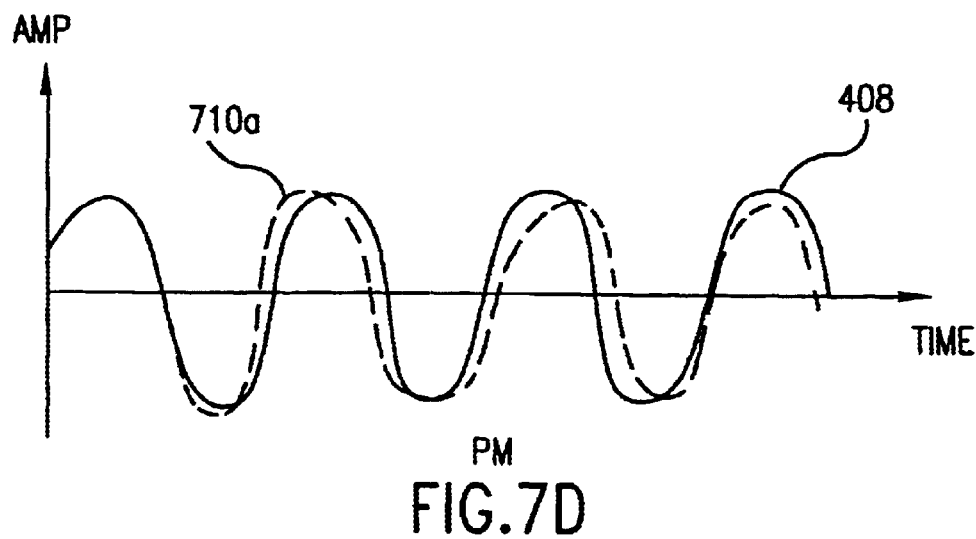
Figure 7E:
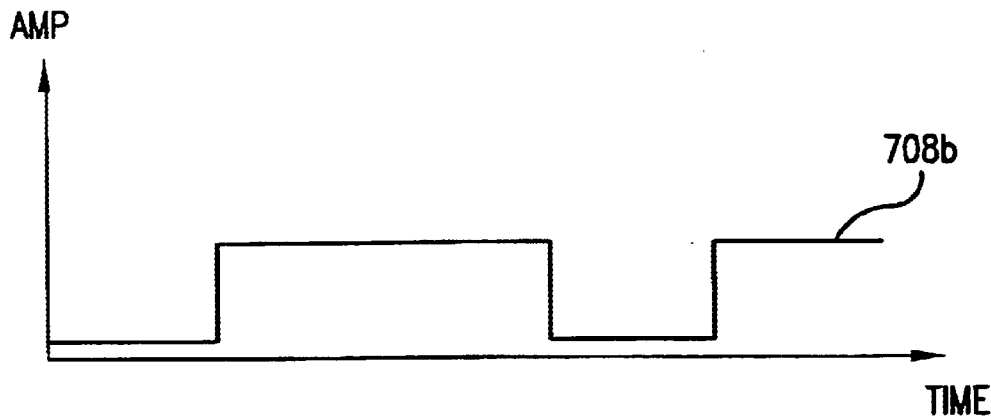
Figure 7F:
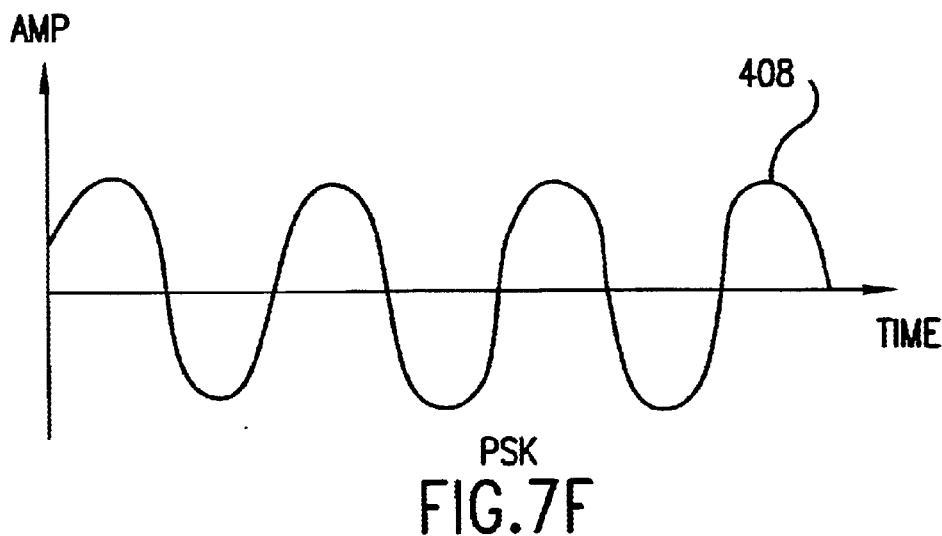
Figure 7G:
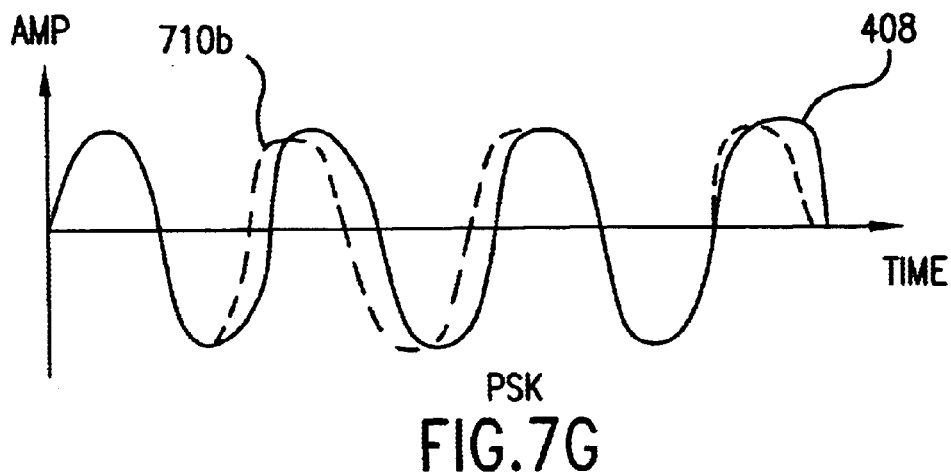

FIG. 7A depicts a flowchart 700 constituting an embodiment of flowchart 400 of FIG. 4A. The embodiment depicted by flowchart 700 illustrates phase modulation (PM), which includes phase shift keying modulation (PSK). In the following discussion, the steps in flowchart 700 will be discussed in relation to the example signal diagrams shown in FIGS. 7B–7H. FIGS. 7B–7D illustrate PM, where modulating baseband signal 308 is an analog modulating baseband signal 708*a*. FIGS. 7E–7G illustrate PSK modulation, where modulating baseband signal 308 is a digital modulating baseband signal 708*b*.

In step 302, modulating baseband signal 308 is accepted. Modulating baseband signal 308 has been previously been described as being either an analog or digital signal. For PM, modulating baseband signal 308 is an analog signal, which is illustrated by modulating baseband signal 708*a* in FIG. 7B. For PSK modulation, modulating baseband signal 308 is a digital signal, which is illustrated by modulating baseband signal 708*b* in FIG. 7E.

In step 402, first oscillating signal 408 is generated. As discussed previously, first oscillating signal 402 is substantially a sinusoid with a characteristic frequency $f_1$. FIGS. 7C and 7F illustrate first oscillating signal 408 for convenience.

In step 702 for PM, the phase of first oscillating signal 408 (FIG. 7C) is varied as a function of modulating baseband signal 708*a*, resulting in an PM modulated signal 710*a* (FIG. 7D). FIG. 7D illustrates both PM modulated signal 710*a*, and the first oscillating signal 408 to illustrate the phase shift of PM modulated signal 710*a* relative to first oscillating signal 408. A comparison of FIG. 7B and FIG. 7D shows the modulated signal 710*a* having a phase shift relative to first oscillating signal 408 that is a function of modulating baseband signal 708*a*.

PSK operates in step 702 in a similar fashion to PM, except that the input modulating baseband signal 708*b* is a signal with discrete states. As shown by comparing FIG. 7E to FIG. 7G, in one embodiment, phase modulated signal 710*b* leads the first oscillating signal 408 to represent a logic "1", and is in-phase with first oscillating signal 408 to represent a logic "0". Those skilled in the art(s) will recognize that the amount and direction of phase shift implemented to represent a logic state is completely arbitrary.

4.2.1.2.1.3.2 Structural Description

Figure 7H:
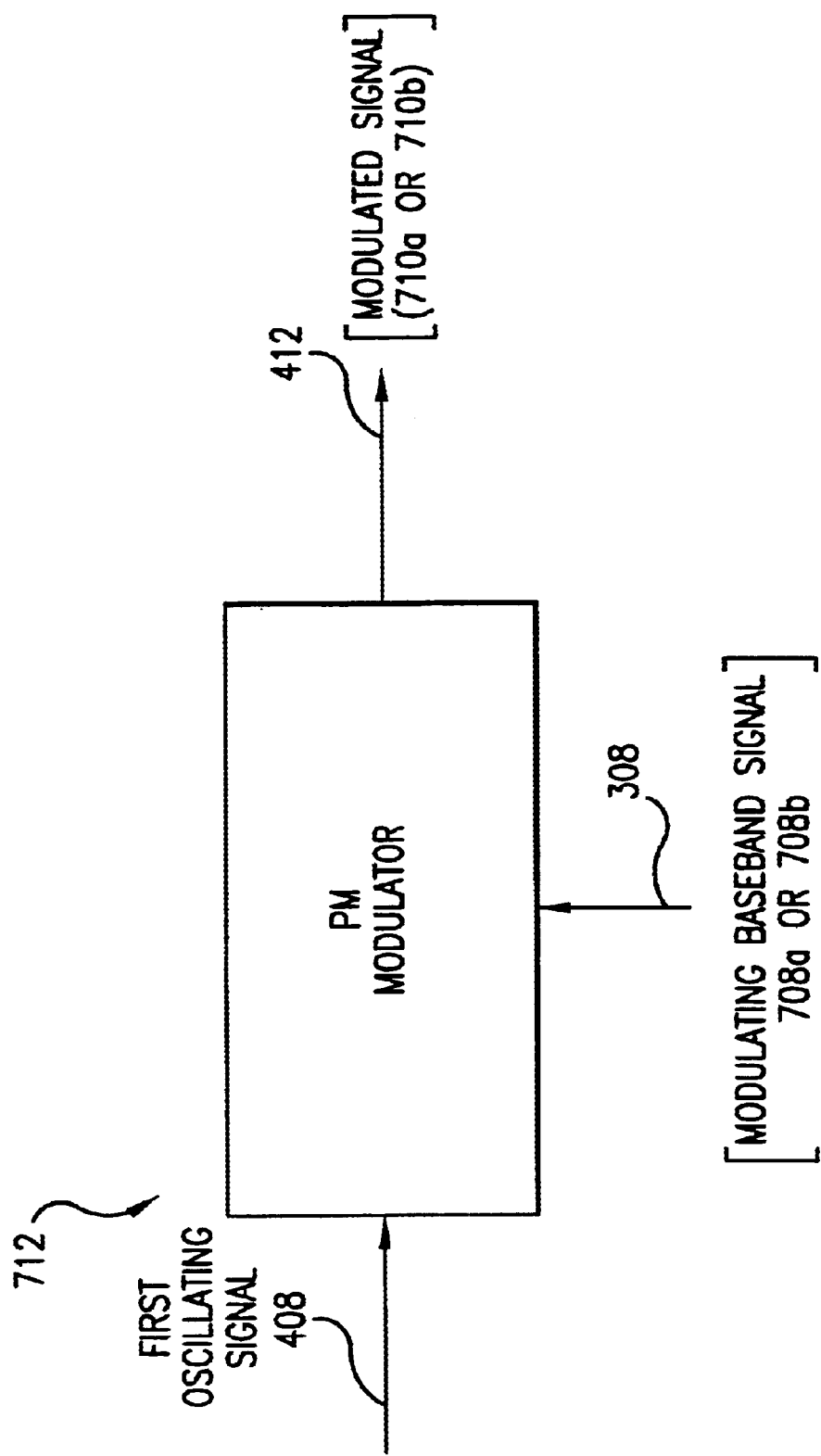
FIG. 7H depicts a structural block diagram associated with flowchart 700 according to an embodiment of the present invention.

FIG. 7H illustrates first stage modulator 420 as an PM modulator 712, which implements PM, including PSK modulation.

For PM modulation, PM modulator 712 accepts modulating baseband signal 708*a* and first oscillating signal 408, where modulating baseband signal 708*a* is an analog modulating baseband signal. PM modulator 712 shifts the phase of first oscillating signal 408 as a function of the modulating baseband signal 708*a*, resulting in modulated signal 710*a*.

PM modulator 712 operates similarly for PSK modulation, except that the modulating baseband signal 308 is a digital modulating baseband signal 708*b* with logic states. As such, PM modulator 712 generates a PSK modulated signal 710*b* with a phase that varies in discrete steps relative to that of first oscillating signal 408 in order to represent the logic states of modulating baseband signal 308. The amount and direction of phase shift implemented to represent a logic state is completely arbitrary.

4.2.1.2.1.4 Other Embodiments

The embodiments described above for first stage modulator 420 are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include combinations of the embodiments described above. Such alternate embodiments fall within the scope and spirit of the present invention.

5 4.2.1.2.2 Second Stage Modulator (Replicator Modulator)

Example embodiments of step 406 in flowchart 400 (FIG. 4A), and replicator module 422 (FIG. 4I) will be discussed in the following section and subsections. The example embodiments include replicating the modulated spectrum 414 by modulating the modulated signal 412 with a second oscillating signal to generate redundant spectrums 416*a–n*. Preferably, the modulated signal 412 is phase or frequency modulated with the second oscillating signal, although other modulation schemes could be used including but not limited to amplitude modulation.

4.2.1.2.2.1 First embodiment: Replicating the Modulated Spectrum by Phase Modulating the Modulated Signal The following discussion describes a method and system for replicating modulated spectrum 414 by phase modulating corresponding modulated signal 412 to generate redundant spectrums 416*a–n* with substantially the same information content.

4.2.1.2.2.1.1 Operational Description

Figure 8A:
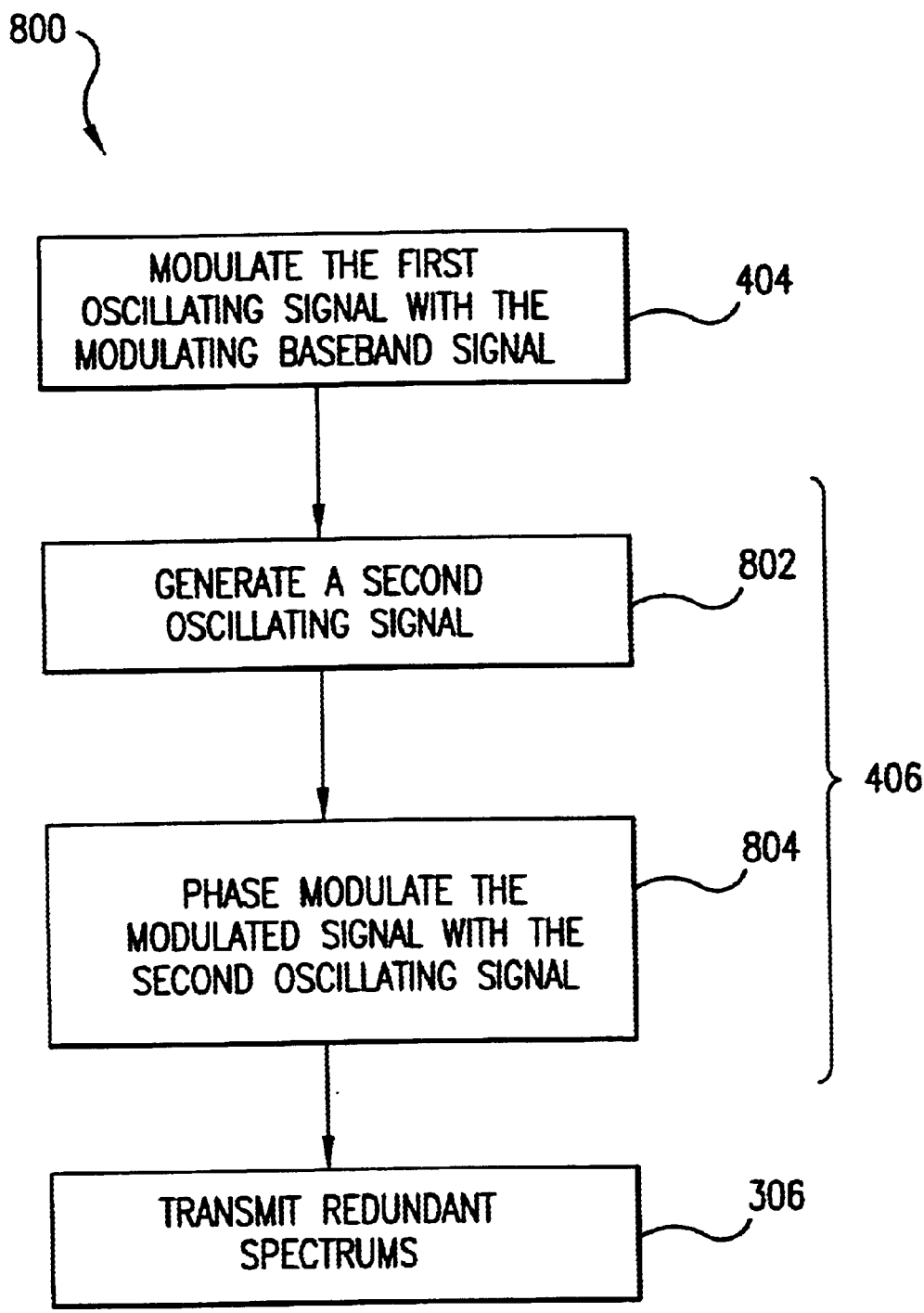
FIG. 8A depicts a flowchart 800, which illustrates phase modulating a modulated signal with a second oscillating signal to generate redundant spectrums according to an embodiment of the present invention.

FIG. 8A depicts a flowchart 800 which illustrates in greater detail the step 406 in flowchart 400. Step 406 generates multiple redundant spectrums 416a–n with substantially the same information content by replicating modulated spectrum 414. In the following discussion, the steps in flowchart 800 will be discussed in relation to the example signal diagrams shown in FIGS. 8B–8E.

Figure 8B:
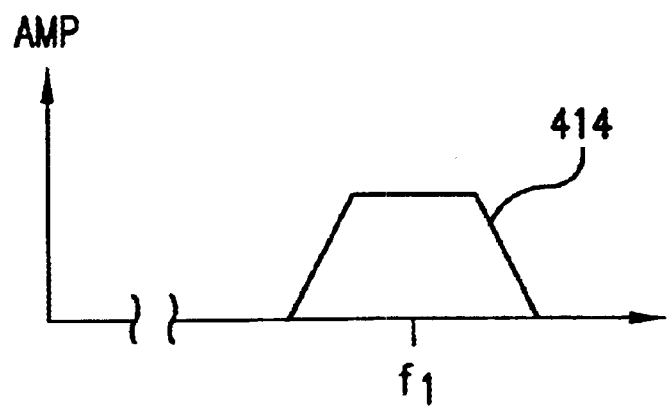

In step 404, the first oscillating signal 408 is modulated with the modulating baseband signal 308 to generate the modulated signal 412 with corresponding modulated spectrum 414 (FIG. 8B). Modulated spectrum 414 includes the necessary amplitude, phase, and frequency information to reconstruct modulating baseband signal 308. This step was discussed earlier, but is repeated here for convenience.

It should be remembered that the frequency spectrum of an EM signal comprises the relative amplitude and phase information of the frequency components that constitute the EM signal. The time domain representation of an EM signal can be constructed by generating a plurality of sine waves, that implement the relative amplitude and phase contained in the frequency spectrum of the EM signal. As such, a given EM signal is uniquely identified by either its time-domain representation or its frequency spectrum.

In step 802, a second oscillating signal 806 (FIG. 8C) with a characteristic frequency $f_2$ is generated. Second oscillating signal 806 is substantially periodic, with a period 808 equal to $1/f_2$.

Figure 8C:
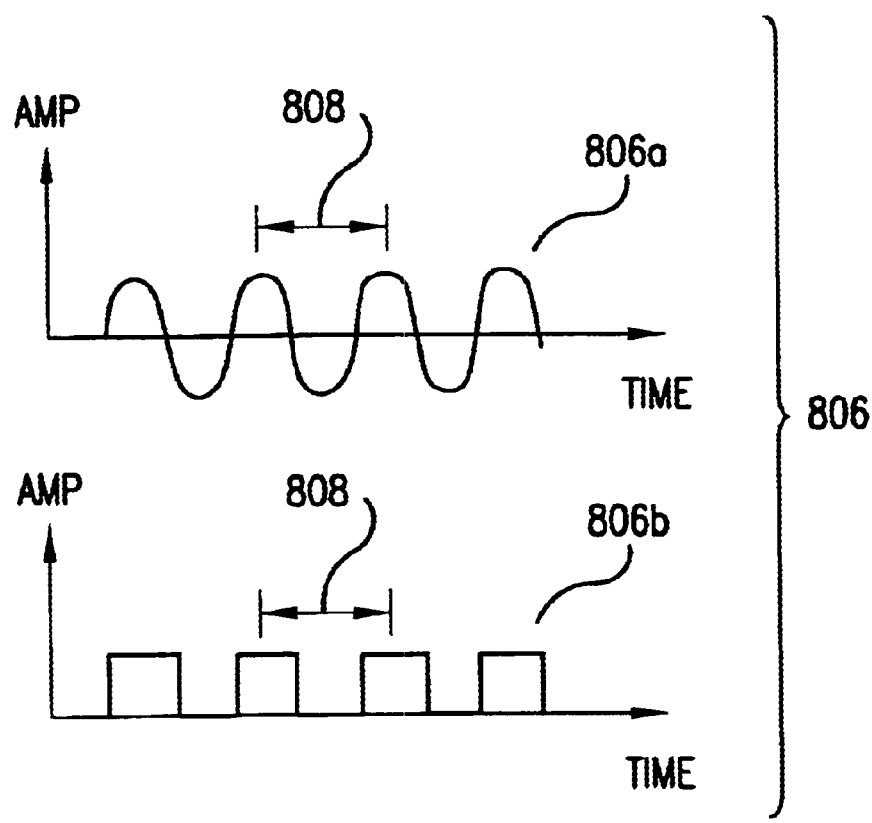

FIG. 8C illustrates without limitation two exemplary waveforms for second oscillating signal 806. These waveforms being sinusoid 806a and square wave 806b, both of which are periodic with frequency $f_2$. Those skilled in the art will recognize there are other types of periodic second oscillating signals that could be alternatively used to implement second oscillating signal 806, including but not limited to sinusoids, square waves, triangle waves, and arbitrary waveforms with a period equal to $1/f_2$.

Figure 8D:
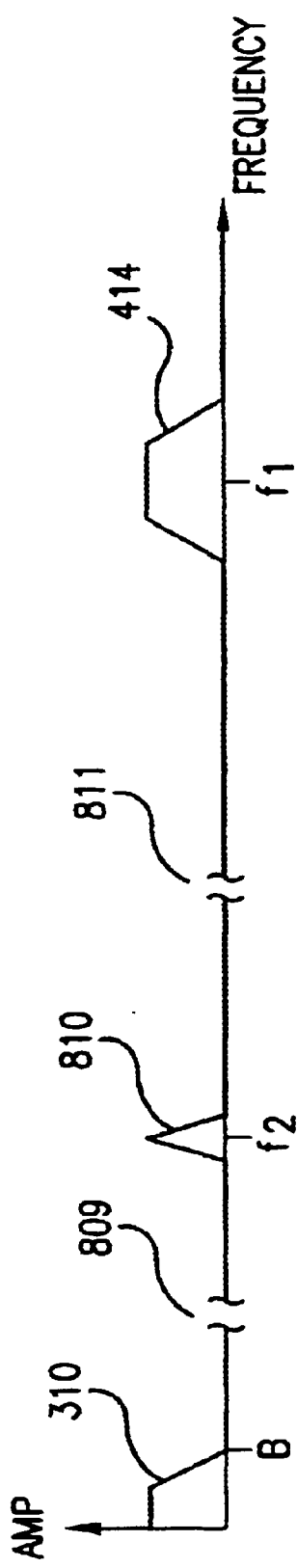

Second oscillating signal 806 has corresponding second oscillating signal spectrum 810 that is centered about $f_2$, and is depicted in FIG. 8D. Second oscillating signal spectrum 810 has a generic shape that is shown for illustration purposes only, and is not intended to limit second oscillating signal 806 in any way. Those skilled in the art will recognize that the actual shape of spectrum 810 is dependent on the specific implementation of second oscillating signal 806.

FIG. 8D also illustrates modulating baseband signal spectrum 310 that corresponds to modulating baseband signal 308, and modulated spectrum 414 that corresponds to modulated signal 412 (FIG. 4F). It will be recalled that modulated signal 412 was generated by modulating first oscillating signal 408 with modulating baseband signal 308 in step 404 of FIG. 4A. Preferably, second oscillating signal spectrum 810 exists at a substantially higher frequency than modulating baseband signal spectrum 310, which is represented by break 809 in the frequency axis of FIG. 8D. Also typically, modulated spectrum 414 exists at a substantially higher frequency than second oscillating signal spectrum 810, which is represented by break 811 in the frequency axis of FIG. 8E. For example and without limitation, spectrum 310 may have a bandwidth B on the order of 10 KHZ. Whereas, second oscillating signal spectrum 810 may have a center frequency $f_2$ on the order of 1 MHZ for this example, and modulated spectrum 414 may have a center frequency $f_1$ on the order of 100 MHZ for this example.

Figure 8E:
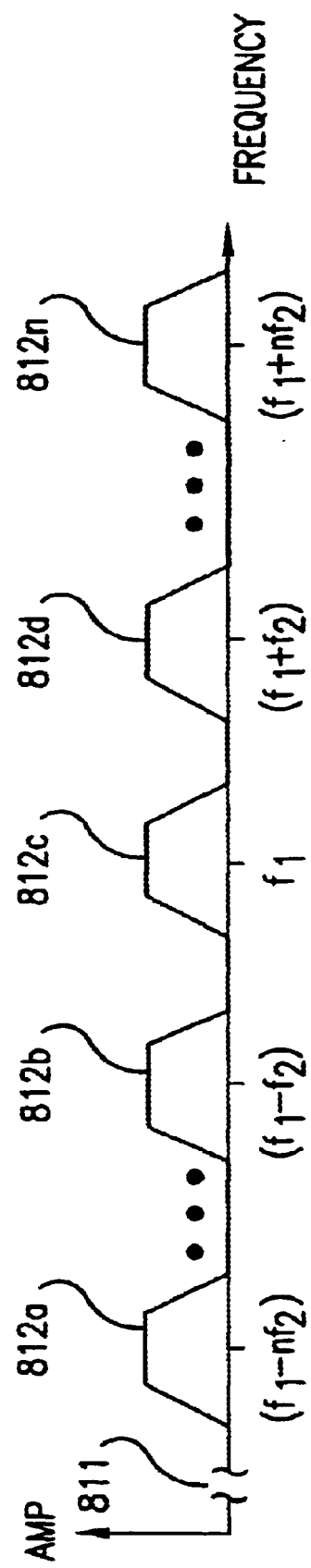
Figure 81:
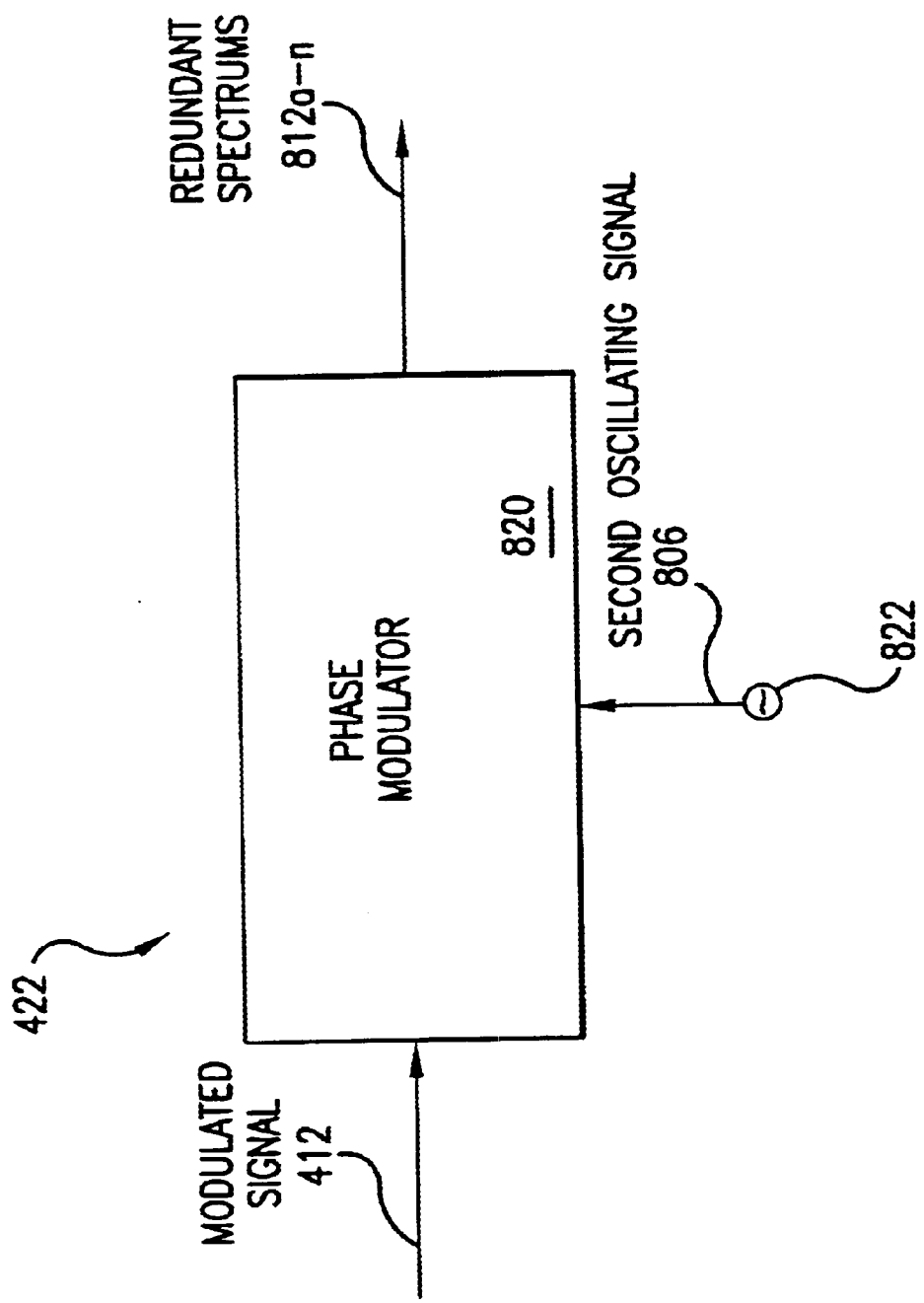

In step 804, modulated signal 412 (having spectrum 414) is phase modulated with second oscillating signal 806 (having spectrum 810), resulting in redundant spectrums 812a–n (FIG. 8E). The effect of phase modulating modulated signal 412 with a periodic second oscillating signal is to shift the phase of modulated signal 412 at the periodic rate $f_2$ of the second oscillating signal.

FIGS. 8F–8H illustrate phase modulation of a modulated signal 814 by a second oscillating signal 816, resulting in signal 818. Modulated signal 814 is an example of modulated signal 414, and second oscillating signal 816 is an example of second oscillating signal 806. As shown, signal 818 is shifted by 180 degrees relative to modulated signal 814 at each transition of second oscillating signal 816. The phase shift of 180 degrees was chosen for convenience of illustration only. Other phase shifts could be alternatively be used. In one embodiment, for example, the amount of phase shift is on the order of 10 degrees.

FIGS. 8F–8H are shown to illustrate the effect of phase modulation on modulated signal 814. But for ease of illustration, FIGS. 8F–8G are not drawn to proper scale. For example and without limitation, modulated signal 814 is shown to have a approximately 5 cycles of period 815 to represent a logic state. Typically, on the order of 10,000 cycles would be used. Furthermore, modulated signal 814 is illustrated to have a period 815 that is approximately 1/5 the period 817 of second oscillating signal 816, which would result in a modulated signal 814 to second oscillating signal 816 frequency ratio of 5:1. A typical modulated signal 814 to second oscillating signal 816 frequency ratio would be, for example, on the order to 100:1. Thus, an accurate representation of this numerical example would show 100 periods of modulated signal 814 within second oscillating signal period 816. This is not shown to ease illustration.

Referring to FIG. 8E, each redundant spectrum 812a–n carries substantially identical information to that in modulated spectrum 414. As such, each redundant spectrum 812a–n includes the necessary amplitude, phase, and frequency information to substantially reconstruct the modulating baseband signal 308. Thus, any one of the redundant spectrums 812a–d can be used to reconstruct modulating baseband signal 308 at the receiver.

As shown in FIG. 8E, redundant spectrum 812a–n are substantially centered around $f_1$, which is the characteristic frequency of first oscillating signal 408. Also, each redundant spectrum 812a–n (except for spectrum 812c) is offset from $f_1$ by approximately a multiple of $f_2$ (Hz), where $f_2$ is the frequency of second oscillating signal 806. Thus, each redundant spectrum 812a–n is offset from an adjacent redundant spectrum 812a–n in frequency by approximately $f_2$ Hz. For example, redundant spectrum 812c is centered around $f_1$, and redundant spectrums 812b and 812d are centered at $f_1-f_2$ and $f_1+f_2$, respectively.

As stated earlier, example values for $f_1$ and $f_2$ are on the order of 100 MHZ and 1 MHZ, respectively. As such, spectrums 812b–d would be located at 99 MHZ, 100 MHz, and 101 MHZ, respectively. Thus, according this numerical example, spectrums 812b–d occupy approximately 3 MHZ of bandwidth that is centered around 100 MHZ; which can be considered sufficiently narrowband to use commercially under the rules of the appropriate governmental administrative agency (i.e. the FCC). These numerical examples are given for illustration purposes only, and are not meant to limit this invention in any way. Those skilled in the art will recognize that the invention could be operated at other frequencies based on the discussion herein. In other words, the those skilled in the art(s) will recognize that the invention could be optimized and/or adjusted as desired to meet specific electromagnetic emission rules or other criteria that may exist.

In step 306, the redundant spectrums 812a–n are transmitted over a communications medium. It is expected, but not required, that the redundant spectrums 812a–n would be generated at a first location and sent to a second location over the communications medium. At the second location, the redundant spectrums would be processed to reconstruct the modulating baseband signal 308. In one embodiment, the communications medium is a wireless communications link.

4.2.1.2.2.1.2 Structural Description

FIG. 8I illustrates a block diagram of the replicator system 422 according to one embodiment of the present invention. The replicator system 422 comprises a phase modulator 820 and an second oscillator 822. Preferably, replicator system 422 accepts a modulated signal 412 and generates multiple redundant spectrums 812a–n in the manner shown in operational flowchart 800. In other words, the replicator system 422 is a structural embodiment for performing the operational steps in flowchart 300. However, it should be understood that the scope and spirit of the present invention includes other structural embodiments for performing steps in flowchart 800. The specifics of these other structural embodiments will be apparent to persons skilled in the relevant art(s) based on the discussion contain herein. Flowchart 800 will re-visited to further illustrate the present invention in view of the structural components in replicator 422.

In step 404, first stage modulator 420 (FIG. 4I) modulates first oscillating signal 408 with the modulating baseband signal 308 to generate the modulated signal 412 with corresponding modulated spectrum 414. Modulated spectrum 414 includes the necessary amplitude, phase, and frequency information of the frequency to reconstruct modulating baseband signal 308. This step was discussed earlier, but is repeated here for convenience.

In step 802, second oscillator 822 generates the second oscillating signal 806 (FIG. 8C) with a characteristic frequency $f_2$. Second oscillating signal 806 is periodic with a period 808 equal to $1/f_2$.

In step 804, phase modulator 820 shifts the phase of modulated signal 412 as a function of second oscillating signal 806, resulting in redundant spectrums 812a–n (FIG. 8E).

In step 306, the (optional) medium interface module 320 transmits redundant spectrums 812a–n over communications medium 322. It is expected, but not required, that the redundant spectrums 812a–n would be generated at a first location and sent to a second location over the communications medium. At the second location, the redundant spectrums would be processed to recover the modulating baseband signal 308. In one embodiment, the communications medium 322 is a wireless communications link.

4.2.1.2.2.2 Second embodiment: Replicating the Modulated Spectrum by Frequency Modulating the Modulated Signal The following discussion describes a method and system for replicating modulated spectrum 414 by frequency modulating corresponding modulated signal 412 to generate redundant spectrums 416a–n with substantially the same information content.

4.2.1.2.2.2.1 Operational Description

Figure 8J:
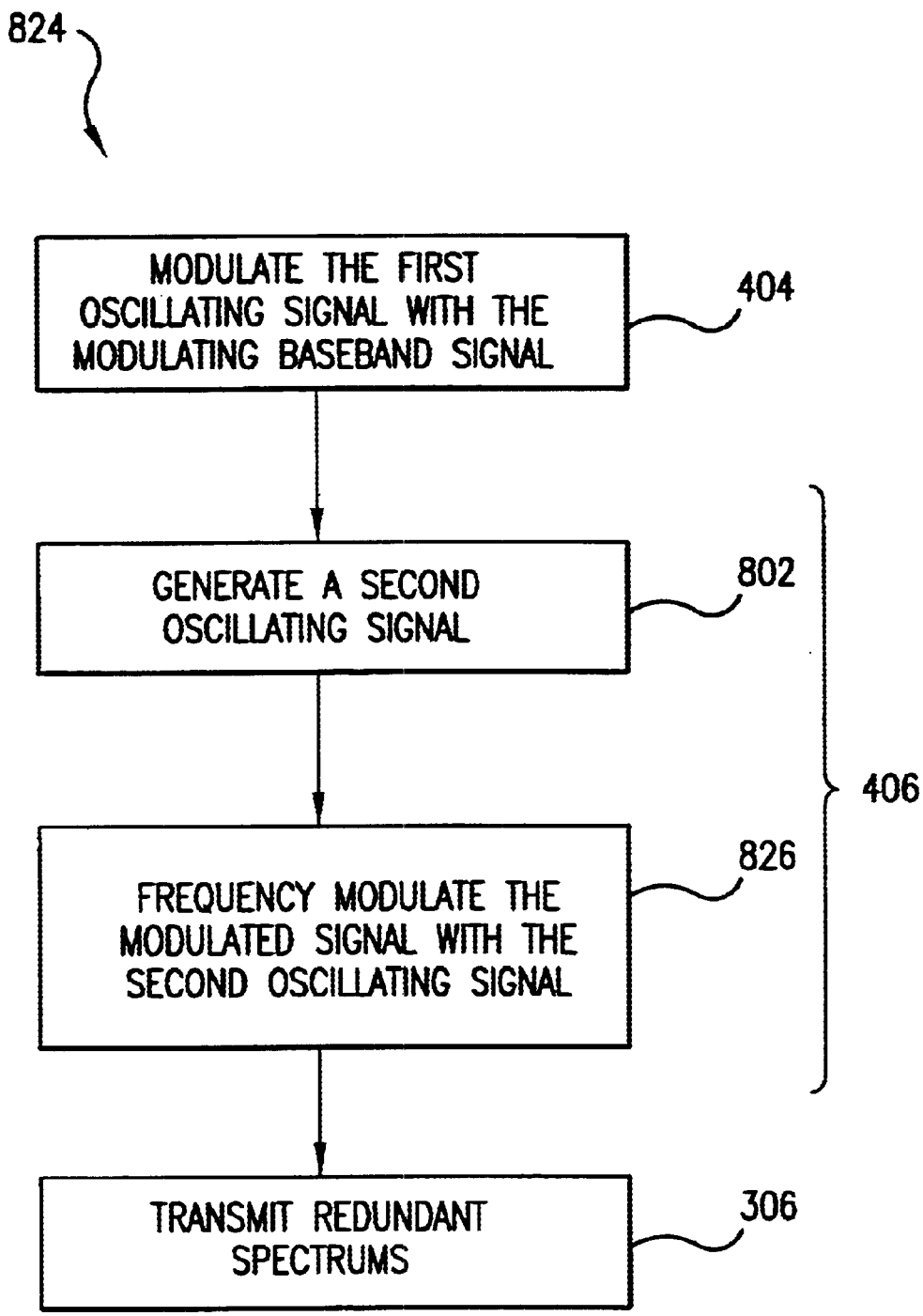
FIG. 8J depicts a flowchart 824, which illustrates frequency modulating a modulated signal with an oscillating signal according to an embodiment of the present invention.

FIG. 8J depicts a flowchart 824 which illustrates in greater detail the step 406 in flowchart 400. Step 406 generates multiple redundant spectrums 416a–n with substantially the same information content by replicating modulated spectrum 414. In the following discussion, the steps in flowchart 826 will be discussed in relation to the example signal diagrams shown in FIGS. 8B–8E. FIGS. 8B–8E were discussed in relation to the first embodiment of generating redundant spectrums by phase modulating modulated signal 412, but are also applicable to the present embodiment of frequency modulating the modulated signal 412.

In step 404, the first oscillating signal 408 is modulated with the modulating baseband signal 308, resulting in the modulated signal 412 with corresponding modulated spectrum 414 (FIG. 8B). This step was discussed earlier in FIG. 4A, but is repeated here for convenience.

In step 802, a second oscillating signal 806 (FIG. 8C) with a characteristic frequency $f_2$ is generated. This step was discussed earlier in FIG. 8A, but is repeated here for convenience. Preferably, second oscillating signal 806 is substantially periodic, with a period 808 equal to $1/f_2$. Also, preferably, $f_2$ for second oscillating signal is substantially higher that the highest frequency of baseband spectrum 310, but is substantially lower than $f_1$ for the first oscillating signal as represented in FIG. 8D.

In step 826, modulated signal 412 (having spectrum 414) is frequency modulated with second oscillating signal 806 (having spectrum 810). In other words, the frequency of modulated signal 412 is varied as a function of second oscillating signal 806, resulting in redundant spectrums 812a–n. Each redundant spectrum 812a–n includes the necessary amplitude, phase, and frequency information to reconstruct modulating baseband signal 308. As stated, frequency modulating the modulated signal 412 with the second oscillating signal 806 (step 826) results in redundant spectrums 812a–n that are substantially similar to that obtained by phase modulating modulated signal 412 with the second oscillating signal 806 (step 804 in FIG. 8A).

In step 306, the redundant spectrums 812a–n are transmitted over a communications medium. It is expected, but not required, that the redundant spectrums 312a–n would be generated at a first location and sent to a second location over the communications medium. At the second location, the redundant spectrums would be processed to reconstruct the modulating baseband signal 308. In one embodiment, the communications medium is a wireless communications link.

4.2.1.2.2.2.2 Structural Description

Figure 8K:
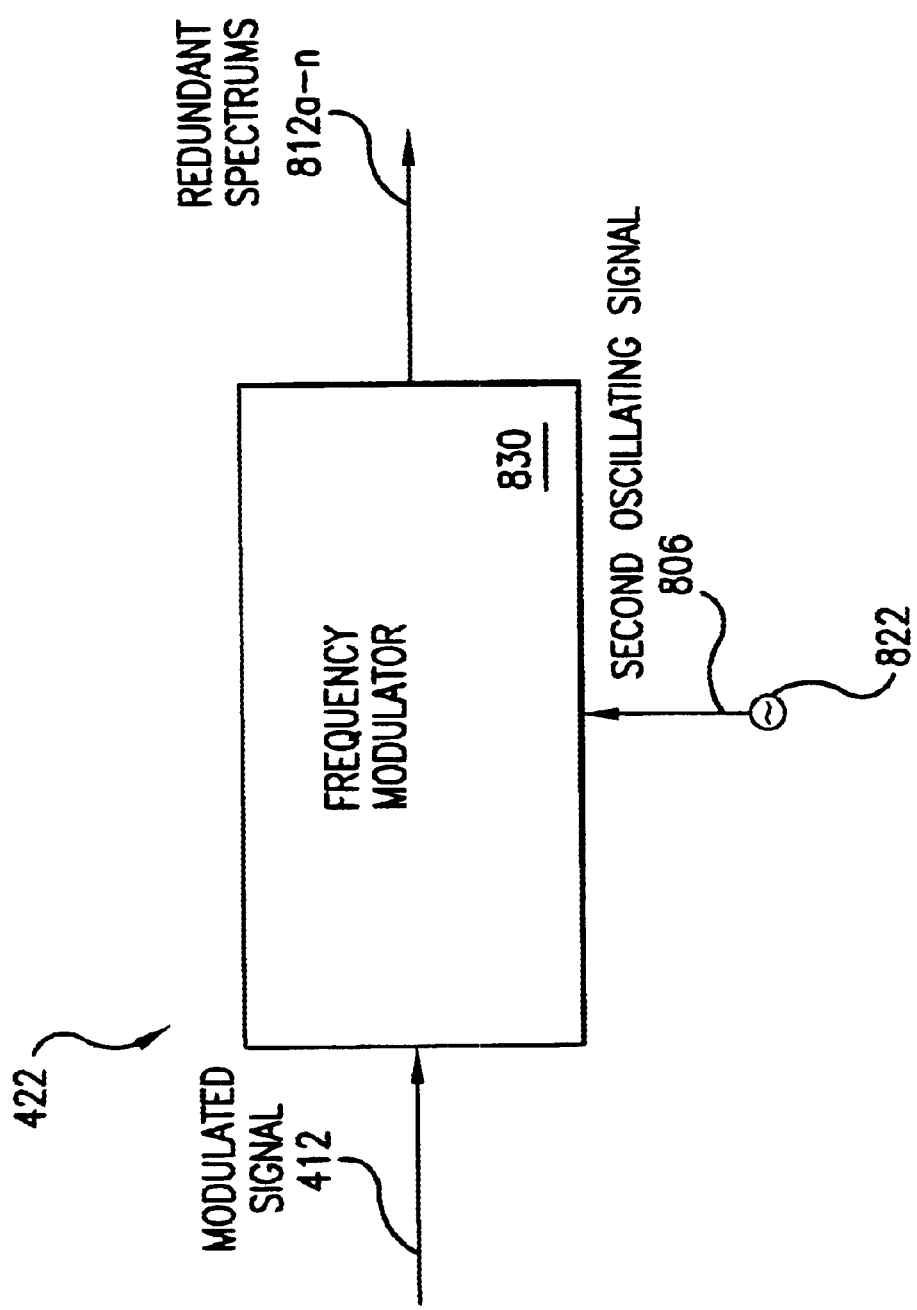
FIG. 8K depicts a structural block diagram associated with flowchart 824 according to an embodiment of the present invention.

FIG. 8K illustrates a block diagram of the replicator system 422 according to one embodiment of the present invention. The replicator system 422 comprises a frequency modulator 830 and an second oscillator 828. Preferably, replicator system 422 accepts a modulated signal 412 and generates multiple redundant spectrums 812a–n in the manner shown in operational flowchart 824. In other words, the replicator system 422 is a structural embodiment for performing the operational steps in flowchart 824 (FIG. 8J). However, it should be understood that the scope and spirit of the present invention includes other structural embodiments for performing steps in flowchart 824. The specifics of these other structural embodiments will be apparent to persons skilled in the relevant art(s) based on the discussion contained herein. Flowchart 824 will re-visited to further illustrate the present invention in view of the structural components in replicator system 422.

In step 404, modulator 420 (FIG. 4I) modulates the first oscillating signal 408 with the modulating baseband signal 308, resulting in the modulated signal 412 with corresponding modulated spectrum 414 (FIG. 8B). This step was discussed earlier, but is repeated here for convenience.

In step 802, second oscillator 828 generates the second oscillating signal 806 (FIG. 8C) with a characteristic frequency $f_2$. Second oscillating signal 806 is periodic with a period 808 equal to $1/f_2$.

In step 826, frequency modulator 830 varies the frequency of modulated signal 412 as a function of second oscillating signal 806, resulting in redundant spectrums 812a–n (FIG. 8E).

In step 306, the (optional) medium interface module 320 transmits redundant spectrums 812a–n over communications medium 322. It is expected, but not required, that the redundant spectrums 812a–n would be generated at a first location and sent to a second location over the communications medium. At the second location, the redundant spectrums would be processed to recover the modulating baseband signal 308.

4.2.1.2.2.3 Other Embodiments

Figures 1, 8K:
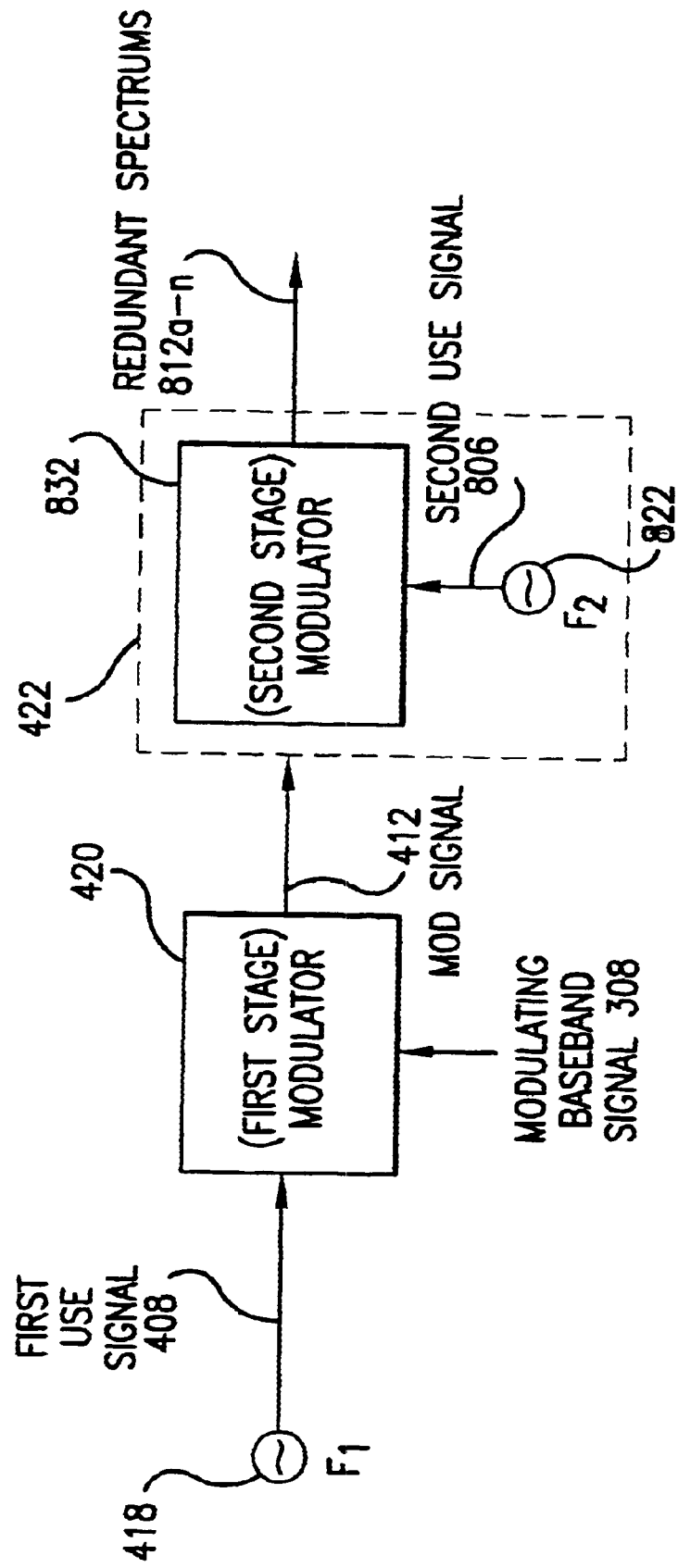

The embodiments described above for replicating a modulated spectrum to generate redundant spectrums are provided for purposes of illustration. These embodiments are not intended to limit the invention. Alternate embodiments, differing slightly or substantially from those described herein, will be apparent to persons skilled in the relevant art(s) based on the teachings contained herein. Such other embodiments include but are not limited to amplitude modulation, and any other modulation technique that can be used to replicate the information in a modulated spectrum. Such alternate embodiments fall within the scope and spirit of the present invention. FIG. 8K-1 illustrates a structural diagram of generator 318 that summarizes the embodiments described in section 4.2.1.2.2 and related subsections. FIG. 8K-1 illustrates the replicator 422 as a second stage modulator 832 and second oscillator 822. As discussed above, second stage modulator 832 (Replicator 422) is preferably a phase modulator or a frequency modulator, but an amplitude modulator could also be used or any other type of modulator (or device) that will generate redundant spectrums.

4.2.1.3 Implementation Examples

Exemplary operational and/or structural implementations related to the method(s), structure(s), and/or embodiments described above are presented in this section (and its subsections). These implementations are presented herein for purposes of illustration, and not limitation. The invention is not limited to the particular implementation examples described herein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

4.2.1.3.1 First Stage Modulator 420

Exemplary operational and/or structural implementations related to the method(s), structure(s), and/or embodiments described above for first stage modulator 420 (FIG. 4I) are presented in this section (and its subsections). As discussed earlier, first stage modulator 420 modulates the first oscillating signal 408 with modulating baseband signal 308, resulting in modulated signal 412. These implementations are presented herein for purposes of illustration, and not limitation. The invention is not limited to the particular implementation examples described herein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

4.2.1.3.1.1 AM Modulator as a Variable Gain Transistor Amplifier

Figure 9:
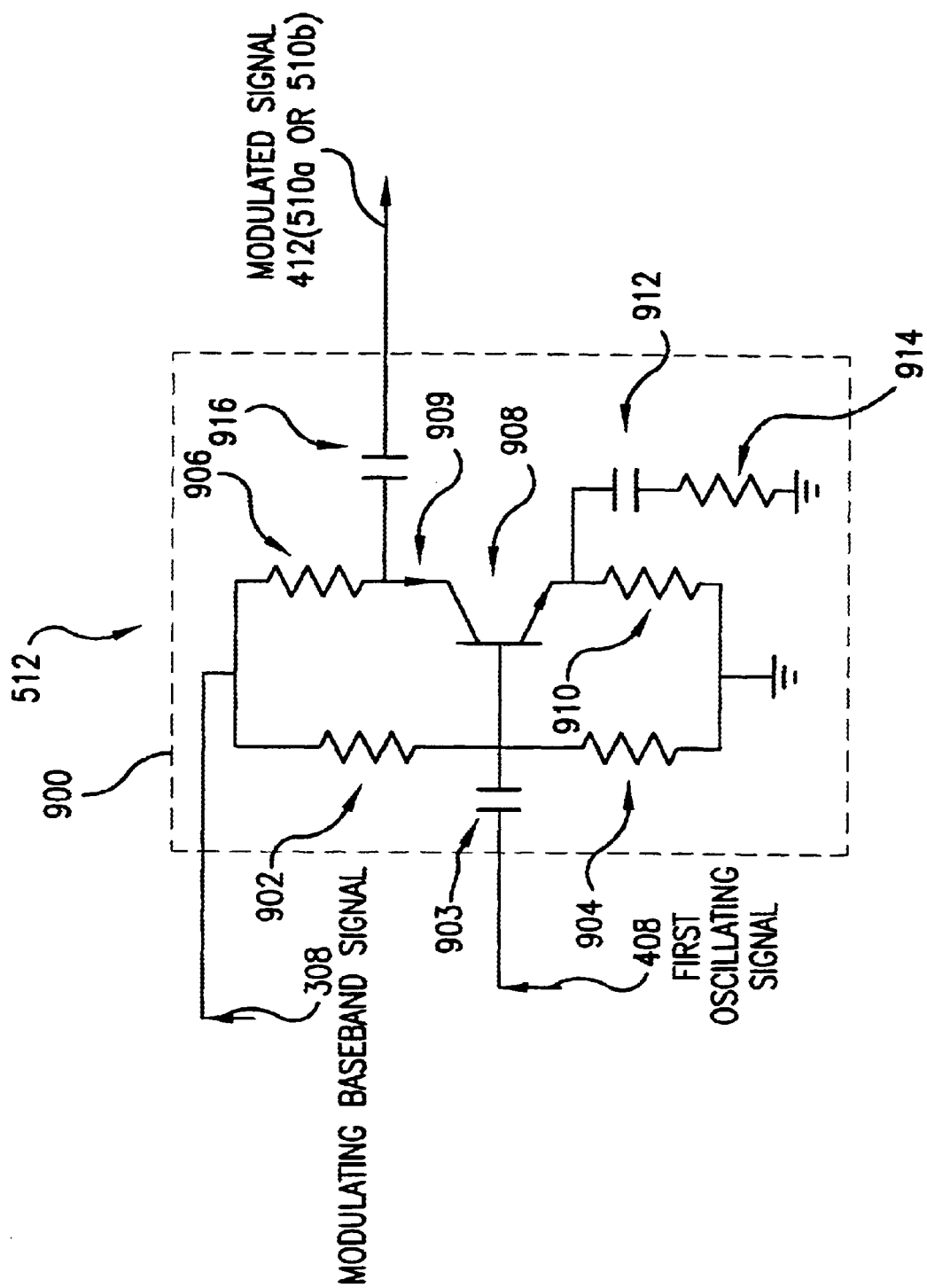
FIG. 9 illustrates a structural implementation of an AM modulator according to one embodiment of the present invention.

FIG. 9 illustrates an AM modulator 900, which is an example circuit implementation of AM modulator 512 (FIG. 5H). As discussed earlier, AM modulator 512 accepts a modulating baseband signal 308 (508a or 508b), and a first oscillating signal 408. AM modulator 512 varies the amplitude of the first oscillating signal 408 as a function of modulating baseband signal 308, resulting in the modulated signal 412 (510a or 510b). AM modulator 900 includes: resistors 902, 904, 906, 910, and 914; transistor 908; capacitors 903, 912, and 916.

AM modulator 900 operates as a variable gain amplifier, where the gain is a function of the modulating baseband signal 308, and operates as follows. Transistor 908 operates to amplify the first oscillating signal 408. The amount of amplification (or gain) is variable and dependent on the bias current 909, as is well known to those skilled in the art(s). Bias current 909 is determined by the modulating baseband signal 308 and bias resistors 902, 904, 906, and 910. This occurs because the modulating baseband signal 308 operates as the voltage supply for transistor 908, and resistors 902, 904, 906, and 910 set the DC bias current 909 for a given value of the modulating baseband signal 308, as is well known to those skilled in the art(s). As such, bias current 909 varies as a function of the modulating baseband signal 308, as does the gain of transistor amplifier 902. This results in a modulated signal 412 (modulated signal 510a or 510b) with an amplitude that varies as a function of modulating baseband signal 308. Capacitors 903 and 916 are DC blocking capacitors. Capacitor 912 and resistor 914 improve the AC gain that is feasible with amplifier 900, as is well known to those skilled in the art(s).

AM modulator 900 described above is provided for illustration purposes only, and is not meant to limit the present invention in any way. Alternate implementations for an AM modulator, differing slightly or substantially from that described herein, will be apparent to those skilled in the relevant art(s) based on the teachings herein. Such alternate implementations include, but are not limited to a transistor oscillator configuration, where the output signal amplitude is varied as a function of supply voltage similar to that described above. Such alternate implementations fall within the scope and spirit of the present invention.

4.2.1.3.1.2 FM Modulator as a Voltage Controlled Oscillator

Figure 10:
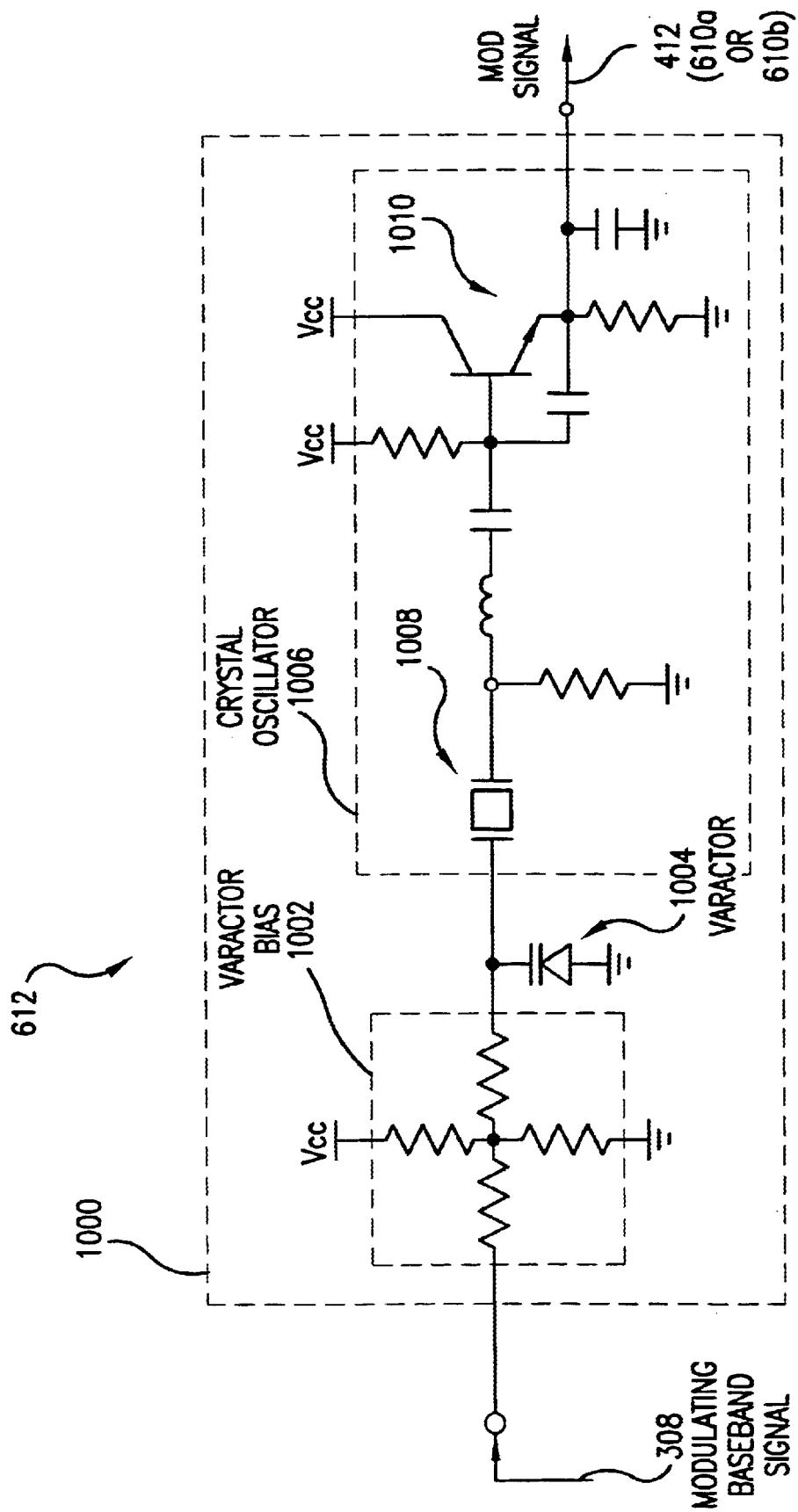
FIG. 10 illustrates a structural implementation of a FM modulator according to one embodiment of the present invention.

FIG. 10 illustrates voltage controlled crystal oscillator (VCXO) 1000, which is one embodiment of FM modulator 612 (FIG. 6H) and first oscillator 418 (FIG. 4I). VCXO 1000 accomplishes the functions of both first oscillator 418 and FM modulator 612 because VCXO 1000 generates first oscillating signal 408 and frequency modulates the first oscillating signal 408 in substantially one step, resulting in modulated signal 412 (610a or 610b). VCXO 1000 includes varactor bias circuit 1002, varactor 1004, and crystal oscillator 1006. Crystal oscillator 1006 includes crystal 1008 and transistor 1010.

VCXO 1000 operates as follows. The crystal oscillator 1006 oscillates at a free-running (or unloaded) frequency that is based on the selection of the crystal 1008. The free running oscillation frequency is preferably on the order of the first oscillating signal 408 (FIG. 4D), where first oscillating signal 408 is referenced here for example purposes only because it has been previously identified as a suitable oscillating signal to be modulated by the modulating baseband signal 308 (i.e. its frequency is high relative to spectrum 310 that is associated with the modulating baseband signal 308), and is not meant to limit the invention in any way. The varactor 1004 is preferably a reversed biased diode (or other device) whose effective capacitance changes a function of a control voltage as shown in FIG. 11D. The effective capacitance of the varactor 1004 loads the crystal oscillator 1006 and pulls the oscillation frequency of the crystal oscillator 1006 from its free-running oscillation frequency. As such, by controlling the varactor 1004 with the modulating baseband signal 308, the oscillation frequency of the crystal oscillator 1006 varies as a function of the modulating baseband signal 308. This results in a modulated signal 412 (610a or 610b) with a frequency that varies as a function of the modulating baseband signal 308.

The VCXO 1000 described above is provided for illustration purposes only, and is not meant to limit the invention in any way. Alternate implementations, differing slightly or substantially from that described herein, will be apparent to those skilled in the art(s) based on the teachings herein. Such alternate implementations include, but are not limited to, voltage controlled oscillators (VCOs) that use other means besides a crystal to determine a free-running oscillation frequency. Such alternate implementations fall within the scope and spirit of the present invention.

4.2.1.3.1.3 PM Modulator as a Tunable Filter

Figure 11A:
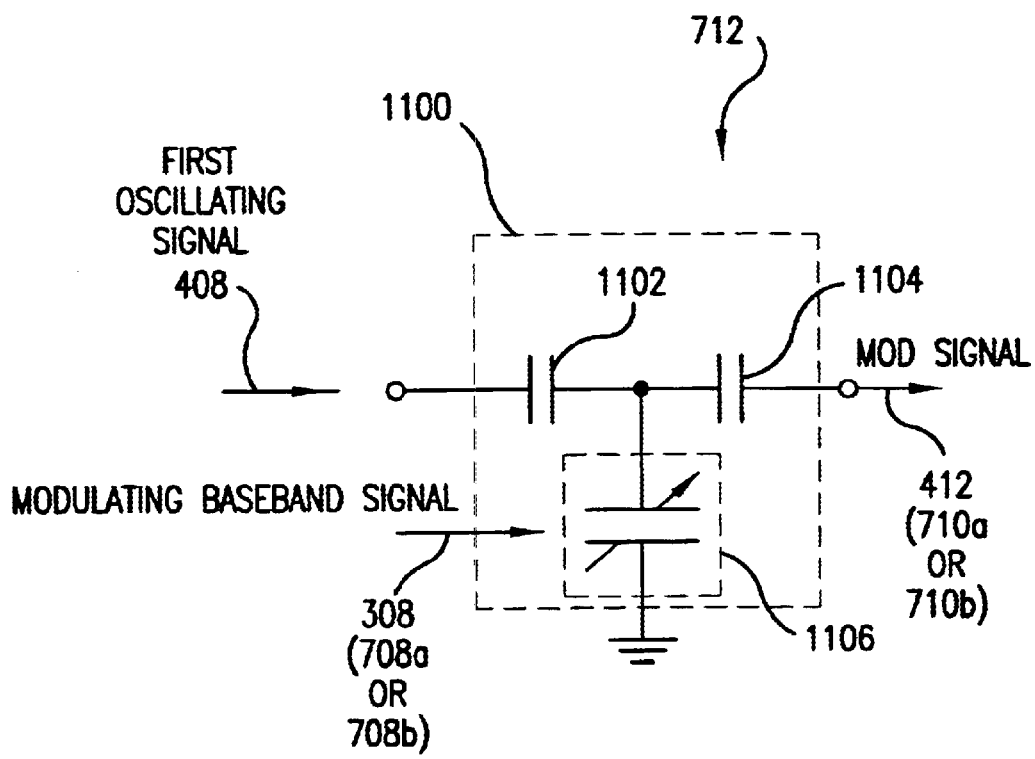
FIGS. 11A–E illustrate a structural implementation of a phase modulator according to one embodiment of the present invention.

FIG. 11A illustrates a tunable bandpass filter (BPF) 1100 which is an example circuit implementation of the PM modulator 712 (FIG. 7H). As discussed earlier, PM modulator 712 accepts the modulating baseband signal 308 (708a or 508b), and the first oscillating signal 408. The PM modulator 712 changes the phase of the first oscillating signal 408 as a function of the modulating baseband signal 308, resulting in modulated signal 412 (710a or 710b). Tunable BPF 1100 includes capacitors 1102, 1104, and a voltage controlled capacitance device 1106.

Figure 11B:
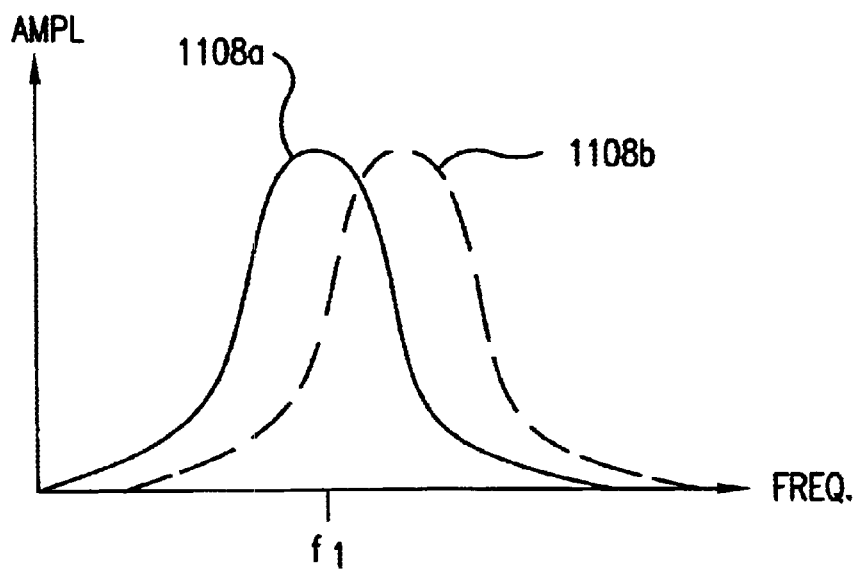
Figure 11C:
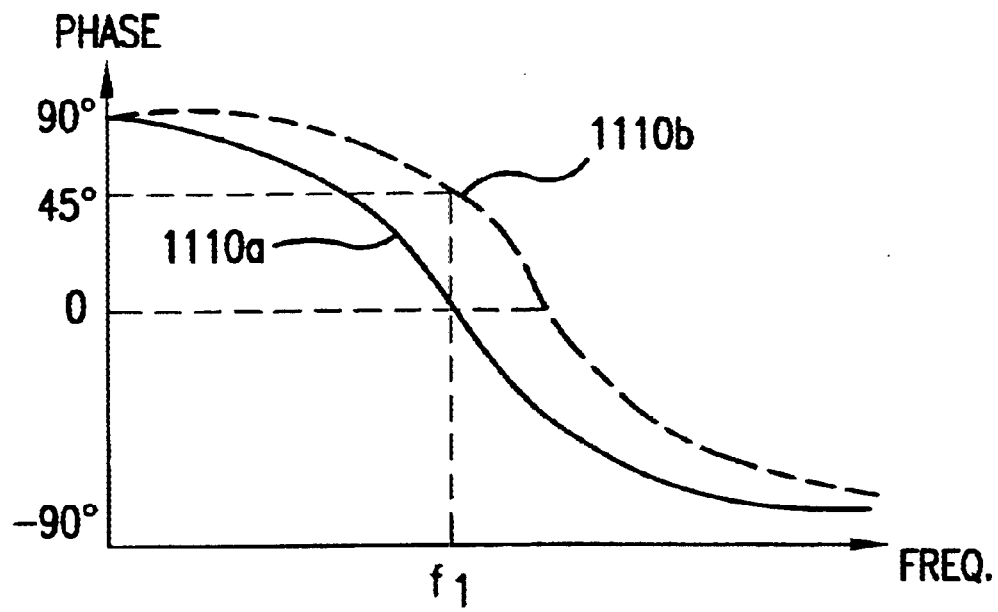
Figure 11D:
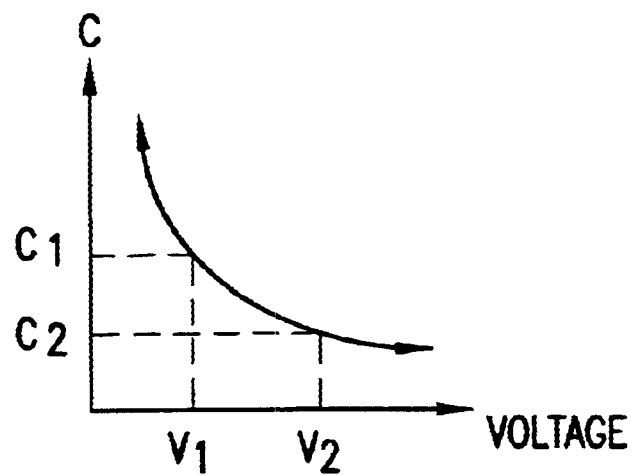

Tunable BPF 1100 has a variable amplitude and phase response that changes as a function of the effective capacitance of the voltage controlled capacitance device 1106. FIGS. 11B and 11C illustrate the relative amplitude and phase response vs. frequency for two effective capacitance values of voltage controlled capacitor device 1106. As shown in FIG. 11B, the amplitude response shifts from 1108a to 1108b as the effective capacitance of voltage controlled capacitance device 1106 changes from a first capacitance to a second capacitance. Likewise, the corresponding phase response shifts from 1110a to 1110b as the effective capacitance shifts from a first capacitance value to a second capacitance value.

Figure 11E:
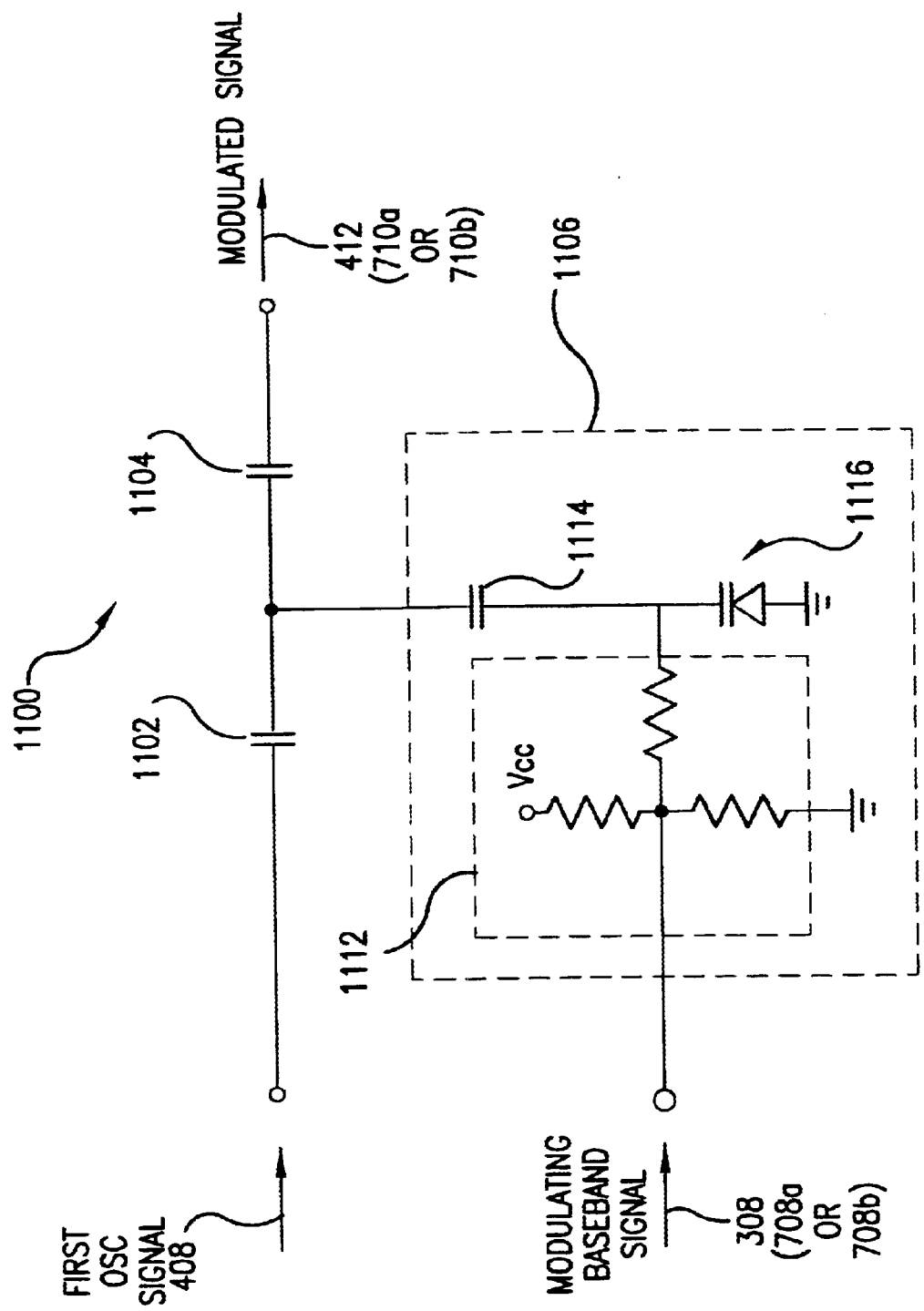

Tunable BPF 1100 is used to phase modulate first oscillating signal 408 by controlling the voltage controlled capacitance device 1106 with the modulating baseband signal 308. In one embodiment, voltage controlled capacitance device 1106 includes varactor bias circuit 1112, varactor 1116, and capacitor 1114 as illustrated in FIG. 11E. Varactor 1116 is a reversed biased varactor diode whose junction capacitance varies as a function of a control voltage as shown in FIG. 11D. Capacitor 1114 pads or restricts the amount of tuning, and operates as a DC block for varactor bias circuit 1112. As such, changes in modulating baseband signal 308 from $V_1$ to $V_2$ will cause the effective capacitance of varactor 1116 to change from $C_1$ to $C_2$, which will cause the phase response of BPF 1100 to shift from 1110a to 1110b. If first oscillating signal 408 has a corresponding frequency at $f_1$ the change in modulating baseband signal 308 from $V_1$ to $V_2$ will cause a phase shift of approximately 45 degrees as illustrated. The phase shift occurs because the phase response of the tunable filter 1100 has shifted from the 1110a to the 1110b, but the frequency of the first oscillating signal 408 is still at $f_1$. The 45 degree phase shift is meant for example only, and is not meant to limit the invention in any way. Those skilled in the art will recognize that other values of phase shift can be achieved based on the discussion given herein.

The present invention is not limited to the bandpass filter configuration illustrated by BPF 1100. Those skilled in the art will recognize that other bandpass filter configurations could be used to implement phase modulator 712. Furthermore, the present invention is not limited to tunable bandpass filters to implement phase modulator 712. Those skilled in the art will recognize that other filter configurations could be used including but not limited to: tunable low pass filters and tunable high pass filters. Also, the present invention is not limited to filter configurations. Those skilled in the art will recognize that other circuit configurations can be used to implement the PM modulator 712, as long as they shift the phase of first oscillating signal 408 as a function of modulating baseband signal 308.

4.2.1.3.1.4 Other Implementations

The implementations described above for first stage modulator 420 are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

4.2.1.3.2 Second Stage Modulator

Exemplary operational and/or structural implementations related to the method(s), structure(s), and/or embodiments described above for second stage modulator (Replicator) 422 (FIG. 4I) are presented in this section (and its subsections). These implementations are presented herein for purposes of illustration, and not limitation. The invention is not limited to the particular implementation examples described herein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

4.2.1.3.2.1 PM Modulator as a Tunable Filter

Figure 12A:
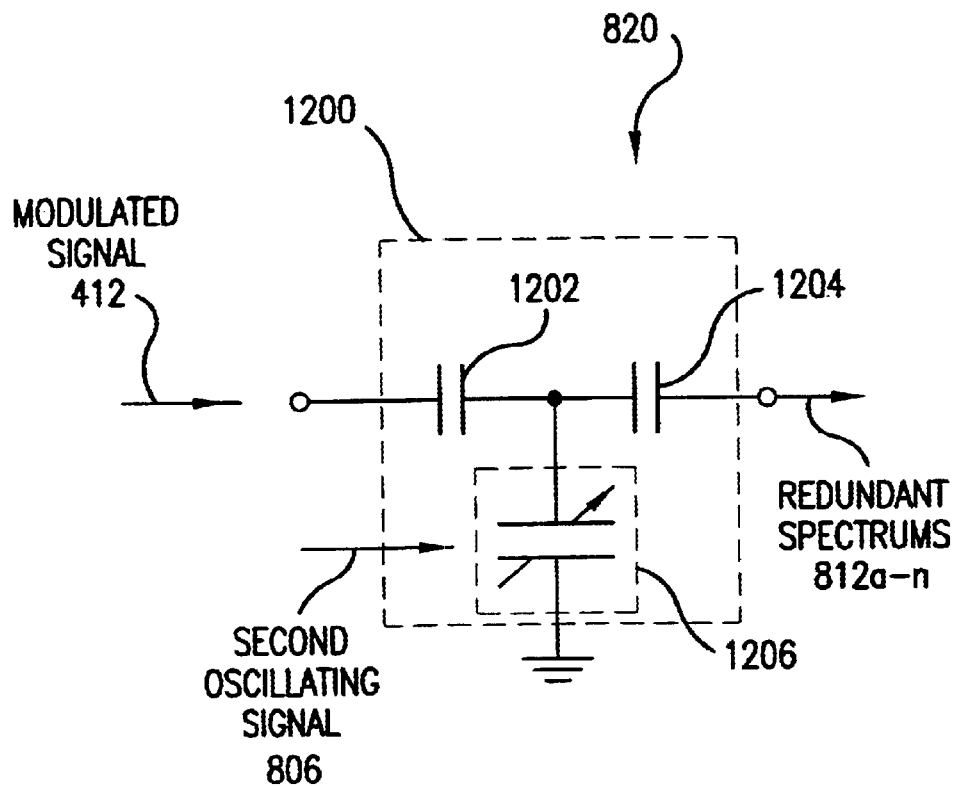
FIGS. 12A–E illustrate a structural implementation of phase modulator 1200, which is an example implementation of PM modulator 820 according to an embodiment of the present invention.

FIG. 12A illustrates a tunable bandpass filter (BPF) 1200 which is an example circuit implementation of PM modulator 820 (FIG. 8I), which is an example embodiment of replicator 422. As discussed earlier, PM modulator 820 accepts the modulated signal 412 and second oscillating signal 806. The PM modulator 820 phase modulates modulated signal 412 with second oscillating signal 806. In other words, the PM modulator 820 shifts the phase of modulated signal 412 as a function of second oscillating signal 806, resulting in redundant spectrums 812a–n. Tunable BPF 1200 includes capacitors 1202, 1204, and voltage controlled capacitor device 1206.

Figure 12B:
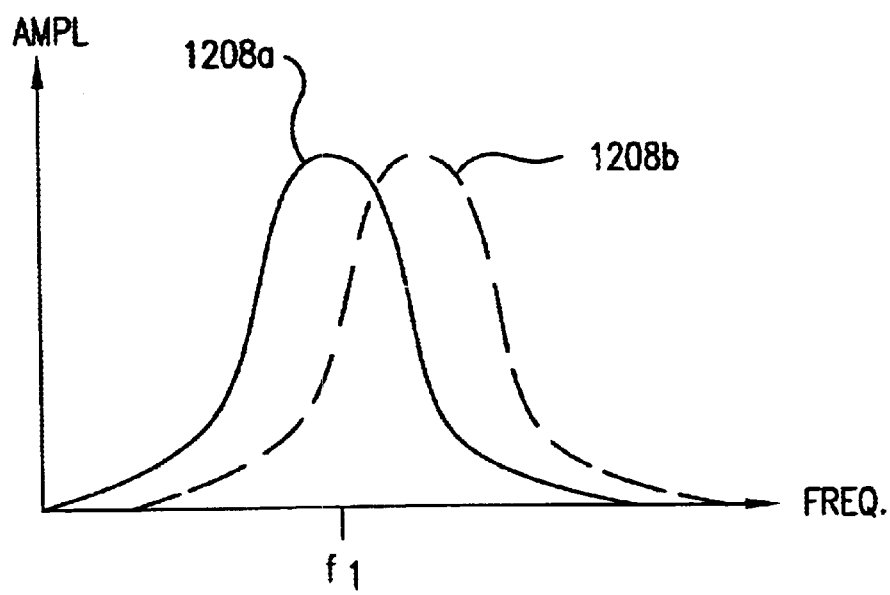
Figure 12C:
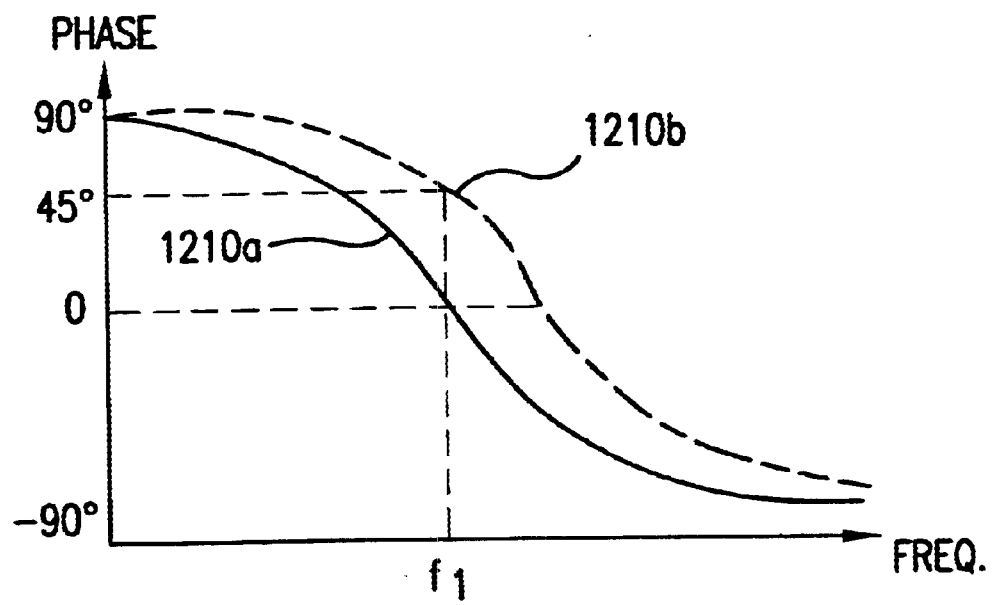

Tunable BPF 1200 has a variable amplitude and phase response that changes as a function of voltage controlled capacitance device 1206. FIGS. 12B and 12C illustrate the relative amplitude and phase response vs. frequency for two effective capacitance values of voltage controlled capacitance device 1206. As shown in FIG. 12B, the amplitude response shifts from 1208a to 1208b as the effective capacitance of the voltage controlled capacitance device 1206 changes from a first capacitance value to a second capacitance value. Likewise, the corresponding phase response shifts from 1210a to 1210b as the effective capacitance shifts from a first capacitance value to a second capacitance value.

Figure 12D:
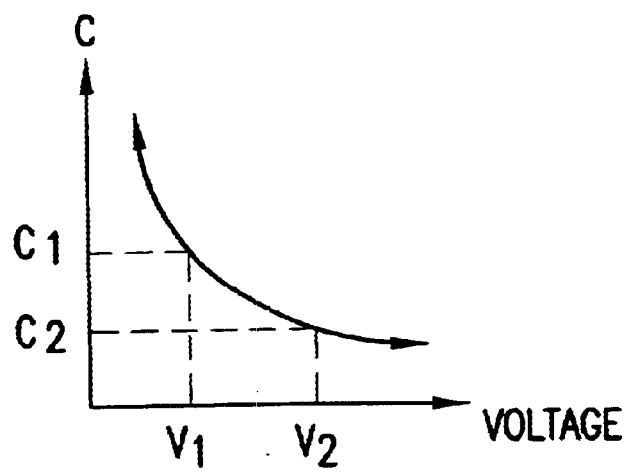
Figure 12E:
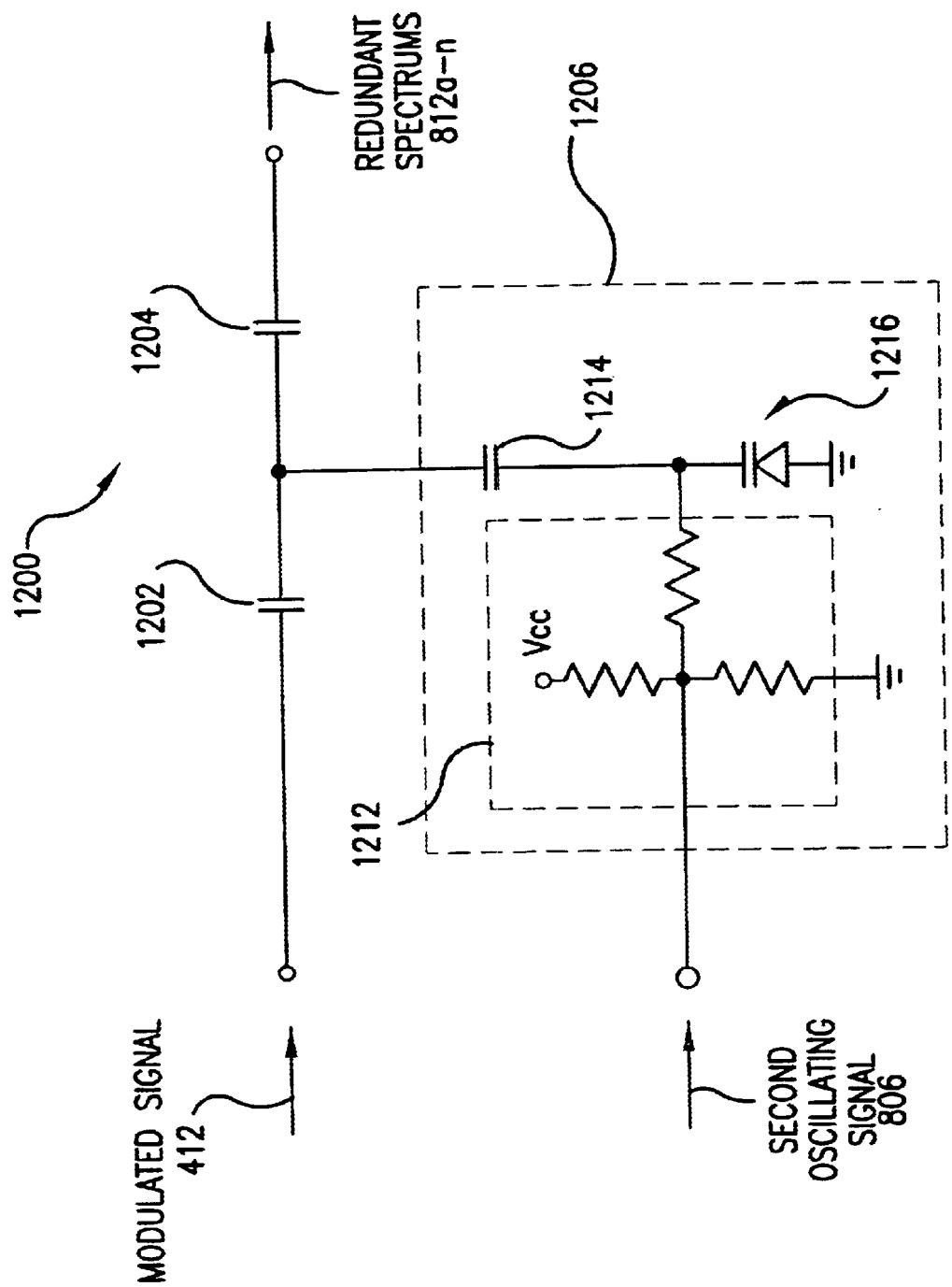

Tunable BPF 1200 is used to phase modulate modulated signal 412 with second oscillating signal 806 by controlling voltage controlled capacitance device 1206 with the second oscillating signal 806. In one embodiment, voltage controlled capacitance device 1206 includes varactor bias circuit 1212, varactor 1216, and capacitor 1214 as is illustrated in FIG. 12E. Varactor 1216 is a reversed biased varactor diode whose junction capacitance varies as a function of a control voltage, as seen in FIG. 12D. Capacitor 1214 pads or restricts the tuning of the effective capacitance of voltage controlled capacitance device 1206, and also operates as a DC block for varactor bias circuit 1212. As such, changes in second oscillating signal 806 from $V_1$ to $V_2$ will cause the capacitance of varactor 1216 to change from $C_1$ to $C_2$, which will cause the phase response of BPF 1200 to shift from 1210a to 1210b. If modulated signal 412 is centered at $f_1$, the change in second oscillating signal 806 from $V_1$ to $V_2$ will cause a phase shift of approximately 45 degrees in modulated signal 412, as illustrated. The phase shift occurs because the phase response of the tunable filter 1200 has shifted from the phase response 1210a to phase response 1210b, but the frequency of modulated signal 412 is still at $f_1$. The 45 degree phase shift is meant for example only, and is not meant to limit the invention in any way. Those skilled in the art will recognize that other values of phase shift can be achieved based on the discussion given herein.

The present invention is not limited to the bandpass filter configuration illustrated by BPF 1200. Those skilled in the art will recognize that other bandpass filter configurations could be used to implement phase modulator 820. Furthermore, the present invention is not limited to tunable bandpass filters to implement phase modulator 820. Those skilled in the art will recognize that other filter configurations could be used including but not limited to: tunable low pass filters and tunable high pass filters. Also, the present invention is not limited to filter configurations. Those skilled in the art will recognize that other circuit configurations can be used to implement phase modulator 820, as long as they shift the phase of modulated signal 412 as a function of second oscillating signal 806.

4.2.1.3.2.2 Other Implementations for a PM Modulator

The implementations described above for PM modulator 820 are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

4.2.1.3.2.3 Implementations for Other Embodiments of Second Stage Modulator

As discussed above, second stage modulator 422 can also be an FM modulator (4.2.1.2.2.2), and an AM modulator (Section 4.2.1.2.2.3). An implementation for an FM modulator and an AM modulator was fully described in sections 4.2.1.3.1.1 and 4.2.1.3.1.2, respectively, to which the reader is directed for an implementation level description of the second stage modulator 422 as an AM modulator and an FM modulator. Furthermore, second stage modulator 422 can be any other type of modulator capable of replicating the information in a modulated spectrum, and the implementation of any such other modulator will be apparent to those skilled in the art(s) based on the discussion herein.

The implementations described above are provided for purposes of illustration only. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

4.2.2 Generate Redundant Spectrums by Modulating an Oscillating Signal With a Modulated Signal The following discussion relates to generating redundant spectrums with substantially the same information content by modulating an oscillating signal with a modulated signal according to embodiments of the present invention.

4.2.2.1 First Embodiment: Generating Redundant Spectrums by Phase Modulating an Oscillating Signal With a Modulated Signal The following discussion relates to a first embodiment of generating redundant spectrums by modulating an oscillating signal with a modulated signal according to embodiments of the present invention. The first embodiment includes phase modulating the oscillating signal with a modulated signal to generate redundant spectrums with substantially the same information content. The second embodiment includes frequency modulating the oscillating signal with a modulated signal. Other embodiments are also within the scope and spirit of the invention.

4.2.2.1.1 High Level Description

The following discussion includes an operational process for generating redundant spectrums by phase modulating an oscillating signal with a modulated signal. Also, a structural description for achieving this process is described herein for illustrative purposes, and is not meant to limit the invention in any way. In particular, the process described in this section can be achieved using any number of structural implementations, at least one of which is described in this section. The details of the structural description will be apparent to those skilled in the art based on the teachings herein.

Figure 13A:
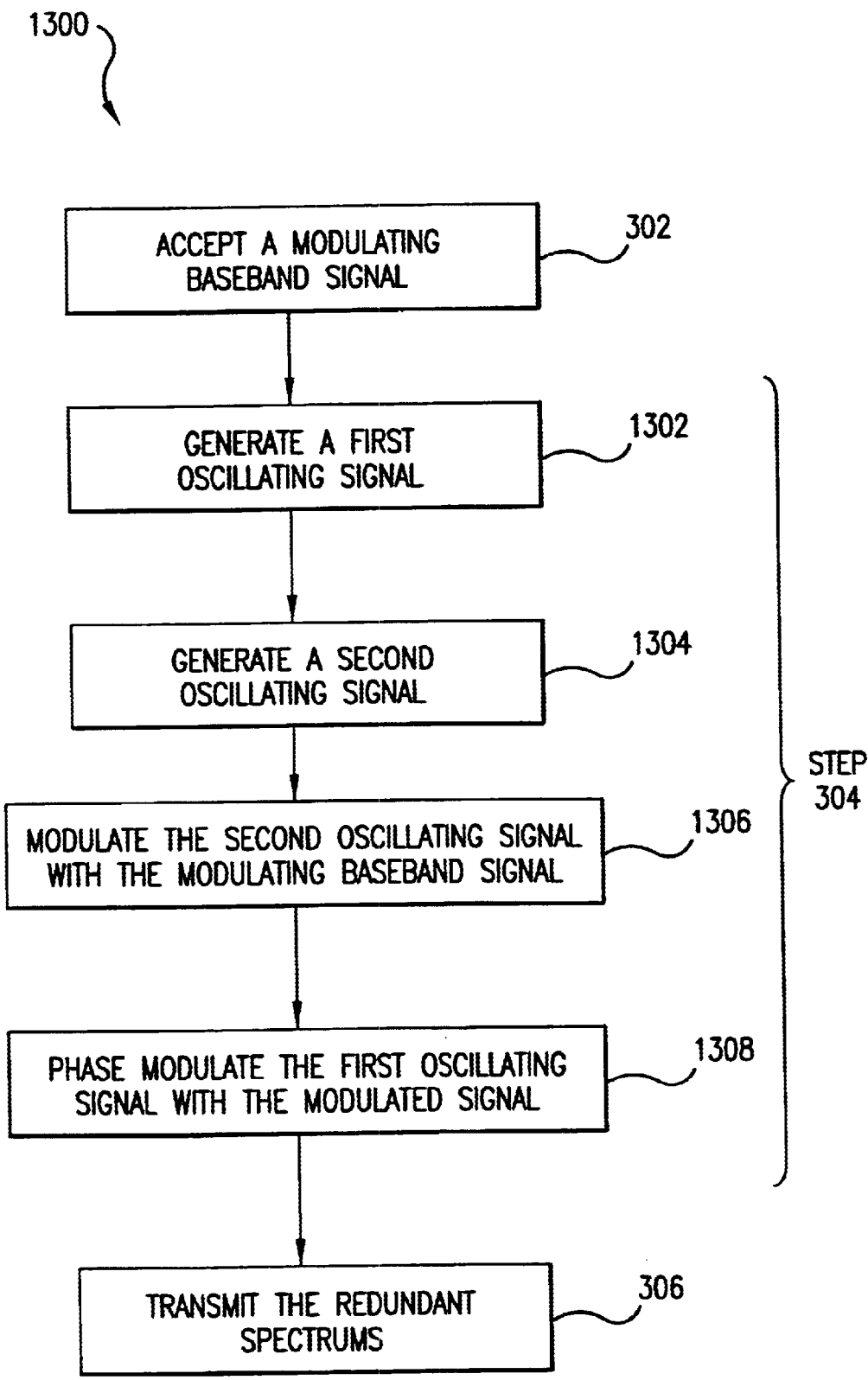
FIG. 13A depicts a flowchart 1300, which illustrates generating redundant spectrums by phase modulating an oscillating signal with a modulated signal according to one embodiment of the present invention.

4.2.2.1.1.1 Operational Description:

FIG. 13A depicts a flowchart 1300 for generating multiple redundant spectrums by phase modulating an oscillating signal with a modulated signal. Each redundant spectrum carries the necessary information to at least substantially or completely reconstruct a modulating baseband signal. In the following discussion, the steps in FIG. 13A will be discussed relative to the example signal diagrams shown in FIGS. 13B–13K.

Figure 13B:
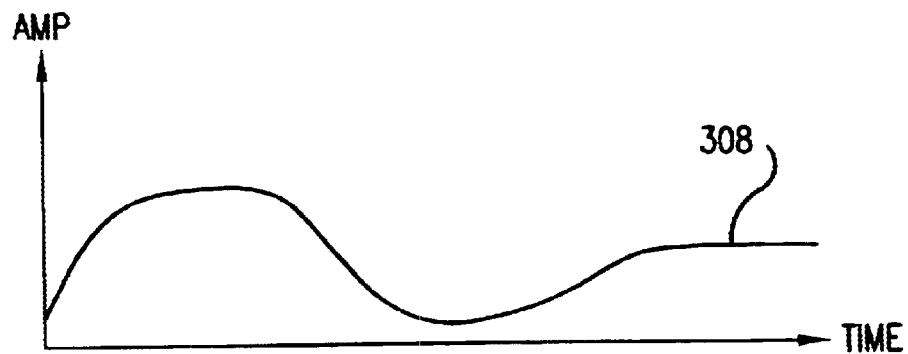
FIGS. 13B–K depict several signal diagrams that are associated with flowchart 1300 according to an embodiment of the present invention.
Figure 13C:
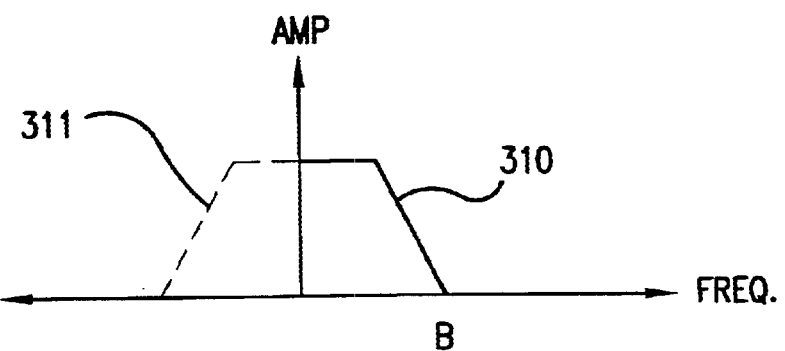
Figure 13D:
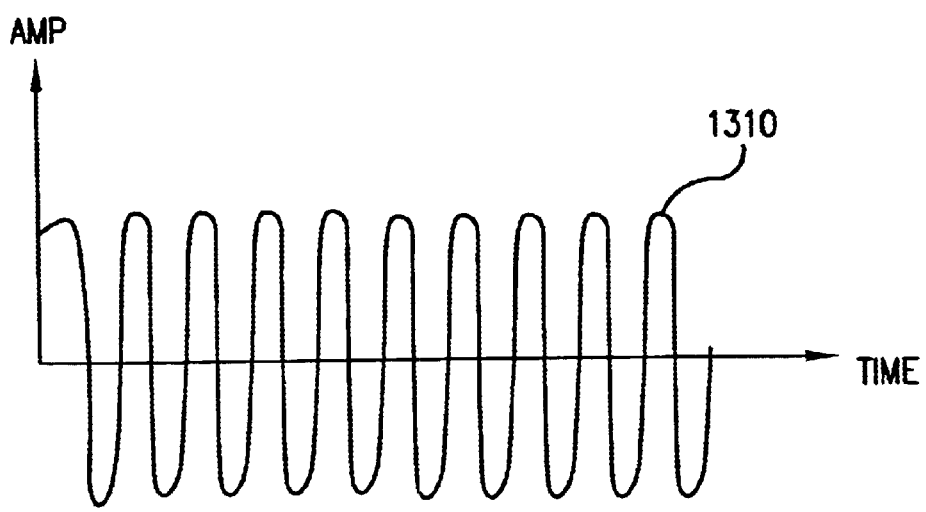

In step 302, the modulating baseband signal 308 is accepted. FIG. 13B illustrates the modulating baseband signal 308, and FIG. 13C illustrates a corresponding the spectrum 310 and image spectrum 311 for modulating baseband signal 308. It is noted that step 302, signal 308, and spectrums 310, 311 described herein are the same as those described in relation to FIGS. 3A–3D. They are re-illustrated here for convenience.

Figure 13E:
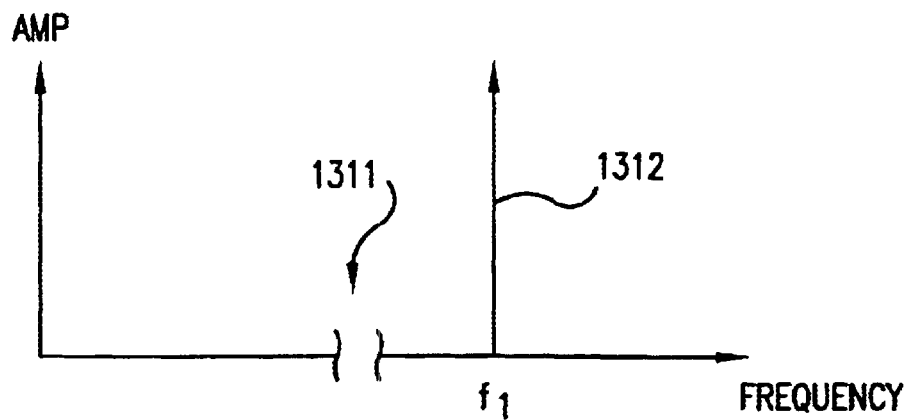
Figure 13F:
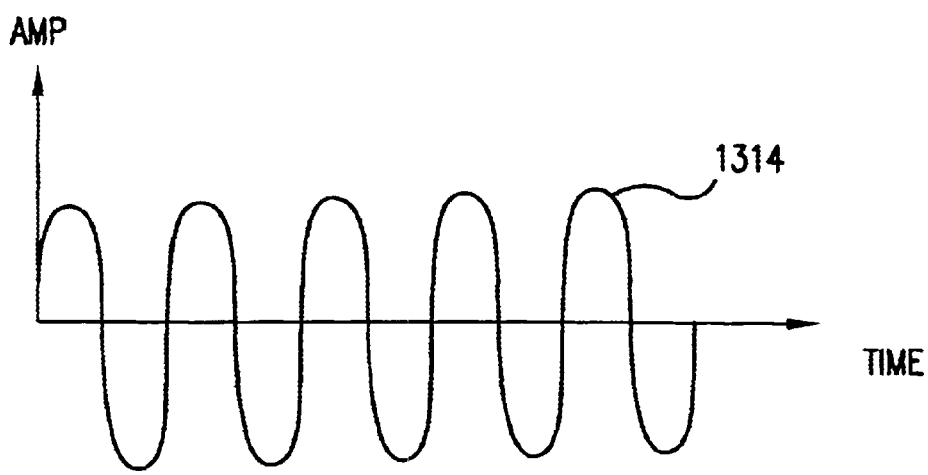

In step 1302, a first oscillating signal 1310 (FIG. 13D) is generated. The first oscillating signal 1310 is preferably a sinewave (but other periodic waveforms could be used) with a characteristic frequency $f_1$. As such, the first oscillating signal 1310 has a frequency spectrum 1312 that is substantially a tone at $f_1$ (FIG. 13E). Preferably, $f_1$ for the first oscillating signal 408 is much higher than the highest frequency B in the modulating baseband signal spectrum 310, which is represented by the break 1311 in the frequency axis of FIG. 13E. For example, the bandwidth B of spectrum 310 is typically on the order of 10 KHz. Whereas, a typical first oscillating signal $f_1$ will on the order of 100 MHZ. These frequency numbers are given for illustration only, and are not meant to limit the invention in any way.

Figure 13G:
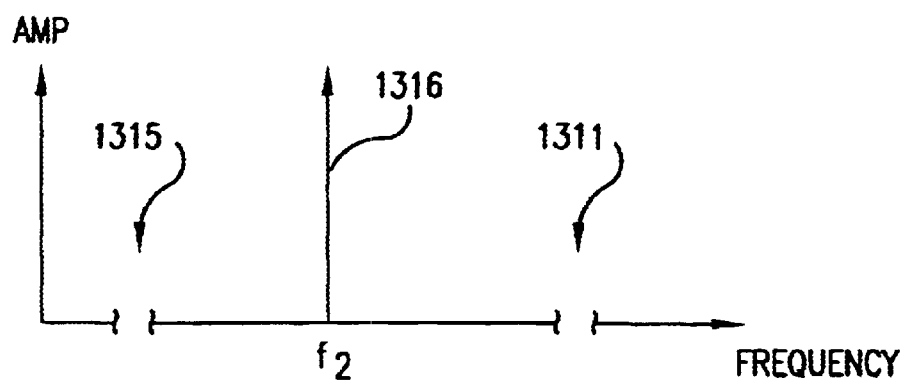

In step 1304, a second oscillating signal 1314 (FIG. 13F) is generated. The second oscillating signal 1314 is preferable a sinewave (but other periodic waveforms could be used) with a constant amplitude and characteristic frequency $f_2$. As such, the second oscillating signal 1314 has a frequency spectrum 1316 that is substantially a tone at $f_2$ (FIG. 13G). Preferably, $f_2$ for the second oscillating signal 1314 is substantially higher than the highest frequency B in the modulating baseband signal spectrum 310, which is represented by the break 1315 in the frequency axis of FIG. 13G. Also preferably, $f_2$ is substantially lower than $f_1$ for the first oscillating signal 1310; which is represented by break 13 11 in the frequency axis of FIG. 13G. For example, a typical spectrum 310 has bandwidth B on the order of 10 KHz, and a typical first oscillating signal $f_1$ is on the order of 100 MHZ. Whereas, a typical second oscillating signal $f_2$ will be on the order of 1 MHZ. These frequency numbers are given for illustration only, and are not meant to limit the invention in any way.

Figure 13H:
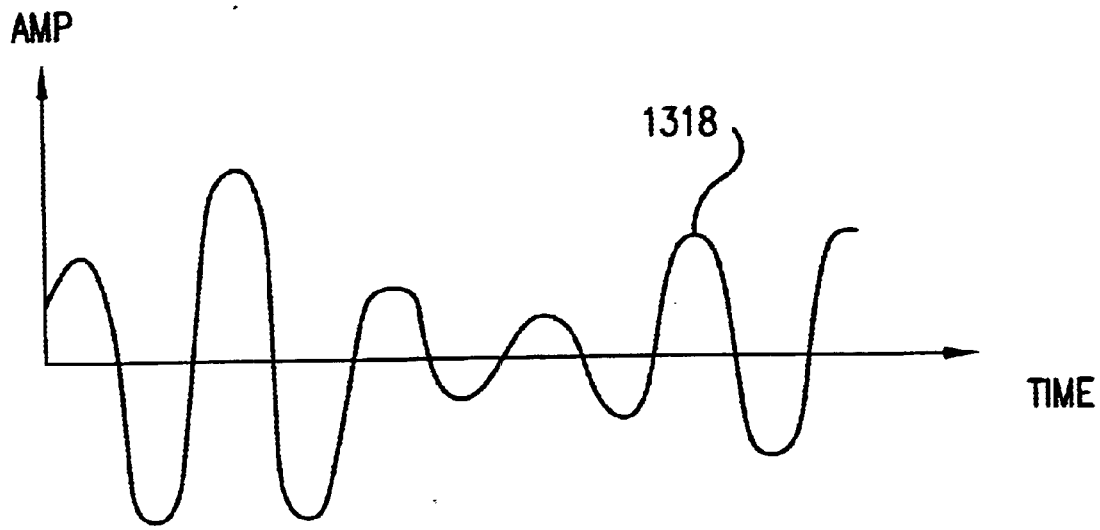
Figure 13I:
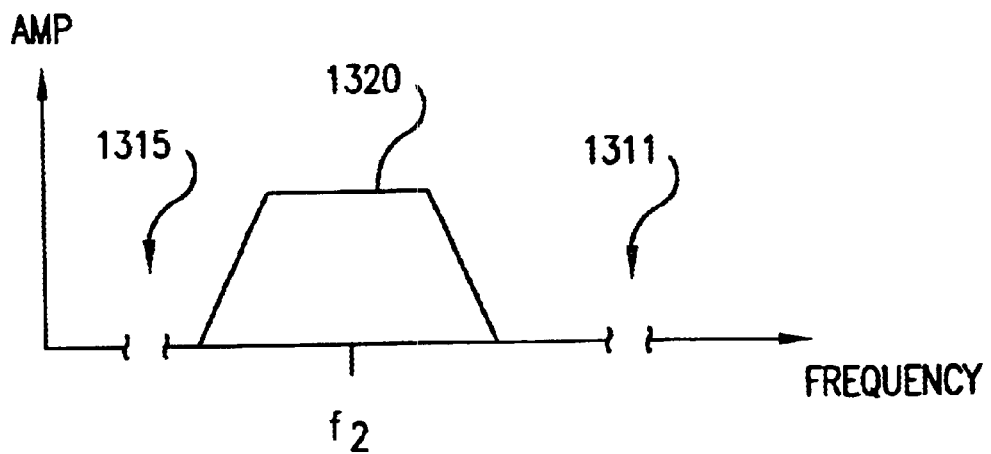

In step 1306, the second oscillating signal 1314 is modulated with the modulating baseband signal 308, resulting in a modulated (mod) signal 1318 (FIG. 13H). The modulated signal 1318 depicts the result of amplitude modulation (AM), where the amplitude of the modulating baseband signal 308 has been impressed on the amplitude of the second oscillating signal 1314. The use of AM is done for example purposes only, and is not meant to limit the invention in any way. Any type of modulation could be used including but not limited to: amplitude modulation (AM), frequency modulation (FM), phase modulation (PM), etc., or any combination thereof. These modulation schemes were described in sections 4.2.1.2.1, 4.2.1.2.2, and the reader is referred to the prior sections for additional details.

The modulated signal 1318 has a corresponding modulated spectrum 1320 (FIG. 13I) that is centered around $f_2$, which is the characteristic frequency of the second oscillating signal 1314. The modulated spectrum 1320 carries the necessary amplitude, phase, and frequency information to reconstruct the modulating baseband signal 308. The modulated spectrum 1320 is illustrated to have a generic shape and bandwidth. Those skilled in the art will recognize that the actual shape and bandwidth of modulated spectrum 1320 will depend on the specific modulating baseband signal 308 and type of modulation used to modulate the second oscillating signal 1314. Furthermore, the modulated spectrum 1320 is illustrated to represent double sideband modulation. Those skilled in the art will recognize how to implement the present invention using single sideband modulation, etc., based on the discussion given herein.

Figure 13J:
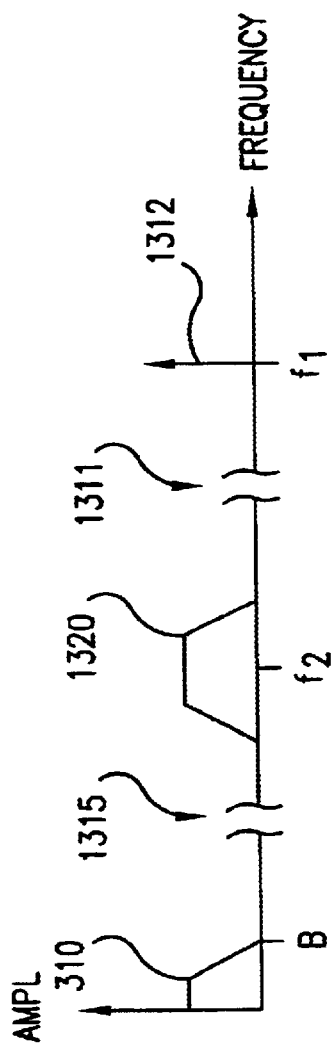

FIG. 13J illustrates example relative frequency locations of: spectrum 310 that corresponds to modulating baseband signal 308; modulated spectrum 1320 that corresponds to modulated signal 1318, and spectrum 1312 that corresponds to first oscillating signal 1310. Typically, modulated spectrum 1320 exists at a substantially higher frequency than modulating baseband signal spectrum 310, which is represented by break 1315 in the frequency axis. Also, typically, first oscillating signal spectrum 1312 exists at a substantially higher frequency than modulated spectrum 1320, which is represented by break 1311 in the frequency axis of FIG. 13J. For example, a typical modulating baseband spectrum 310 has bandwidth B on the order of 10 KHz. Whereas, a typical modulated spectrum 1320 has a center frequency on the order of 1 MHz, and a typical first oscillating signal spectrum 1312 has a center frequency on the order of 100 MHZ.

In step 1308, first oscillating signal 1310 is phase modulated with modulated signal 1318. That is, the phase of the first oscillating signal 1310 is shifted as a function of modulated signal 1318, resulting in redundant spectrums 1322*a–n*. The degree of phase shift implemented per relative unit change in modulated signal 1318 is completely arbitrary and is up to the system designer. Each redundant spectrum 1322*a–n* is substantially identical in information content to the other redundant spectrums, and carries a copy of the necessary information to reconstruct modulating baseband signal 308. (i.e. each redundant spectrum contains the necessary amplitude, phase, and frequency information to reconstruct the modulating baseband signal 308.)

Figure 13K:
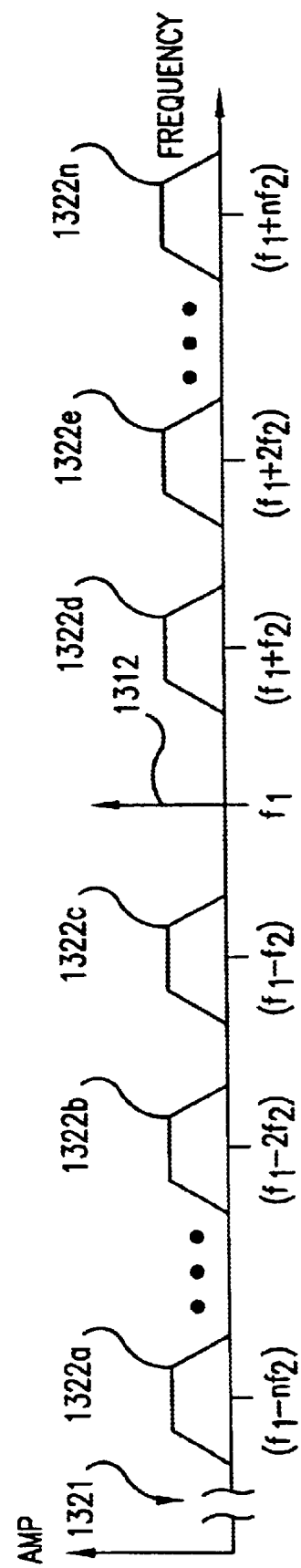

As shown in FIG. 13K, redundant spectrums 1322*a–n* are substantially centered around and offset from the first oscillating signal spectrum 1312 at $f_1$; where first oscillating signal 1312 remains substantially unmodulated. First oscillating signal spectrum 1312 can be substantially suppressed or attenuated in step 1308 by optimizing the amount of phase shift per unit change in modulated signal 1318 or other phasing techniques, as is well known to those skilled in the art(s). Also, each redundant spectrum 1322*a–n* is offset from $f_1$ by approximately a multiple of $f_2$ (Hz), where $f_2$ is the frequency of the second oscillating signal. Thus, the redundant spectrums 1322*a–n* are offset from each other by $f_2$ (Hz).

As stated earlier, example values for $f_1$ and $f_2$ are on the order of 100 MHZ and 1 MHz, respectively. As such, in one example, spectrums 1322*b–e* are located at 98 MHZ, 99 MHZ, 101 MHZ, and 102 MHZ, respectively. Thus, according this numerical example, spectrums 1322*b–e* occupy approximately 4 MHZ of bandwidth that is centered around 100 MHZ; which can be considered sufficiently narrowband to use commercially under the rules of the appropriate governmental administrative agency (i.e. the FCC). These numerical examples are given for illustration purposes only, and are not meant to limit this invention in any way. Those skilled in the art will recognize that the invention could be operated at other frequencies based on the discussion herein. In other words, those skilled in the art(s) will recognize that the invention could be optimized as desired to meet specific electromagnetic emission rules that may exist.

In step 306, redundant spectrums 1322*a–n* are transmitted over a communications medium. It is expected, but not required, that the redundant spectrums 1322*a–n* would be generated at first location and sent to a second location over the communications medium. At the second location, the redundant spectrums would processed to reconstruct modulating baseband signal 308. In one embodiment, the communications medium is wireless communications link.

As stated above, each redundant spectrum 1322*a–n* at least substantially or entirely contains a copy of the information necessary to reconstruct modulating baseband signal 308. As such, even if one or more of the redundant spectrums 1322*a–n* are corrupted by a jamming signal in the communications medium, the modulating baseband signal 308 can still be recovered from any of the other redundant spectrums 1322*a–n* that have not been corrupted.

4.2.2.1.1.2 Structural Description

Figure 13L:
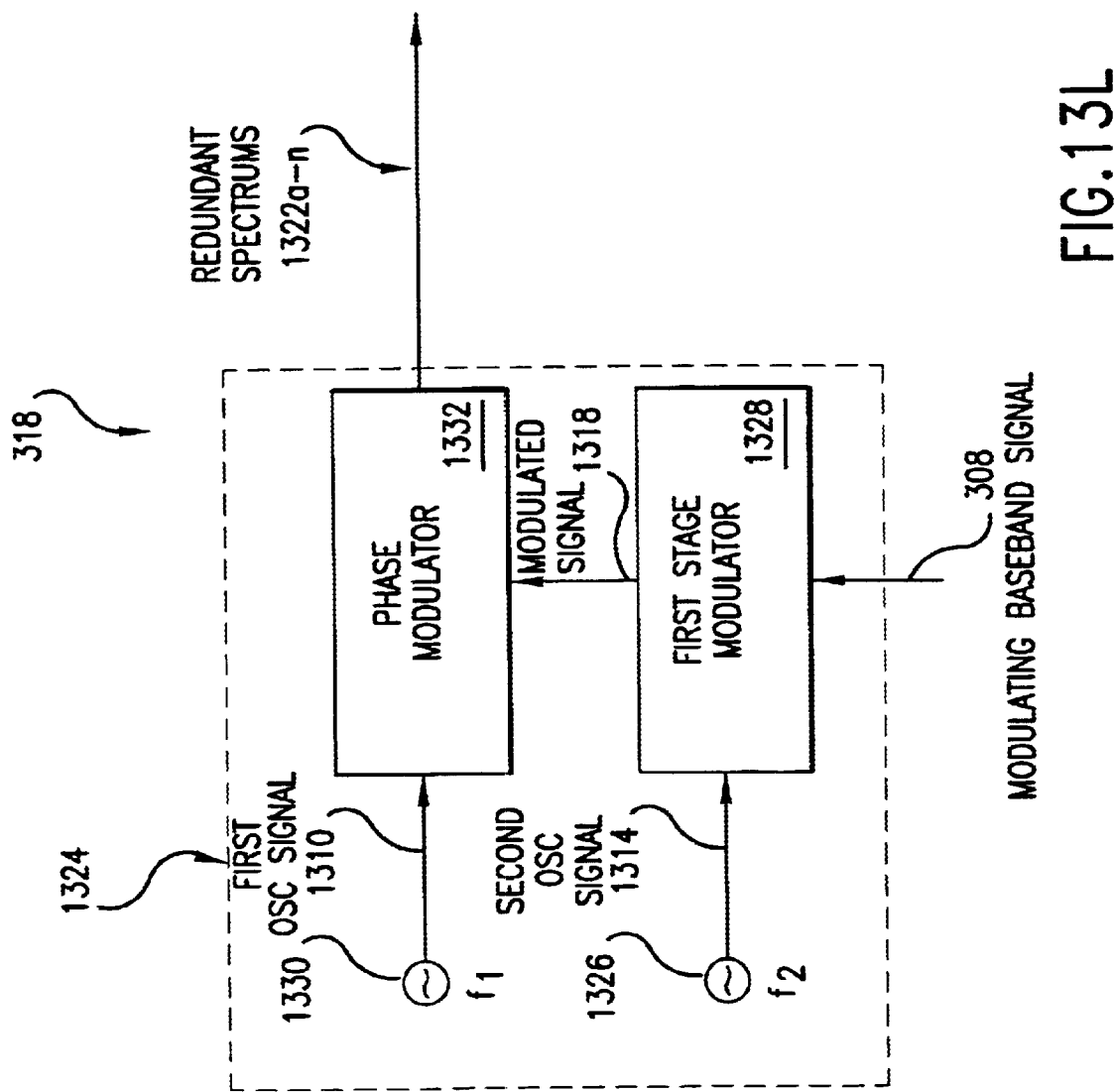
FIG. 13L depicts a structural block diagram associated with flowchart 1300 according to an embodiment of the present invention.

FIG. 13L illustrates a block diagram of generator 1324 which is one embodiment of generator 318 according to the present invention. Generator 1324 comprises first oscillator 1330, second oscillator 1326, first stage modulator 1328; and phase modulator 1332. Generator 1324 accepts a modulating baseband signal and generates multiple redundant spectrums in the manner shown in operational flowchart 1300. In other words, the generator 1324 is a structural embodiment for performing the operational steps in flowchart 1300. However, it should be understood that the scope and spirit of the present invention includes other structural embodiments for performing steps in flowchart 1300. The specifics of these other structural embodiments will be apparent to persons skilled in the relevant art(s) based on the discussion contained herein. Flowchart 1300 will be re-visited to further illustrate the present invention in view of the structural components in generator 1324:

In step 302, first stage modulator 1328 accepts the modulating baseband signal 308.

In step 1302, first oscillator 1330 generates the first oscillating signal 1310. Preferably, oscillating signal 1310 is substantially a sinusoid (although other periodic waveforms can used) with a characteristic frequency $f_1$.

In step 1304, second oscillator 1326 generates second oscillating signal 1314. The second oscillating signal 1314 is preferably a sinewave (although other waveforms could be used) with a characteristic frequency $f_2$.

In step 1306, the first stage modulator 1328 modulates the second oscillating signal 1314 with the modulating baseband signal 308, resulting in a modulated (mod) signal 1318, with a corresponding modulated spectrum 1320 (FIG. 13J) that is centered at $f_2$. As discussed earlier, first stage modulator 1328 can be any type of modulator including but not limited to: an amplitude modulator, a frequency modulator, a phase modulator, etc., or a combination thereof.

In step 1308, phase modulator 1332 phase modulates the first oscillating signal 1310 with modulated signal 1318. In other words, phase modulator 1332 shifts the phase of the first oscillating signal 1310 as a function of modulated signal 1318, resulting in redundant spectrums 1322*a–n*. The degree of phase shift per relative unit change in modulated signal 1314 is arbitrary, and up to the system designer.

Each redundant spectrum 1332*a–n* is substantially identical to the other redundant spectrums, and carries a copy of the necessary information to reconstruct modulating baseband signal 308. (i.e. each redundant spectrum includes the necessary amplitude, phase, and frequency information to substantially reconstruct the modulating baseband signal 308.)

In step 306, (optional) medium interface module 320 (FIG. 3F) transmits the redundant spectrums 1322*a–n* over a communications medium 322. It is expected, but not required, that the redundant spectrums 1322*a–n* are generated at a first location and sent to a second location over the communications medium. At the second location, the redundant spectrums are processed to reconstruct modulating baseband signal 308. In one embodiment, the communications medium 322 is a wireless communications link.

As stated above, each redundant spectrum 1322*a–n* at least substantially or entirely contains a copy of the information to reconstruct modulating baseband signal 308. As such, even if one or more of the redundant spectrums 1322*a–n* are corrupted by a jamming signal in the communications medium 322, the modulating baseband signal 308 can still be recovered from any of the other redundant spectrums 1322*a–n* that have not been corrupted.

4.2.2.1.2 Example Components of the Embodiments

The following section and subsections describe various embodiments related to the method(s) and structure(s) for generating redundant spectrums by phase modulating an oscillating signal with a modulated signal. These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based of the teachings contained herein. The invention is intended and adapted to include such alternate embodiments.

4.2.2.1.2.1 First Stage Modulator

Example embodiments of step 1306 in flowchart 1300 (FIG. 13A), and the first stage modulator 1328 are discussed in the following sections. The example embodiments include but are not limited to: amplitude modulation, frequency modulation, phase modulation, and combinations thereof.

4.2.2.1.2.1.1 First Embodiment: Amplitude Modulation (AM) Mode, Including Amplitude Shift Keying (ASK) Mode According to an embodiment of the invention, step 1306 includes amplitude modulating the second oscillating signal 1314 with the modulating baseband signal 308. The operational and structural description for such amplitude modulation is substantially similar to that described in section 4.2.1.2.1.1 above. Specifically, steps 302, 402, 502, in flowchart 500 (FIG. 5A) and the related discussion apply to amplitude modulation (AM), which includes amplitude shift keying (ASK). However, in the embodiment being described herein, the second oscillating signal 1314 replaces first oscillating signal 408 (FIG. 5C and 5F). Furthermore, the description of AM modulator 512 (FIG. 5H) applies to first stage modulator 1328 when modulator 1328 is an AM modulator.

4.2.2.1.2.1.2 Second Embodiment: Frequency Modulation (FM) Mode, Including Frequency Shift Keying (FSK) Mode According to an embodiment of the invention, step 1306 includes frequency modulating the second oscillating signal 1314 with the modulating baseband signal 308. The operational and structural description for such frequency modulation is substantially similar to that described in section 4.2.1.2.1.2 above. Specifically, steps 302, 402, 602, in flowchart 600 (FIG. 6A) and the related discussion apply to frequency modulation (FM), which includes frequency shift keying (FSK). However, in the present embodiment being described herein, the second oscillating signal 1314 replaces first oscillating signal 408 (FIG. 6C and 6F). Furthermore, the description of FM modulator 612 (FIG. 6H) applies to first stage modulator 1328 when modulator 1328 is an FM modulator.

4.2.2.1.2.1.3 Third Embodiment: Phase Modulation (PM) Mode, Including Phase Shift Keying (PSK) Mode According to an embodiment of the invention, step 1306 includes phase modulating the second oscillating signal 1314 with the modulating baseband signal 308. The operational and structural description for such phase modulation is substantially similar to that described in section 4.2.1.2.1.3 above. Specifically, steps 302, 402, 702, in flowchart 700 (FIG. 7A) and the related discussion apply to phase modulation (PM), including phase shift keying (PSK). However, in the embodiment being described herein, the second oscillating signal 1314 replaces first oscillating signal 408 (FIG. 7C and 7F). Furthermore, the description of PM modulator 712 (FIG. 7H) applies to first stage modulator 1328 when modulator 1328 is a PM modulator.

4.2.2.1.2.1.4 Other Embodiments:

The embodiments for the first stage modulator 1328 described above are provided for purposes of illustration. These embodiments are not intended to limit the invention. Alternate embodiments, differing slightly or substantially from those described herein, will be apparent to those skilled in the relevant art(s) based on the teachings contained herein. Such alternate embodiments include but are not limited to combinations of the above mentioned embodiments. Such alternate embodiments fall within the scope and spirit of the present invention.

4.2.2.1.3 Implementation Examples

Exemplary operational and/or structural implementations related to the method(s), structure(s), and/or embodiments described above are presented in this section (and its subsections). These implementations are presented herein for purposes of illustration, and not limitation. The invention is not limited to the particular implementation examples described herein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

4.2.2.1.3.1 First Stage Modulator 1328

Implementation examples for the first stage modulator 1328 (FIG. 13L) are described below.

4.2.2.1.3.1.1 AM Modulator as a Variable Gain Transistor Amplifier

As described in section 4.2.2.1.2.1.1, the first stage modulator 1328 can be an AM modulator. An AM modulator can be implemented as a variable gain transistor amplifier, which is described in detail in section 4.2.1.3.1.1 and FIG. 9A, to which the reader is directed for a description of this aspect of the invention.

4.2.2.1.3.1.2 FM Modulator as a Voltage Controlled Oscillator

As described in section 4.2.2.1.2.1.2, the first stage modulator 1328 can be a FM modulator. An FM modulator can be implemented as a voltage controlled crystal oscillator (VCXO), which is described in detail in section 4.2.1.3.1.2 and to which the reader is directed for a description of this aspect of the invention.

4.2.2.1.3.1.3 PM Modulator as a Tunable Filter

As described in section 4.2.2.1.2.1.3, first stage modulator 1328 can be a PM modulator. A PM modulator can be implemented as a tunable filter, which is described in detail in section 4.2.1.3.2.1 and FIGS. 11A–E, to which the reader is directed for a description of this aspect of the invention.

4.2.2.1.3.1.4 Other Implementations

The implementations described above for first stage modulator 1328 are provided for purposes of illustration. These implementations are not intended to limit the invention. Alternate implementations, differing slightly or substantially from those described herein, will be apparent to persons skilled in the relevant art(s) based on the teachings contained herein. Such alternate implementation include but are not limited to combinations of the above mentioned implementations. Such alternate implementations fall within the scope and spirit of the present invention.

4.2.2.1.3.2 Phase Modulator 1332

Implementation examples for the phase modulator 1332 (FIG. 13L) are described below.

4.2.2.1.3.2.1. Phase Modulator 1332 as a Tunable Filter

Phase modulator 1332 (FIG. 13L) can be implemented as a tunable filter. The implementation of the phase modulator 1332 as a tunable filter is similar to the implementation of the phase modulator 820 as a tunable filter, which was described in detail in section 4.2.1.3.2.1 and FIGS. 12A–E. However, for phase modulator 1332 (in contrast to the phase modulator 820), the modulated signal 1318 controls voltage controlled capacitance device 1206 (instead of second oscillating signal 806), and first oscillating signal 1310 is the input signal to capacitor 1202 (instead of modulated signal 412).

4.2.2.1.3.2.2 Other Implementations

The implementation described above for phase modulator 1332 is provided for purposes of illustration only. These implementation are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

4.2.2.2 Second Embodiment: Generating Redundant Spectrums by Frequency Modulating an Oscillating Signal With a Modulated Signal The following discussion relates to a second embodiment of generating redundant spectrums by modulating an oscillating signal with a modulated signal. The second embodiment is to frequency modulate an oscillating signal with a modulated signal to generate redundant spectrums with substantially the same information content.

4.2.2.2.1 High Level Description

The following discussion includes an operational process for generating redundant spectrums by frequency modulating an oscillating signal with a modulated signal. Also, a structural description for achieving this process is described herein for illustrative purposes, and is not meant to limit the invention in any way. In particular, the process described in this section can be achieved using any number of structural implementations, at least one of which is described in this section. The details of the structural description will be apparent to those skilled in the art based on the teachings herein.

Figure 13M:
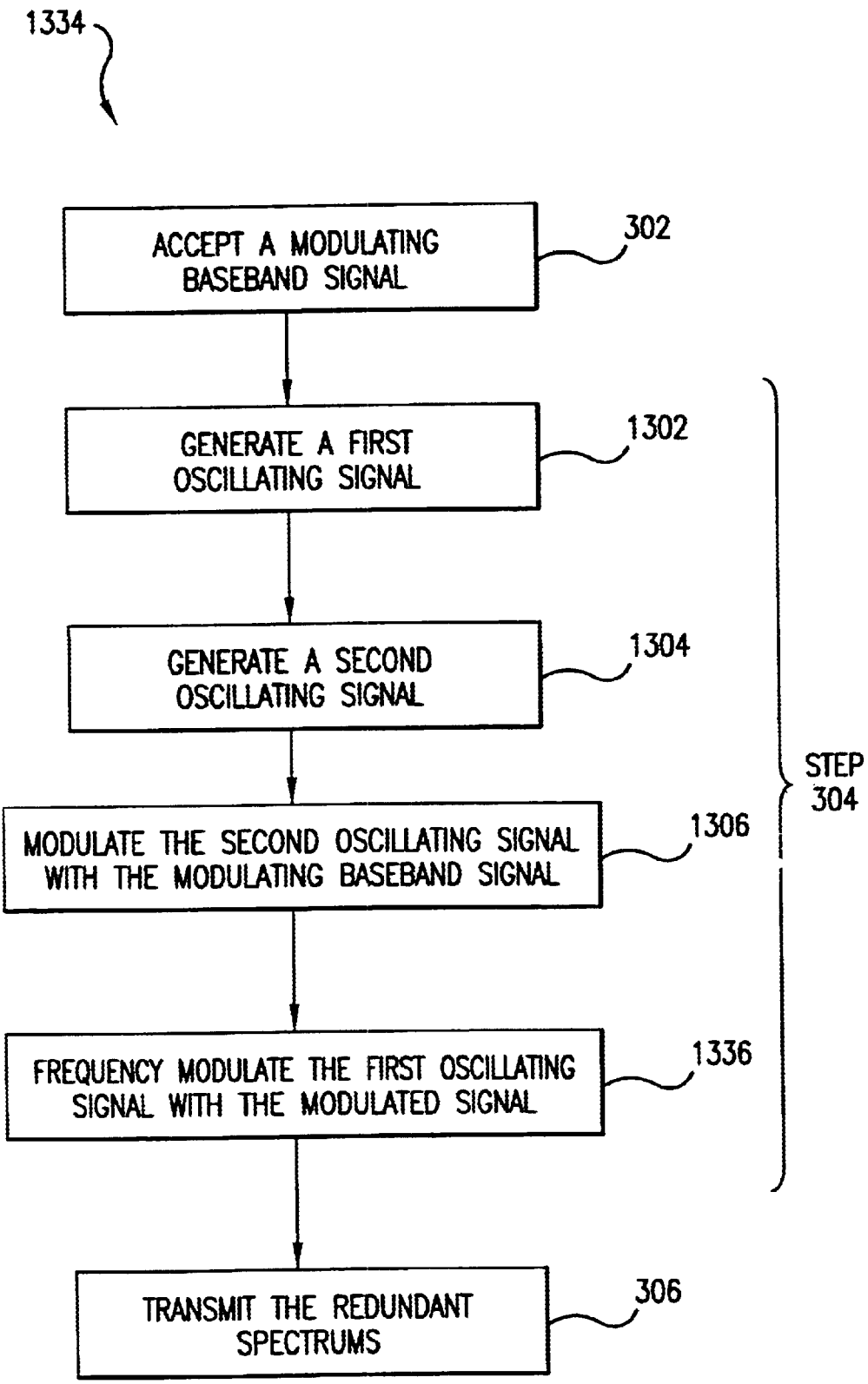
FIG. 13M depicts a flowchart 1334, which illustrates generating redundant spectrums by frequency modulating an oscillating signal with a modulated signal according an embodiment of the present invention.

4.2.2.2.1.1 Operational Description:

FIG. 13M depicts a flowchart 1334 for generating multiple redundant spectrums by frequency modulating an oscillating signal with a modulated signal. In the following discussion, the steps in flowchart 1334 will be discussed in relation to the example signal diagrams shown in FIGS. 13B–13K. The signal diagrams illustrated in FIGS. 13B–13K were first discussed in relation to section 4.2.2.1.1.1 (operational description of generating redundant spectrums by phase modulating an oscillating signal), but are also applicable to the present embodiment of frequency modulating an oscillating signal with a modulated signal.

In step 302, the modulating baseband signal 308 is accepted. FIG. 13B illustrates the modulating baseband signal 308, and FIG. 13C illustrates a corresponding the spectrum 310 and image spectrum 311 for modulating baseband signal 308. It is noted that step 302, signal 308, and spectrums 310, 311 described herein are the same as those described in relation to FIGS. 3A–3D. They are re-illustrated here for convenience.

In step 1302, a first oscillating signal 1310 (FIG. 13D) is generated. The first oscillating signal 1310 is preferably a sinewave (but other periodic waveforms could be used) with a characteristic frequency $f_1$. As such, the first oscillating signal 1310 has a frequency spectrum 1312 that is substantially a tone at $f_1$ (FIG. 13E). Preferably, $f_1$ for the first oscillating signal 408 is much higher than the highest frequency B in the modulating baseband signal spectrum 310, which is represented by the break 1311 in the frequency axis of FIG. 13E. For example, the bandwidth B of spectrum 310 is typically on the order of 10 KHz. Whereas, a typical first oscillating signal $f_1$ will on the order of 100 MHZ. These frequency numbers are given for illustration only, and are not meant to limit the invention in any way.

In step 1304, a second oscillating signal 1314 (FIG. 13F) is generated. The second oscillating signal 1314 is preferable a sinewave (but other periodic waveforms could be used) with a constant amplitude and characteristic frequency $f_2$. As such, the second oscillating signal 1314 has a frequency spectrum 1316 that is a tone at $f_2$ (FIG. 13G). Preferably, $f_2$ for the second oscillating signal 1314 is substantially higher than the highest frequency B in the modulating baseband signal spectrum 310, which is represented by the break 1315 in the frequency axis of FIG. 13E. Also preferably, $f_2$ is substantially lower than $f_1$ for the first oscillating signal 1310; which is represented by break 1311 in the frequency axis of FIG. 13E. For example, the bandwidth B of spectrum 310 is typically on the order of 10 KHz, and $f_1$ for the first oscillating signal is typically on the order of 100 MHZ.

Whereas, $f_2$ for the second oscillating signal is on the order of 1 MHz. These frequency numbers are given for illustration only, and are not meant to limit the invention in any way.

In step 1306, the second oscillating signal 1314 is modulated with the modulating baseband signal 308, resulting in a modulated (mod) signal 1318 (FIG. 13H). The modulated signal 1318 depicts the result of amplitude modulation (AM), where the amplitude of the modulating baseband signal 308 has been impressed on the amplitude of the second oscillating signal 1314. The use of AM is done for example purposes only, and is not meant to limit the invention in any way. Any type of modulation scheme could be used including but not limited to: amplitude modulation (AM), frequency modulation (FM), phase modulation (PM), etc., or any combination thereof. These modulation schemes were described in sections 4.2.1.2.1 3, and the reader is referred to the prior sections for additional details.

The modulated signal 1318 has a corresponding modulated spectrum 1320 (FIG. 13I) that is centered around $f_2$, which is the characteristic frequency of the second oscillating signal 1314. The modulated spectrum 1320 carries the necessary information to reconstruct the modulating baseband signal 308. (That is, the modulated spectrum 1320 carries the necessary amplitude, phase, and frequency information to reconstruct the modulating baseband signal 308.) The modulated spectrum 1320 has a generic shape and bandwidth. Those skilled in the art will recognize that the actual shape and bandwidth of modulated spectrum 1320 will depend on the specific modulating baseband signal 308 and type of modulation used to modulate the first oscillating signal 1314. Furthermore, the modulated spectrum 1320 is illustrated to represent double sideband modulation. Those skilled in the art will recognize how to implement the present invention using single sideband modulation, etc. based on the discussion given herein.

FIG. 13J illustrates the typical relative frequency locations of: spectrum 310 that corresponds to modulating baseband signal 308; modulated spectrum 1320 that corresponds to modulated signal 1318, and spectrum 1312 that corresponds to first oscillating signal 1310. Typically, modulated spectrum 1320 exists at a substantially higher frequency than modulating baseband signal spectrum 310, which is represented by break 1315 in the frequency axis. Also, typically, first oscillating signal spectrum 1312 exists at a substantially higher frequency than modulated spectrum 1320, which is represented by break 1311 in the frequency axis of FIG. 13J. For example, a typical modulating baseband spectrum 310 has bandwidth B on the order of 10 KHz. Whereas, atypical modulated spectrum 1320 has a center frequency on the order of 1 MHz, and a typical first oscillating signal spectrum 1312 has a center frequency on the order of 100 MHZ. These frequency values are provided for illustrative purposes only, and are not limiting. The invention can work with any frequency values.

In step 1336, first oscillating signal 1310 is frequency modulated with modulated signal 1318. That is, the frequency of the first oscillating signal 1310 is varied as a function of modulated signal 1318, resulting in redundant spectrums 1322a–n (FIG. 13K). The amount of frequency shift implemented per relative unit change in modulated signal 1318 is arbitrary and is up to the system designer. Each redundant spectrum 1322a–n independently includes the necessary amplitude, phase, and frequency information to reconstruct modulating baseband signal 308.

As shown in FIG. 13K, redundant spectrums 1322a–n are substantially centered around and offset from the first oscillating signal spectrum 1312 at $f_1$; where first oscillating signal 1312 remains substantially unmodulated. First oscillating signal spectrum 1312 can be substantially suppressed or attenuated in step 1308 by optimizing the amount of frequency shift per unit change in modulated signal 1318 or other frequency/phasing shifting techniques, as is well known to those skilled in the art(s). Also, each redundant spectrum 1322a–n is offset from $f_1$ by approximately a multiple of $f_2$ (Hz), where $f_2$ is the frequency of the second oscillating signal. Thus, each redundant spectrum 1332a–n is offset from each other by $f_2$ (Hz).

As stated earlier, example values for $f_1$ and $f_2$ are on the order of 100 MHZ and 1 MHz, respectively. As such, in one example, spectrums 1322b–e are located at 98 MHZ, 99 MHZ, 101 MHZ, and 102 MHZ, respectively. As such, according this numerical example, spectrums 1322b–e occupy a bandwidth of approximately 4 MHZ that is centered around 100 MHZ; which can be sufficiently narrowband to use commercially under the rules of the appropriate governmental or administrative agency (i.e. the FCC or the equivalent thereof). These numerical examples are given for illustration purposes only, and are not meant to limit this invention in any way. Those skilled in the art will recognize that the invention could be operated at other frequencies based on the discussion herein.

In step 306, redundant spectrums 1322a–d are transmitted over a communications medium. It is expected, but not required, that the redundant spectrums 1322a–n would be generated at first location and sent to a second location over the communications medium. At the second location, the redundant spectrums would be processed to reconstruct modulating baseband signal 308. In one embodiment, the communications medium is a wireless communications link.

As stated above, each redundant spectrum 1322a–n at least substantially or entirely contains a copy of the information in spectrum 310. As such, even if one or more of the redundant spectrums 1322a–n are corrupted by a jamming signal in the communications medium, the modulating baseband signal 308 can still be recovered from any of the other redundant spectrums 1322a–n that have not been corrupted.

4.2.2.2.1.2 Structural Description

Figure 13N:
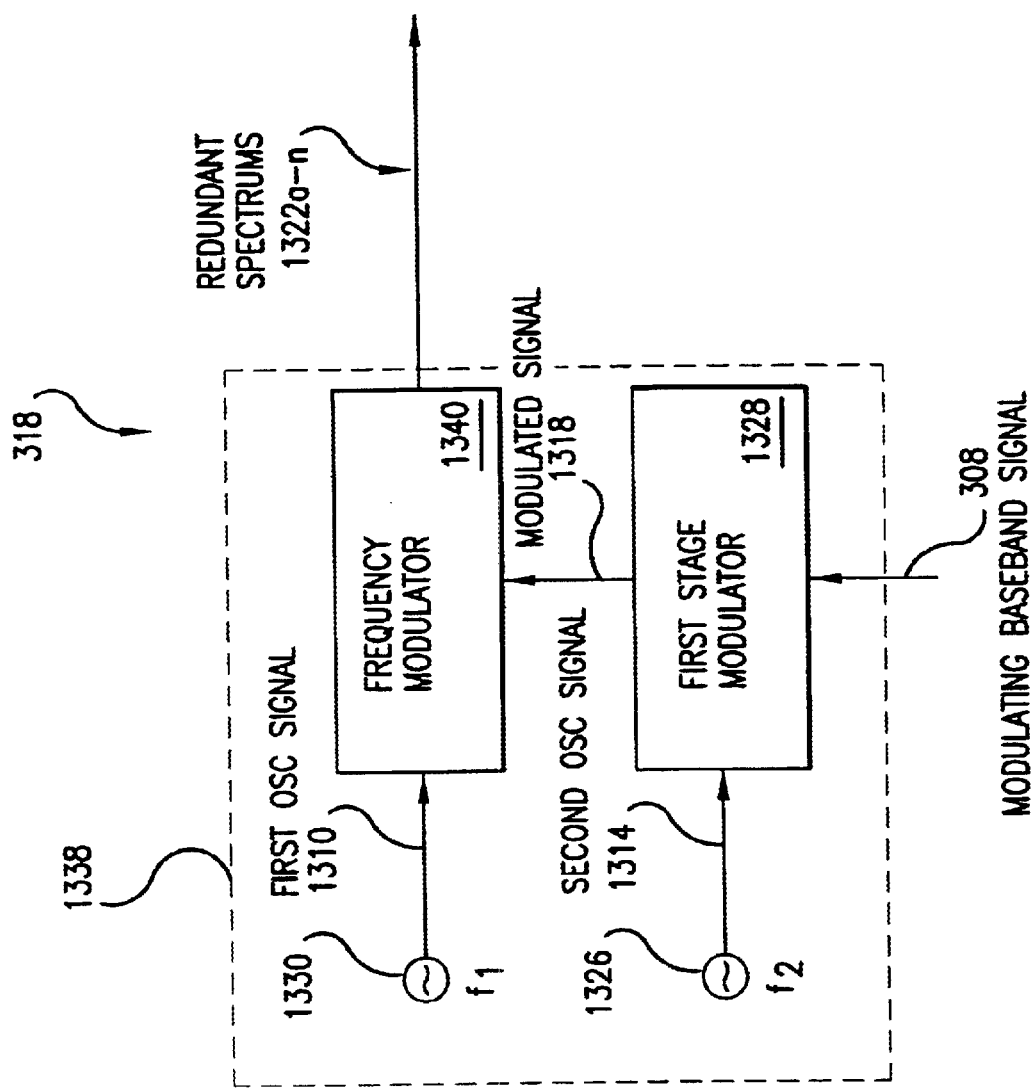
FIG. 13N depicts a structural block diagram associated with flowchart 1334 according to one embodiment of the present invention.
Figures 1, 13N:
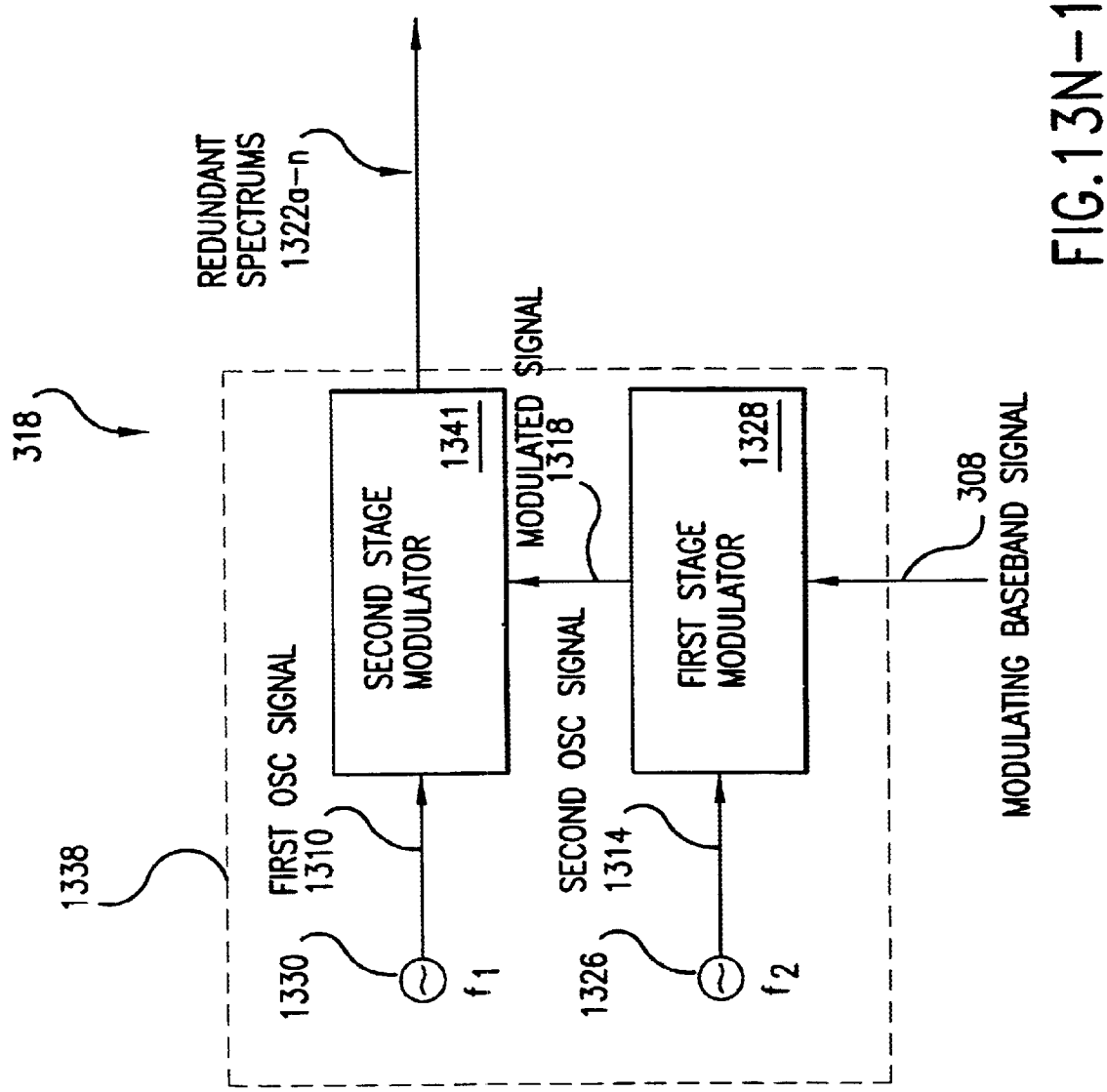
Figure 130:
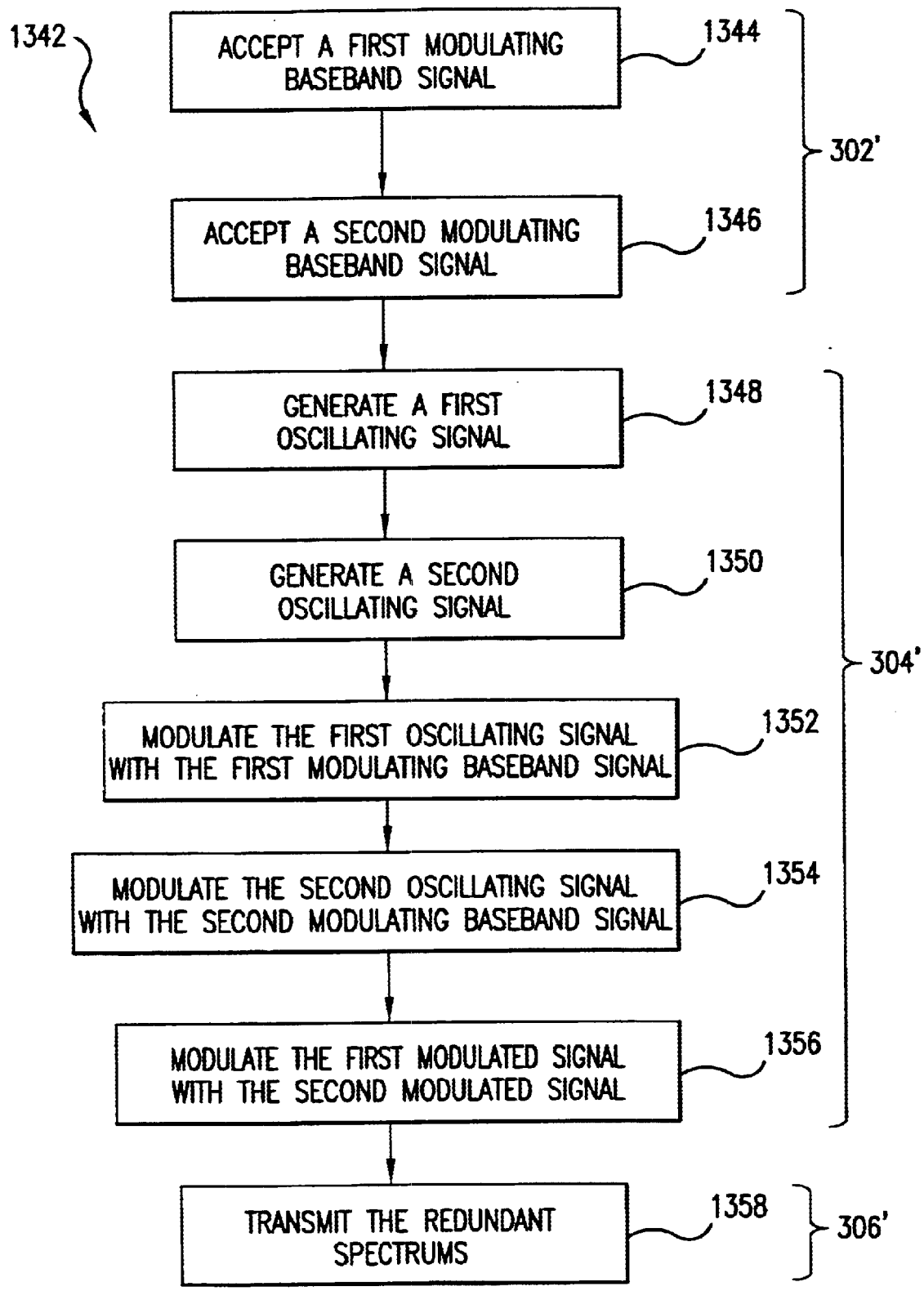

FIG. 13N illustrates a block diagram of generator 1338, which is one embodiment of generator 318 according to the present invention. Generator 1338 comprises first oscillator 1330, second oscillator 1326, first stage modulator 1328, and frequency modulator 1340. Generator 1338 accepts a modulating baseband signal 308 and generates multiple redundant spectrums 1322a–n in the manner shown in operational flowchart 1334. In other words, the generator 1338 is a structural embodiment for performing the operational steps in flowchart 1334 (FIG. 13M). However, it should be understood that the scope and spirit of the present invention includes other structural embodiments for performing steps in flowchart 1334. The specifics of these other structural embodiments will be apparent to persons skilled in the relevant art(s) based on the discussion contained herein. Flowchart 1334 will be re-visited to further illustrate the present invention in view of the structural components in generator 1338.

In step 302, first stage modulator 1328 accepts the modulating baseband signal 308.

In step 1302, first oscillator 1330 generates the first oscillating signal 1310. Preferably, first oscillating signal 1310 is substantially a sinusoid (although other periodic waveforms can used) with a characteristic frequency $f_1$.

In step 1304, second oscillator 1326 generates second oscillating signal 1314. The second oscillating signal 1314 is preferably a sinewave (although other waveforms could be used) with a characteristic frequency $f_2$.

In step 1306, the first stage modulator 1328 modulates the second oscillating signal 1314 with the modulating baseband signal 308, resulting in a modulated (mod) signal 1318, with a corresponding modulated spectrum 1320 that is centered at $f_2$. As discussed earlier, first stage modulator 1328 can be any type of modulator including but not limited to: an amplitude modulator, a frequency modulator, a phase modulator, etc., or a combination thereof.

In step 1336, frequency modulator 1338 frequency modulates the first oscillating signal 1310 with modulated signal 1318. In other words, frequency modulator 1338 shifts the phase of the first oscillating signal 1310 as a function of modulated signal 1318, resulting in redundant spectrums 1322a–n. The degree of phase shift per relative unit change in modulated signal 1318 is arbitrary, and up to the system designer.

Each redundant spectrum 1332a–n includes a copy of the necessary information to reconstruct the modulating baseband signal 308. That is, each redundant spectrum contains the necessary amplitude, phase, and frequency information to reconstruct the modulating baseband signal 308.

In step 306, (optional) medium interface module 320 (FIG. 3F) transmits the redundant spectrums 1322a–n over a communications medium 322. It is expected, but not required, that the redundant spectrums 1322a–n are generated at a first location and sent to a second location over the communications medium. At the second location, the redundant spectrums are processed to reconstruct the modulating baseband signal 308. In one embodiment, the communications medium 322 is a wireless communications link.

As stated above, each redundant spectrum 1322a–n at least substantially or entirely contains a copy of the information necessary to reconstruct the modulating baseband signal 308. As such, even if one or more of the redundant spectrums 1322a–n are corrupted by a jamming signal in the communications medium 322, the modulating baseband signal 308 can still be recovered from any of the other redundant spectrums 1322a–n that have not been corrupted.

4.2.2.2.2 Example Component(s) of the Embodiment(s)

The following section and subsections describe various embodiments related to the method(s) and structure(s) for generating redundant spectrums by frequency modulating an oscillating signal with a modulated signal. These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based of the teachings contained herein. The invention is intended and adapted to include such alternate embodiments.

4.2.2.2.2.1 First Stage Modulator

Example embodiments of step 1306 in flowchart 1334 (FIG. 13M), and the first stage modulator 1328 include but are not limited to the use of: amplitude modulation, frequency modulation, phase modulation, and other types of modulation. These embodiments were discussed in sections 4.2.2.1.2.1.1, 4.2.2.1.2.1.2, 4.2.2.1.2.1.3, 4.2.2.1.2.1.4 respectively; to which the reader is directed for a description of this aspect of the invention. Alternate embodiments, differing slightly or substantially from those described herein, will be apparent to those skilled in the art(s) based on the discussion given herein. Such alternate embodiments fall within the scope and spirit of the present invention.

4.2.2.2.3 Implementation Examples

Exemplary operational and/or structural implementations related to the method(s), structure(s), and/or embodiments described above are presented in this section (and its subsections). These implementations are presented herein for purposes of illustration, and not limitation. The invention is not limited to the particular implementation examples described herein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

4.2.2.2.3.1 First Stage Modulator 1328

Implementation examples for the first stage modulator 1328 (FIG. 13N) are described below.

4.2.2.2.3.1.1 AM Modulator as a Variable Gain Transistor Amplifier

As described in section 4.2.2.2.2.1, the first stage modulator 1328 can be an AM modulator. An AM modulator can be implemented as a variable gain transistor amplifier, which is described in detail in section 4.2.1.3.1.1 and FIG. 9, to which the reader is directed for a description of this aspect of the invention.

4.2.2.2.3.1.2 FM Modulator as a Voltage Controlled Oscillator

As described in section 4.2.2.2.2.1, the first stage modulator 1328 can be a FM modulator. An FM modulator can be implemented as a voltage controlled crystal oscillator (VCXO), which is described in detail in section 4.2.1.3.1.2 and FIG. 10, to which the reader is directed for a description of this aspect of the invention.

4.2.2.2.3.1.3 PM Modulator as a Tunable Filter

As described in section 4.2.2.2.2.1., first stage modulator 1328 can be a PM modulator. A PM modulator can be implemented as a tunable filter, which is described in detail in section 4.2.1.3.2.1 and FIGS. 11A–E, to which the reader is directed for a description of this aspect of the invention.

4.2.2.2.3.1.4 Other Implementations

The implementations described above for first stage modulator 1328 are provided for purposes of illustration. These implementations are not intended to limit the invention. Alternate implementations, differing slightly or substantially from those described herein, will be apparent to persons skilled in the relevant art(s) based on the teachings contained herein. Such alternate implementation include but are not limited to combinations of the above mentioned implementations. Such alternate implementations fall within the scope and spirit of the present invention.

4.2.2.2.3.2 Frequency Modulator 1340

Implementation examples for frequency modulator 1340 (FIG. 13N) are described below.

4.2.2.2.3.2.1 Frequency Modulator 1340 as a VCXO

Frequency Modulator 1340 (FIG. 13N) can be implemented as a voltage controlled crystal oscillator (VCXO). The implementation of frequency modulator 1340 as a VCXO is similar to the implementation of FM modulator 612 as a VCXO, which was fully described in section 4.2.1.3.1.2, and FIG. 10. Those skilled in the arts will recognize how to implement frequency modulator 1340 as a VCXO based on the discussion in section 4.2.1.3.1.2, and FIG. 10.

4.2.2.2.3.2.2. Other Implementations

The implementation described above for frequency modulator 1340 is provided for purposes of illustration only. These implementation are not intended to limit the invention. Alternate implementations, differing slightly or substantially from those described herein, will be apparent to persons skilled in the relevant art(s) based on the teachings contained herein. Such alternate implementations include but are not limited to voltage controlled oscillators that do not utilize a crystal for a frequency frequency reference. Such alternate implementations fall within the scope and spirit of the present invention.

4.2.2.3 Other Embodiments:

The embodiments described above in sections 4.2.2.1 and 4.2.2.2 (for generating redundant spectrums by modulating an oscillating signal with a modulated signal) are provided for purposes of illustration. These embodiments are not intended to limit the invention. Alternate embodiments, differing slightly or substantially from those described above, will be apparent to those skilled in the arts based on the teachings given herein. Such alternate embodiments include, but are not limited to: generating redundant spectrums by amplitude modulating an oscillating signal with a modulated signal; and generating redundant spectrums by using any other modulation technique to modulate an oscillating signal with a modulated signal. FIG. 13N-1 illustrates a generalized structural embodiment to summarize the embodiments described in section 4.2.2 and the related subsections. FIG. 13N-1 includes a second stage modulator 1341 that modulates first oscillating signal 1310 with a modulated signal 1318. As discussed in sections 4.2.2.1 and 4.2.2.2, second stage modulator 1341 is preferably a phase modulator or a frequency modulator, but may also be an amplitude modulator or any other type of modulator (or device) that will generate redundant spectrums 1322*a–n*.

4.2.3 Generating Redundant Spectrums by Modulating a First Modulated Signal With a Second Modulated Signal The following discussion relates to modulating a first modulated (first mod) signal with a second modulated (second mod) signal to generate redundant spectrums with substantially the same information content. This embodiment allows for a single set of redundant spectrums to carry the necessary information to reconstruct two distinct modulating baseband signals.

4.2.3.1 High Level Description

The following discussion includes an operational process for generating redundant spectrums by modulating a first modulated signal with a second modulated signal. Preferably, the first modulated signal is phase or frequency modulated with the second modulated signal; although other types of modulation could be used including but not limited to AM modulation. Also, a structural description for achieving this process is described herein for illustrative purposes, and is not meant to limit the invention in any way. In particular, the process described in this section can be achieved using any number of structural implementations, at least one of which is described in this section. The details of the structural description will be apparent to those skilled in the art based on the teachings herein.

4.2.3.1.1 Operational Description:

FIG. 13O depicts a flowchart 1342 for generating multiple redundant spectrums by modulating a first modulated signal with a second modulated signal. In the following discussion, the steps in flowchart 1342 will be discussed in relation to the example signal diagrams shown in FIGS. 13P–13V.

In step 1344, a first modulating baseband signal 1360 (FIG. 13P) is accepted. First modulating baseband signal 1360 is illustrated as a digital signal for example purposes only, and could be an analog signal as is well known to those skilled in the art(s).

In step 1346, a second modulating baseband signal 1366 (FIG. 13S) is accepted. Second modulating baseband signal 1366 is illustrated as an analog signal for example purposes only, and could be an digital signal as is will be understood by those skilled in the art(s).

In step 1348, a first oscillating signal 1362 (FIG. 13Q) is generated. The first oscillating signal 1362 is preferably a sine wave (but other periodic waveforms could be used) with a characteristic frequency $f_1$. Preferably, $f_1$ for the first oscillating signal is much higher than the highest frequency of the first modulating baseband signal 1360.

In step 1350, a second oscillating signal 1368 (FIG. 13T) is generated. The second oscillating signal 1368 is preferably a sine wave (but other periodic waveforms could be used) with a characteristic frequency $f_2$. Preferably, $f_2$ for the second oscillating signal 1368 is much higher than the highest frequency of the second modulating baseband signal 1366, but is substantially lower than $f_1$ for the first oscillating signal 1362.

Figure 13P:
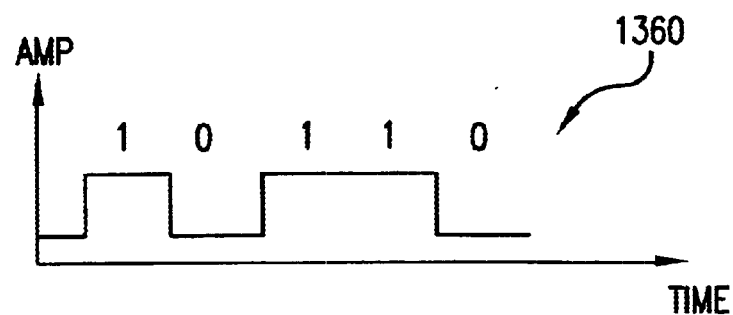
FIGS. 13P–V depict several signal diagrams that are associated with flowchart 1342 according to an embodiment of the present invention.
Figure 13Q:
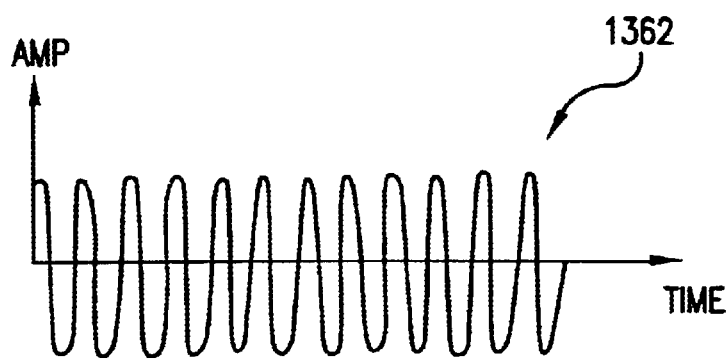
Figure 13R:
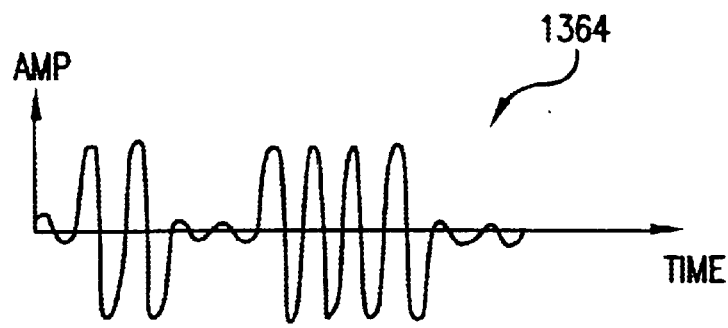

In step 1352, the first oscillating signal 1362 is modulated with the first modulating baseband signal 1360, resulting in first modulated (mod) signal 1364 (FIG. 13R). The first modulated signal 1364 depicts the result of amplitude modulation, where the amplitude of first modulating baseband signal 1360 is impressed on the first oscillating signal 1362. The illustration of AM is meant for example purposes only, and is not meant to limit the invention in any way. Any type of modulation can be implemented including but not limited to: amplitude modulation (AM), frequency modulation (FM), phase modulation (PM), etc., or any combination thereof. These various modulation schemes were explored in sections: 4.2.1.2.1.1–4.2.1.2.1.3.

Figure 13S:
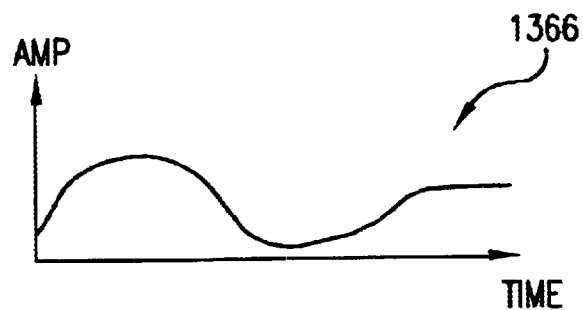
Figure 13T:
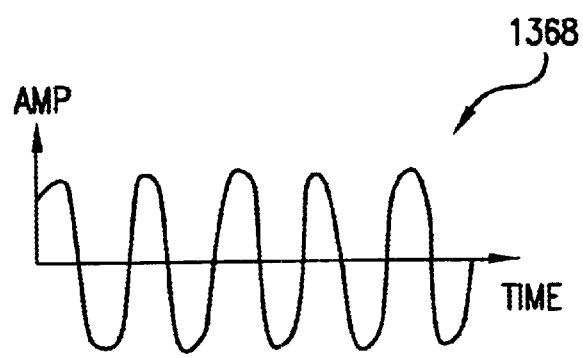
Figure 13U:
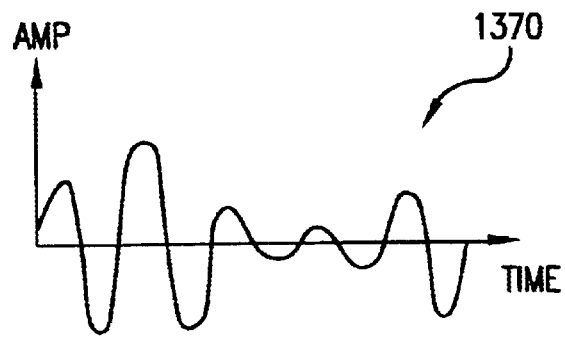

In step 1354, the second oscillating signal 1368 is modulated with the second modulating baseband signal 1366, resulting in second modulated (mod) signal 1370 (FIG. 13U). The second modulated signal 1370 depicts the result of amplitude modulation, where the amplitude of second modulating baseband signal 1366 is impressed on the second oscillating signal 1368. The illustration of AM is meant for example purposes only, and is not meant to limit the invention in any way. Any type of modulation can be implemented including but not limited to: amplitude modulation (AM), frequency modulation (FM), phase modulation (PM), etc., or any combination thereof. These various modulation schemes were explored in sections: 4.2.1.2.1.1–4.2.1.2.1.3.

Figure 13V:
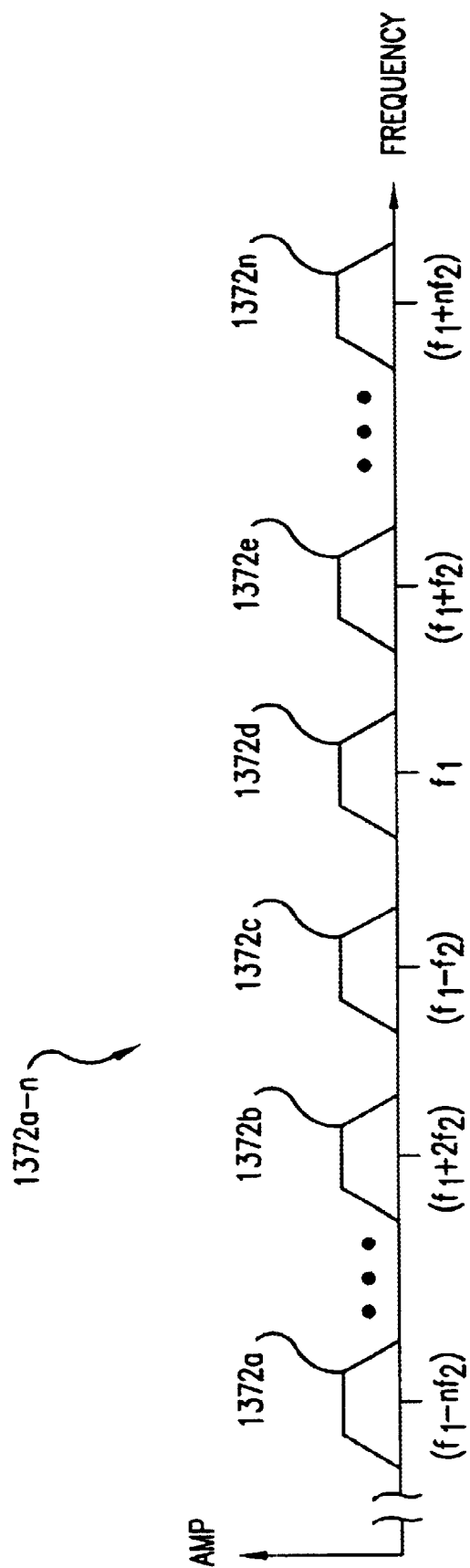

In step 1356, the first modulated signal 1364 is modulated with the second modulated signal 1370, resulting in redundant spectrums 1372*a–n* (FIG. 13V). Preferably, the first modulated signal is phase modulated or frequency modulated with the second modulated signal; although other modulation techniques could be used including but not limited to amplitude modulation. In other words, preferably, the phase or frequency of the first modulated signal is varied as a function of the second modulated signal.

Each redundant spectrum 1372*a–n* includes the necessary amplitude, phase, and frequency information to substantially reconstruct the second modulating baseband signal 1366. Furthermore, the amplitude level of redundant spectrums 1372*a–n* will fluctuate (in mass) between discrete levels over time because first modulated signal 1364 is the result of AM modulation using digital modulating baseband signal 1360. As such, the fluctuating power level of redundant spectrums 1372*a–n* carries the information to reconstruct modulating baseband signal 1360.

In step 1358, (optional) medium interface module 320 transmits the redundant spectrums 1372*a–n* over communications medium 3222. It is expected but not required that the redundant spectrums 1372*a–n* would be generated at a first location and sent to a second location over the communications medium. At the second location, the redundant spectrums 1372a–n would be processed to reconstruct the first modulating baseband signal 1360 and the second modulating baseband signal 1366. In one embodiment, the communications medium is a wireless communications link.

4.2.3.1.2 Structural Description

Figure 13W:
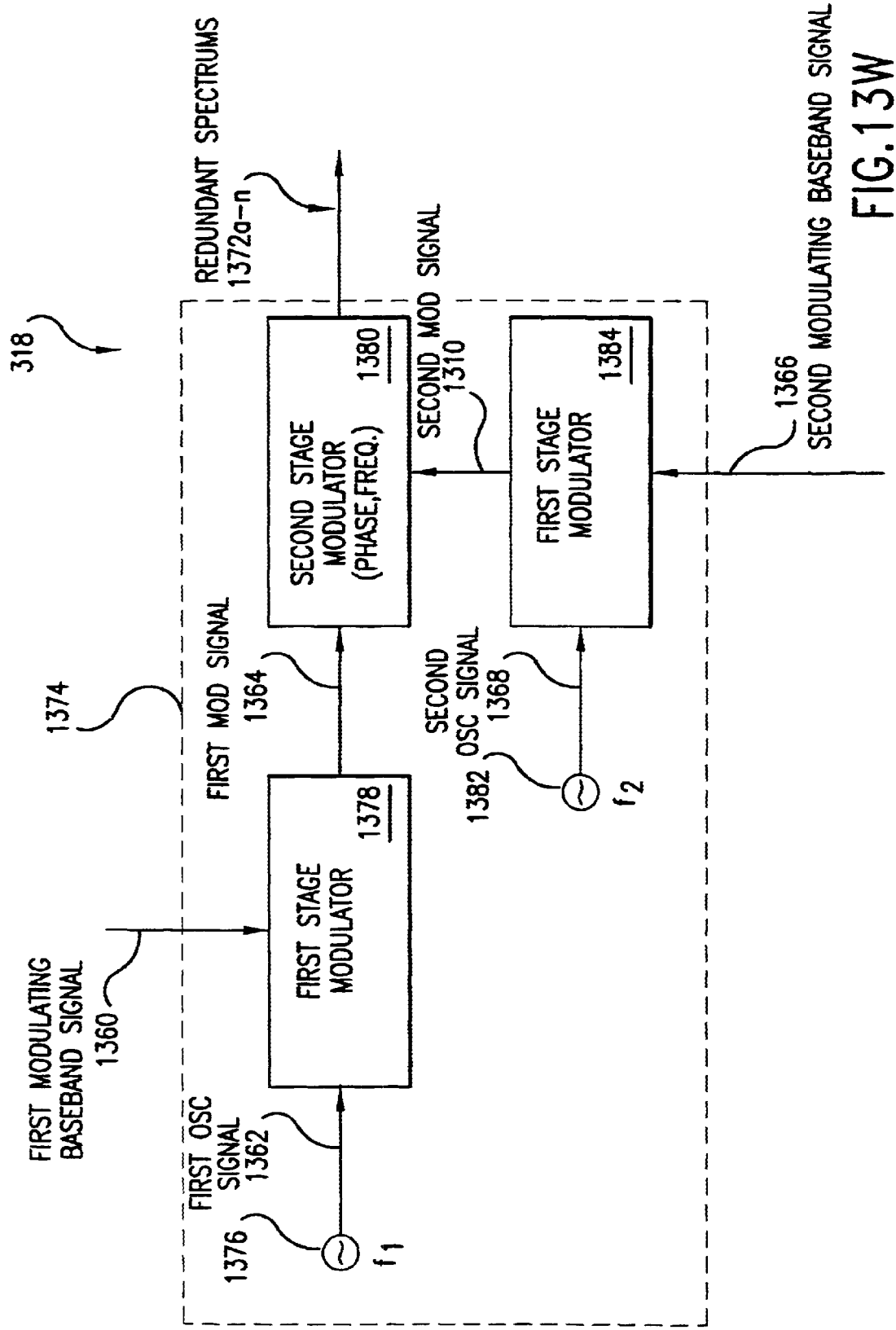
FIG. 13W depicts a structural block diagram associated with flowchart 1342 according to one embodiment of the present invention.

FIG. 13W illustrates a block diagram of generator 1374, which is one embodiment of generator 318 according to the present invention. Generator 1374 comprises first oscillator 1376, second oscillator 1382, first stage modulator 1378, first stage modulator 1384, and second stage modulator 1380. Generator 1374 accepts first modulating baseband signal 1360, and second modulating baseband signal 1366, and generates multiple redundant spectrums 1372a–n in the manner shown in operational flowchart 1342. In other words, the generator 1374 is a structural embodiment for performing the operational steps in flowchart 1342. However, it should be understood that the scope and spirit of the present invention includes other structural embodiments for performing steps in flowchart 1342. The specifics of these other structural embodiments will be apparent to persons skilled in the relevant art(s) based on the discussion contained herein. Flowchart 1342 will be re-visited to further illustrate the present invention in view of the structural components in generator 1374.

In step 1344, the first stage modulator 1378 accepts first modulating baseband signal 1360 (FIG. 13P). First modulating baseband signal 1360 is illustrated as digital signal for example purposes only, and could be an analog signal as is well known to those skilled in the art(s).

In step 1346, the first stage modulator 1384 accepts second modulating baseband signal 1366 (FIG. 13S). The second modulating baseband signal 1366 is illustrated as an analog signal for example purposes only, and could be an digital signal as is well known to those skilled in the art(s).

In step 1348, first stage modulator 1378 generates the first oscillating signal 1362 (FIG. 13Q). The first oscillating signal 1362 is preferably a sine wave (but other periodic waveforms could be used) with a characteristic frequency $f_1$. Preferably, $f_1$ for the first oscillating signal is much higher than the highest frequency of the first modulating baseband signal 1360.

In step 1350, oscillator 1382 generates the second oscillating signal 1368 (FIG. 13T). The second oscillating signal 1368 is preferably a sine wave (but other periodic waveforms could be used) with a characteristic frequency $f_2$. Preferably, $f_2$ for the second oscillating signal 1368 is much higher than the highest frequency of the second modulating baseband signal 1366, but is substantially lower than $f_1$ for the first oscillating signal 1362.

In step 1352, the first stage modulator 1378 modulates first oscillating signal 1362 with the first modulating baseband signal 1360, resulting in first modulated signal 1364 (FIG. 13R). The first modulated signal 1364 depicts the result of amplitude modulation, where the amplitude of first modulating baseband signal 1360 is impressed on the first oscillating signal 1362. The illustration of AM is meant for example purposes only, and is not meant to limit the invention in any way. Any type of modulation can be implemented including but not limited to: amplitude modulation (AM), frequency modulation (FM), phase modulation (PM), etc., or any combination thereof. These various modulation schemes were explored in sections: 4.2.1.2.1.1–4.2.1.2.1.3.

In step 1354, the first stage modulator 1384 modulates the second oscillating signal 1368 with the second modulating baseband signal 1366, resulting in second modulated (mod) signal 1370 (FIG. 13U). The second modulated signal 1370 depicts the result of amplitude modulation, where the amplitude of second modulating baseband signal 1366 is impressed on the second oscillating signal 1368. The illustration of AM is meant for example purposes only, and is not meant to limit the invention in any way. Any type of modulation can be implemented including but not limited to: amplitude modulation (AM), frequency modulation (FM), phase modulation (PM), etc., or any combination thereof. These various modulation schemes were explored in sections: 4.2.1.2.1.1–4.2.1.2.1.3.

In step 1356, the second stage modulator 1380 modulates first modulated signal 1364 with the second modulated signal 1370, resulting in redundant spectrums 1372a–n (FIG. 13V). Preferably, second stage modulator 1380 is a phase or frequency modulator; although other types of modulators could be used including but not limited to an AM modulator. As such, preferably, second stage modulator 1380 phase modulates or frequency modulates the first modulated signal 1364 with the second modulating signal 1370 to generate redundant spectrums 1372a–n.

Each redundant spectrum 1372a–n includes the necessary amplitude, phase, and frequency information to substantially reconstruct the second modulating baseband signal 1366. Furthermore, the amplitude level of redundant spectrums 1372a–n will fluctuate (in mass) between discrete levels over time because first modulated signal 1364 is the result of AM modulation using digital modulating baseband signal 1360. As such, the fluctuating power level of redundant spectrums 1372a–n carries the information to reconstruct modulating baseband signal 1360.

In step 1358, the (optional) medium interface module 320 generates redundant spectrums 1372a–n are transmitted over a communications medium. It is expected but not required that the redundant spectrums 1372a–n would be generated at a first location and sent to a second location over the communications medium. At the second location, the redundant spectrums 1372a–n would be processed to reconstruct the first modulating baseband signal 1360 and the second modulating baseband signal 1366. In one embodiment, the communications medium is a wireless communications link, and the (optional) medium interface module 320 is an antenna.

5.0 Spectrum Processing Prior To Transmission Over a Communications Medium

As discussed, the present invention generates redundant spectrums that have substantially the same information content; where each redundant spectrum contains the necessary amplitude, phase, and frequency information to reconstruct the modulating baseband signal. It is expected but not required that the redundant spectrums would be generated at a first location and transmitted over a communications medium to a second location. The number of redundant spectrums generated by the present invention is arbitrary and can be unlimited. However, the typical communications medium will have a physical and/or administrative (i.e. FCC regulations) bandwidth limitation that will restrict the number of redundant spectrums that can be practically transmitted over the communications medium. Also, there may be other reasons to limit the number of spectrums to be transmitted. Therefore, preferably, the redundant spectrums are processed prior to transmission over a communications medium.

5.1 High Level Description

This section (including its subsections) provides a high level description of processing redundant spectrums prior to transmission over a communications medium according to the present invention. In particular, an operational description of processing the redundant spectrums is described at a high level. Also, a structural implementation is described herein for illustrative purposes only, and is not limiting. In particular, the process described in this section can be achieved using any number of structural implementations, one of which is described in this section. The details of the possible structural implementations will be apparent to those skilled in the relevant art(s) based on the teachings herein.

5.1.1 Operational Description

Figure 14A:
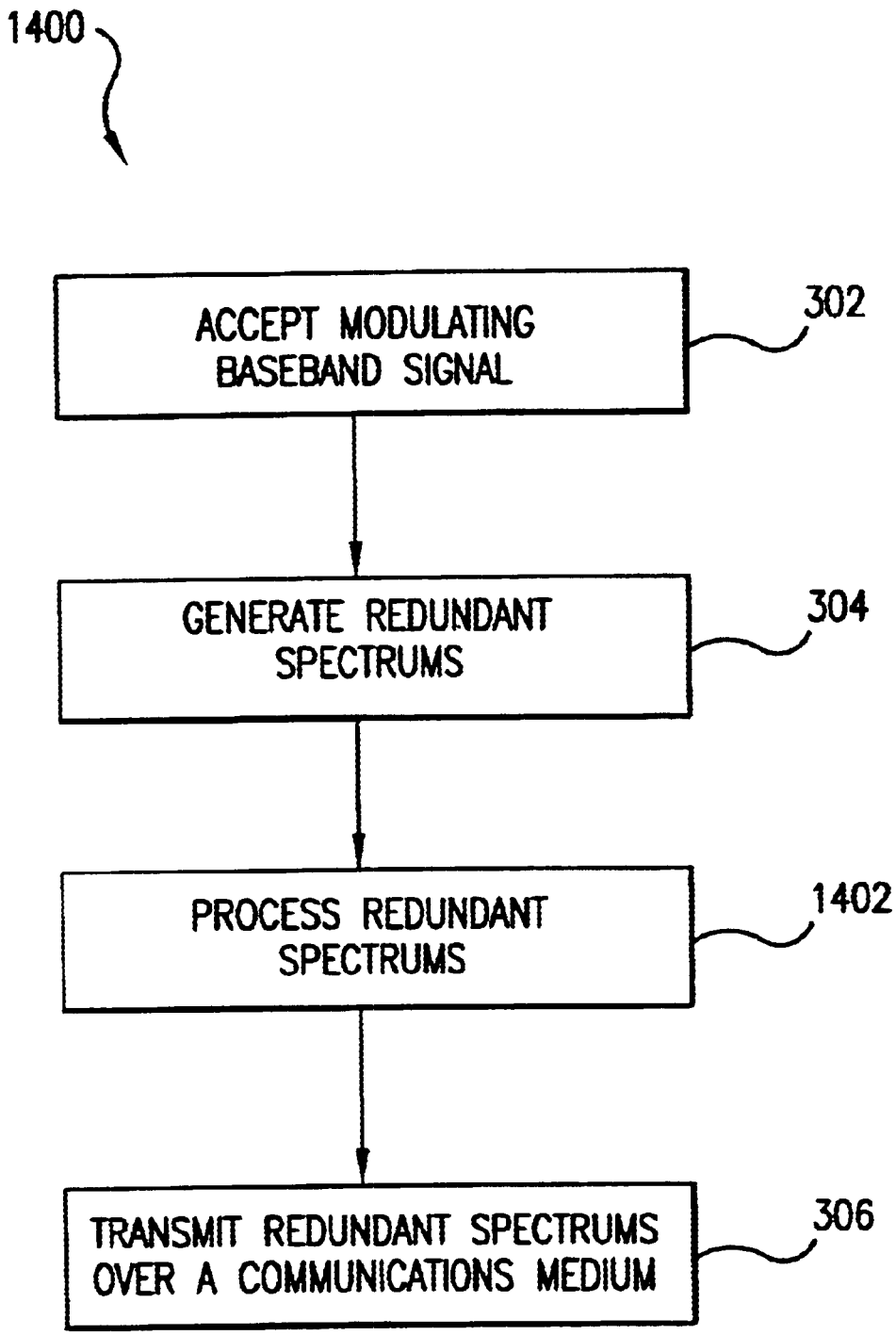
FIG. 14A depicts flowchart 1400, which illustrates processing redundant spectrums according to one embodiment of the present invention.

FIG. 14A depicts flowchart 1400 for processing redundant spectrums according to an embodiment of the present invention. The steps in flowchart 1400 will be discussed in relation to the example signal diagrams in FIGS. 14B–C. It is expected but not required that step 1402 would be performed after step 304 and before step 306 of FIG. 3A. That is, it is expected that the steps would be performed after the redundant spectrums are generated but before the redundant spectrums are sent over a communications medium. Steps 304 and 306 are included below for convenience.

In step 302, a modulating baseband signal 308 (FIG. 3B) is accepted with corresponding spectrum 310 (FIG. 3C).

In step 304, redundant spectrums 312a–n (FIG. 14B) are generated. Redundant spectrums 312a–n were first illustrated in FIG. 3E, and are presented in FIG. 14B for convenience. As discussed earlier, each redundant spectrum 312a–n has the necessary amplitude, and phase information to substantially reconstruct modulating baseband signal 308.

In step 1402, redundant spectrums 312a–n are processed, resulting in spectrums 1404b–n (FIG. 14C), which are a subset of redundant spectrums 312a–n. That is, there is at least one less redundant spectrum 1404b–n when compared with redundant spectrums 312a–n. Although FIGS. 14B–C suggest that only spectrum 312a was removed, any spectrum or subset of spectrums 312a–n could be removed. Preferably, spectrum removal in step 1402 is achieved using a filtering operation, which will be described in more detail in following subsections. The spectrum removal need not be complete as long as the spectrum energy in the removed spectrum is sufficiently attenuated so as to be negligible compared to the remaining spectrums 1404b–n. Furthermore, the "a–n" designation is used for convenience only and puts no limitation on the number of spectrums in redundant spectrums 312a–n. In other words, "n" is a variable. Likewise, the "b–n" designation puts no limitation on the number of spectrums in 1404b–n.

In step 306, redundant spectrums 1404b–n are transmitted over a communications medium. It is expected, but not required, that redundant spectrums 1404b–n are generated at a first location and sent to a second location over the communications medium. At the second location, the redundant spectrums are processed to reconstruct the modulating baseband signal 308. In one embodiment, the communications medium is a wireless communications link.

5.1.2 Structural Description

Figure 14D:
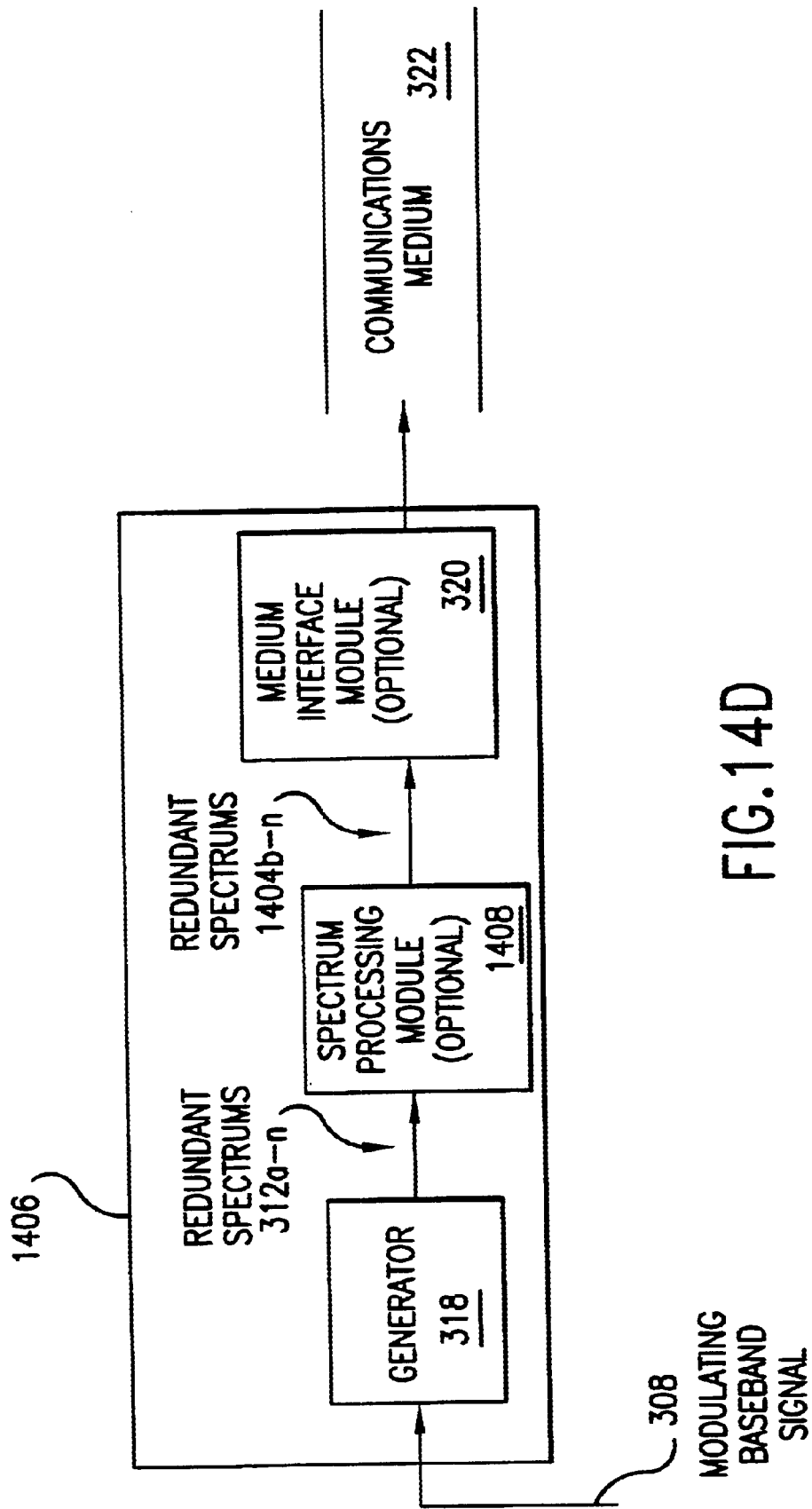
FIG. 14D depicts a structural block diagram associated flowchart 1400 according to an embodiment of the present invention.

FIG. 14D illustrates a block diagram of transmission system 1406. Transmission system 1406 includes: generator 318, spectrum processing module 1408, and (optional) medium interface module 320 according to one embodiment of the present invention. Transmission system 1406 accepts a modulating baseband signal 308 and transmits redundant spectrums 1404b–n in a manner shown in flowchart 1400. In other words, the transmission system 1406 is a structural embodiment for performing the operational steps in flowchart 1400. However, it should be understood that the scope and spirit of the present invention includes other structural embodiments for performing steps in flowchart 1400. The specifics of these other structural embodiments will be apparent to persons skilled in the relevant art(s) based on the discussion contain herein. Flowchart 1400 will re-visited to further illustrate the present invention in view of the structural components in transmission system 1406.

In step 302, generator 318 accepts modulating baseband signal 308 (FIG. 3B) that has the corresponding spectrum 310 (FIG. 3C).

In step 304, generator 318 generates redundant spectrums 312a–n (FIG. 14B). Redundant spectrums 312a–n were first illustrated in FIG. 3E, and are presented in FIG. 14B for convenience. As discussed earlier, each redundant spectrum 312a–n has the necessary amplitude and phase information to substantially reconstruct modulating baseband signal 308.

In step 1402, spectrum precessing module 1408 processes redundant spectrums 312a–n, resulting in redundant spectrums 1404b–n (FIG. 14C), which are a subset of redundant spectrums 312a–n. That is, preferably, there is at least one less redundant spectrum 1404b–n than in redundant spectrums 312a–n (in other embodiments no spectrums are deleted).

In step 306, (optional) medium interface module 320 transmits redundant spectrums 1404b–n over communications medium 322. It is expected, but not required, that redundant spectrums 1404b–n would be generated at a first location and sent to a second location over communications medium 322. At the second location, the redundant spectrums would be processed to reconstruct the modulating baseband signal 308. In one embodiment, the communications medium 322 is a wireless communications link.

5.2 Example Embodiments:

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

5.2.1 First Embodiment Processing Redundant Spectrums

The following discussion relates to an operational and structural embodiment for processing redundant spectrums. Redundant spectrums can be generated in at least two configurations. In one configuration, the redundant spectrums are a continuous (and unbroken) string of redundant spectrums as is illustrated by redundant spectrums 1508a–n in FIG. 15B. In an alternative configuration, the redundant spectrums are centered on, and offset from, an unmodulated spectrum (or tone) as is illustrated by spectrums 1602a–n in FIG. 16A. The processing of both configurations will be described concurrently in the following discussion. Other configurations may be possible and are within the scope and spirit of the present invention.

5.2.1.1 Operational Description

Figure 15A:
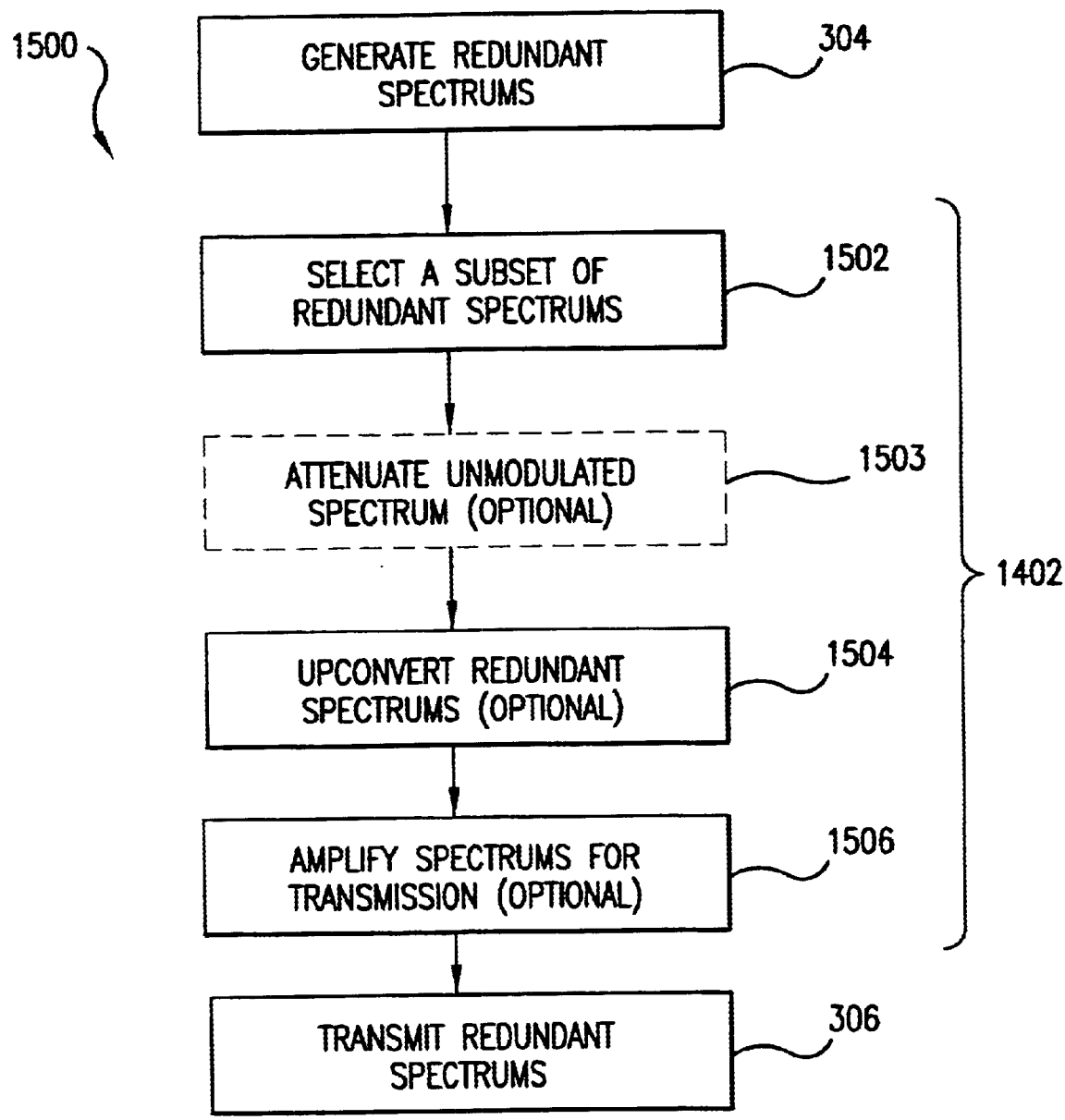
FIG. 15A depicts flowchart 1500, which illustrates processing redundant spectrums according to an embodiment of the present invention.

FIG. 15A depicts flowchart 1500 for processing redundant spectrums according to one embodiment of the present invention. As such, flowchart 1500 includes an expansion of step 1402 in flowchart 1400. The steps in flowchart 1500 will be discussed in relation to the example signal diagrams shown in FIG. 15B–D, and the signal diagrams shown in FIGS. 16A–D.

Figure 15B:
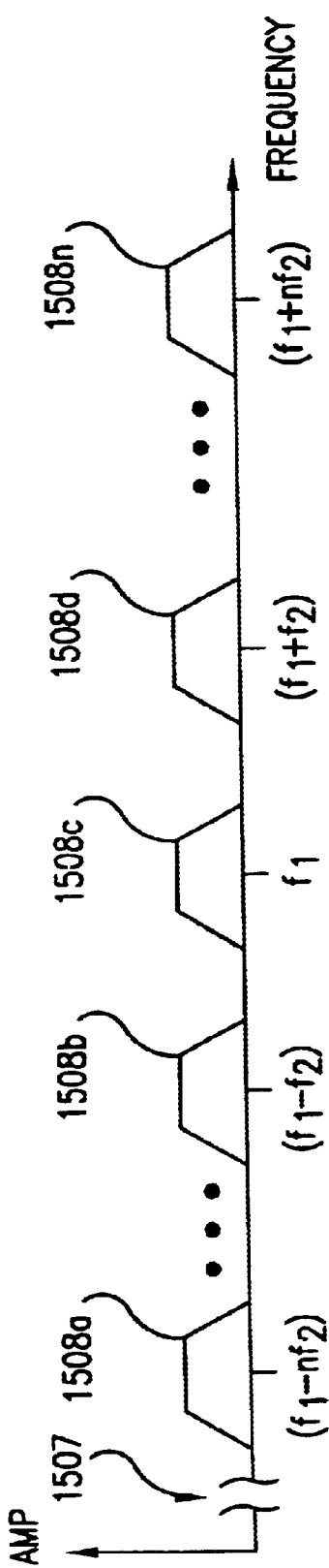
FIGS. 15B–F depict several signal diagrams that are associated with flowchart 1500 according to an embodiment of the present invention.

In step 304, redundant spectrums are generated. This step was first discussed in FIG. 3A, but is repeated here for convenience. FIG. 15B illustrates redundant spectrums 1508*a–n*, which are a continuous and unbroken string of redundant spectrums that are centered at $f_1$ (Hz), and offset from $f_1$ (Hz) by a multiple of $f_2$ (Hz). An alternative configuration of redundant spectrums is illustrated in FIG. 16A. FIG. 16A illustrates redundant spectrums 1602*a–n* which are centered on an oscillating signal spectrum 1604, where oscillating signal 1604 is substantially unmodulated. Other configurations are possible and are within the scope and spirit of the present invention. Breaks 1507 and 1601 in the frequency axises of FIGS. 15B and 16A indicate that spectrums 1508*a–n* and 1602*a–n* are located above baseband frequencies.

Figure 15C:
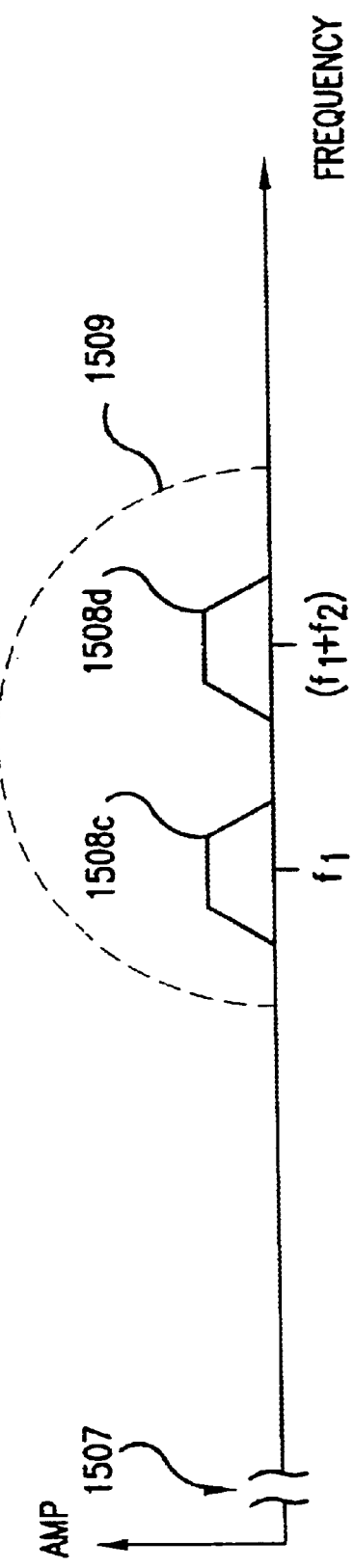

In step 1502, a subset of redundant spectrums is selected. FIG. 15C illustrates subset 1509, which includes spectrums 1508*c,d* that are centered at $f_1$ and $(f_1+f_2)$, respectively. FIG. 16 illustrates subset 1606, which includes spectrums 1602*c,d* and oscillating signal spectrum 1604. The redundant spectrums selected for the subsets 1509 and 1606 are completely arbitrary, and dependent on system design consideration. In other words, the selection of spectrums 1508*c,d* in subset 1509, and the selection of spectrums 1602*c,d* in subset 1606 is meant for illustration purposes only and not meant to limit the invention in any way. Other spectrums could have been chosen as is well known to those skilled in the art(s). Furthermore, the number of redundant spectrums in the subsets 1509 and 1606 is not limited to two; greater or fewer redundant spectrums could be chosen. However, there may be a practical bandwidth limitation to the number of redundant spectrums that should be selected if the subset of spectrums is to be transmitted over a communications medium, as is well known to those skilled in the art(s).

In step 1503, oscillating signal spectrum 1604 is attenuated as shown in FIG. 16C. Step 1503 is only applicable to redundant spectrums that contain an unmodulated spectrum, such as oscillating signal spectrum 1604 in FIG. 16B. Even when step 1503 is applicable, it is optional based on the choice of the system designer. This is indicated by the dotted line representation for step 1503 in flowchart 1500. Step 1503 is optional because there may be advantages to transmitting an unmodulated spectrum (or tone) along with the redundant spectrums. One advantage being that an unmodulated tone can be used as a frequency reference at the receiver for coherent detection configurations, as is well known to those skilled in the art(s).

Figure 15D:
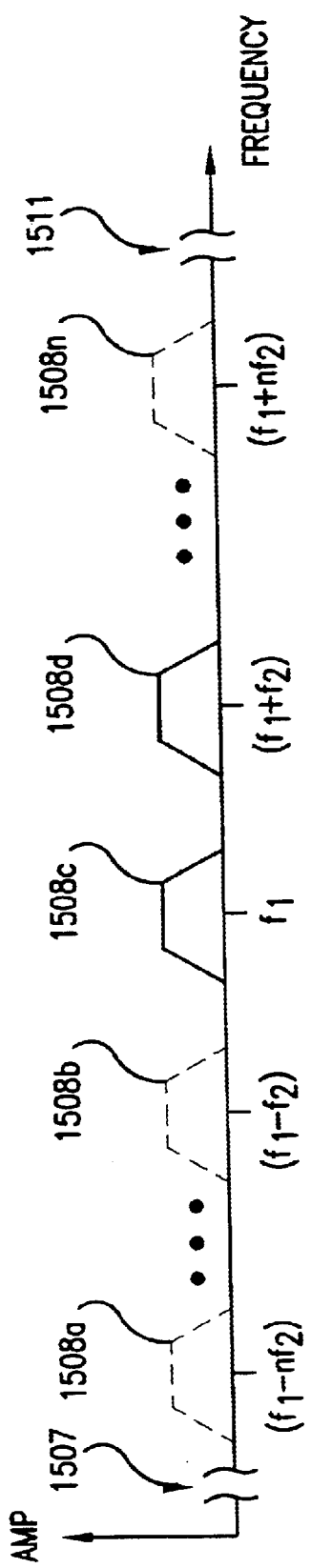

In step 1504, the subset of redundant spectrums is upconverted to a higher frequency. FIG. 15D illustrates subset redundant spectrums 1508*c,d*, and also includes redundant spectrums 1508*a,b,n*. Redundant spectrums 1508*a,b,n* are included (despite being removed in step 1502) in order to illuminate the bandwidth effects of up-converting a large string a redundant spectrums, which may not be apparent if only two spectrums were discussed. FIG. 16E illustrates subset redundant spectrums 1608*c,d*, and additional spectrums 1608*a,n* for similar reasoning. The bandwidth effect of upconverting redundant spectrums varies depending on whether the redundant spectrums were generated using frequency modulation. It will be shown below that upconverting redundant spectrums that were generated with frequency modulation (hereinafter referred to as FM-related spectrums) results in upconverted spectrums that occupy a larger frequency bandwidth when compared with the up-conversion of non-FM related spectrums.

Figure 15E:
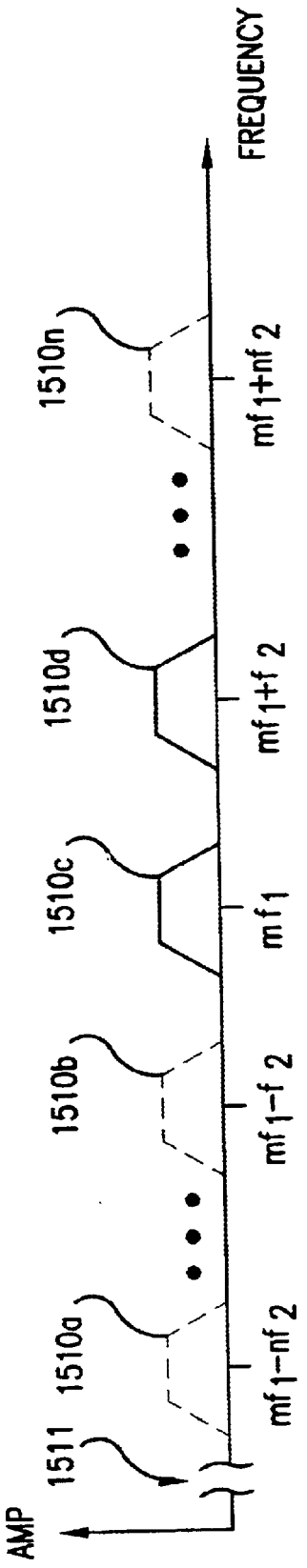
Figure 15F:
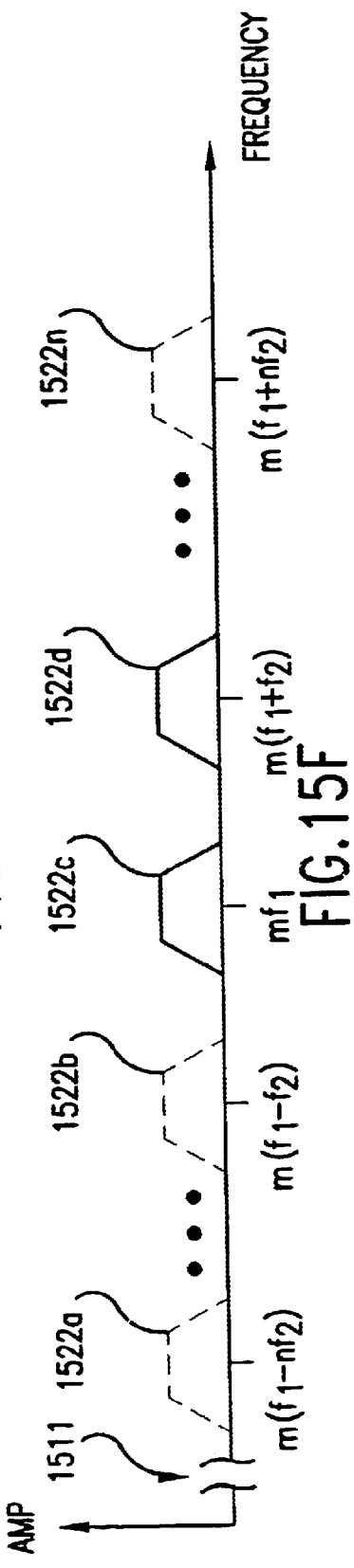

FIG. 15E illustrates redundant spectrums 1510*a–n*, which results from upconverting spectrums 1508*a–n* that are non-FM related. Redundant spectrums 1510*a–n* contain substantially the same information as redundant spectrums 1508*a–n*, and thus can be used to reconstruct the modulating baseband signal 308. But, redundant spectrums 1510*a–n* are located at higher frequencies relative to spectrums 1508*a–n*, which is represented by the relative placement of break 1511 in the frequency axises of FIGS. 15D and 15E. FIG. 15F illustrates redundant spectrums 1522*a–n*, which result from upconverting redundant spectrums 1508*a–n* that are FM related. Redundant spectrums 1522*a–n* also contain substantially the same information as redundant spectrums 1508*a–n*, and can be used to reconstruct the modulating baseband signal 308.

Referring to FIGS. 15E and 15F, the difference between FM related spectrums 1522*a–n* (FIG. 15F) and non-FM related spectrums 1510*a–n* (FIG. 15E) is that the frequency bandwidth occupied by FM related spectrums 1522*a–n* is larger than that of non-FM related spectrums 1510*a–n*. This occurs because the frequency spacing between FM related spectrums 1522*a–n* has increased by the frequency multiplication factor ("m" in FIGS. 15E–F) relative to the frequency spacing of spectrums 1508*a–b*. This effect does not occur for non-FM related spectrums 1510*a–n*, and can be seen by comparing spectrums 1510*a–n* (FIG. 15E) to that of spectrums 1522*a–n* (FIG. 15F).

For example, FM-related spectrums 1522*c,d* are located at $mf_1$ (Hz) and $mf_1+mf_2$ (Hz), respectively. Thus, the frequency spacing between FM related spectrums 1522*c,d* is $mf_2$ (Hz) Whereas, non-FM related spectrums 1510*c,d* are located at $mf_1$ and $mf_1+f_2$, respectively, for a frequency spacing of $f_2$ (Hz). The overall result is that up-conversion of non-FM related spectrums does not increase the bandwidth occupied by the resulting upconverted spectrums. Whereas, the upconversion of FM related spectrums increases the bandwidth occupied by the resulting up-converted spectrums by a factor of "m", where "m" is the frequency multiplication factor implemented by the up-conversion.

The bandwidth spreading effect described above also applies to spectrums 1602*a–n* that are centered on unmodulated spectrum 1604, shown in FIG. 16D. FIG. 16E illustrates redundant spectrums 1608*a–n*, which result from upconverting redundant spectrums 1602*a–n* that are non-FM related. And, FIG. 16F illustrates redundant spectrums 1610*a–n*, which result from upconverting redundant spectrums 1602*a–n* that are FM related.

An advantage of upconverting redundant spectrums is that frequency upconversion facilitates transmission over a communications medium as is well known to those skilled in the art(s). This particularly so for wireless links, where relative antenna size requirements vary inversely with frequency of the signal to be transmitted.

In step 1506, redundant spectrums 1510*c,d* and/or spectrums 1608*c,d* are amplified. Typically this is done to boost signal power prior to transmission over a communications medium.

In step 306, redundant spectrums 1510*c,d* and/or spectrums 1608*c,d* are transmitted over a communications medium. An advantage of transmitting a subset of the full set of redundant spectrums is that the channel bandwidth requirements to carry the redundant spectrums is reduced. The bandwidth reduction can be substantial since the number of redundant spectrums generated in step 304 can be unlimited.

As stated earlier, flowchart 1500 contains an expansion of step 1402 in flowchart 1400. Specifically, steps 1502–1506 are an expansion of step 1402. Steps 1502–1506 are all independent and optional steps for processing redundant spectrums after generation. As such, one or more of steps 1502–1506 can be eliminated, and/or the order of operation of the steps can be changed.

5.2.1.2 Structural Description

Figure 15G:
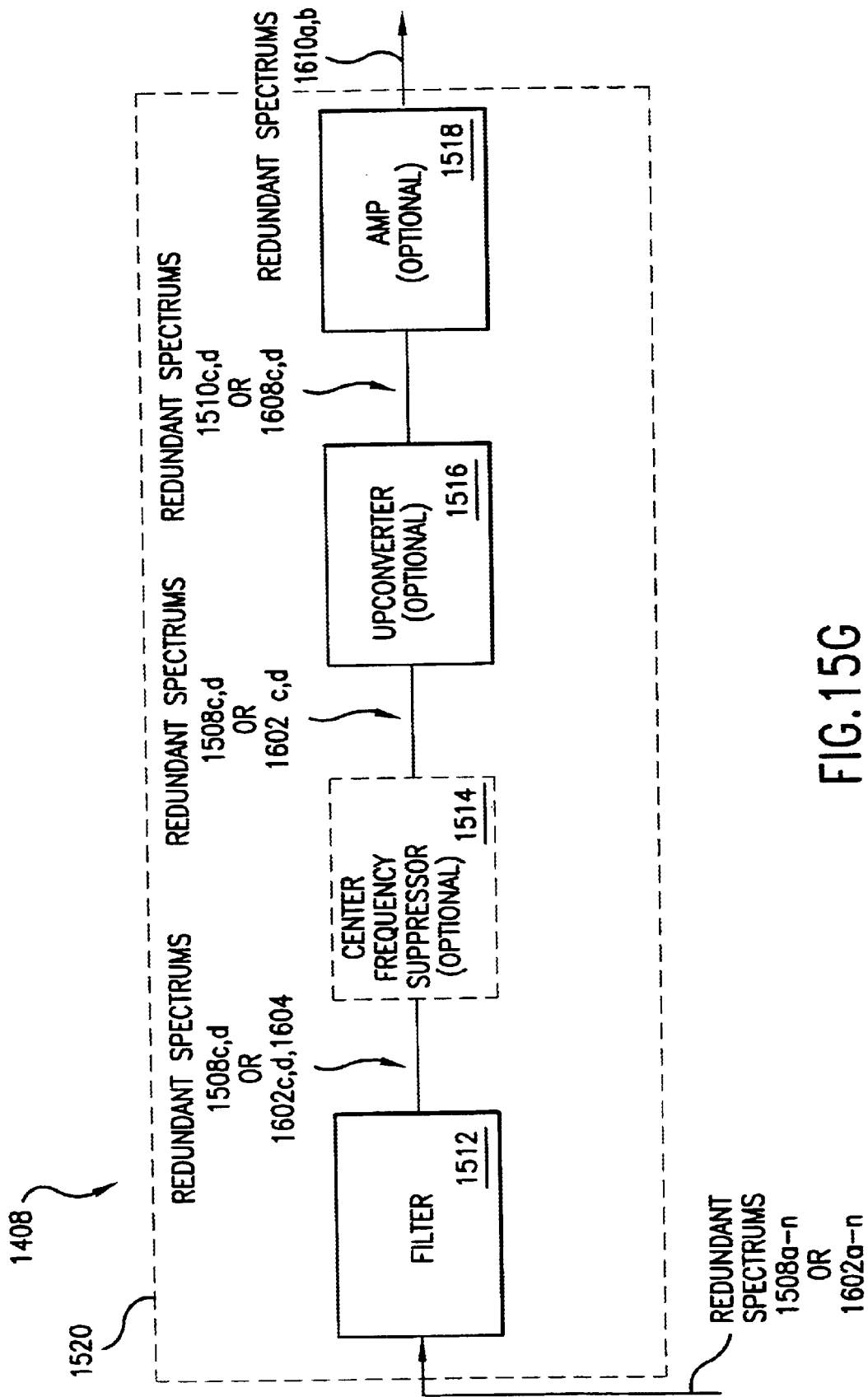
FIG. 15G depicts a structural block diagram associated with flowchart 1500 according to an embodiment of the present invention.

FIG. 15G illustrates a block diagram of spectrum processing module 1520, which is one embodiment of spectrum processing module 1408. Spectrum processing module 1520 includes: filter 1512, center frequency suppressor 1514, multiplier 1516, and amplifier 1518, according to one embodiment of the present invention. Spectrum processing module 1408 is one structural embodiment for performing the operational steps in flowchart 1500. However, it should be understood that the scope and spirit of the present invention includes other structural embodiments for performing steps in flowchart 1500. The specifics of these other structural embodiments will be apparent to persons skilled in the relevant art(s) based on the discussion contain herein. Flowchart 1500 will re-visited to further illustrate the present invention in view of the structural components in the spectrum processing module 1408.

In step 304, generator 318 generates redundant spectrums. FIGS. 15B and 16A illustrates two distinct configurations of redundant spectrums which can be generated. FIG. 15B illustrates redundant spectrums 1508*a–n* that are a continuous string of redundant spectrums. FIG. 16A illustrates redundant spectrums 1602*a–n* that are centered on a substantially unmodulated oscillating signal 1604. Other configurations are possible and are within the scope and spirit of the present invention.

In step 1502, filter 1512 selects a subset of redundant spectrums. The passband of filter 1512 determines which redundant spectrums are selected, and the passband is tunable by changing the effective reactance of one or more of the filter components as was described in section 4.2.1.3.1.3. FIG. 15C illustrates a passband 1509 containing redundant spectrums 1508*c,d*. FIG. 16B illustrates a passband 1606 containing redundant spectrums 1602*c,d* and oscillating signal 1604. FIGS. 15C and 16B suggest that filter 1512 is a bandpass filter. However, those skilled in the art will recognize that high pass filters, low pass filters, or other known filter combinations would be useful for filtering redundant spectrums to select a subset of redundant spectrums. These other filter configurations are within the scope and spirit of the present invention.

In step 1503, center frequency suppressor 1514 attenuates first oscillating signal spectrum 1604 as shown in FIG. 16C. Center frequency suppressor 1514 is applicable to redundant spectrums that contain an unmodulated spectrum, such as unmoduilated oscillating signal spectrum 1604 in FIG. 16B. Even when center frequency suppressor 1514 is applicable, it is optional because an unmodulated spectrum (or tone) may be ignored or used as a frequency reference at the receiver for coherent detection systems. Center frequency suppressor 1514 is typically a bandstop filter that has a stop band 1603 that encompasses oscillating signal spectrum 1604, but not the adjacent redundant spectrums 1602*c,d*, as is illustrated in FIG. 16C. Other filter configurations may be useful including but not limited to a combination of lowpass and highpass filter as will be understood by those skilled in the art(s) based on the discussion given herein. Furthermore, phasing techniques can be implemented during redundant spectrum generation to attenuate first oscillating signal spectrum 1604 as was discussed in section 4.2.2.1.1.1.

In step 1504, up-converter 1516 upconverts the redundant spectrums to a higher frequency. FIG. 15E illustrates redundant spectrums 1510*a–n* which results when redundant spectrums 1508*a–n* are non-FM related spectrums. FIG. 15F illustrates redundant spectrums 1522*a–n* which results when redundant spectrums 1508*a–n* are FM-related spectrums. It will be noted spectrums 1522*a–n* occupy a bandwidth larger than that of spectrums 1508*a–n* by a factor of m, where m is the frequency multiplication factor associated with the up-conversion. Similarly, FIG. 16E illustrates redundant spectrums 1608*a–n* which results when spectrums 1602*a–n* are non-FM related. FIG. 16F illustrates redundant spectrums 1610*a–n* which results when spectrums 1610*a–n* are FM related.

Upconverted redundant spectrums 1510*a–n* (FIG. 15E) and spectrums 1522*a–n* are located at frequencies that are a multiple of the frequency locations of redundant spectrums 1508*a–n*. This would suggest that up-converter 1516 is a frequency multiplier. This is but one embodiment, other up-converters could be used including but not limited to frequency mixers. Frequency mixers are capable of upconverting redundant spectrums to higher frequencies that are not multiples of the lower frequencies as will be understood by those skilled in the art(s) based on the discussion given herein.

In step 1506, amplifier 1518 amplifies redundant spectrums 1510*a,b*. Likewise for spectrums 1608*a,b*. Typically this is done to boost signal power prior to transmission over a communications medium.

In step 306, (optional) medium interface module 320 transmits redundant spectrums 1510*a,b* and/or spectrums 1608*a,b* over the communications medium 322. The effect of selecting a subset of redundant spectrums for transmission is that the channel bandwidth occupied by the transmitted spectrums is reduced compared with that occupied by the redundant spectrums generated in step 304. The bandwidth reduction can be substantial since the number of redundant spectrums generated in step 304 can be unlimited. Furthermore, the number of redundant spectrums in the subset can be optimized so the occupied bandwidth will be sufficiently narrow that the subset can be used commercially under the rules of the appropriate governmental administrative agency (i.e. the FCC).

As discussed, spectrum processing module 1520 is one structural embodiment for performing the steps 1502–1506 in flowchart 1500. As stated above, the performance of steps 1502–1506 is optional and/or their order of operation can be changed. Therefore, the components in spectrum processing module 1520 are also optional and/or their order can rearranged.

5.2.2. Other Embodiments:

The embodiment described above for processing redundant spectrums is provided for purposes of illustration. This embodiment is not intended to limit the invention. Alternate embodiments, differing slightly or substantially from that described herein, will be apparent to those skilled in the relevant art(s) based on the teachings given herein. For example, up-converter 1516 can be designed to up-convert only those frequencies containing the spectrums of interest. Alternatively, the amplifier 1518 can be designed to amplify only those frequencies containing the spectrums of interest. Such alternate embodiments fall within the scope and spirit of the present invention.

5.2.3 Implementation Example(s)

Exemplary operational and/or structural implementations related to the method(s), structure(s), and/or embodiments described above are presented in this section (and its subsections). These implementations are presented herein for purposes of illustration, and not limitation. The invention is not limited to the particular implementation examples described herein. Alternate implementations (including equivalents, extensions, variations, deviations, etc., of those described herein) will be apparent to persons skilled in the relevant art(s) based on the teachings contained herein. Such alternate implementations fall within the scope and spirit of the present invention.

5.2.3.1 Implementation Example(s) for Frequency Up-conversion

This section provides a structural description of frequency up-conversion system 1620 (FIG. 16G), which is an implementation for up-converter 1516. As discussed above, up-converter 1516 upconverts redundant spectrums to a higher frequency. The frequency up-conversion system 1620 is further described in the copending U.S. patent application entitled "Method and System for Frequency Up-conversion", of common Assignee, Ser. No. 09/17615; which is incorporated herein by reference in its entirety. The following describes frequency up-conversion of an input signal (e.g. redundant spectrums 1508c,d), resulting in an output signal (e.g. redundant spectrums 1510c,d).

Figure 16G:
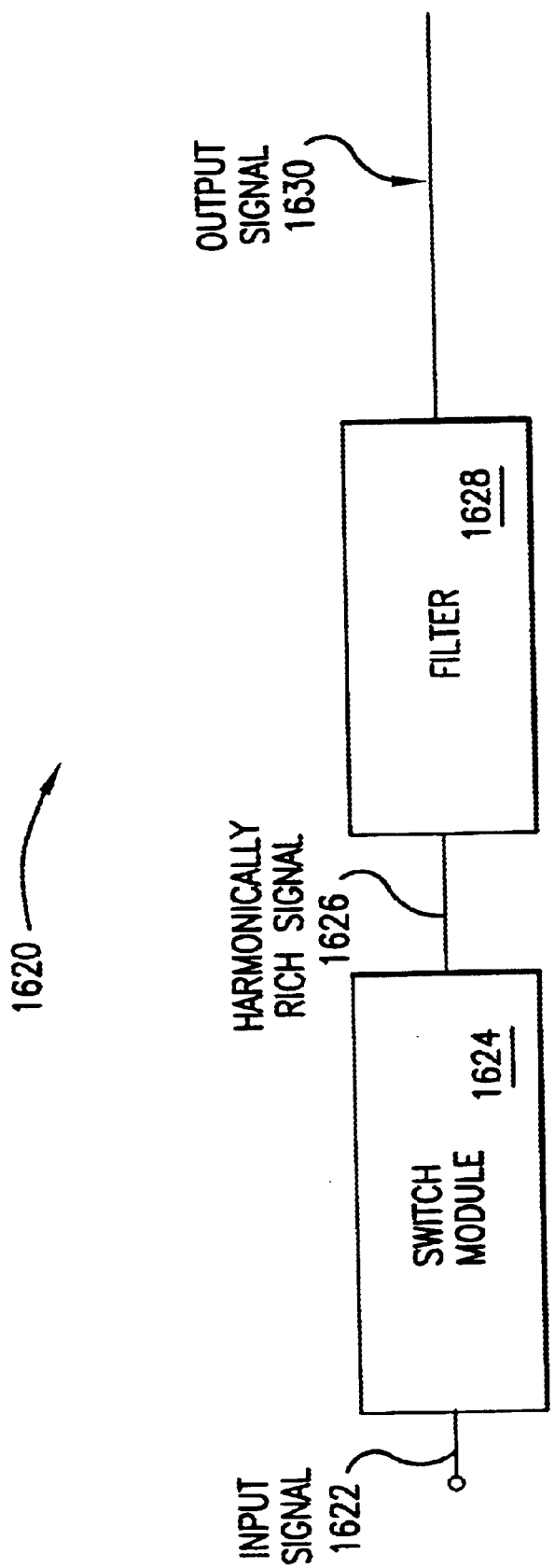

Frequency up-conversion system 1620 is illustrated in FIG. 16G. An input signal 1622, such as a frequency modulated (FM) input signal 1652 of FIG. 16L, is accepted by a switch module 1624. It should be noted in FIG. 16L that FM input signal 1652 may have been generated by modulating oscillating signal 1650 (FIG. 16K) with information signal 1648 (FIG. 16J). The embodiment shown in FIG. 16L is for the case wherein the information signal 1648 is a digital signal and the frequency of oscillating signal 1650 is varied as a function of the value of information signal 1648. This embodiment is referred to as frequency shift keying (FSK) which is a subset of FM. It will be apparent to those skilled in the relevant art(s) that information signal 1648 can be analog, digital, or any combination thereof, and that any modulation scheme can be used. The output of switch module 1624 is a harmonically rich signal 1626, shown in FIG. 16M as a harmonically rich signal 1654 that has a continuous and periodic waveform. FIG. 16N is an expanded view of two sections of harmonically rich signal 1654 that includes section 1656 and section 1658. This waveform is preferably a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed. Harmonically rich signal 1626 is comprised of a plurality of sinusoidal waves whose frequencies are integer multiples of the fundamental frequency of the waveform. These sinusoidal waves are referred to as the harmonics of the underlying waveform, and the fundamental frequency is referred to as the first harmonic. FIG. 16O and FIG. 16P show separately the sinusoidal components making up the first, third, and fifth harmonics of section 1656 and section 1658, respectively. (Note that there are an infinite number of harmonics, and, in this example, because harmonically rich signal 1654 is shown as a square wave, there will only be odd harmonics.) These three harmonics are shown simultaneously (but not summed) in FIG. 16Q for section 1656 and section 1658. The relative amplitudes of the harmonics are generally a function of the relative widths of the pulse width of harmonically rich signal 1626 and the period of the fundamental frequency, and can be determined by doing a Fourier analysis of harmonically rich signal 1626. As further described below, according to an embodiment of the invention, the pulse width of input signal 1622 is adjusted to ensure that the amplitude of the desired harmonic is sufficient for its intended use (e.g., transmission). A filter 1628 filters out the undesired frequencies (harmonics), and outputs an electromagnetic (EM) signal at the desired harmonic frequency as an output signal 1630, shown as a filtered output signal 1660 in FIG. 16R. FIG. 16R illustrates that the fifth harmonic of sections 1656 and 1658 where selected by filter 1628. Filter 1628 can be filtered to select other harmonics as will be understood by those skilled in the relevant art(s).

Figure 16H:
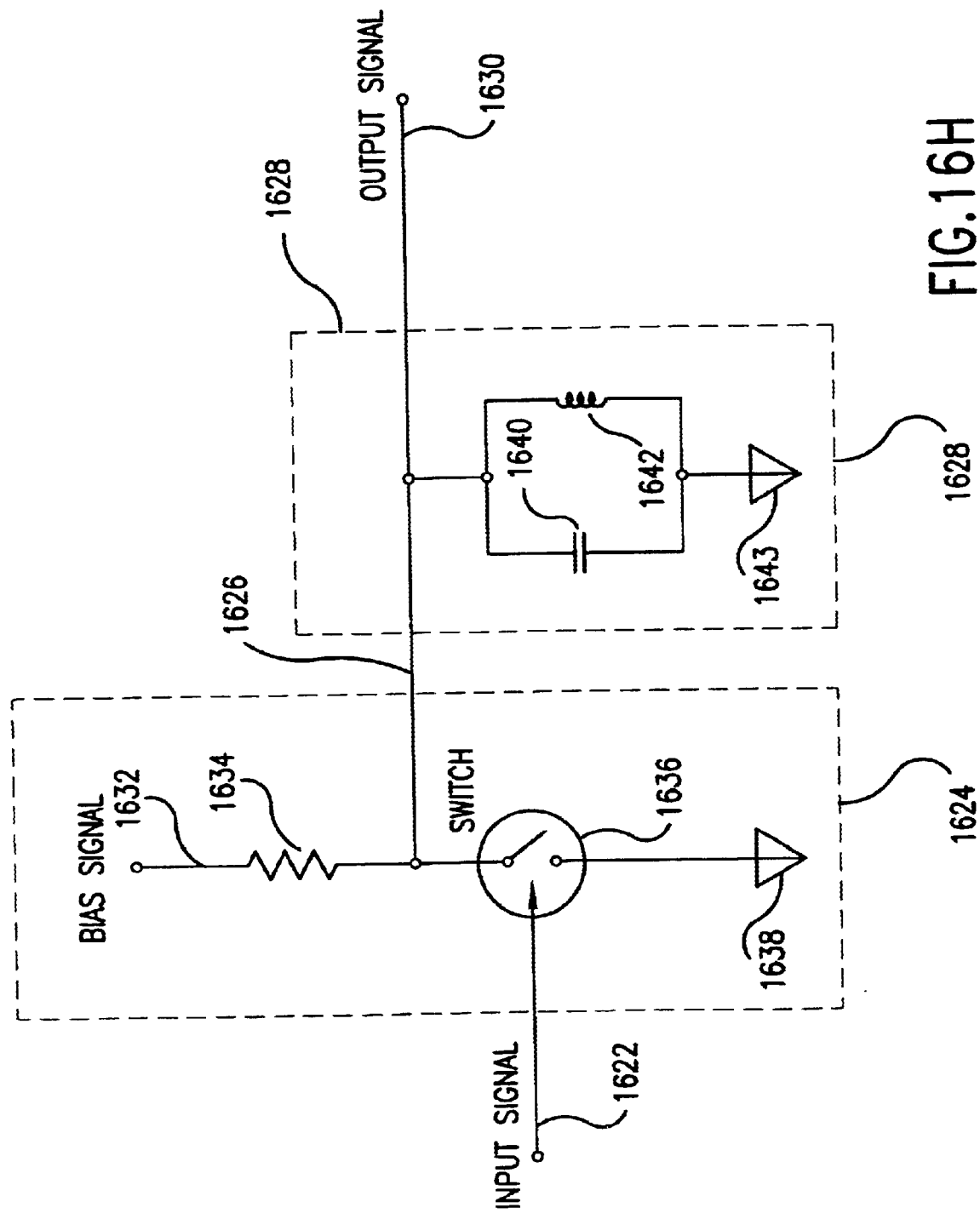
Figure 161:
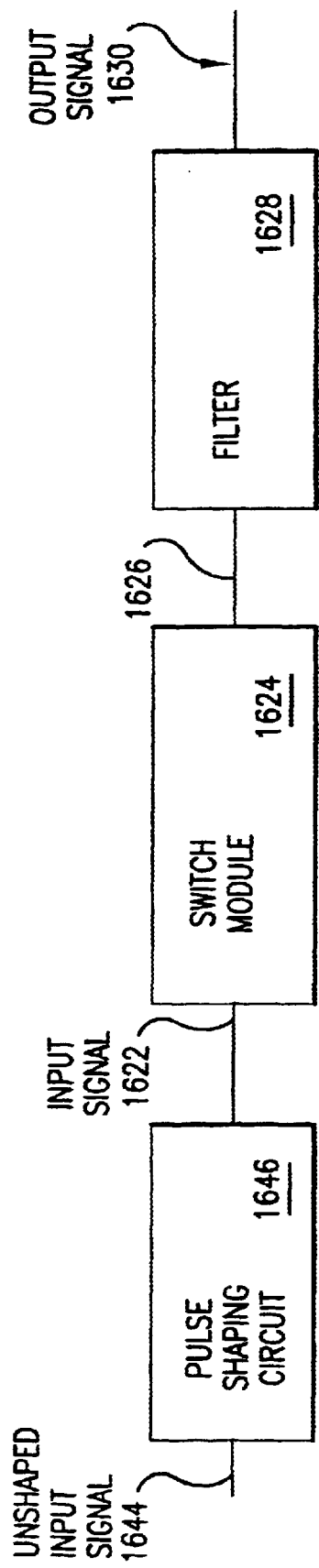
Figure 16J:
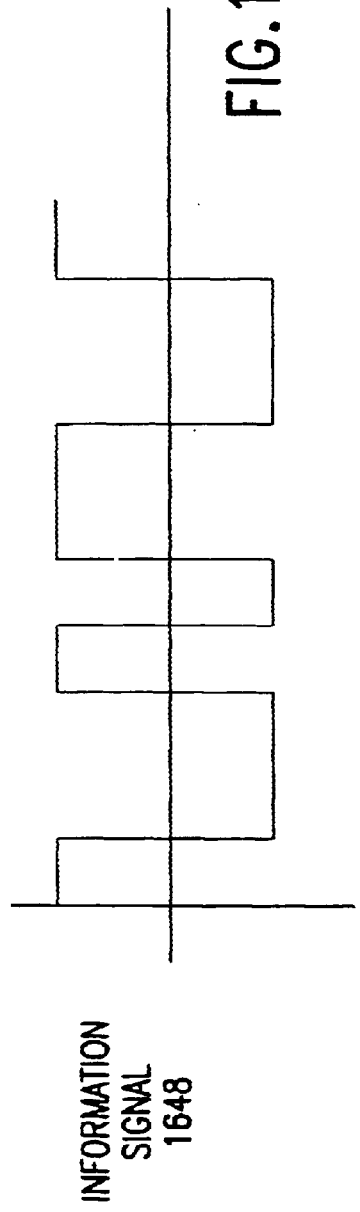
Figure 16K:
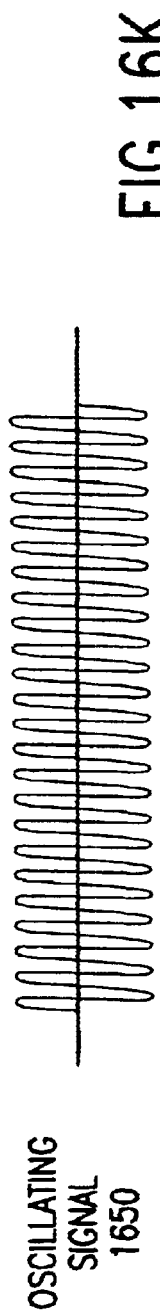
Figure 16L:
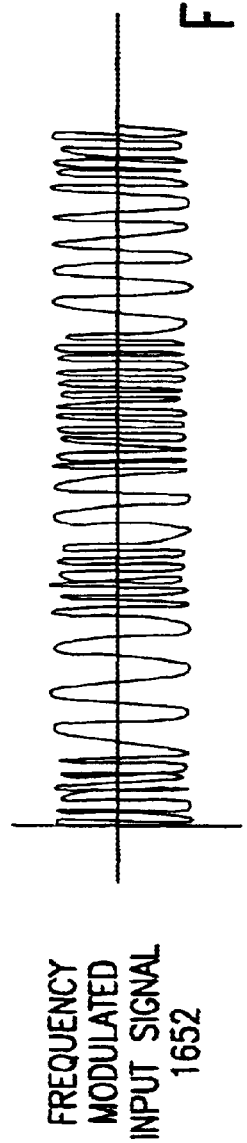
Figure 16M:
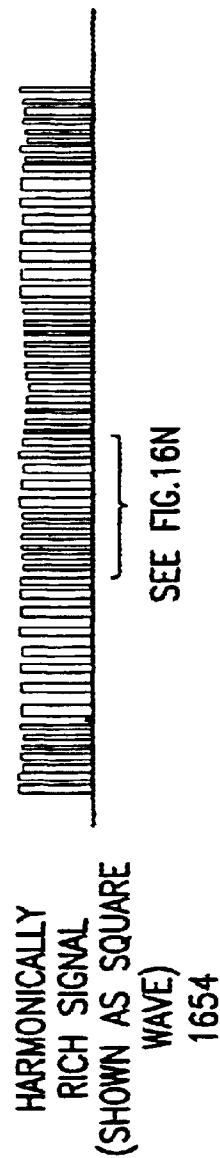
Figure 16Q:
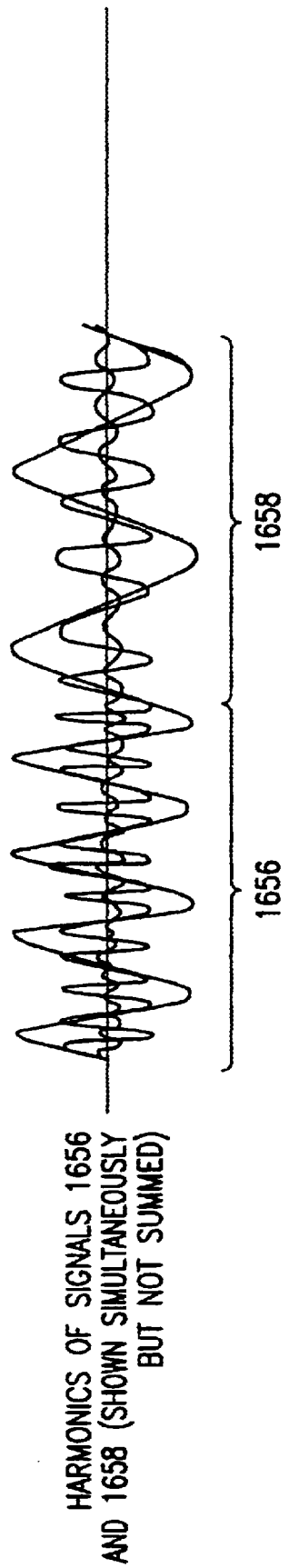
Figure 16R:
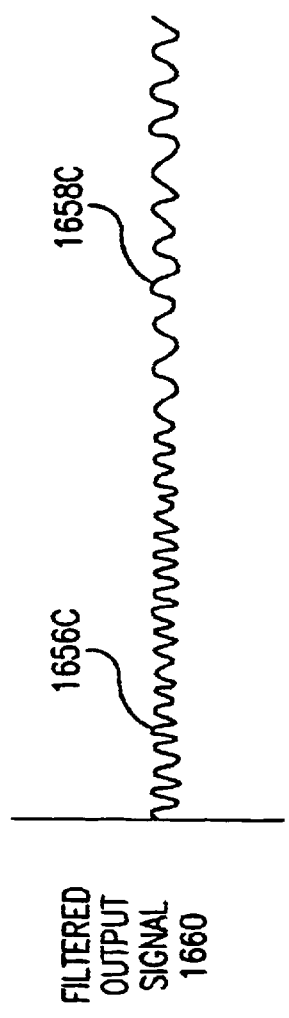

Looking at FIG. 16H, switch module 1624 is seen as comprised of a bias signal 1632, a resistor 1634, a switch 1636, and a ground 1638 (or another voltage reference). The input signal 1622 controls the switch 1636, and causes it to close and open. Harmonically rich signal 1626 is generated at a point located between the resistor 1634 and the switch 1636.

Also in FIG. 16H, it can be seen that filter 1628 is comprised of a capacitor 1640 and an inductor 1642 shunted to a ground 1643. The filter is designed to filter out the undesired harmonics of harmonically rich signal 1626.

In an alternate embodiment, FIG. 16I illustrates an unshaped input signal 1644 being routed to a pulse shaping module 1646 to become input signal 1622 and then routed to the switch module 1624. Looking to the waveforms of FIGS. 16J–R, this would have the effect of routing FM input signal 1652 into pulse shaping module 1646. The purpose of the pulse shaping module 1646 is to control the pulse width of the input signal 1622 controlling the opening and closing of the switch 1636 in switch module 104. The pulse width of the input signal 1622 controls the opening and closing of switch 206 to determine the pulse width of the harmonically rich signal 1626. As stated above, a factor in determining the relative amplitudes of the harmonics of harmonically rich signal 1626 is determined by its pulse width. For example, an efficient pulse width would be approximately ½ the period of the desired harmonic that is output signal 1630. For example, if an output signal of 900 MHZ was desired, then the pulse width would be approximately 555 picoseconds (½·1/900 MHZ).

5.2.3.2 Other Implementation(s)

The implementation for up-converter 1516 described above is for provided for purposes of illustration. This implementation is not intended to limit the invention in any way. Alternate implementations, differing slightly or substantially from that described herein, will be apparent to those skilled in the relevant art(s) based on the teachings contained herein. Alternate implementations include but are not limited to various mixer circuits, various frequency multiplier circuit configurations, and other well known up-converter apparatus. Such alternate implementations fall within the scope and spirit of the present invention.

6.0 Recovering a Demodulated Baseband Signal From Redundant Spectrums That Have Substantially the Same Information Content

6.1 High Level Description

This section (including subsections) provides a high level description of an embodiment of recovering a demodulated baseband signal from redundant spectrums that were generated with substantially the same information content. The following discussion includes an exemplary operational process for recovering a demodulated baseband signal from redundant spectrums. Also, a structural description for achieving this process is described herein for illustrative purposes, and is not meant to limit the invention in any way. In particular, the process described in this section can be achieved using any number of structural implementations, at least one of which is described in this section. The details of the structural description will be apparent to those skilled in the art based on the teachings herein.

Figure 17A:
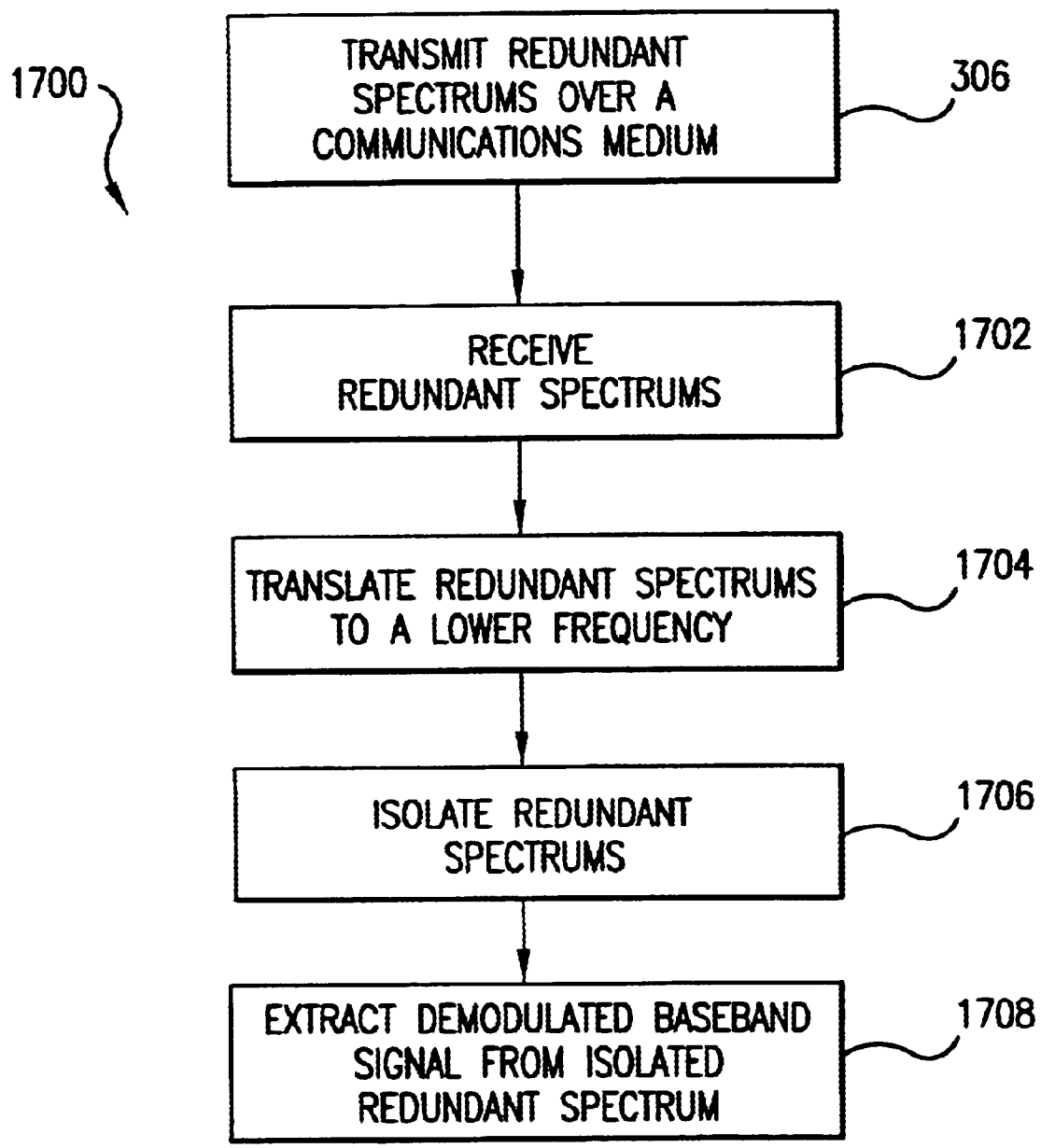
FIG. 17A depicts flowchart 1700, which illustrates recovering a demodulated baseband signal from redundant spectrums according to an embodiment of the present invention.

6.1.1 Operational Description:

FIG. 17A depicts flowchart 1700 for recovering a demodulated baseband signal from redundant spectrums according to one embodiment of the present invention. In the following discussion, the steps in FIG. 17A will be discussed in relation to the example signal diagrams in FIGS. 17B–17GH.

In step 306, redundant spectrums 1710*a*–*c* (FIG. 17B) are transmitted over a communications medium from a first location. This step was discussed in FIGS. 3A, 4A, 8A, 13A, 14A, 15A, 16A, and related discussions and is mentioned here for convenience. Each redundant spectrum 1710*a*–*c* carries the necessary information to reconstruct modulating baseband signal 308. In other words, each redundant spectrum 1710*a*–*c* includes the necessary amplitude, phase, and frequency information to reconstruct the modulating baseband signal 308. Furthermore, the redundant spectrums 1710*a*–*c* are typically located at a frequency that is substantially higher than the baseband spectrum 310 that is associated with the modulating baseband signal 308, as illustrated by break 1709 in the frequency axis. As is the case throughout this specification, modulating baseband signal 308 can be any type of arbitrary signal including but not limited to an analog signal, a digital signal, or a combination thereof.

As discussed in earlier, the number of redundant spectrums that are transmitted over the communications medium is arbitrary. In other words, FIG. 17B depicts redundant spectrums 1710*a*–*c* for illustration purposes only; greater or fewer redundant spectrums can be transmitted over the communications medium. A general limit to the number of redundant spectrums that can be transmitted is the available channel bandwidth. Legal or administrative limits (i.e. FCC regulations) may further restrict the number of redundant spectrums that can be transmitted over a communications medium.

In step 1702, redundant spectrums 1712*a*–*c* are received (FIG. 17C) from the communications medium. Redundant spectrums 1712*a*–*c* are substantially similar to redundant spectrums 1710*a*–*c* that were transmitted in step 306, except for changes introduced by the communications medium. Such changes can include but are not limited to signal attenuation, and signal interference. For example, FIG. 17C depicts jamming spectrum 1711 existing within the same frequency bandwidth as that occupied by spectrum 1712*b* in order to illustrate the advantages of the present invention. Jamming signal spectrum 1711 is a frequency spectrum associated with a generic jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 1711, and can have any generic spectral shape, as will be understood by those skilled in the art(s).

In step 1704, redundant spectrums 1712*a*–*c* are translated to lower intermediate frequencies, resulting in redundant spectrums 1714*a*–*c* (FIG. 17D) that are located at intermediate frequencies $f_{IFA}$, $f_{IFB}$, and $f_{IFC}$ respectively, with frequency separation approximately equal to $f_2$ (Hz). Redundant spectrums 1714*a*–*c* contain substantially the same information content as spectrums 1712*a*–*c*, except that they exist at a substantially lower frequency; which is represented by the relative placement of break 1709 in the frequency axis of FIG. 17D. Jamming signal spectrum 1711 is also translated to a lower frequency since it is located within the bandwidth of spectrum 1712*b*, resulting in jamming signal spectrum 1716.

Figure 17E:
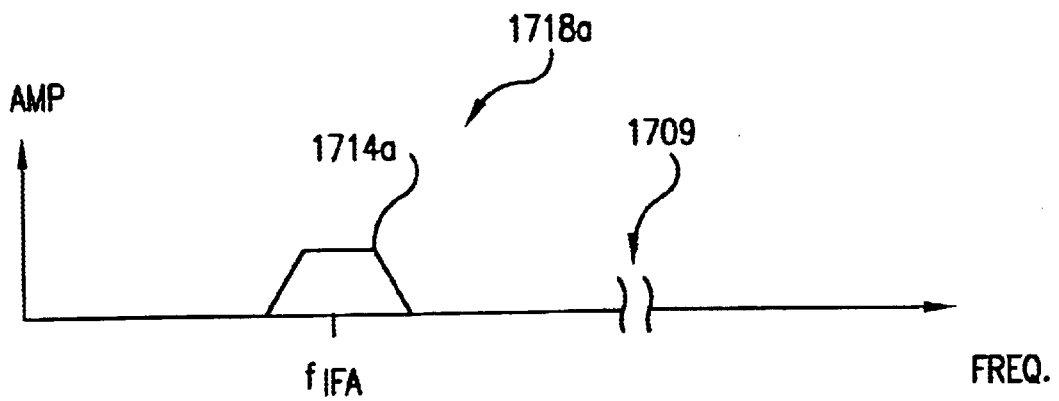
Figure 17F:
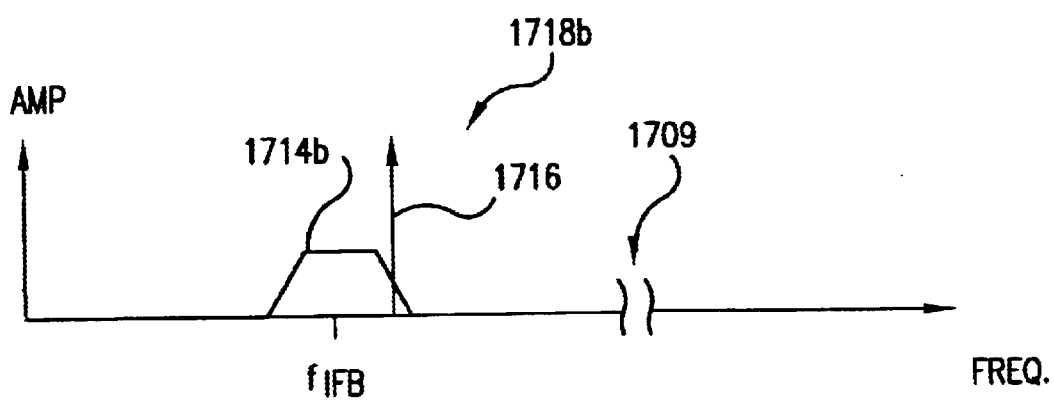
Figure 17G:
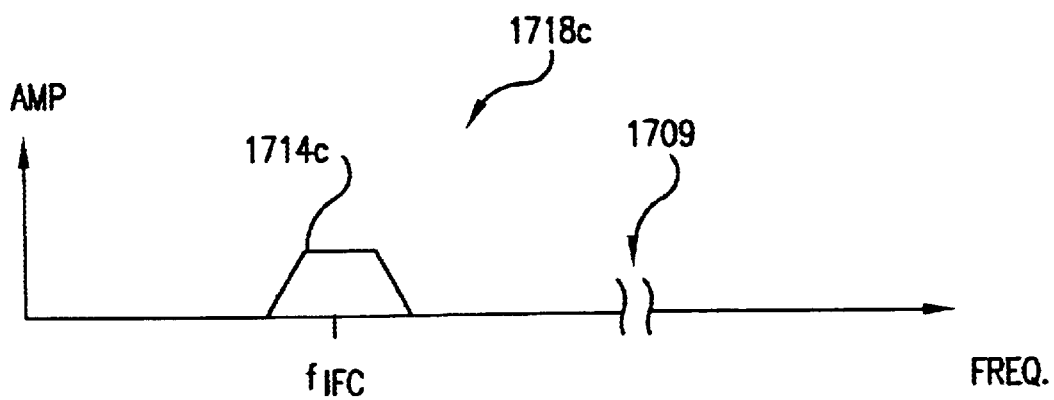

In step 1706, redundant spectrum 1714*a*–*c* are isolated from each other into separate channels, resulting in channels 1718*a*–*c* (shown in FIGS. 17E–17G). As such, channel 1718*a* comprises redundant spectrum 1714*a*; channel 1718*b* comprises redundant spectrum 1714*b* and jamming signal spectrum 1716; and channel 1718*c* comprises redundant spectrum 1714*c*. Each channel 1718*a*–*c* carries the necessary amplitude, phase, and frequency information to reconstruct the modulating baseband signal 308 because redundant spectrums 1714*a*–*c* carry such information. However, channel 1718*b* also carries jamming signal spectrum 1716 that may prevent channel 1718*b* from being used to reconstruct modulating baseband signal 308, depending on the relative signal strength of jamming signal spectrum 1716.

In step 1708, demodulated baseband signal 1720 (FIG. 17H) is extracted from channels 1718*a*–*c*; where demodulated baseband signal 1720 is substantially similar to modulated baseband signal 308.

An advantage of the present invention should now be apparent. The recovery of modulating baseband signal 308 can be accomplished in spite of the fact that high strength jamming signal(s) (e.g. jamming signal spectrum 1711) exist "in band" on the communications medium. The intended baseband signal can be recovered because multiple redundant spectrums are transmitted, where each redundant spectrum carries the necessary information to reconstruct the baseband signal. At the destination, the redundant spectrums are isolated from each other so that the baseband signal can be recovered even if one or more of the redundant spectrums are corrupted by a jamming signal.

6.1.2 Structural Description:

FIG. 17I illustrates an example receiver module 1730. Receiver module 1730 includes: (optional) medium interface module 1722, down-converter 1724, spectrum isolation module 1726, and signal extraction module 1728. Preferably receiver module 1730 generates demodulated baseband signal 1720 from redundant spectrums 1712*a*–*c*. In other words, receiver module 1730 is a structural embodiment for performing the operational steps in flowchart 1700. However, it should be understood that the scope and spirit of the of the present invention includes other structural embodiments for performing the steps of flowchart 1700. Flowchart 1700 will be revisited to further illustrate the present invention in view of the structural components in receiver module 1730.

In step 306, (optional) medium interface module 320 transmits redundant spectrums 1710*a*–*c* (FIG. 17B) over the communications medium 322 from a first location. This step was discussed in FIGS. 3A, 4A, 8A, 13A, 14A, 15A, 16A, and the related discussions, and is mentioned here for convenience. Each redundant spectrum 1710*a*–*c* carries the necessary information to reconstruct modulating baseband signal 308. In other words, each redundant spectrum 1710*a*–*c* carries the necessary amplitude, phase and frequency information to reconstruct the modulating baseband signal 308. Furthermore, the redundant spectrums 1710*a*–*n* are typically located at a frequency that is substantially higher than the baseband spectrum 310 that is associated with the modulating baseband signal 308, as illustrated by break 1709 in the frequency axis.

As discussed in earlier, the number of redundant spectrums that are transmitted over the communications medium is arbitrary. In other words, FIG. 17B depicts redundant spectrums 1710*a*–*c* for illustration purposes only; greater or fewer redundant spectrums can be transmitted over the communications medium. One limit to the number of redundant spectrums that can be transmitted is the available channel bandwidth.

In step 1702, (optional) medium interface module 1722 receives redundant spectrums 1712a–c (FIG. 17C) from the communications medium 322. Redundant spectrums 1712a–c are substantially similar to redundant spectrums 1710a–c that were transmitted in step 306, except for changes introduced by the communications medium. Such changes can include but are not limited to signal attenuation, and signal interference. For example, FIG. 17C depicts jamming signal spectrum 1711 existing within the same frequency bandwidth as that occupied by spectrum 1712b in order to illustrate the advantages of the present invention. Jamming signal spectrum 1711 is a frequency spectrum associated with a generic jamming signal. For purposes of this invention, a "jamming signal" refers to any unwanted signal, regardless of origin, that may interfere with the proper reception and reconstruction of an intended signal. Furthermore, the jamming signal is not limited to tones, and can have any generic spectrum shape, as will be understood by those skilled in the art(s).

In step 1704, down-converter 1724 translates redundant spectrums 1712a–c to a lower frequency; resulting in redundant spectrums 1714a–c (FIG. 17D) that are located at frequencies $f_{IFA}$, $f_{IFB}$, and $f_{IFC}$, respectively, with frequency separation approximately equal to $f_2$ (Hz). Redundant spectrums 1714a–c have substantially the same information content as spectrums 1712a–c, except that they exist at a substantially lower frequency; which is represented by the relative placement of break 1709 in frequency axis of FIG. 17D. Jamming signal spectrum 1711 is also translated to a lower frequency since it is located within the bandwidth of spectrum 1712b, resulting in jamming signal spectrum 1716.

In step 1706, spectrum isolation module 1726 isolates redundant spectrums 1714a–c from each other into separate channels, resulting in channels 1718a–c (shown in FIGS. 17E–17G). As such, channel 1718a comprises redundant spectrum 1714a; channel 1718b comprises redundant spectrum 1714b and jamming signal spectrum 1716; and channel 1718c comprises redundant spectrum 1714c. Each channel 1718a–c carries the necessary amplitude, phase, and frequency information necessary to reconstruct modulating baseband signal 308 because redundant spectrums 1714a–c carry such information. However, channel 1718b also carries jamming signal spectrum 1716 that may prevent channel 1718b from being used to reconstruct modulating baseband signal 308, depending on the relative signal strength of jamming signal spectrum 1716.

In step 1708, signal extraction module 1728 recovers demodulated baseband signal 1720 from channels 1718a–c; where demodulated baseband signal 1720 is substantially similar to modulated baseband signal 308.

An advantage of the present invention should now be apparent. The recovery of modulating baseband signal 308 can be accomplished in spite of the fact that high strength jamming signal(s) exist "in band" on the communications medium. The intended baseband signal can be recovered because multiple redundant baseband spectrums are transmitted over the communications medium, where each redundant spectrum carries the necessary information to reconstruct the baseband signal. At the destination, the redundant are isolated from each other so that the baseband signal can be recovered even if one or more of the redundant spectrums are corrupted Further illustration and discussion will be given in following sections.

6.2. Example Embodiments

Various embodiments related to the method(s) and structure(s) described above are presented in this section (and its subsections). Specifically, the following discussion describes example embodiments of recovering a demodulated baseband signal from multiple redundant spectrums. These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

6.2.1 Down-conversion

Example embodiments of step 1704 and down-converter 1724 will be discussed as follows. A first embodiment includes translating redundant spectrums to a lower intermediate frequency (IF) by mixing the redundant spectrums with a local oscillating signal at the receiver. A second embodiment includes down-conversion by aliasing the redundant spectrums using a universal frequency translation (UFT) module. Other methods and systems of down-conversion are also included.

6.2.1.1 Down-conversion by Mixing Redundant Spectrums With an Oscillating Signal The following discussion describes a method and system for translating redundant spectrums to lower intermediate frequencies (IF) by mixing the redundant spectrums with a local oscillating signal.

Figure 18A:
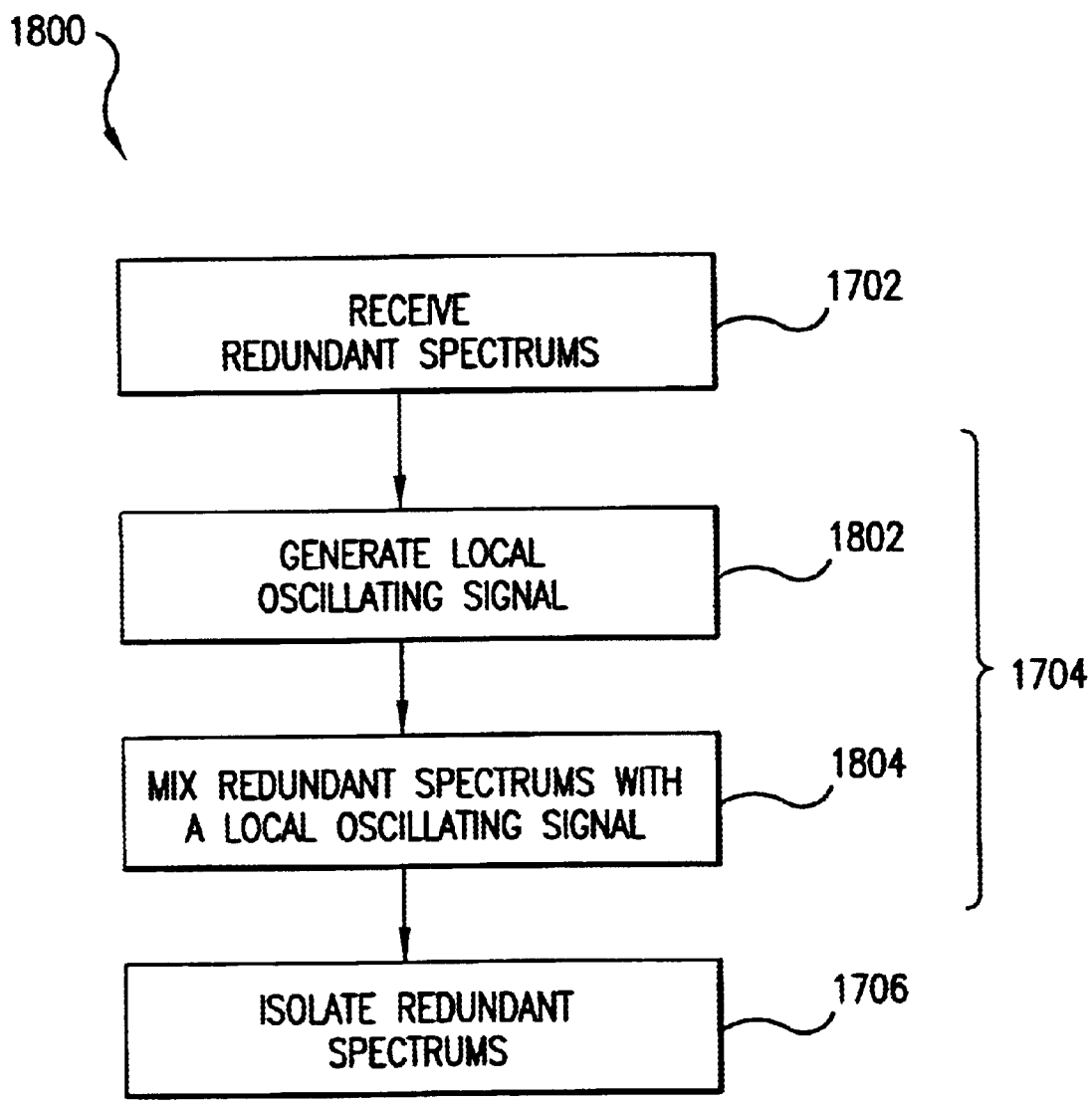
FIG. 18A depicts flowchart 1800, which illustrates translating redundant spectrums to a lower frequency according to an embodiment of the present invention.

6.2.1.1.1 Operational Description:

FIG. 18A depicts flowchart 1800 for translating redundant spectrums to a lower frequency (step 1704, FIG. 17A) according to one embodiment of the present invention. In the following discussion, the steps in FIG. 18A will be discussed in relation to the example signal diagrams in FIGS. 18B–18H.

In step 1702, redundant spectrums 1712a–c are received (FIG. 18B) from a communications medium. Step 1702 and spectrums 1712a–c were first discussed in FIGS. 17A and 17C, respectively, and are repeated here for convenience.

In step 1802, a local oscillating signal 1806 (FIG. 18C) is generated. The local oscillating signal 1806 is preferably a sine wave (although other periodic waveforms can be used) with a characteristic frequency $f_3$. The local oscillating signal 1806 has a spectrum 1808 (FIG. 18D) that is preferably a tone, but other spectrums could be useful as is well known those skilled in the art(s).

In step 1804, redundant spectrums 1712a–c are mixed with local oscillating signal 1806, resulting in redundant spectrums 1810a–c (FIG. 18E) that are located at intermediate frequencies $(f_1-f_2)-f_3$, $f_1-f_3$, and $(f_1+f_2)-f_3$, respectively. Redundant spectrums 1810a–c contain substantially similar information to that of spectrums 1712a–c, except that they exist at a substantially lower frequency; which is represented by the relative placement of break 1709 in the frequency axis of FIG. 18E. Jamming signal spectrum 1711 is also translated to a lower frequency since it is located within the bandwidth of spectrum 1712b, resulting in jamming signal spectrum 1811.

The frequency $(f_1-f_3)$ produced by the mixing $f_1$ with $f_3$ (step 1804) is referred to as the difference frequency by those skilled in the art(s). Typically, the mixing process will also produce spectrums centered at a sum frequency $(f_1+f_3)$, which is not shown in FIG. 18E because it is outside the relevant frequency band defined by break 1709 in the frequency axis. The spectrums located in and around the sum frequency can be attenuated or suppressed by a number of methods including but not limited to filtering, as is will be understood by those skilled in the art(s).

Figure 18F:
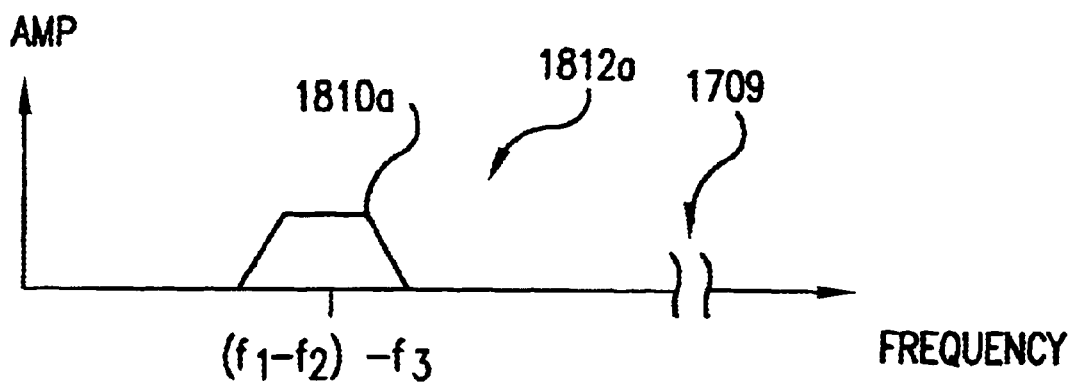
Figure 18G:
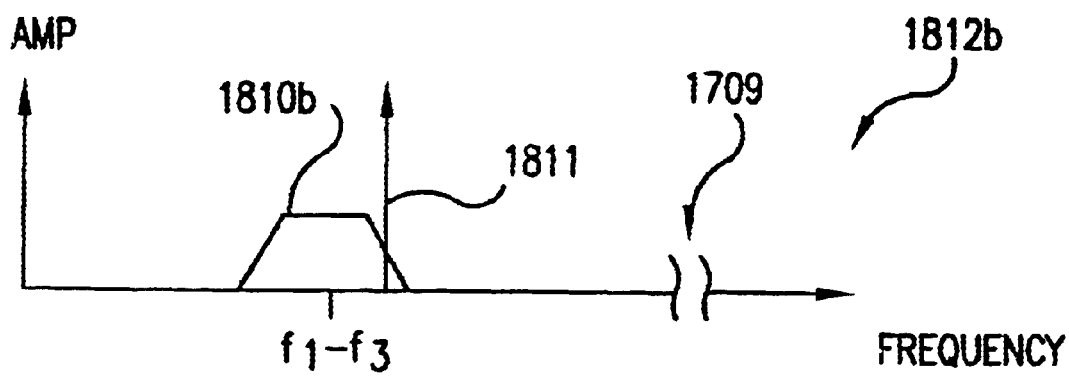
Figure 18H:
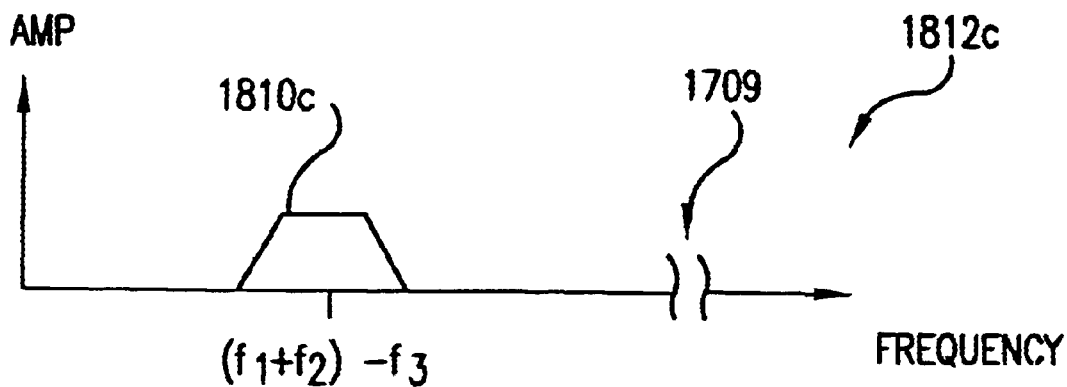

In step 1706, redundant spectrum 1810a–c are isolated from each other into channels 1812a–c (shown in FIGS. 18F–18H, respectively). As such, channel 1812a comprises redundant spectrum 1810a; channel 1812b comprises redundant spectrum 1810b and jamming signal spectrum 1811; and channel 1812c comprises redundant spectrum 1810c. Each channel 1812a–c carries the necessary amplitude, phase, and frequency information to reconstruct modulating baseband signal 308 because redundant spectrums 1810a–c carry such information. However, channel 1812b also carries jamming signal spectrum 1811 that may prevent channel 1812b from being used to reconstruct modulating baseband signal 308, depending on the relative signal strength of jamming signal spectrum 1811. Step 1706 was first discussed in relation to FIG. 17A, but is repeated here for convenience.

6.2.1.1.2 Structural Description:

FIG. 18I illustrates a block diagram of down-converter 1818, which is one embodiment of down-converter 1724 (FIG. 17I). Down-converter 1818 includes mixer 1814 and local oscillator 1816. Preferably down-converter 1818 translates redundant spectrums 1712a–c to substantially lower frequencies by mixing redundant spectrums 1712a–c with a local oscillating signal. In other words, down-converter 1818 is a structural embodiment for performing the operational steps in flowchart 1800. However, it should be understood that the scope and spirit of the of the present invention includes other structural embodiments for performing the steps of flowchart 1800. Flowchart 1800 will be revisited to further illustrate the present invention in view of the structural components in down-converter 1818.

In step 1702, (optional) medium interface module 1722 receives redundant spectrums 1712a–c (FIG. 18B) from a communications medium. Step 1702 and spectrums 1712a–c were first discussed in FIGS. 17A–B respectively, and are repeated here for convenience.

In step 1802, a local oscillator 1816 generates local oscillating signal 1806 (FIG. 18C). The local oscillating signal 1806 is preferably a sine wave (although other periodic waveforms could be used) with a characteristic frequency $f_3$. The local oscillating signal 1806 has a spectrum 1808 (FIG. 18D) that is preferably a tone, but other spectrums could be useful as is well known those skilled in the art(s). Also, preferably, $f_3$ is on the order of $f_1$.

In step 1804, mixer 1814 mixes redundant spectrums 1712a–c with local oscillating signal 1806, resulting in redundant spectrums 1810a–c (FIG. 18E) that are located at frequencies $(f_1-f_2)-f_3$, $f_1-f_3$, and $(f_1+f_2)-f_3$ respectively. Redundant spectrums 1810a–c contain substantially similar information to that of spectrums 1810a–c, except that they exist at a substantially lower frequency; which is represented by the relative placement of break 1709 in frequency axis. Jamming signal spectrum 1711 is also translated to a lower frequency since it is located within the bandwidth of spectrum 1712b, resulting in jamming signal spectrum 1811.

Mixer 1814 typically includes at least one non-linear circuit element including but not limited to a diode or a transistor. Mixer 1814 can be implemented in multiple different types of circuit implementations including but not limited to: single diode configurations, single balanced mixers, double balanced mixers, etc. These mixer circuit implementations are well known to those skilled in the art(s) based on the discussion given herein, and are within the scope and spirit of the present invention.

In step 1706, spectrum isolation module 1726 isolates redundant spectrums 1810a–c from each other into channels 1812a–c (shown in FIGS. 18F–18H). As such, channel 1812a contains redundant spectrum 1810a; channel 1812b contains redundant spectrum 1810b and jamming signal spectrum 1811; and channel 1812c contains redundant spectrum 1810c. Each channel 1812a–c carries the necessary amplitude, phase, and frequency information to reconstruct modulating baseband signal 308 because redundant spectrums 1714a–c carry such information. However, channel 1712b also carries jamming signal spectrum 1711 that may prevent channel 1712b from being used to reconstruct modulating baseband signal 308, depending on the relative signal strength of jamming signal spectrum 1711.

6.2.1.2 Down-conversion Using a Universal Frequency Down-conversion Module

The following discussion describes down-converting redundant spectrums using a Universal Frequency Down-conversion Module. Redundant spectrums represent an electromagnetic signal (EM signal), as will be understood by those skilled in the art(s). The down-conversion by aliasing an EM signal at an aliasing rate is further described in co-pending U.S. patent application entitled "Method and System for Down-converting an Electromagnetic Signal", of common Assignee, Ser. No. 09/176,022, now U.S. Pat. No. 6,061,551, issued May 9, 2000; which is incorporated herein by reference in its entirety. A relevant portion of the above mentioned patent application is summarized below to describe down-converting an input signal (e.g. redundant spectrums 1712a–c) to produce a down-converted signal (e.g. redundant spectrums 1714a–c) that exists at a lower frequency.

Figure 19A:
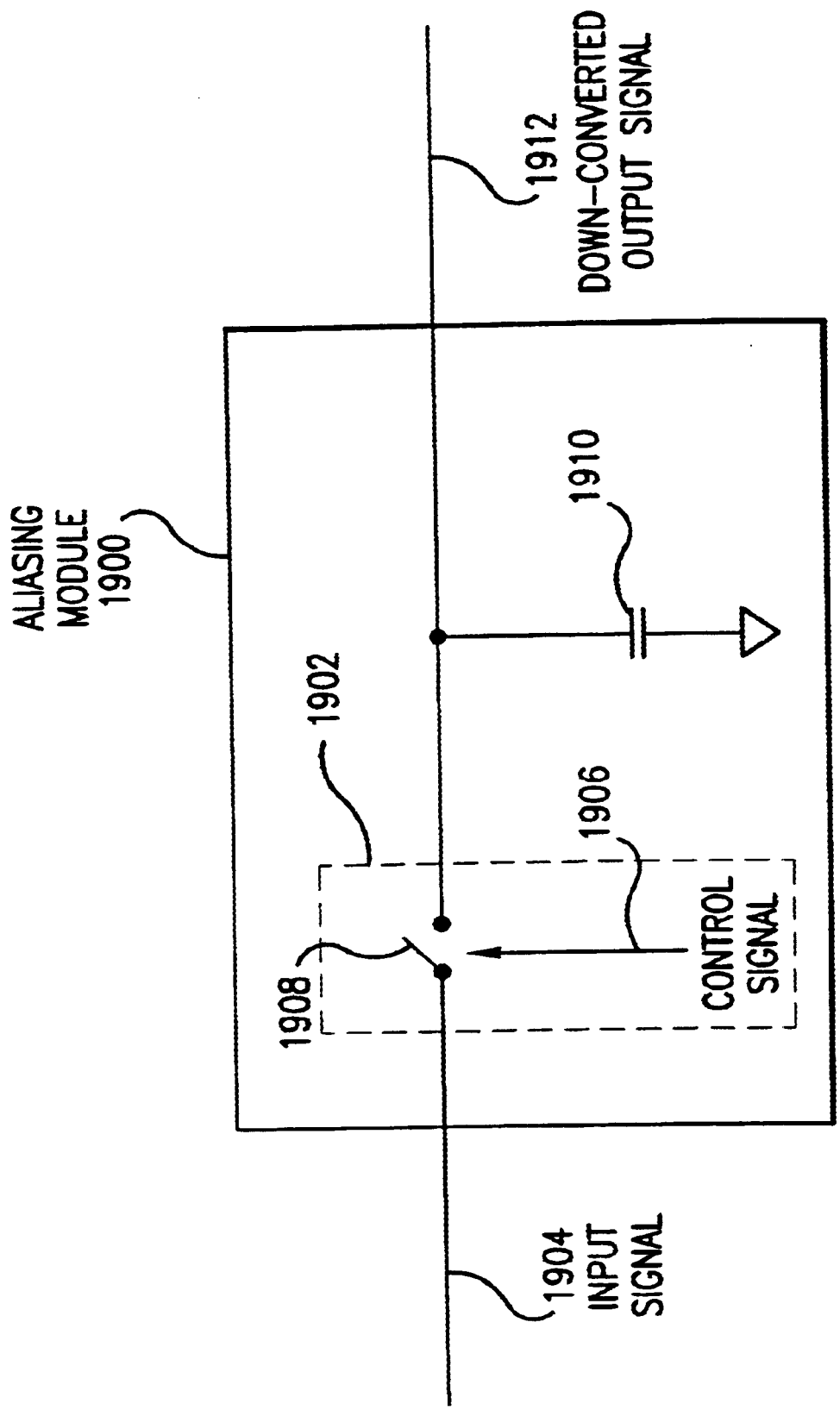
Figures 1, 19A:
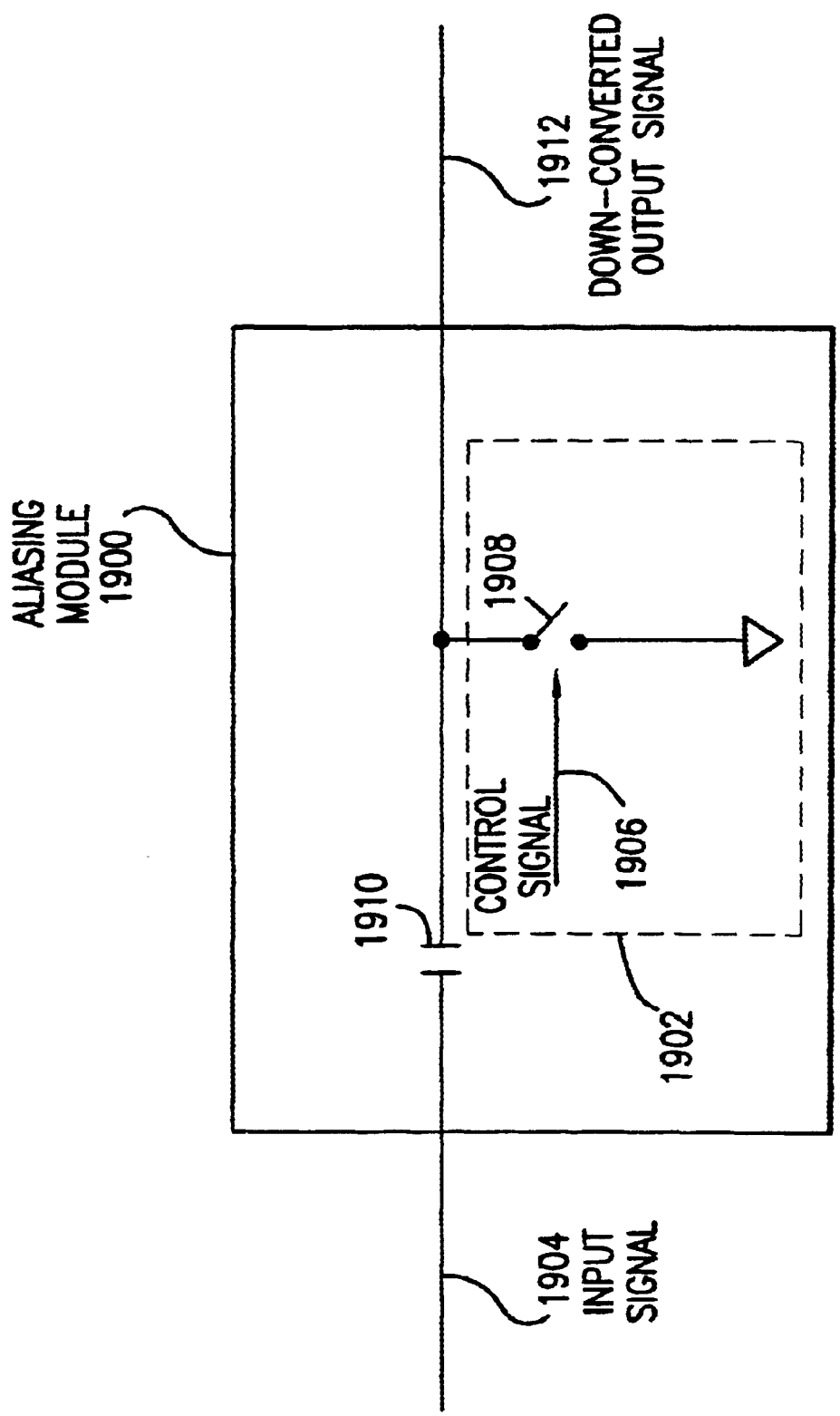

FIG. 19A illustrates an aliasing module 1900 for down-conversion using a universal frequency translation (UFT) module 1902 which down-converts an EM input signal 1904. In particular embodiments, aliasing module 1900 includes a switch 1908 and a capacitor 1910. The electronic alignment of the circuit components is flexible. That is, in one implementation, the switch 1908 is in series with input signal 1904 and capacitor 1910 is shunted to ground (although it may be other than ground in configurations such as differential mode). In a second implementation (see FIG. 19A-1), the capacitor 1910 is in series with the input signal 1904 and the switch 1908 is shunted to ground (although it may be other than ground in configurations such as differential mode). Aliasing module 1900 with UFT module 1902 can be easily tailored to down-convert a wide variety of electromagnetic signals using aliasing frequencies that are well below the frequencies of the EM input signal 1904.

In one implementation, aliasing module 1900 down-converts the input signal 1904 to an intermediate frequency (IF) signal. In another implementation, the aliasing module 1900 down-converts the input signal 1904 to a demodulated baseband signal. In yet another implementation, the input signal 1904 is a frequency modulated (FM) signal, and the aliasing module 1900 down-converts it to a non-FM signal, such as a phase modulated (PM) signal or an amplitude modulated (AM) signal. Each of the above implementations is described below.

In an embodiment, the control signal 1906 includes a train of pulses that repeat at an aliasing rate that is equal to, or less than, twice the frequency of the input signal 1904 In this embodiment, the control signal 1906 is referred to herein as an aliasing signal because it is below the Nyquist rate for the frequency of the input signal 1904. Preferably, the frequency of control signal 1906 is much less than the input signal 1904.

Figure 19B:
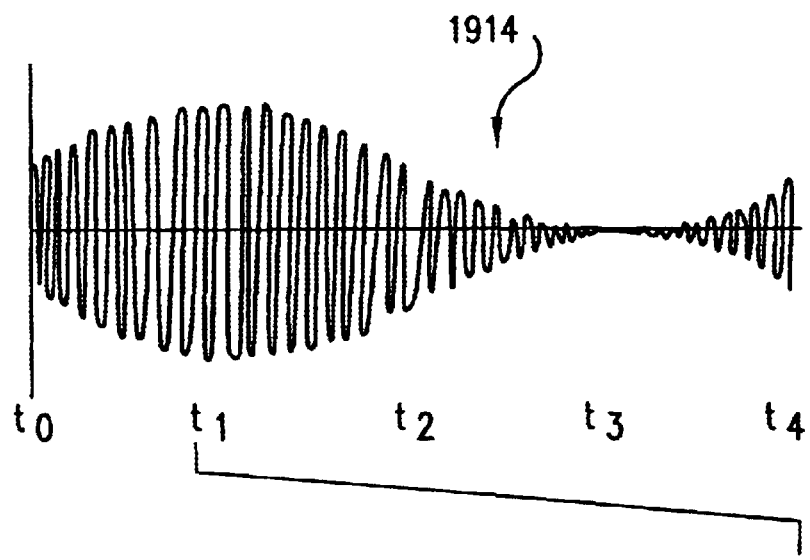
FIGS. 19B–F depict several signal diagrams that are associated with a universal frequency translation (UFT) module 1902 in FIG. 19A.
Figure 19C:
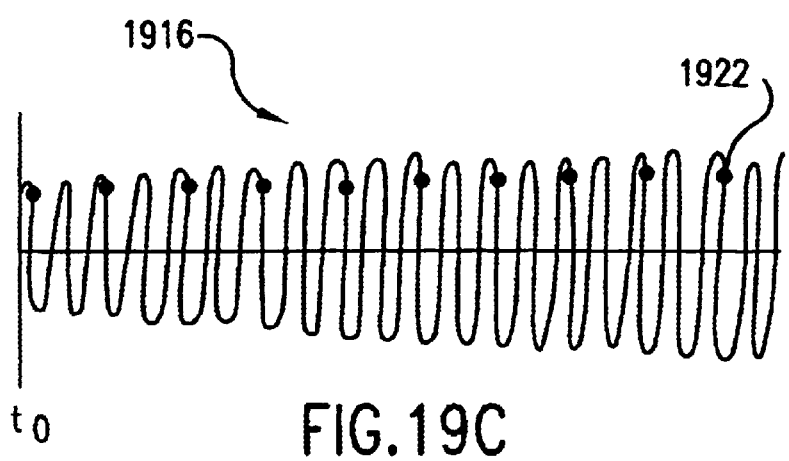
Figure 19D:
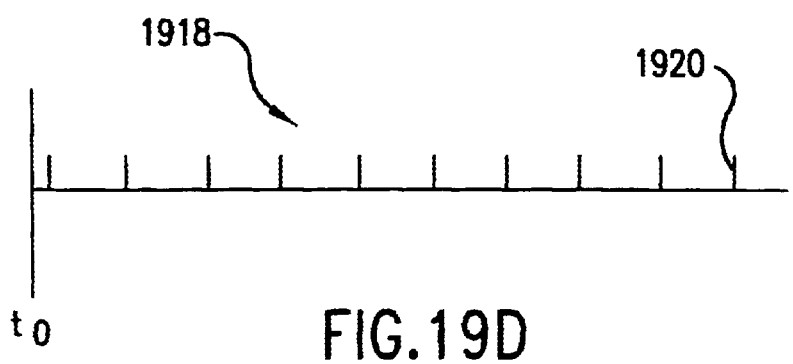
Figure 19E:
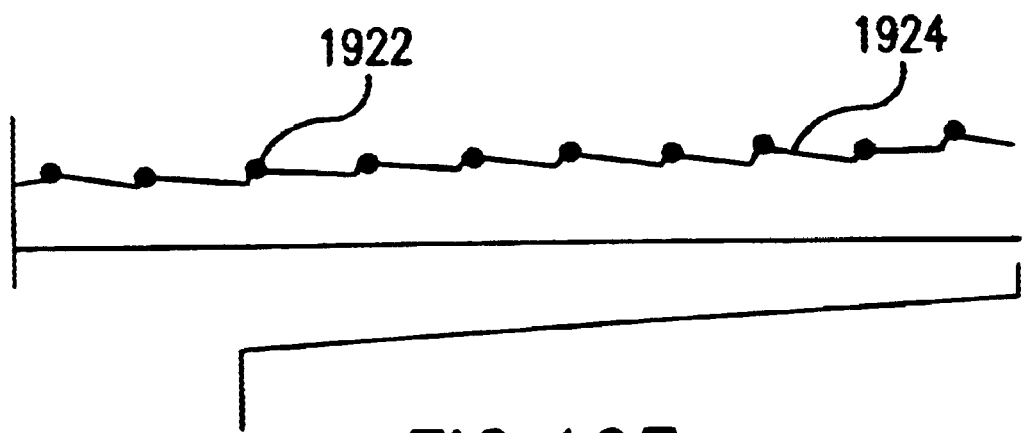

The train of pulses 1918 of FIG. 19D control the switch 1908 to alias the input signal 1904 with the control signal 1906 to generate a down-converted output signal 1912. More specifically in an embodiment, switch 1908 closes on a first edge of each pulse 1920 of FIG. 19D and opens on a second edge of each pulse. When the switch 1908 is closed, the input signal 1904 is coupled to the capacitor 1910, and charge is transferred from the input signal to the capacitor 1910. The charge stored during successive pulses forms down-converted output signal 1912.

Exemplary waveforms are shown in FIGS. 19B–19F.

FIG. 19B illustrates an analog amplitude modulated (AM) carrier signal 1914 that is an example of input signal 1904. For illustrative purposes, in FIG. 19C, an analog AM carrier signal portion 1916 illustrates a portion of the analog AM carrier signal 1914 on an expanded time scale. The analog AM carrier signal portion 1916 illustrates the analog AM carrier signal 1914 from time $t_0$ to time $t_1$.

Figure 19F:
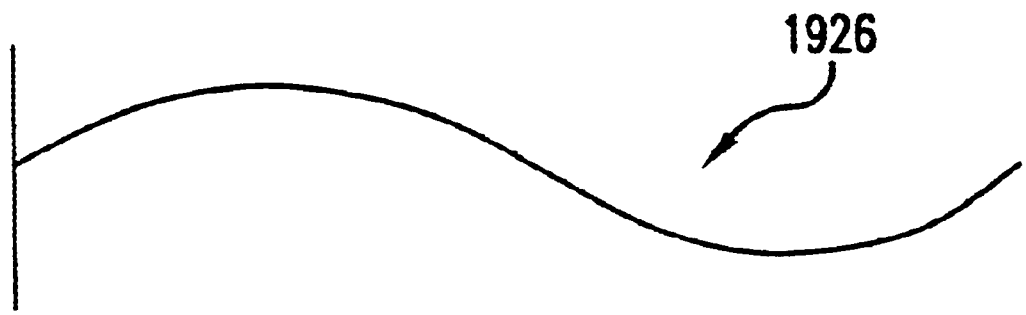

FIG. 19D illustrates an exemplary aliasing signal 1918 that is an example of control signal 1906. Aliasing signal 1918 is on approximately the same time scale as the analog AM carrier signal portion 1916. In the example shown in FIG. 19D, the aliasing signal 1918 includes a train of pulses 1920 having negligible apertures that tend towards zero (the invention is not limited to this embodiment, as discussed below). The pulse aperture may also be referred to as the pulse width as will be understood by those skilled in the art(s). The pulses 1920 repeat at an aliasing rate, or pulse repetition rate of aliasing signal 1918. The aliasing rate is determined as described below, and further described in co-pending U.S. Patent Application entitled "Method and System for Down-converting an Electromagnetic Signal," Application No. 09/176,022, now U.S. Pat. No. 6,061,551, issued May 9, 2000;

As noted above, the train of pulses 1920 (i.e., control signal 1906) control the switch 1908 to alias the analog AM carrier signal 1916 (i.e., input signal 1904) at the aliasing rate of the aliasing signal 1918. Specifically, in this embodiment, the switch 1908 closes on a first edge of each pulse and opens on a second edge of each pulse. When the switch 1908 is closed, input signal 1904 is coupled to the capacitor 1910, and charge is transferred from the input signal 1904 to the capacitor 1910. The charge transferred during a pulse is referred to herein as an under-sample. Exemplary under-samples 1922 form down-converted signal portion 1924 (FIG. 19E) that corresponds to the analog AM carrier signal portion 1916 (FIG. 19C) and the train of pulses 1920 (FIG. 19D). The charge stored during successive under-samples of AM carrier signal 1914 forms a down-converted signal 1924 (FIG. 19F) that is an example of down-converted output signal 1912 (FIG. 19A). In FIG. 19F, a demodulated baseband signal 1926 represents the demodulated baseband signal 1924 after filtering on a compressed time scale. As illustrated, down-converted signal 1926 has substantially the same "amplitude envelope" as AM carrier signal 1914, but has lower characteristic frequency. Therefore, FIGS. 19B–19F illustrate down-conversion of AM carrier signal 1914.

The waveforms shown in FIGS. 19B–19F are discussed herein for illustrative purposes only, and are not limiting. Additional exemplary time domain and frequency domain drawings, and exemplary methods and systems of the invention relating thereto, are disclosed in co-pending U.S. Patent Application entitled "Method and System for Down-converting an Electromagnetic Signal," Application No. 09/176,022, now U.S. Pat. No. 6,061,551, issued May 9, 2000;

The aliasing rate of control signal 1906 determines whether the input signal 1904 is down-converted to an IF signal, down-converted to a demodulated baseband signal, or down-converted from an FM signal to a PM or an AM signal. Generally, relationships between the input signal 1904, the aliasing rate of the control signal 1906, and the down-converted output signal 1912 are illustrated below:

(Freq. of input signal 1904)=$n$•(Freq. of control signal 1906)+(Freq. of down-converted output signal 1912)

For the examples contained herein, only the "+" condition will be discussed. The value of n represents a harmonic or sub-harmonic of input signal 1904 (e.g., n=0.5, 1, 2, 3, . . . ).

When the aliasing rate of control signal 1906 is off-set from the frequency of input signal 1904, or off-set from a harmonic or sub-harmonic thereof, input signal 1904 is down-converted to an IF signal. This is because the under-sampling pulses occur at different phases of subsequent cycles of input signal 1904. As a result, the under-samples form a lower frequency oscillating pattern. If the input signal 1904 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 1906 would be calculated as follows:

(Freq$_{input}$−Freq$_{IF}$)/$n$=Freq$_{control}$(901 MHZ−1 MHZ)/$n$=900/$n$

For n=0.5, 1, 2, 3, 4, etc., the frequency of the control signal 1906 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signal, and exemplary methods and systems thereof, are disclosed in co-pending U.S. Patent Application entitled "Method and System for Down-converting an Electromagnetic Signal," Application No. 09/176,022, now U.S. Pat. No. 6,061,551, issued May 9, 2000;

Alternatively, when the aliasing rate of the control signal 1906 is substantially equal to the frequency of the input signal 1904, or substantially equal to a harmonic or sub-harmonic thereof, input signal 1904 is directly down-converted to a demodulated baseband signal. This is because, without modulation, the under-sampling pulses occur at the same point of subsequent cycles of the input signal 1904. As a result, the under-samples form a constant output baseband signal. If the input signal 1904 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 1906 would be calculated as follows:

(Freq$_{input}$−Freq$_{IF}$)/$n$=Freq$_{control}$(900 MHZ−0 MHZ)/$n$=900 MHZ/$n$ For n=0.5, 1, 2, 3, 4, etc., the frequency of the control signal 1906 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in the co-pending U.S. Patent Application entitled "Method and System for Down-converting an Electromagnetic Signal," Application No. 09/176,022, now U.S. Pat. No. 6,061,551, issued May 9, 2000;

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2) \div 2]$) of the FSK signal is down-converted to zero IF. For example, to down-convert an FSK signal having $F_1$ equal to 899 MHZ and $F_2$ equal to 901 MHZ, to a PSK signal, the aliasing rate of the control signal 1906 would be calculated as follows:

Frequency of the input=$(F_1+F_2) \div 2 =$(899 MHZ+901 MHZ)$\div 2=900$ MHZ

Frequency of the down-converted signal=0 (i.e., baseband)

$(Freq_{input}-Freq_{IF})/n=Freq_{control}$(900 MHZ–0 MHZ)/$n$=900 MHZ/$n$

For n=0.5, 1, 2, 3, etc., the frequency of the control signal 1906 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 1906 should be substantially equal to:

(900 MHZ–0 MHZ)/$n$=900 MHZ/$n$, or (901 MHZ–0 MHZ)/$n$=901 MHZ/$n$.

For the former case of 900 MHZ/n, and for n=0.5, 1, 2, 3, 4, etc., the frequency of the control signal 1906 should be substantially equal to 1.8 GHz, 900 MHZ, 450 MHZ, 300 MHZ, 225 MHZ, etc. For the latter case of 901 MHZ/n, and for n=0.5, 1, 2, 3, 4, etc., the frequency of the control signal 1906 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

Exemplary time domain and frequency domain drawings, illustrating down-conversion of FM signals to non-FM signals, and exemplary methods and systems thereof, are disclosed in the co-pending U.S. Patent Application entitled "Method and System for Down-converting an Electromagnetic Signal," Application No. 09/176,022, now U.S. Pat. No. 6,061,551, issued May 9, 2000;

In an embodiment, the pulses of the control signal 1906 have negligible apertures that tend towards zero. This makes the UFT module 1902 a high input impedance device. This configuration is useful for situations where minimal disturbance of the input signal may be desired.

In another embodiment, the pulses of the control signal 1906 have non-negligible apertures that tend away from zero. This makes the UFT module 1902 a lower input impedance device. This allows the lower input impedance of the UFT module 1902 to be substantially matched with a source impedance of the input signal 1904. This also improves the energy transfer from the input signal 1904 to the converted output signal 1912, and hence the efficiency and signal to noise (s/n) ratio of UFT module 1902.

Exemplary systems and methods for generating and optimizing the control signal 1906 and for otherwise improving energy transfer and s/n ratio, are disclosed in the co-pending U.S. Patent Application entitled "Method and System for Down-converting an Electromagnetic Signal," Application No. 09/176,022, now U.S. Pat. No. 6,061,551, issued May 9, 2000;

6.2.1.3 Other Embodiments

The down-conversion embodiments described above are provided for purposes of illustration. These embodiments are not intended to limit the invention. Alternate embodiments, differing slightly or substantially from those described herein, will be apparent to those skilled in the relevant art(s) based on the teachings given herein. Such alternate embodiments include but are not limited to: super-heterodyne down-conversion, digital down-conversion, and down-conversion using specialized mixers including harmonic mixers; and any well known down-conversion apparatus. Such alternate embodiments fall within the scope and spirit of the present invention.

6.2.2. Spectrum Isolation

Example embodiments for step 1706 of flowchart 1700 (FIG. 17A), and spectrum isolation module 1726 will be discussed in the following sections. The example embodiments include isolating redundant spectrums that were isolated into separate channels by filtering each of the redundant spectrums.

6.2.2.1 Spectrum Isolation by Filtering Redundant Spectrums

The following discussion describes a method and system for isolating redundant spectrums into separate channels by filtering each of the redundant spectrums.

6.2.2.1.1 Operational Description

Figure 20A:
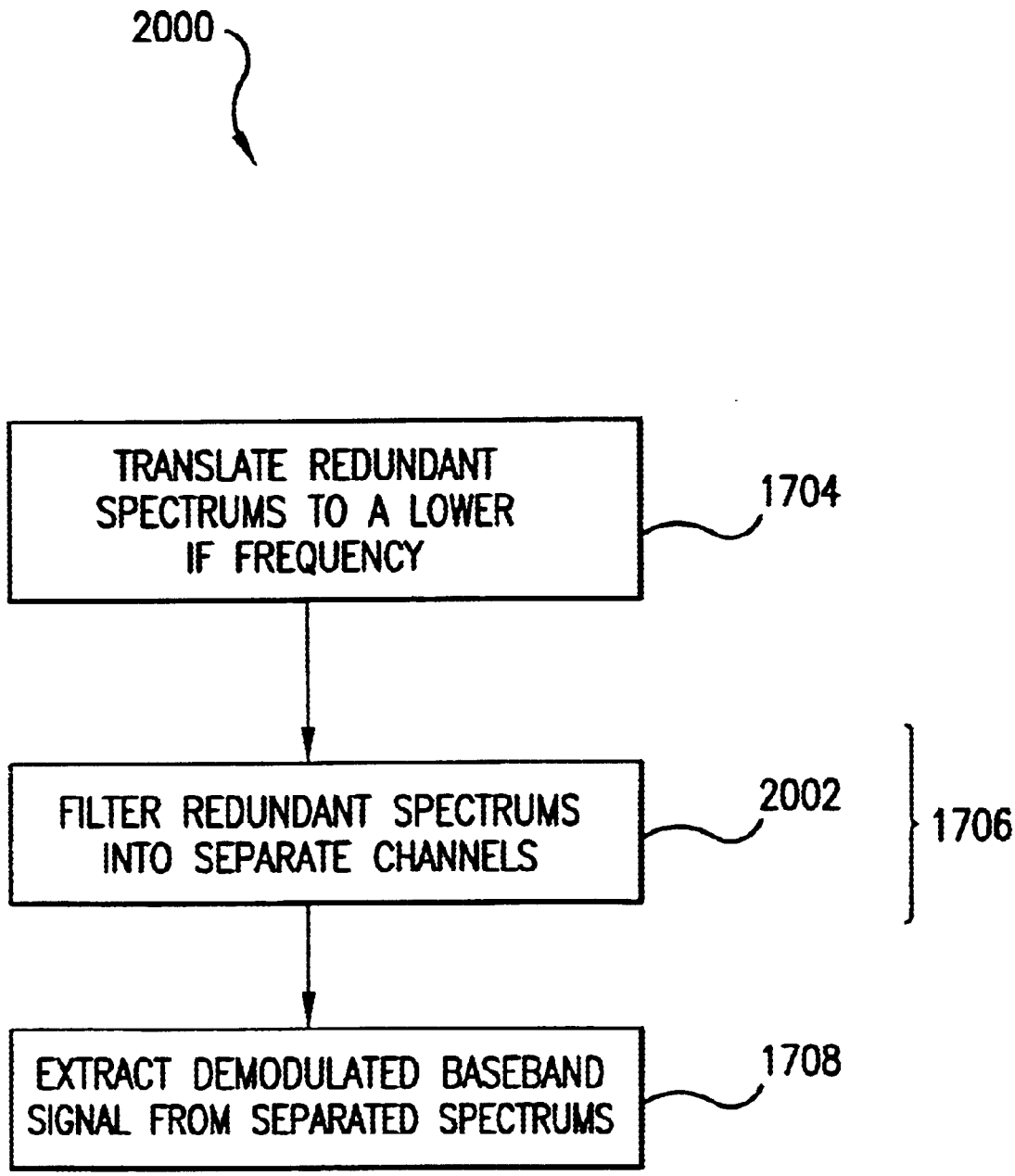
FIG. 20A depicts flowchart 2000, which illustrates isolating redundant spectrums into a separate channels according to an embodiment of the present invention.

FIG. 20A depicts flowchart 2000 for isolating redundant spectrums in separate channels according to one embodiment of the present invention. In the following discussion, the steps in FIG. 20A will be discussed in relation to the example signal diagrams in FIGS. 17D–17G. FIGS. 17D–G were initially described in relation to flowchart 1700, and are also applicable to the discussion herein.

In step 1704, redundant spectrums 1712a–c are translated to lower intermediate frequencies; resulting in redundant spectrums 1714a–c (FIG. 17D) that are located at frequencies $F_{IFA}$, $f_{IFB}$, and $f_{IFC}$, respectively. These spectrums 1714a–c are separated by $f_2$ (Hz). Redundant spectrums 1714a–c contain substantially the same information as spectrums 1712a–c, except that they exist at a substantially lower frequencies, which is represented by the relative placement of break 1709 in frequency axis. Jamming signal spectrum 1711 is also translated to a lower frequency since it is located within the bandwidth of spectrum 1712b, resulting in jamming signal spectrum 1716. Step 1704 and spectrums 1714a–c were first discussed in FIG. 17A and FIG. 17D, respectively, and are repeated here for convenience.

In step 2002, redundant spectrum 1714a–c are filtered into separate channels, resulting in channels 1718a–c (shown in FIGS. 17E–17G). As such, channel 1718a comprises redundant spectrum 1714a; channel 1718b comprises redundant spectrum 1714b and jamming signal spectrum 1716; and channel 1718c comprises redundant spectrum 1714c. Each channel 1718a–c carries the necessary amplitude, phase, and frequency information to reconstruct modulating baseband signal 308 because redundant spectrums 1714a–c carry such information. However, channel 1718b also carries jamming signal spectrum 1716 that may prevent channel 1718b from being used to reconstruct modulating baseband signal 308, depending on the relative signal strength of jamming signal spectrum 1716.

In step 1708, demodulated baseband signal 1720 is extracted from channels 1718a–c, where demodulated baseband signal 1720 is substantially similar to modulated baseband signal 308.

Figure 20B:
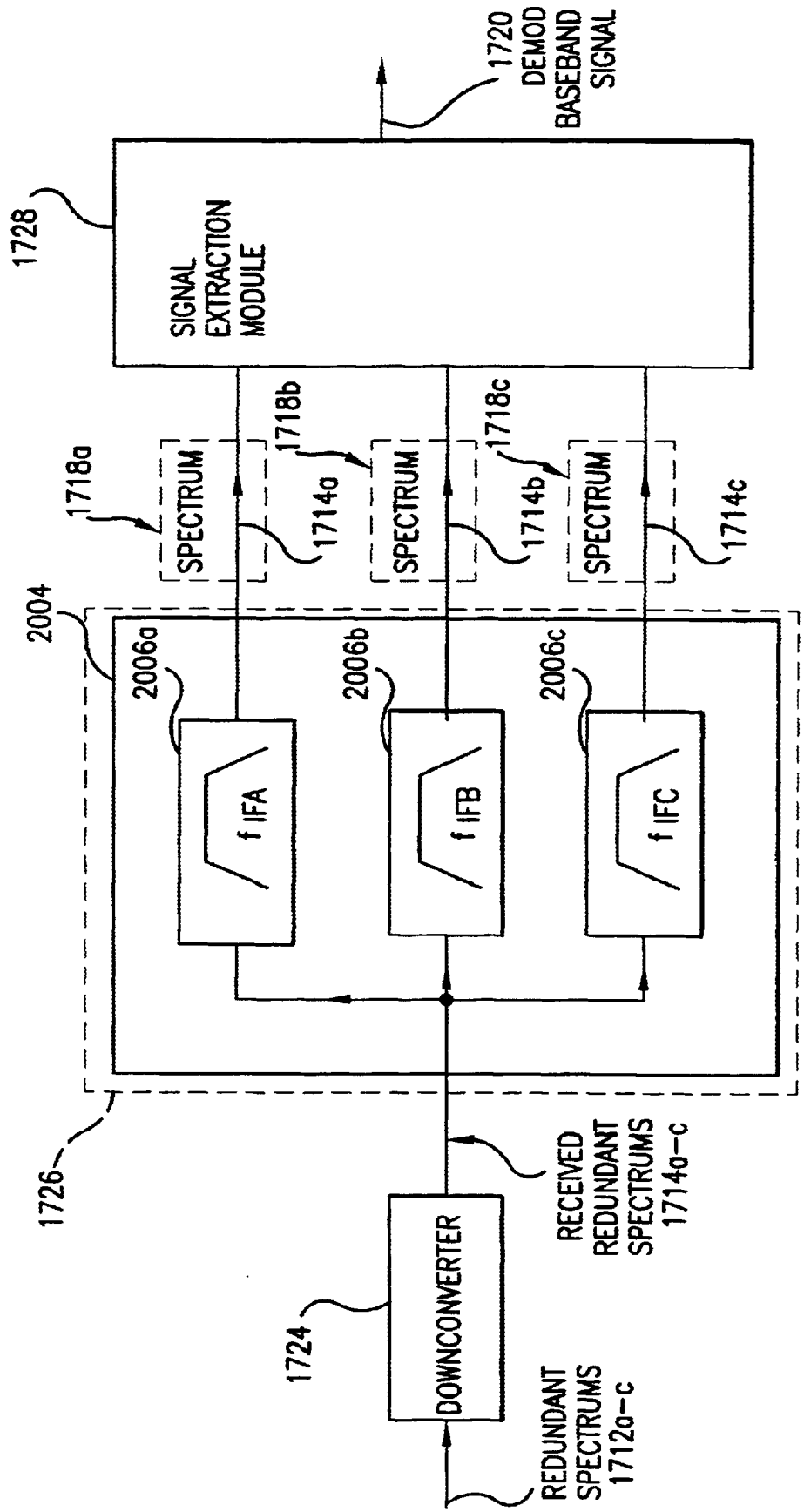
FIG. 20B depicts a structural block diagram associated with flowchart 2000 according to an embodiment of the present invention.

6.2.2.1.2 Structural Description:

FIG. 20B illustrates down-converter 1724, filter bank 2004, and signal extraction module 1728 associated with receiver module 1730 (FIG. 17I), where filter bank 2004 is one embodiment of spectrum isolation module 1726. Filter bank 2004 includes band pass filters 2006a–c. Preferably filter bank 2004 separates redundant spectrums 1714a–c into channels 1718a–c. In other words, filter bank 2004 is a structural embodiment for performing the operational step 2002 in flowchart 2000 (and step 1706 in flowchart 1700). However, it should be understood that the scope and spirit of the of the present invention includes other structural embodiments for performing the step 2002 of flowchart 2000. Flowchart 2000 will be revisited to further illustrate the present invention in view of the structural components in receiver module 1730.

In step 1704, down-converter 1724 translates redundant spectrums 1712a–c to a lower intermediate frequencies. This results in redundant spectrums 1714a–c (FIG. 17D) that are located at frequencies $f_{IFA}$, $f_{IFB}$, and $f_{IFC}$, respectively, that are separated by $f_2$ (Hz). Redundant spectrums 1714a–c are substantially similar to spectrums 1712a–c, except that they exist at a substantially lower frequency; which is represented by the relative placement of break 1709 in frequency axis. Jamming signal spectrum 1711 is also translated to a lower frequency since it is located within the bandwidth of spectrum 1712b, resulting in jamming signal spectrum 1716. Step 1704 and spectrums 1714a–c were first discussed in FIG. 17A and FIG. 17B, respectively, and are repeated here for convenience.

In step 2002, filter bank 2004 filters redundant spectrum 1714a–c into separate channels 1718a–c that contain spectrums 1714a–c, respectively. In doing so, band pass filter 2006a has center frequency at $f_{IFA}$, and a passband that is sufficient to pass spectrum 1714a, but rejects the remaining redundant spectrums 1714b,c. Band pass filter 2006b has a center frequency at $f_{IFB}$, and a passband that is sufficient to pass spectrum 1714b, but rejects the remaining redundant spectrums 1714a,c. As such, band pass filter 2006b will also pass jamming signal spectrum 1716 because it is withing the frequency bandwidth of redundant spectrum 1714b. Band pass filter 2006c has a center frequency at $f_{IFC}$, and a passband that is sufficient to pass spectrum 1714c, but rejects the remaining redundant spectrums 1714a,b.

The result of step 2002 is that channel 1718a comprises redundant spectrum 1714a; channel 1718b comprises redundant spectrum 1714b and jamming signal spectrum 1716; and channel 1718c comprises redundant spectrum 1714c. Each channel 1718a–c carries the necessary amplitude, phase, and frequency information to reconstruct modulating baseband signal 308 because redundant spectrums 1714a–c carry such information. However, channel 1718b also carries jamming signal spectrum 1716 that may prevent channel 1718b from being used to reconstruct modulating baseband signal 308, depending on the relative signal strength of the jamming signal spectrum 1716.

In one embodiment described in section 6.2.1.1, down-converter 1724 includes a mixer 1814 and a local oscillator 1816 with a characteristic frequency $f_3$. When mixer 1814 is used, $f_{IFA}$, $f_{IFB}$, and $f_{IFC}$ are substantially equal to $(f_1-f_2)-f_3$, $(f_1-f_3)$, and $(f_1+f_2)-f_3$ as described in section 6.2.1.1. As such, filters 2006a–c should be centered accordingly, as would be well known to those skilled in the art(s) based on the discussion herein. In practice, it is possible to design and implement the filter bank 2004 using many well known filter techniques since $f_1$, $f_2$, and $f_3$ are known.

Furthermore, filter bank 2004 depicts three bandpass 2006a–c to process three redundant spectrums 1714a–c. This is for example only. As stated in section 6.2.1.1, any number of redundant spectrums can be transmitted (and thus received) over a communications medium. As such, filter bank 2004 can be scaled to include any number of band pass filters to process any number of redundant spectrums received by (optional) medium interface module 1722, as would be well known to those skilled in the art(s) based on the discussion given herein. The invention is not limited to the use of bandpass filters. In other embodiments, other well known filter techniques can be used.

In step 1708, demodulated baseband signal 1720 is extracted from channels 1718a–c, where demodulated baseband signal 1720 is substantially similar to modulated baseband signal 308.

6.2.2.2. Down-conversion and Spectrum Isolation using a Unified Down-converting and Filtering Module (UDF)

Figure 20C:
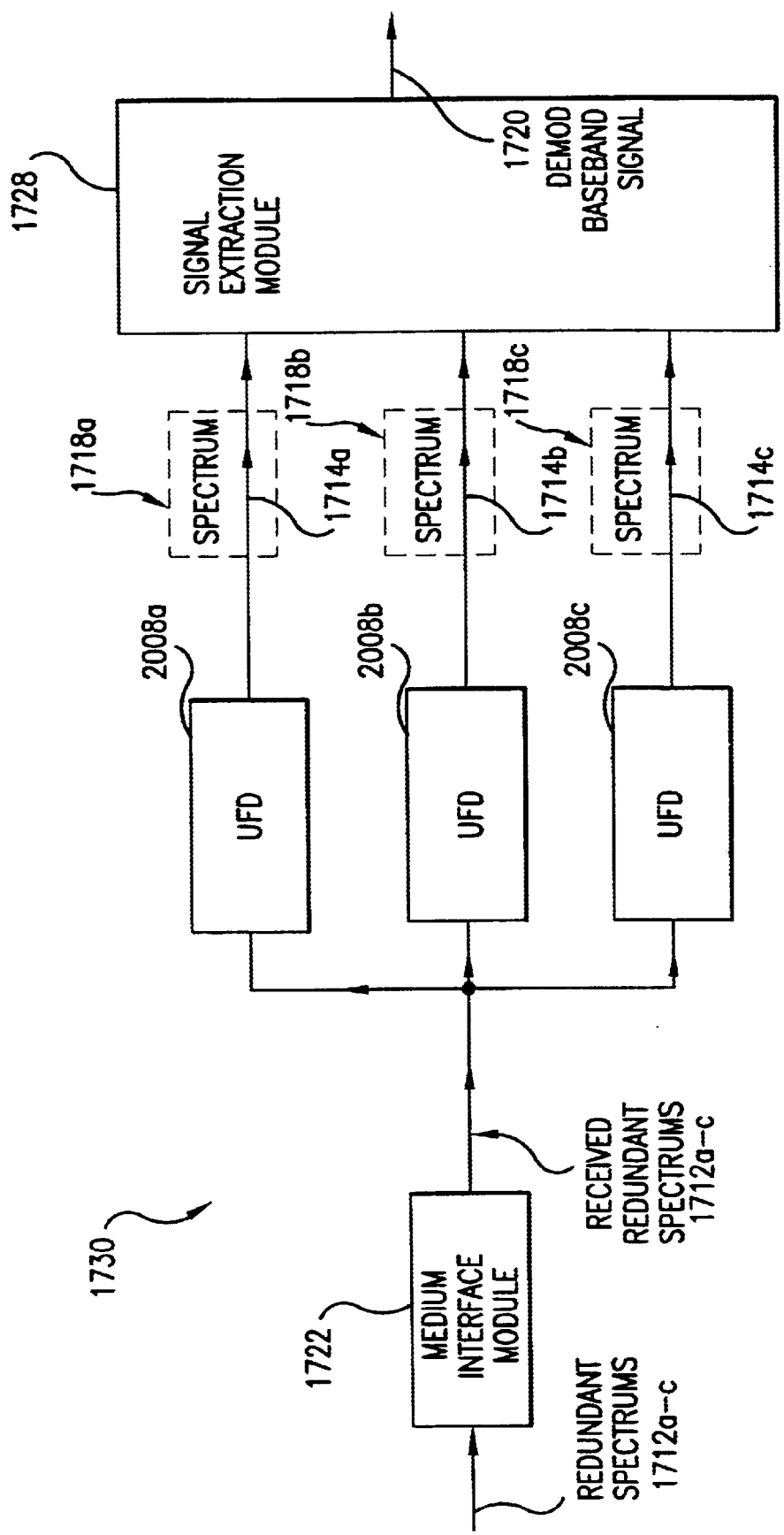
FIG. 20C depicts a structural embodiment of receiver 1730 using UFD modules.

In one embodiment, one or more unified down-converting and filtering modules (UDF) replace the down-converter 1724, and the spectrum isolation module 1726. A single UDF module both down-converts and filters a redundant spectrum in an integrated manner. FIG. 20C illustrates the relative placement of UDF modules 2008a–c in receiver 1730 (FIG. 17I, see also FIG. 20B) between (optional) medium interface module 1722 and signal extraction module 1720, where a UDF module is implemented for each received redundant spectrum (or each spectrum of interest) according to one embodiment of the present invention. Down-converting and filtering in a unified manner using a UDF module is further described in co-pending U.S. patent application entitled "Integrated Frequency Translation and Selectivity", of common assignee, Ser. No. 09/175,966, now U.S. Pat. No. 6,049,706, issued April 11, 2000; and which is herein incorporated by reference in its entirety. A relevant portion of the above mentioned application is summarized below to describe down-converting and filtering an input signal (e.g. redundant spectrums 1712a–c) to an output signal (e.g. redundant spectrums 1714a–c). The summary of the UDF module is as follows.

The present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 24:
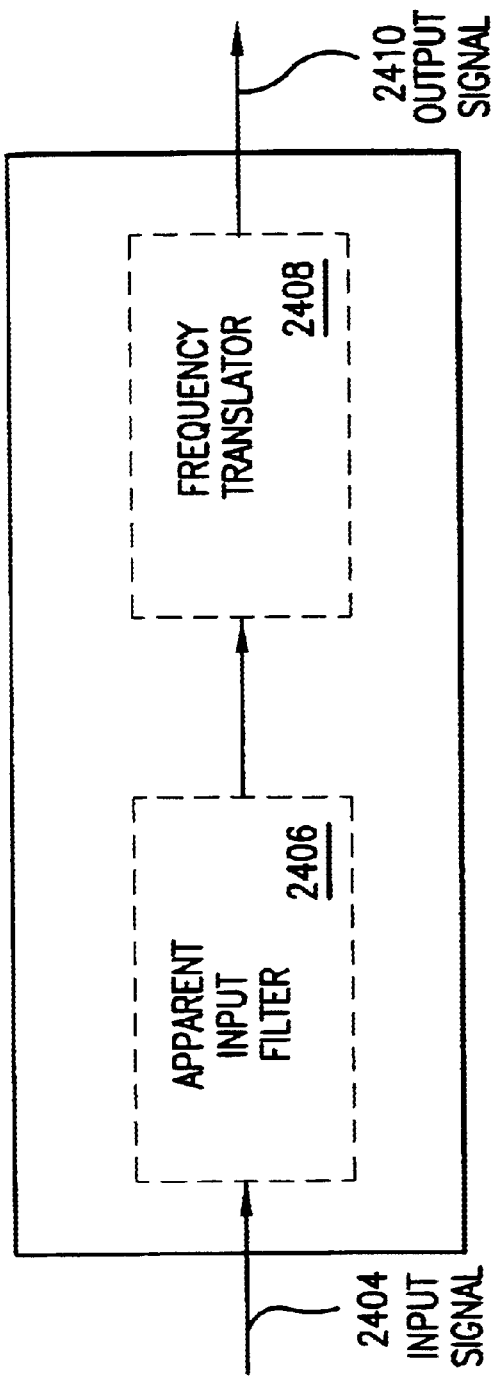
FIG. 24 depicts the conceptual representation of a Unified Down-Converting and Filtering Module (UDF)

FIG. 24 is a conceptual block diagram of a UDF module 2402 according to an embodiment of the present invention. The UDF module 2402 performs at least frequency translation and frequency selectivity.

The effect achieved by the UDF module 2402 is to perform the frequency selectivity operation prior to the performance of the frequency translation operation. Thus, the UDF module 2402 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 2404 received by the UDF module 2402 are at radio frequencies. The UDF module 2402 effectively operates to input filter these RF input signals 2404. Specifically, in these embodiments, the UDF module 2402 effectively performs input, channel select filtering of the RF input signal 2404. Accordingly, the invention achieves high selectivity at high frequencies.

The UDF module 2402 effectively performs various types of filtering, including but not limited to bandpass filtering, low pass filtering, high pass filtering, notch filtering, all pass filtering, band stop filtering, etc., and combinations thereof.

Conceptually, the UDF module 2402 includes a frequency translator 2408. The frequency translator 2408 conceptually represents that portion of the UDF module 2402 that performs frequency translation (down conversion).

The UDF module 2402 also conceptually includes an apparent input filter 2406 (also sometimes called an input filtering emulator). Conceptually, the apparent input filter 2406 represents that portion of the UDF module 2402 that performs input filtering.

In practice, the input filtering operation performed by the UDF module 2402 is integrated with the frequency translation operation. The input filtering operation can be viewed as being performed concurrently with the frequency translation operation. This is a reason why the input filter 2406 is herein referred to as an "apparent" input filter 2406.

The UDF module 2402 of the present invention includes a number of advantages. For example, high selectivity at high frequencies is realizable using the UDF module 2402. This feature of the invention is evident by the high Q factors that are attainable. For example, and without limitation, the UDF module 2402 can be designed with a filter center frequency $f_C$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of the UDF module 2402 can be electrically adjusted, either statically or dynamically.

Also, the UDF module 2402 can be designed to amplify input signals.

Further, the UDF module 2402 can be implemented without large resistors, capacitors, or inductors. Also, the UDF module 2402 does not require that high tolerances be maintained on its individual components, i.e., its resistors, capacitors, inductors, etc. As a result, the architecture of the UDF module 2402 is friendly to integrated circuit design techniques and processes.

The features and advantages exhibited by the UDF module 2402 are achieved at least in part by adopting a new technological paradigm with respect to frequency selectivity and translation. Specifically, according to the present invention, the UDF module 2402 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 26:
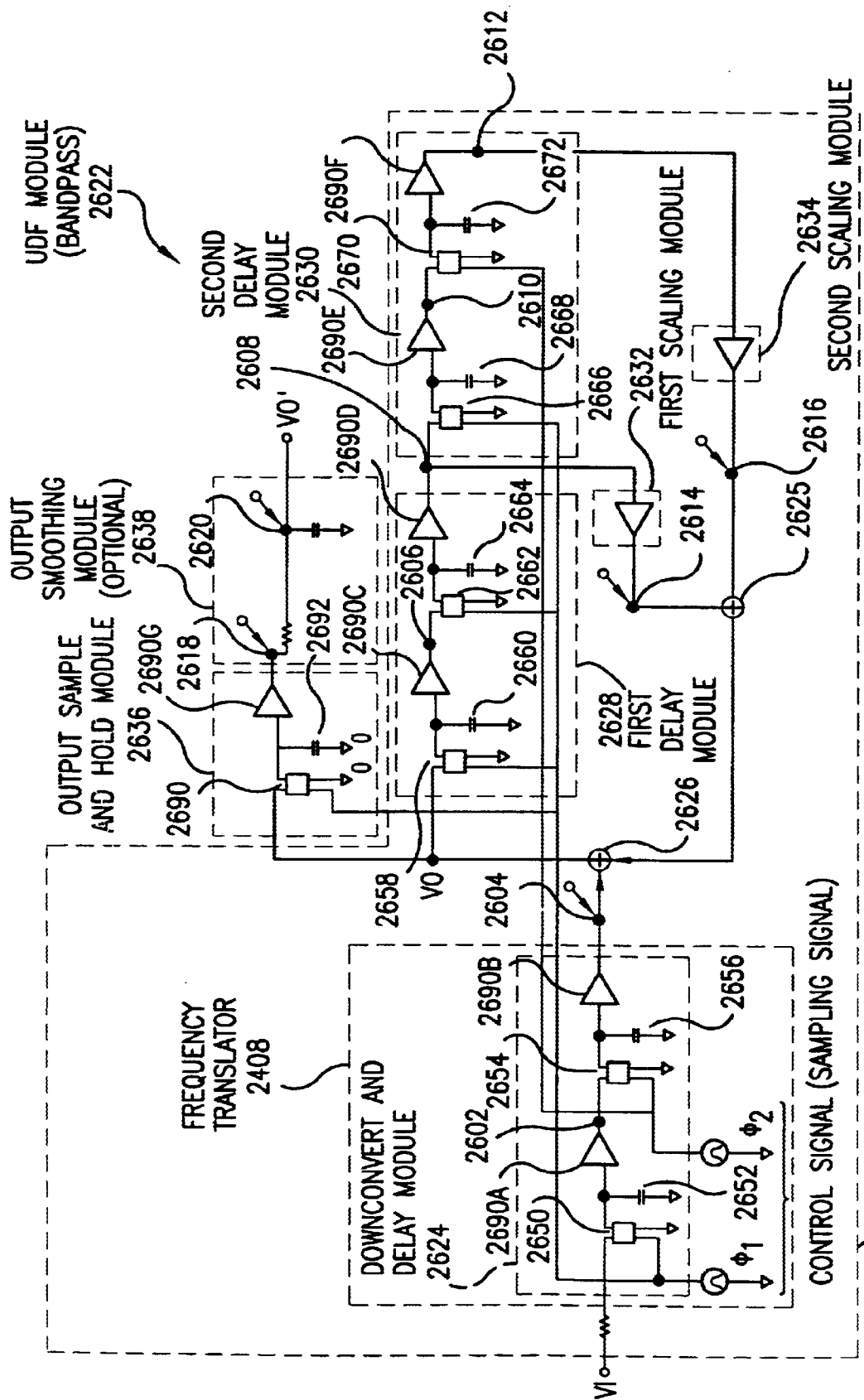
FIG. 26 illustrates a structural implementation of a UFD module.

FIG. 26 illustrates an example implementation of the unified down-converting and filtering (UDF) module 2622. The UDF module 2622 performs the frequency translation operation and the frequency selectivity operation in an integrated, unified manner as described above, and as further described below.

In the example of FIG. 26, the frequency selectivity operation performed by the UDF module 2622 comprises a band-pass filtering operation according to EQ. 1, below, which is an example representation of a band-pass filtering transfer function.

$$VO = \alpha_1 z^{-1} VI - \beta_1 z^{-1} VO - \beta_0 z^{-2} VO \qquad \text{EQ. 1}$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, EQ. 1 is referred to herein for illustrative purposes only, and is not limiting.

The UDF module 2622 includes a down-convert and delay module 2624, first and second delay modules 2628 and 2630, first and second scaling modules 2632 and 2634, an output sample and hold module 2636, and an (optional) output smoothing module 2638. Other embodiments of the UDF module will have these components in different configurations, and/or a subset of these components, and/or additional components. For example, and without limitation, in the configuration shown in FIG. 26, the output smoothing module 2638 is optional.

As further described below, in the example of FIG. 26, the down-convert and delay module 2624 and the first and second delay modules 2628 and 2630 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example of FIG. 26, it is assumed that $\alpha_1$ is equal to one. Thus, the output of the down-convert and delay module 2624 is not scaled. As evident from the embodiments described above, however, the invention is not limited to this example.

The example UDF module 2622 has a filter center frequency of 900.2 MHZ and a filter bandwidth of 570 KHz. The pass band of the UDF module 2622 is on the order of 899.915 MHZ to 900.485 MHZ. The Q factor of the UDF module 2622 is approximately 1579 (i.e., 900.2 MHZ divided by 570 KHz).

The operation of the UDF module 2622 shall now be described with reference to a Table 2502 (FIG. 25) that indicates example values at nodes in the UDF module 2622 at a number of consecutive time increments. It is assumed in Table 2502 that the UDF module 2622 begins operating at time t−1. As indicated below, the UDF module 2622 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 2650 in the down-convert and delay module 2624 closes. This allows a capacitor 2652 to charge to the current value of an input signal, $VI_{t-1}$ such that node 2602 is at $VI_{t-1}$. This is indicated by cell 2504 in FIG. 25. In effect, the combination of the switch 2650 and the capacitor 2652 in the down-convert and delay module 2624 operates to translate the frequency of the input signal VI to a desired lower frequency, such as IF or baseband. Thus, the value stored in the capacitor 2652 represents an instance of a down-converted image of the input signal VI.

The manner in which the down-convert and delay module 2624 performs frequency down-conversion is further described elsewhere in this application, and is additionally described in pending U.S. application "Methods and Systems for Down-Converting Electromagnetic Signals," Ser. No. 09/176,022, now U.S. Pat. No. 6,061,551, issued May 9, 2000; which is herein incorporated by reference in its entirety.

Also at the rising edge of $\phi_1$ at time t−1, a switch 2658 in the first delay module 2628 closes, allowing a capacitor 2660 to charge to $VO_{t-1}$, such that node 2606 is at $VO_{t-1}$. This is indicated by cell 2506 in Table 2502. (In practice, $VO_{t-1}$ is undefined at this point. However, for ease of understanding, $VO_{t-1}$ shall continue to be used for purposes of explanation.)

Also at the rising edge of $\phi_1$ at time t−1, a switch 2666 in the second delay module 2630 closes, allowing a capacitor 2668 to charge to a value stored in a capacitor 2664. At this time, however, the value in capacitor 2664 is undefined, so the value in capacitor 2668 is undefined. This is indicated by cell 2507 in table 2502.

At the rising edge of $\phi_2$ at time t−1, a switch 2654 in the down-convert and delay module 2624 closes, allowing a capacitor 2656 to charge to the level of the capacitor 2652. Accordingly, the capacitor 2656 charges to $VI_{t-1}$, such that node 2604 is at $VI_{t-1}$. This is indicated by cell 2510 in Table 2502.

The UDF module 2622 may optionally include a unity gain module 2690A between capacitors 2652 and 2656. The unity gain module 2690A operates as a current source to enable capacitor 2656 to charge without draining the charge from capacitor 2652. For a similar reason, the UDF module 2622 may include other unity gain modules 2690B–2690G. It should be understood that, for many embodiments and applications of the invention, these unity gain modules 2690A–2690G are optional. The structure and operation of the unity gain modules 2690 will be apparent to persons skilled in the relevant art(s).

Also at the rising edge of $\phi_2$ at time t−1, a switch 2662 in the first delay module 2628 closes, allowing a capacitor 2664 to charge to the level of the capacitor 2660. Accordingly, the capacitor 2664 charges to $VO_{t-1}$, such that node 2608 is at $VO_{t-1}$. This is indicated by cell 2514 in Table 2502.

Also at the rising edge of $\phi_2$ at time t−1, a switch 2670 in the second delay module 2630 closes, allowing a capacitor 2672 to charge to a value stored in a capacitor 2668. At this time, however, the value in capacitor 2668 is undefined, so the value in capacitor 2672 is undefined. This is indicated by cell 2515 in table 2502.

At time t, at the rising edge of $\phi_1$, the switch 2650 in the down-convert and delay module 2624 closes. This allows the capacitor 2652 to charge to $VI_t$, such that node 2602 is at $VI_t$. This is indicated in cell 2516 of Table 2502.

Also at the rising edge of $\phi_1$ at time t, the switch 2658 in the first delay module 2628 closes, thereby allowing the capacitor 2660 to charge to $VO_t$. Accordingly, node 2606 is at $VO_t$. This is indicated in cell 2520 in Table 2502.

Further at the rising edge of $\phi_1$ at time t, the switch 2666 in the second delay module 2630 closes, allowing a capacitor 2668 to charge to the level of the capacitor 2664. Therefore, the capacitor 2668 charges to $VO_{t-1}$, such that node 2610 is at $VO_{t-1}$. This is indicated by cell 2524 in Table 2502.

At the rising edge of $\phi_2$ at time t, the switch 2654 in the down-convert and delay module 2624 closes, allowing the capacitor 2656 to charge to the level of the capacitor 2652. Accordingly, the capacitor 2656 charges to $VI_t$, such that node 2604 is at $VI_t$. This is indicated by cell 2528 in Table 2502.

Also at the rising edge of $\phi_2$ at time t, the switch 2662 in the first delay module 2628 closes, allowing the capacitor 2664 to charge to the level in the capacitor 2660. Therefore, the capacitor 2664 charges to $VO_t$, such that node 2608 is at $VO_t$. This is indicated by cell 2532 in Table 2502.

Further at the rising edge of $\phi_2$ at time t, the switch 2670 in the second delay module 2630 closes, allowing the capacitor 2672 in the second delay module 2630 to charge to the level of the capacitor 2668 in the second delay module 2630. Therefore, the capacitor 2672 charges to $VO_{t-1}$, such that node 2612 is at $VO_{t-1}$. This is indicated in cell 2536 of FIG. 25.

At time t+1, at the rising edge of $\phi_1$ the switch 2650 in the down-convert and delay module 2624 closes, allowing the capacitor 2652 to charge to $VI_{t+1}$. Therefore, node 2602 is at $VI_{t+1}$, as indicated by cell 2538 of Table 2502.

Also at the rising edge of $\phi_1$ at time t+1, the switch 2658 in the first delay module 2628 closes, allowing the capacitor 2660 to charge to $VO_{t+1}$. Accordingly, node 2606 is at $VO_{t+1}$, as indicated by cell 2542 in Table 2502.

Further at the rising edge of $\phi_1$ at time t+1, the switch 2666 in the second delay module 2630 closes, allowing the capacitor 2668 to charge to the level of the capacitor 2664. Accordingly, the capacitor 2668 charges to $VO_t$, as indicated by cell 2546 of Table 2502.

In the example of FIG. 26, the first scaling module 2632 scales the value at node 2608 (i.e., the output of the first delay module 2628) by a scaling factor of −0.1. Accordingly, the value present at node 2614 at time t+1 is $-0.1*VO_t$. Similarly, the second scaling module 2634 scales the value present at node 2612 (i.e., the output of the second scaling module 2630) by a scaling factor of −0.8. Accordingly, the value present at node 2616 is $-0.8*VO_{t-1}$ at time t+1.

At time t+1, the values at the inputs of the summer 2626 are: $VI_t$ at node 2604, $-0.1*VO_t$ at node 2614, and $-0.8*VO_{t-1}$ at node 2616 (in the example of FIG. 26, the values at nodes 2614 and 2616 are summed by a second summer 2625, and this sum is presented to the summer 2626). Accordingly, at time t+1, the summer generates a signal equal to $VI_t-0.1*VO_t-0.8*VO_{t-1}$.

At the rising edge of $\phi_1$ at time t+1, a switch 2690 in the output sample and hold module 2636 closes, thereby allowing a capacitor 2692 to charge to $VO_{t+1}$. Accordingly, the capacitor 2692 charges to $VO_{t+1}$, which is equal to the sum generated by the adder 2626. As just noted, this value is equal to: $VI_t-0.1*VO_t-0.8*VO_{t-1}$. This is indicated in cell 2550 of Table 2502. This value is presented to the output smoothing module 2638, which smooths the signal to thereby generate the instance of the output signal $VO_{t+1}$. It is apparent from inspection that this value of $VO_{t+1}$ is consistent with the band pass filter transfer function of EQ. 1.

6.2.2.3 Other Embodiments

The spectrum isolation embodiments described above are provided for purposes of illustration. These embodiments are not intended to limit the invention. Alternate embodiments, differing slightly or substantially from those described herein, will be apparent to those skilled in the relevant art(s) based on the teachings given herein. Such alternate embodiments fall within the scope and spirit of the present invention.

6.2.3 Signal extraction

Example embodiments for step 1708 of flowchart 1700 (FIG. 17A), and signal extraction module 1728 will be discussed in the following section and subsections. The example embodiments include extracting a demodulated baseband signal from redundant spectrums that are isolated into separate channels.

6.2.3.1 Signal Extraction by Demodulation, With Error Checking and/or Error Correction The following description includes a system and method for extracting the demodulated baseband signal from redundant spectrums that were isolated into separate channels. The system and method includes demodulating redundant spectrums along with error checking, and/or error correction.

6.2.3.1.1 Operational Description

Figure 21A:
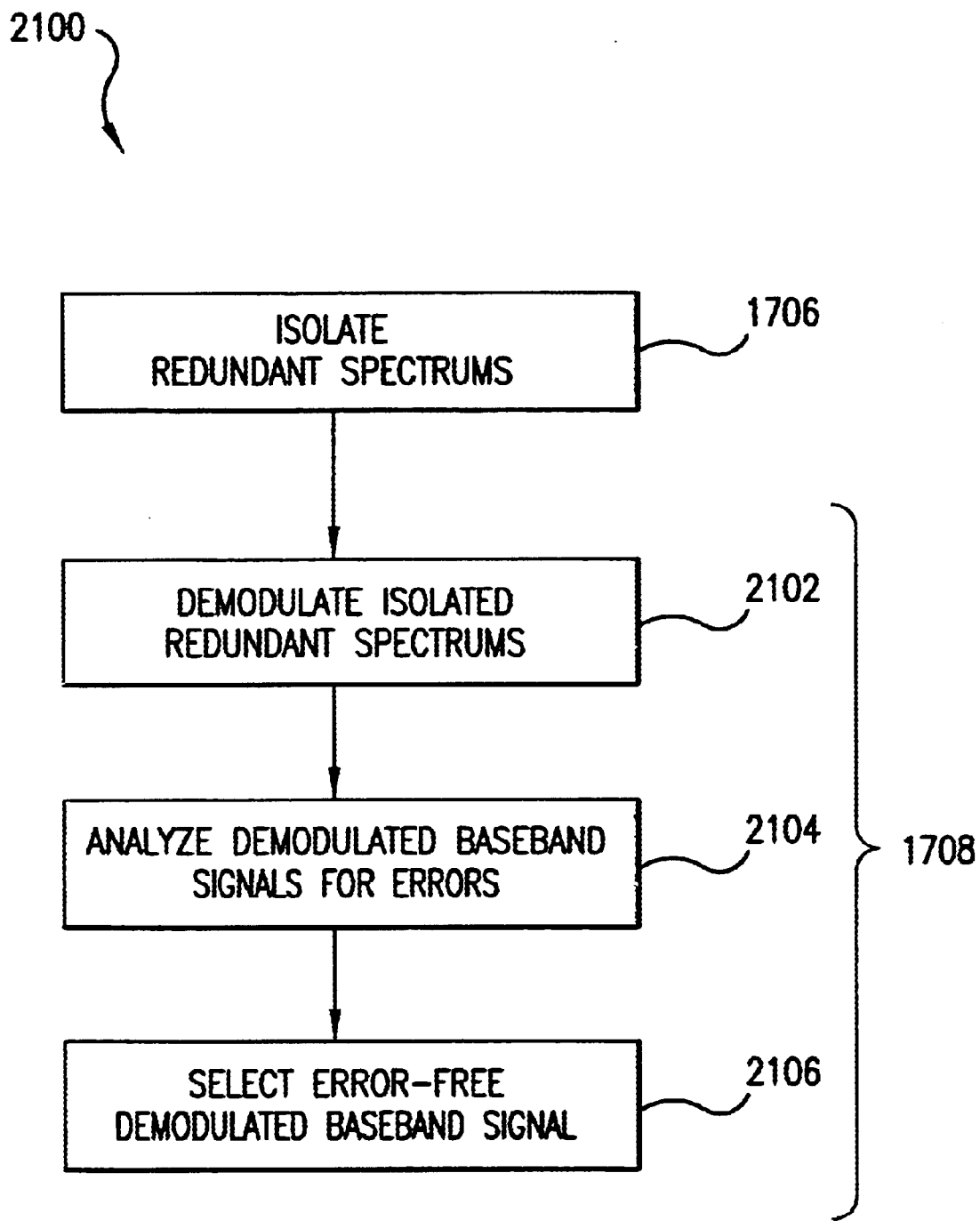
FIG. 21A depicts flowchart 2100, which illustrates extracting a demodulated baseband signal from redundant spectrums according to an embodiment of the present invention.
Figure 21B:
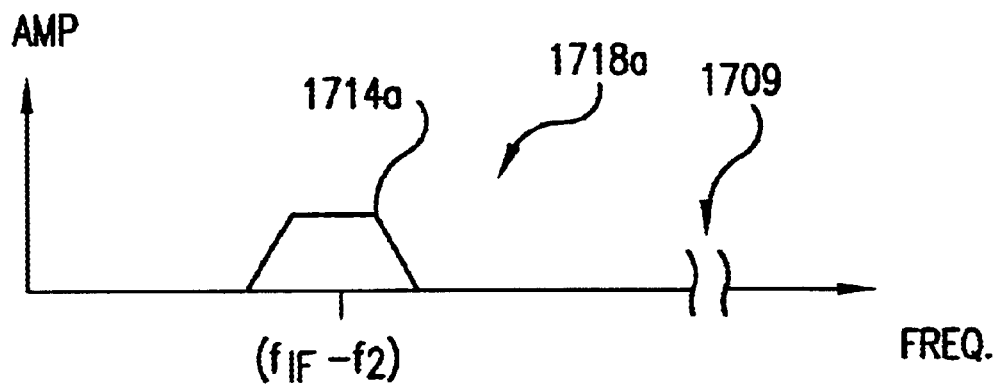
FIGS. 21B–H depict several signal diagrams that are associated with flowchart 2100 according to an embodiment of the present invention.
Figure 21C:
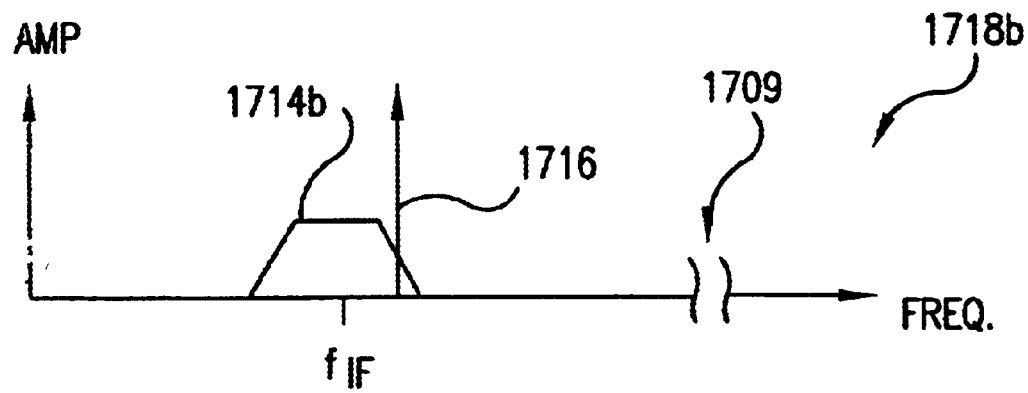
Figure 21D:
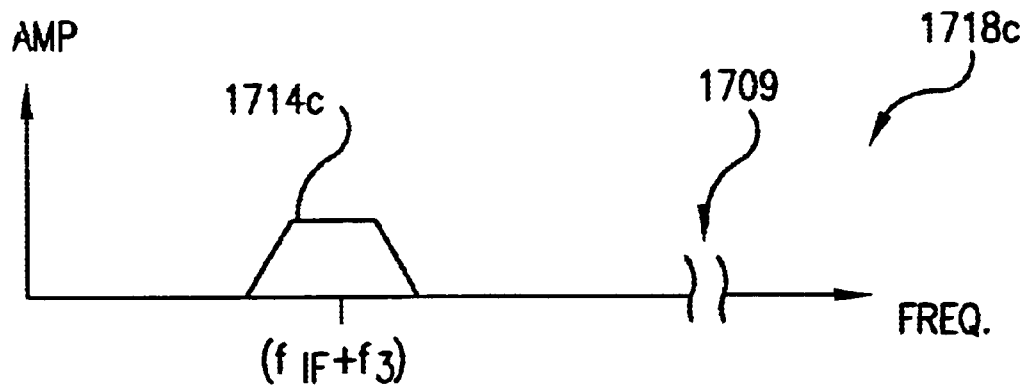
Figure 21E:
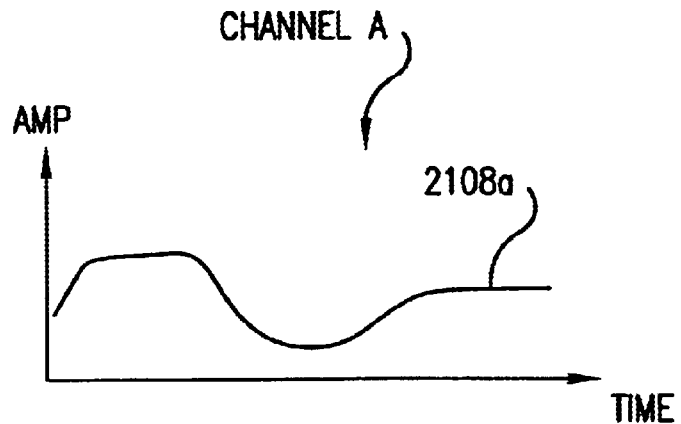
Figure 21F:
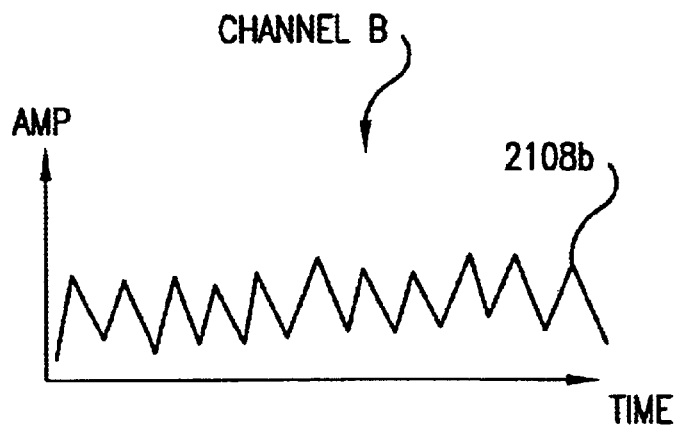
Figure 21G:
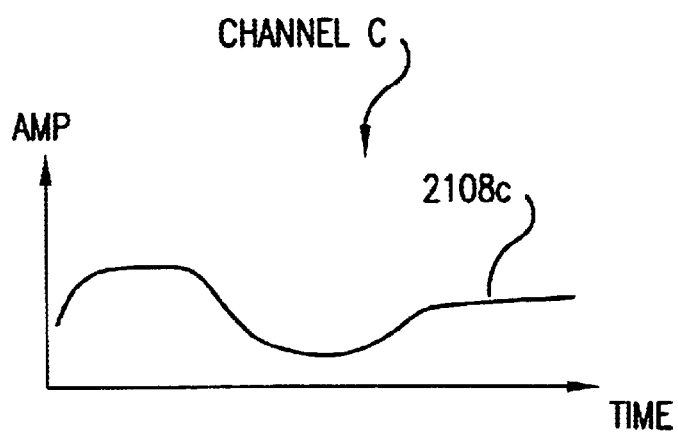
Figure 21H:
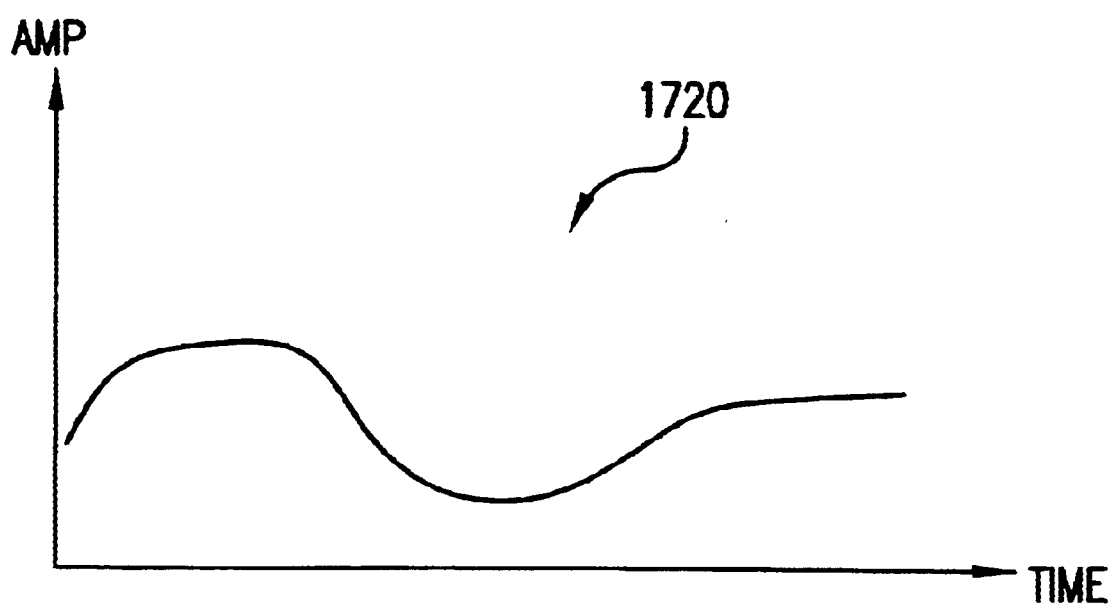
Figure 211:
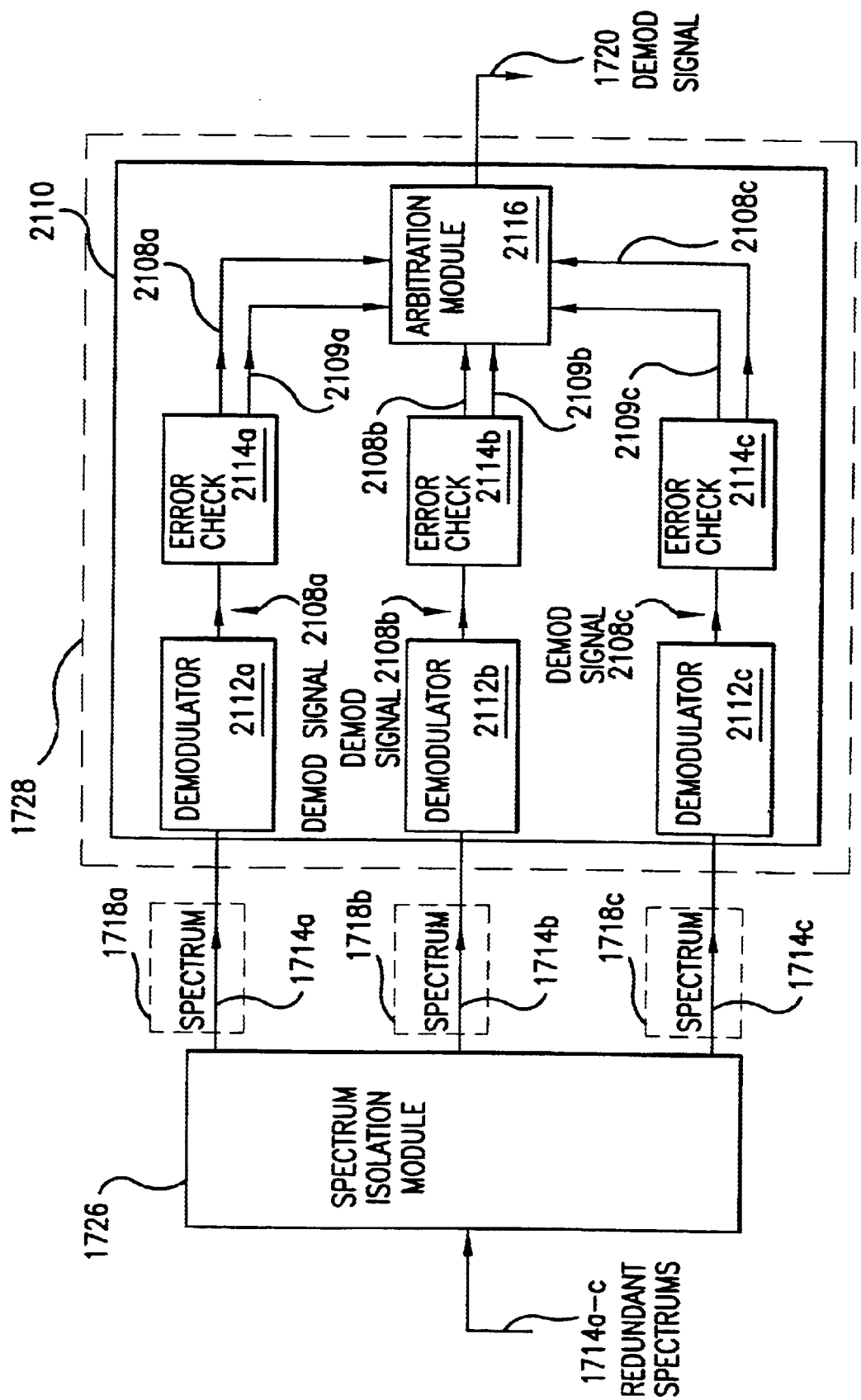

FIG. 21A depicts flowchart 2100 for extracting the demodulated baseband signal 1720 (FIG. 21H) from channels 1718a–c (FIGS. 21E–G). Demodulated baseband signal 1720 was first presented in FIG. 17H, and is re-illustrated in FIG. 21H for convenience. Similarly, channels 1718a–c were first presented in FIGS. 17E–G, respectively, and are re-illustrated in FIGS. 21B–D for convenience. In the following discussion, the steps in FIG. 21A will be discussed in relation to the example signal diagrams in FIGS. 21B–21H.

In step 1706, redundant spectrum 1714a–c are isolated from each other into separate channels, resulting in channels 1718a–c (shown in FIGS. 21B–21D). As such, channel 1718a comprises redundant spectrum 1714a; channel 1718b comprises redundant spectrum 1714b and jamming signal spectrum 1716; and channel 1718c comprises redundant spectrum 1714c. Each channel 1718a–c carries the necessary amplitude, phase, and frequency information to reconstruct modulating baseband signal 308 because redundant spectrums 1714a–c carry such information. However, channel 1718b also carries jamming signal spectrum 1716 that may prevent channel 1718b from being used to reconstruct modulating baseband signal 308, depending on the relative signal strength of jamming signal spectrum 1716. Step 1706 and channels 1718a–c were first discussed in FIGS. 17A and FIGS. 17E–G, respectively, and are re-illustrated here for convenience.

In step 2102, redundant spectrums 1714a–c (in channels 1718a–c, respectively) are preferably independently demodulated (or decoded), resulting in demodulated baseband signals 2108a–c (FIGS. 21E–G), respectively. The type of demodulation implemented in step 2108 is consistent with the type of modulation scheme used to generate redundant spectrums 1714a–c. Demodulation techniques for standard modulation schemes include but are not limited to AM, ASK, FM, FSK, PM, PSK, etc., combinations thereof, and other modulation schemes will be apparent to those skilled in the art(s) based on the teachings given herein.

FIGS. 21E and 21G depict demodulated baseband signals 2108a and 2108c that are substantially similar to modulated baseband signal 308 (FIG. 3A), as is desired. However, FIG. 21F depicts a demodulated baseband signal 2108b that is not substantially similar to modulating baseband signal 308, as would be expected from the presence of jamming signal spectrum 1716 in channel 1718b, from which the demodulated baseband signal 2108b is derived.

In step 2104, each demodulated baseband signal 2108a–c is analyzed to detect errors. In one embodiment, when a demodulated baseband signal is determined to be erroneous, an associated error flag is set. The error flag for each demodulated baseband signal can then be examined in step 2106 to select an error-free demodulated baseband signal.

Any of the many available error detection schemes can be used to detect errors in step 2104. Furthermore, in some instances, methodologies can be used to correct detected errors in digital signals. Some effective error detection schemes for digital and analog demodulated baseband signals will be discussed below.

Cylic Redundancy Check (CRC) and parity check can be used to detect errors in demodulated baseband signals that are digital signals. A short summary of each follows. CRC examines a bit stream (prior to transmission over a communications medium) and calculates an n-bit CRC character according to a specific mathematical relationship based on the examined bit stream. The CRC character is then transmitted with the examined bit stream over the communications medium. The same calculation is performed at the receiver. If the CRC character determined by the receiver agrees with that sent with the bit stream, then the bit stream is determined to be error free. If there is disagreement, then an error has been introduced. Parity check also generates n-bit character associated with a bit stream; where the parity check character is based on the number of logic "1"s or "0"s in the bit stream. The scope and spirit of the present invention includes all other error checking/correction schemes including but not limited to check sum as will be understood by those skilled in the art(s) based on the discussion given herein.

Error detection for analog demodulated baseband signals can be implemented through various encoder/decoder and pattern recognition schemes. In one embodiment, this is done by examining the separated demodulated baseband signals to determine a consensus signal shape. Each demodulated baseband signal can then be compared with the consensus signal, where any demodulated baseband signal that is substantially different from the consensus signal is deemed erroneous. Implementation of this scheme on demodulated baseband signals 2108a–c (FIGS. 21E–21G) will result in baseband signal 2108b being deemed as erroneous.

In another embodiment, error detection for analog signals is accomplished by monitoring a pilot tone that is embedded in the redundant spectrums from which the demodulated baseband signals are generated. After calibration, any degradation in pilot tone may be evidence of signal interference.

In another embodiment, error detection for analog signals is accomplished by passing each demodulated baseband signal through a high pass filter to select the (out-of-band) high frequency components in each demodulated baseband signal. Ideally, the amplitude of these out-of-band frequency components is small. Therefore, if the power level of these out-of-band frequency components is above some threshold level, then the demodulated baseband signal may be corrupted with unwanted interference. This method of error detection would flag demodulated baseband signal 2108b (FIG. 21F) as erroneous.

Figure 17H:
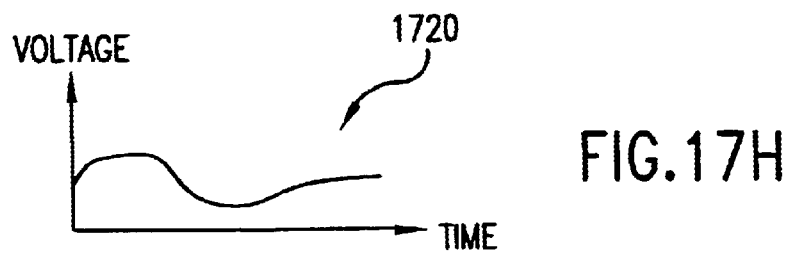
Figure 171:
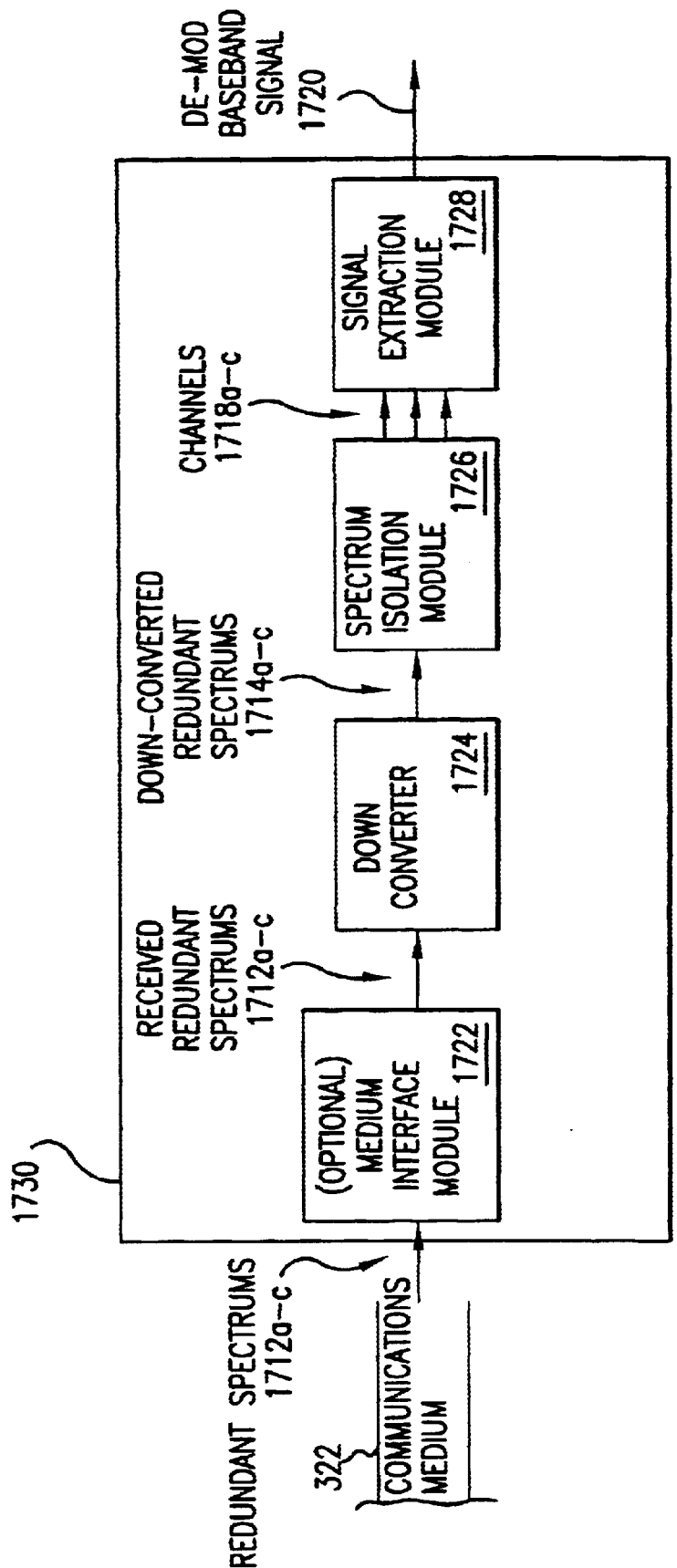

In step 2106, a substantially error-free demodulated baseband signal is selected; resulting in demodulated baseband signal 1720 (FIG. 17H). In one embodiment, a particular demodulated baseband signal is substantially error-free if it is sufficiently similar to (i.e. representative of) the modulating baseband signal (associated with the transmitted redundant spectrums in step 306) for the needs of the application. Therefore, in one embodiment, the level of similarity is application specific. For example and without limitation, voice communication may require less similarity than data communications as will be understood by those skilled in the relevant art(s). In the example illustrated in FIGS. 21E–G, either demodulated baseband signal 2108a or 2108c can be selected as demodulated baseband signal 1720.

Figure 22A:
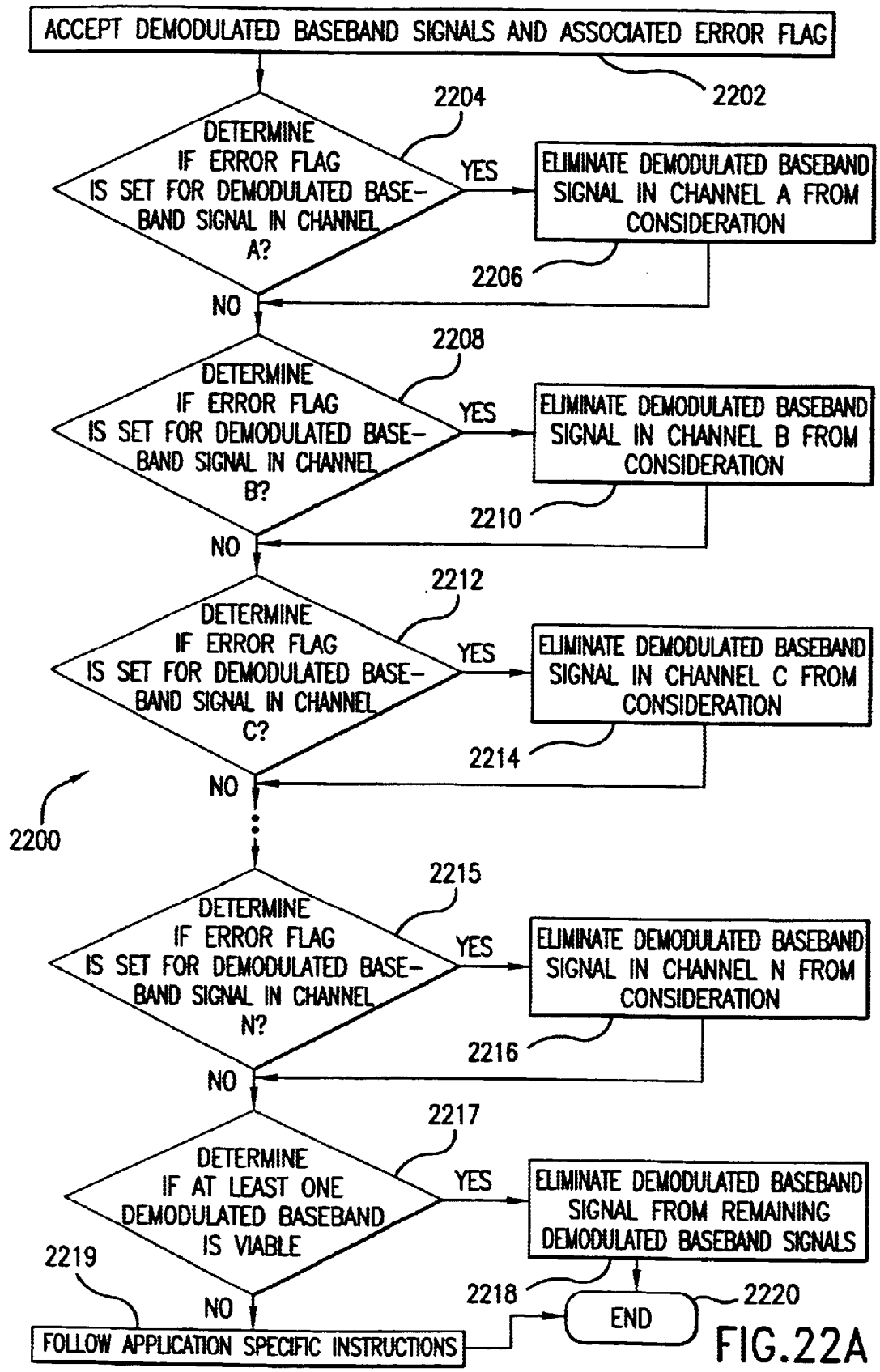
FIG. 22A depicts a flowchart 2200, which illustrates selecting an error-free demodulated baseband signal using a process of elimination according to an embodiment of the present invention.
Figure 22B:
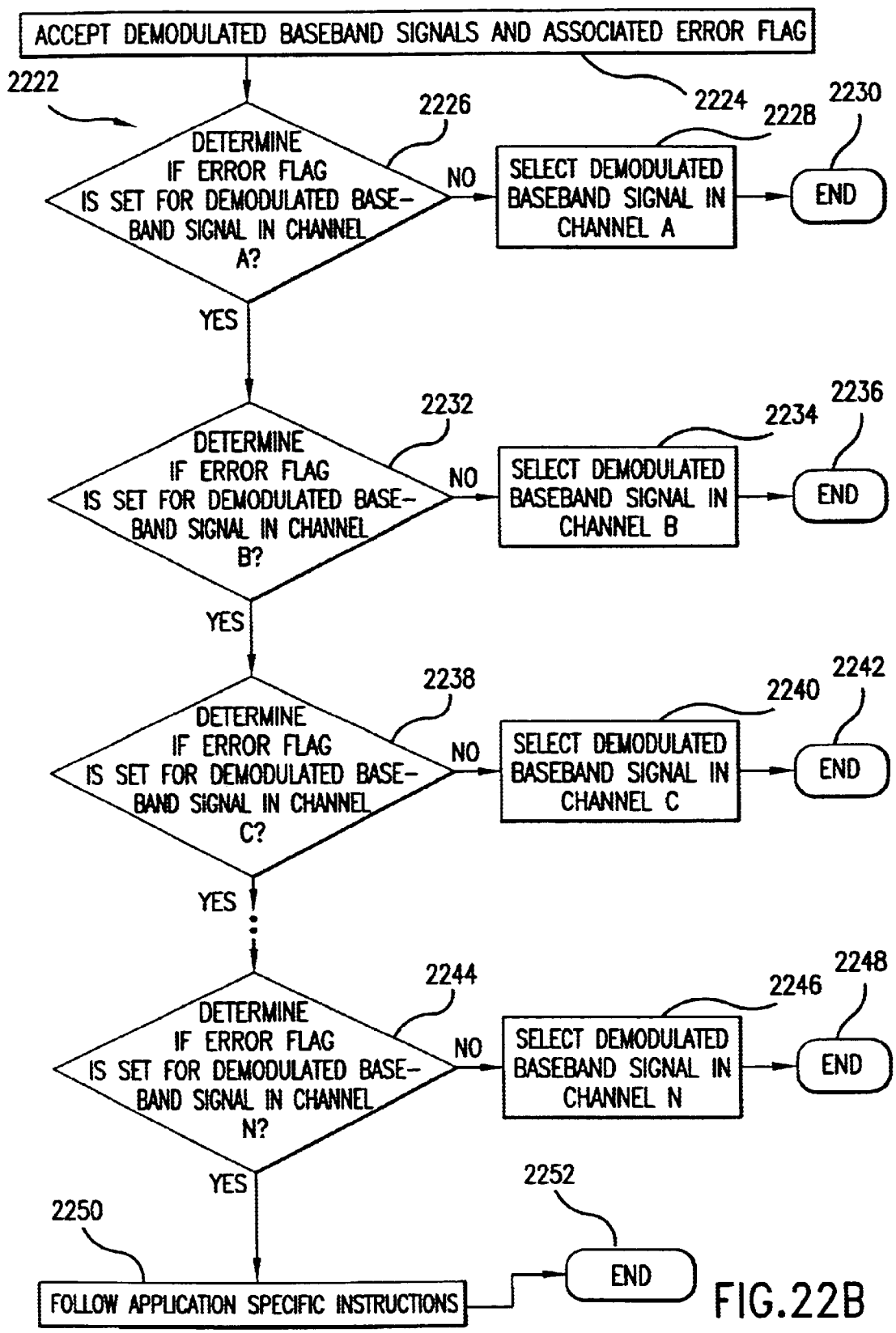
FIG. 22B depicts a flowchart 2222, which illustrates selecting an error-free demodulated baseband signal using a process of elimination according to an embodiment of the present invention.
Figure 23:
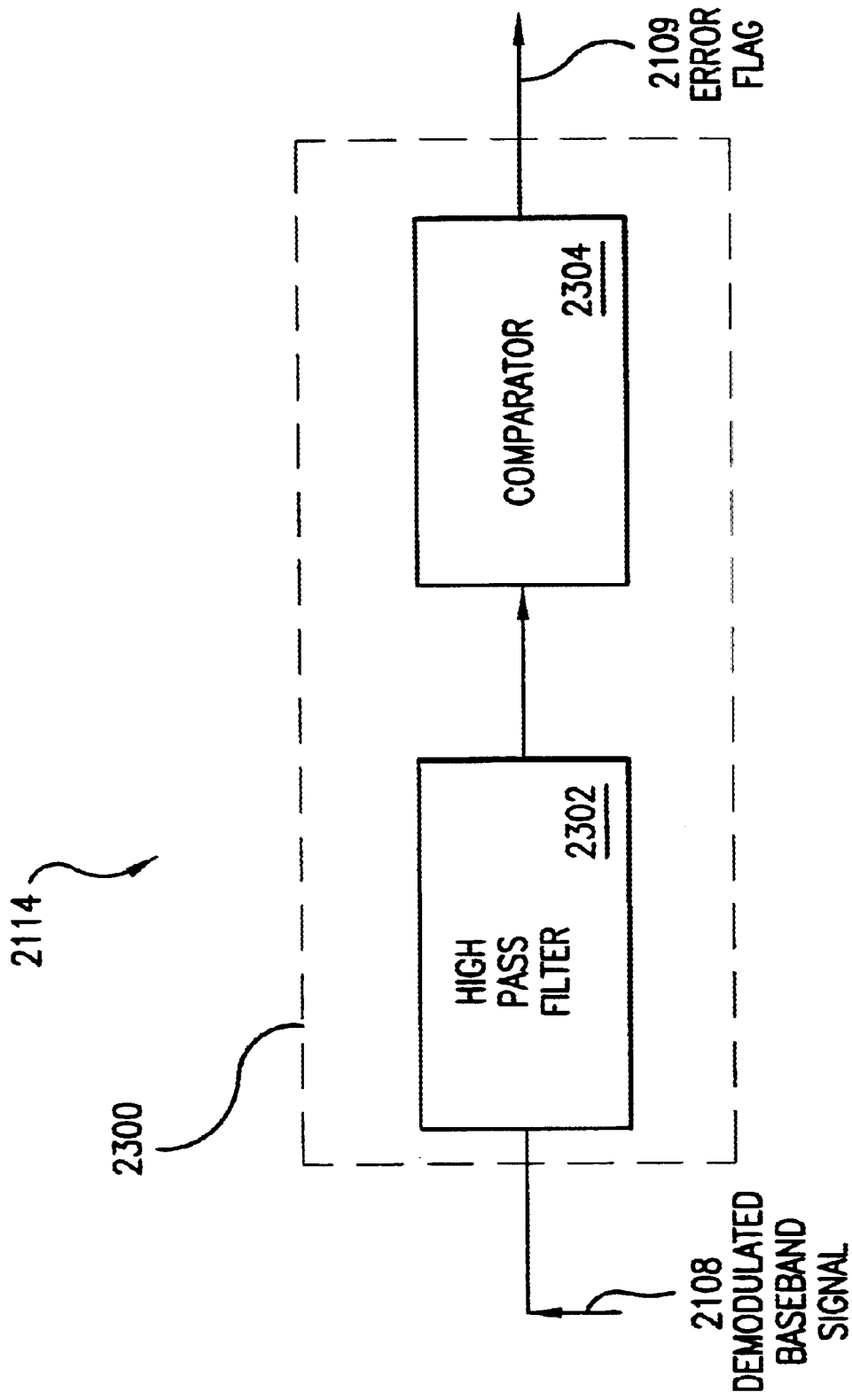
FIG. 23 depicts a structural block diagram of an embodiment of error check module 2114, according to one embodiment of the present invention.

In one embodiment, step 2106 selects a substantially error-free demodulated baseband signal through a process of elimination. This can be done by examining status of the error flag generated in step 2104 for each demodulated baseband signal. If the error flag is set, then the associated demodulated baseband signal is eliminated from consideration. This embodiment is further illustrated by flowchart 2200 (FIG. 22) that is discussed below.

Flowchart 2200 (FIG. 22A) is an operational process for selecting an error-free demodulated baseband signal through a process of elimination, and is one embodiment of step 2106 in flowchart 2100 (FIG. 21A). Flowchart 2200 will be discussed as follows.

In step 2202, a plurality of demodulated baseband signals and associated error flags are accepted. The demodulated baseband signals are preferable isolated in channels A–N. For example, demodulated baseband signals 2108a–c can be described as existing in channels that correspond to the their corresponding letter "a–c". The error flag associated with each demodulated baseband signal is preferably generated as described in step 2104 above.

In step 2204, it is determined whether the error flag associated with the demodulated baseband signal in channel A is set. If yes, then in step 2206, the demodulated baseband signal in channel A is eliminated from consideration, after which control flows to step 2208. If no, then flowchart 2200 sends control directly to step 2208.

In step 2208, it is determined whether the error flag associated with the demodulated baseband signal in channel B is set. If yes, then in step 2210, the demodulated baseband signal in channel B is eliminated from consideration, after which control flows to step 2212. If no, then flowchart 2200 sends control directly to step 2212.

In step 2212, it is determined whether the error flag associated with the demodulated baseband signal in channel C is set. If yes, then in step 2214, the demodulated baseband signal in channel C is eliminated from consideration, after which control flows to step 2215. If no, then flowchart 2200 sends control directly to step 2215.

The process described above continues until the $N^{th}$ channel is reached. In step 2215, it is determined whether the error flag associated with demodulated baseband signal in channel N is set. If yes, then in step 2216, the demodulated baseband signal in channel N is eliminated from consideration, after which control flows to step 2217. If no, then flowchart 2200 sends control directly to step 2217.

In step 2217, it is determined whether at least one demodulated baseband signal is viable (i.e., at least one that has not been eliminated). If yes, then control flows to step 2218. If no, then control flows to step 2219, where the process follows application specific instructions to address the situation where all de-modulated baseband signals have been determined to be erroneous. After which, the process ends in step 2220.

In step 2218, a demodulated baseband signal is selected from the demodulated baseband signals that are still under consideration. If more than one demodulated baseband signal is still viable, then the selection can be done according to the channel order (i.e. select channel A over channel C), or inverse channel order (i.e. select channel C over channel A), or any other means of selection including selection based on highest power level.

The selection process described by flowchart 2200 will now be applied to demodulated baseband signal 2108a–c in FIGS. 21 E–G, respectively. In doing so, the error flag associated with demodulated baseband signal 2108b in channel B will be set. Therefore, step 2208 will eliminate demodulated baseband signal 2108b from consideration. This leaves the choice between demodulated baseband signals 2108a and 2108c. In one embodiment, demodulated baseband signal 2108a is selected because it is in Channel A, and Channel A was the first channel examined. In another embodiment, demodulated baseband signal 2108c is selected because it is in Channel C, and was the last channel examined. In another embodiment, channel power level is monitored, and the channel with the strongest demodulated baseband signal is selected. Either way a substantially error-free demodulated baseband signal is selected that is substantially similar to the modulating baseband signal used to generate the redundant spectrums.

Flowchart 2222 (FIG. 22B) is an alternative operational process for selecting a substantially error-free demodulated baseband signal through a process of elimination, and is one embodiment of step 2106 in flowchart 2100 (FIG. 21A). Flowchart 2222 will be discussed as follows.

In step 2224, a plurality of demodulated baseband signals and associated error flags are accepted. The demodulated baseband signals are preferable isolated in channels A–N. For example, demodulated baseband signals 2108a–c can be described as existing in channels that correspond to the their corresponding letter "a–c". The error flag associated with each demodulated baseband signal is preferably generated as described in step 2104 above.

In step 2226, it is determined whether the error flag associated with the demodulated baseband signal in channel A is set. If yes, then control flows to step 2232. If no, then in step 2228, the demodulated baseband signal in channel A is selected as a substantially error-free demodulated baseband signal, after which flowchart processing ends in step 2230. As stated earlier, a particular demodulated baseband signal is substantially error-free if it is sufficiently similar to and/or representative of the modulating baseband signal as needed for the specific application in use.

In step 2232, it is determined whether the error flag associated with the demodulated baseband signal in channel B is set. If yes, then control flows to step 2238, and the demodulated baseband signal in channel B is eliminated from consideration. If no, then in step 2234, the demodulated baseband signal in channel 25B is selected as a substantially error-free demodulated baseband signal, after which processing ends in step 2236.

In step 2238, it is determined whether the error flag associated with the demodulated baseband signal in channel C is set. If yes, then control flows to step 2244, and the demodulated baseband signal in channel C is eliminated from consideration. If no, then in step 2240, the demodulated baseband signal in channel C is selected as a substantially error-free demodulated baseband signal, after which processing ends in step 2242.

The process described above continues until the $N^{th}$ channel is reached. In step 2244, it is determined whether the error flag associated with the demodulated baseband signal in channel N is set. If yes, then control flows to step 2250, and the demodulated baseband signal in channel N is eliminated from consideration. If no, then in step 2246, the demodulated baseband signal in channel N is selected as a substantially error-free demodulated baseband signal, after which processing ends in step 2248.

If the process reaches step 2250, then all the error flags for the available channels have been checked and determined to be set, meaning that all the available de-modulated baseband signals have been determined to contain errors. In such case, step 2250 follows application specific instructions, after which processing ends in step 2252. In one embodiment, the application specific instruction may be a request for re-transmission.

6.2.3.1.2Structural Description:

FIG. 21I illustrates spectrum isolation module 1726, and signal extraction module 1728 from receiver module 1730 (FIG. 17I), where in one embodiment signal extraction module 1728 includes signal extraction module 2110. Signal extraction module 2110 includes demodulators 2112a–c, error check modules 2114a–c, and arbitration module 2116. Preferably signal extraction module 2110 receives redundant spectrums 1714a–c and extracts demodulated baseband signal 1720. In other words, signal extraction module 1728 is a structural embodiment for performing the operational steps 2102–2106 in flowchart 2100. However, it should be understood that the scope and spirit of the of the present invention includes other structural embodiments for performing the steps 2102–2106 of flowchart 2100.

Flowchart 2100 will be revisited to further illustrate the present invention in view of the structural components in signal extraction module 2110.

In step 1706, spectrum isolation module 1726 isolates redundant spectrum 1714a–c from each other into separate channels, resulting in channels 1718a–c (shown in FIGS. 21B–21D). As such, channel 1718a comprises redundant spectrum 1714a; channel 1718b comprises redundant spectrum 1714b and jamming signal spectrum 1716; and channel 1718c comprises redundant spectrum 1714c. Each channel 1718a–c carries the necessary amplitude, phase, and frequency information to reconstruct modulating baseband signal 308 because redundant spectrums 1714a–c carry such information. However, channel 1718b also carries jamming signal spectrum 1716 that may prevent channel 1718b from being used to reconstruct modulating baseband signal 308, depending on the relative signal strength of jamming signal spectrum 1716. Step 1706 and channels 1718a–c were first discussed in FIGS. 17A and FIGS. 17E–G, respectively, and are re-illustrated here for convenience.

In step 2102, demodulators (or detectors) 2112a–c demodulate redundant spectrums 1714a–c (in channels 1718a–c, respectively), resulting in demodulated baseband signals 2108a–c, respectively. Demodulators 2112a–c are consistent with the type of modulation used to generate redundant spectrums 1714a–c. As such, example embodiments of demodulators 2112a–c include but are not limited to: AM demodulators, FM demodulators, and PM demodulators, and demodulators that can demodulate redundant spectrums that are combinations thereof. Furthermore, the present invention can be operated with other modulation schemes that are not listed above, as will be recognized by to those skilled in art(s) based on the discussion given herein. Furthermore, the number of demodulators 2112 need not be three, as is illustrated in FIG. 21I. The number demodulators 2112 can be scaled to be consistent with the number of redundant spectrums, or subset of redundant spectrums received by (optional) medium interface module 1722, as would be well known to those skilled in the arts based on the discussion given herein.

In one embodiment, the down-converter 1516 is included in demodulators 2112a–c. In this case, down-conversion and demodulation are done in one step so that isolated redundant spectrums are directly down-converted to demodulated baseband signals without using any IF stages. Direct down-conversion can done using the aliasing module 1902 that was summarized in section 6.2.1.2.

In step 2104, error check modules 2114a–c analyze demodulated baseband signals 2108a–c, respectively, to detect errors in demodulated baseband signals 2108a–c. In one embodiment, each error check module 2114 generates an error flag 2109 whenever the corresponding demodulated baseband signal is determined to be erroneous. The error flags 2109a–c are sent with the demodulated baseband signal 2108a–c to the arbitration module 2116. The arbitration module will use the error flags to weed out erroneous demodulated baseband signals.

Error check modules 2114a–c can implement any number of the possible available error detection schemes to detect errors in step 2104. Furthermore, in some instances, methodologies can be used to correct detected errors in digital signals. Some effective error detection schemes that can be used for digital and analog signals will be discussed below.

For demodulated baseband signals that are digital signals, error check modules 2114a–c can implement cyclic redundancy check (CRC) or parity check to detect errors. A brief summary of which follows. CRC examines a digital bit stream and calculates an n-bit CRC character according to a specific mathematical relationship. The CRC character is then transmitted with the examined bit stream over the communications medium. The same calculation is performed at the receiver. If the receiver CRC character agrees with that sent with the bit stream, then the bit stream is determined to be error free. IF there is disagreement, then an error has been introduced. Parity check also generates n-bit character associated with a bit stream; where the parity check character is based on the number of logic "1"s or "0"s in the bit stream. The scope and spirit of the present invention includes all other error checking/correction schemes as will be understood by those skilled in the art(s) based on the discussion given herein.

For demodulated baseband signals that are analog signals, error check modules 2114a–c can monitor a pilot tone to detect errors. The pilot tone is embedded in the redundant spectrums from which the demodulated baseband signals are generated. After calibration, any degradation in the pilot tone may be evidence of signal interference.

In an alternate embodiment, error detection modules 2114a–c can comprise analog error detection module 2300 to detect errors in analog demodulated baseband signals. Analog error detection module 2300 comprises high pass filter 2302, and comparator 2304. Analog error detection module 2300 operates as follows. High pass filter 2302 selects the out-of-band high frequency spectral components in the demodulated baseband signal 2108. These out-of-band spectral components are ideally small in amplitude. Comparator 2304 compares the amplitude of these out-of-band spectral components to some threshold level, and sets the error flag 2109 if the threshold level is exceeded.

In alternate embodiment, arbitration module 2116 can detect errors in analog demodulated baseband signals by examining the demodulated baseband signals to determine a consensus signal shape. Each demodulated baseband signal can then be compared with the consensus signal, where any demodulated baseband signal that is substantially different from the consensus signal is deemed erroneous. Implementation of this scheme on demodulated baseband signals 2108a–c (FIGS. 21E–21G) will result in baseband signal 2108b being deemed as erroneous. It should recalled that exemplary de-modulated baseband signal 2108b was demodulated from spectrum 1714b that was illustrated to be corrupted with a jamming signal spectrum 1716.

In step 2106, arbitration module 2116 selects an error free demodulated baseband signal, resulting in demodulated baseband signal 1720, which is substantially similar modulating baseband signal 308. In the example illustrated in FIGS. 21E–G, demodulated baseband signal 1720 can be either one of demodulated baseband signals 2108a or 2108c.

In one embodiment, arbitration module 2116 uses error flags 2109 generated by error detection modules 2114, and an elimination process to select the error-free demodulated baseband signal. Example elimination processes were described in section 6.2.3.1.1, in flowcharts 2200 (in FIG. 22A) and 2222 (in FIG. 22B), to which the reader is referred to for further description.

6.2.3.2 Other Embodiments

The embodiment for signal extraction described above is provided for purposes of illustration. This embodiment is not intended to limit the invention. Alternate embodiments, differing slightly or substantially from those described herein, will be apparent to those skilled in the relevant art(s) based on the teachings given herein. Such alternate embodiments fall within the scope and spirit of the present invention.

IV. Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments include but are not limited to hardware, software, and software/hardware implementations of the methods, systems, and components of the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A method of generating a communications signal for transmitting a first and a second baseband signal, comprising the steps of:

(1) receiving a first modulating baseband signal and a second modulating baseband signal wherein the first modulating baseband signal differs from the second modulating baseband signal;

(2) modulating a first oscillating signal having a frequency $f_1$ with said first modulating baseband signal to generate a first modulated signal;

(3) modulating a second oscillating signal having a frequency $f_2$ with said second modulating baseband signal to generate a second modulated signal; and (4) modulating said first modulated signal with said second modulated signal to generate a plurality of redundant spectrums, wherein each of said redundant spectrums contains information that is representative of said first modulating baseband signal and said second modulating baseband signal.

2. The method of claim 1, wherein step (2) includes the step of amplitude modulating said first oscillating signal with said first modulating baseband signal, step (3) includes the step of amplitude modulating said second oscillating signal with said second modulating baseband signal, and wherein step (4) includes the step of angle modulating said first modulated signal with said second modulated signal.

3. The method of claim 2, wherein step (4) includes the step of phase modulating said first modulated signal with said second modulated signal.

4. The method of claim 2, wherein step (4) includes the step of frequency modulating said first modulated signal with said second modulated signal.

5. The method of claim 2, wherein each redundant spectrum includes amplitude, phase, and frequency information to substantially reconstruct said second modulating baseband signal, and wherein an amplitude of said redundant spectrums fluctuates in mass to represent the first modulating baseband signal.

6. A system for generating a communications signal that is representative of a first modulating baseband signal and a second modulating baseband signal, comprising:

a first first-stage modulator configured to generate a first modulated signal using the first modulating baseband signal and a first oscillating signal at a frequency $f_1$;

a second first-stage modulator configured to generate a second modulated signal using the second modulating baseband signal and a second oscillating signal at a frequency $f_2$ wherein the first modulating baseband signal differs from the second modulating baseband signal; and a second stage modulator configured to modulate said first modulated signal with said second modulated signal to generate a plurality of redundant spectrums, each redundant spectrum representative of said first modulating baseband signal and said second modulating baseband signal.

7. The system of claim 6, wherein said first first-stage modulator and said second first stage modulator are both amplitude modulators, and wherein said second stage modulator is an angle modulator, wherein each redundant spectrum includes amplitude, phase, and frequency information to substantially reconstruct said second modulating baseband signal, and wherein an amplitude of said redundant spectrums fluctuates in mass to represent the first modulating baseband signal.

8. A system for generating a communications signal that is representative of a first modulating baseband signal and a second modulating baseband signal, comprising:

a first amplitude modulator configured to generate a first amplitude modulated signal using the first modulating baseband signal and a first oscillating signal at a frequency $f_1$;

a second amplitude modulator configured to generate a second amplitude modulated signal using the second modulating baseband signal and a second oscillating signal at a frequency $f_2$; and an angle modulator configured to angle modulate said first amplitude modulated signal with said second amplitude modulated signal to generate a plurality of redundant spectrums, each redundant spectrum representative of said first modulating baseband signal and said second modulating baseband signal.

9. A method of generating a communications signal for transmitting a first and a second baseband signal, comprising the steps of:

(1) receiving a first modulating baseband signal and a second modulating baseband signal;

(2) amplitude modulating a first oscillating signal having a frequency $f_1$ with said first modulating baseband signal to generate a first modulated signal;

(3) amplitude modulating a second oscillating signal having a frequency $f_2$ with said second modulating baseband signal to generate a second modulated signal; and (4) angle modulating said first modulated signal with said second modulated signal to generate a plurality of redundant spectrums, wherein each of said redundant spectrums contains information that is representative of said first modulating baseband signal and said second modulating baseband signal.

10. The method of claim 9, wherein step (4) includes the step of phase modulating said first modulated signal with said second modulated signal.

11. The method of claim 9, wherein step (4) includes the step of frequency modulating said first modulated signal with said second modulated signal.

12. The method of claim 9, wherein each redundant spectrum includes amplitude, phase, and frequency information to substantially reconstruct said second modulating baseband signal, and wherein an amplitude of said redundant spectrums fluctuates in mass to represent the first modulating baseband signal.

13. A system for generating a communications signal that is representative of a first modulating baseband signal and a second modulating baseband signal, comprising:

a first first-stage modulator configured to generate a first modulated signal using the first modulating baseband signal and a first oscillating signal at a frequency $f_1$;

a second first-stage modulator configured to generate a second modulated signal using the second modulating baseband signal and a second oscillating signal at a frequency $f_2$; and a second stage modulator configured to modulate said first modulated signal with said second modulated signal to generate a plurality of redundant spectrums, each redundant spectrum representative of said first modulating baseband signal and said second modulating baseband signal;

wherein said first first-stage modulator and said second first stage modulator are both amplitude modulators, and wherein said second stage modulator is an angle modulator, wherein each redundant spectrum includes amplitude, phase, and frequency information to substantially reconstruct said second modulating baseband signal, and wherein an amplitude of said redundant spectrums fluctuates in mass to represent the first modulating baseband signal.

* * * * *